(12) United States Patent
Li et al.

(10) Patent No.: US 10,475,514 B2
(45) Date of Patent: Nov. 12, 2019

(54) NONVOLATILE DIGITAL COMPUTING WITH FERROELECTRIC FET

(71) Applicant: The Penn State Research Foundation, University Park, PA (US)

(72) Inventors: Xueqing Li, State College, PA (US); Sumitha George, State College, PA (US); John Sampson, State College, PA (US); Sumeet Gupta, State College, PA (US); Suman Datta, South Bend, IN (US); Vijaykrishnan Narayanan, State College, PA (US); Kaisheng Ma, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 0 days.

(21) Appl. No.: 15/976,315

(22) Filed: May 10, 2018

(65) Prior Publication Data
US 2018/0330791 A1 Nov. 15, 2018

Related U.S. Application Data

(60) Provisional application No. 62/504,775, filed on May 11, 2017.

(51) Int. Cl.
*G11C 14/00* (2006.01)
*G11C 13/00* (2006.01)
(Continued)

(52) U.S. Cl.
CPC ...... *G11C 14/0072* (2013.01); *G11C 11/1675* (2013.01); *G11C 11/1693* (2013.01); *G11C 11/223* (2013.01); *G11C 11/2275* (2013.01); *G11C 11/2293* (2013.01); *G11C 13/0002* (2013.01); *G11C 13/0007* (2013.01);
(Continued)

(58) Field of Classification Search
CPC ............ G11C 14/0072; G11C 11/1693; G11C 11/2275; G11C 13/0002; G11C 11/223; G11C 11/1675; G11C 14/009; G11C 14/0081; G11C 13/0069
See application file for complete search history.

(56) References Cited

U.S. PATENT DOCUMENTS 6,067,244 A * 5/2000 Ma .......................... G11C 11/22
365/145
2001/0011743 A1 8/2001 Arita et al.
(Continued)

*Primary Examiner* — Mohammed A Bashar
(74) *Attorney, Agent, or Firm* — Buchanan Ingersoll & Rooney PC

(57) ABSTRACT

Embodiments include nonvolatile a memory (NVM) device that can be configured for logic switching and/or digital computing. For example, embodiments of the NVM device can be configured as any one or combination of a memory cell, a D flip flop (DFF), a Backup and Restore circuit (B&R circuit), and/or a latch for a DFF. Any of the NVM devices can have a Fe field effect transistors (FeFET) configured to exploit the $I_{DS}$-$V_G$ hysteresis of the steep switch at low voltage for logic memory synergy. The FeFET-based devices can be configured to include a wide hysteresis, a steep hysteresis edge, and high ratio between the two $I_{DS}$ states at $V_G$=0.

12 Claims, 89 Drawing Sheets

(51) Int. Cl.
*H01L 29/78* (2006.01)
*G11C 11/16* (2006.01)
*G11C 11/22* (2006.01)

(52) U.S. Cl.
CPC ...... *G11C 13/0061* (2013.01); *G11C 13/0069* (2013.01); *G11C 14/009* (2013.01); *G11C 14/0054* (2013.01); *G11C 14/0081* (2013.01); *H01L 29/78391* (2014.09)

(56) References Cited

U.S. PATENT DOCUMENTS

| | | |
|---|---|---|
| 2004/0041186 A1 | 3/2004 | Dimmler et al. |
| 2009/0190430 A1 | 7/2009 | Kang et al. |
| 2011/0147807 A1 | 6/2011 | Wilson et al. |
| 2012/0014169 A1 | 1/2012 | Snider |
| 2012/0319096 A1* | 12/2012 | Rinzler ................. B82Y 10/00 257/40 |
| 2015/0089293 A1 | 3/2015 | Waechter et al. |

* cited by examiner

Baseline MOSFET curve

M5 polarization
M6 polarization

| | Supply voltage | | | | | |
|---|---|---|---|---|---|---|
| | 0.5V | 0.6V | 0.7V | 0.8V | 0.9V | 1.0V |
| $V_{TH}$ variation 30mV | Pass | Pass | Pass | Pass | Pass | Pass |
| $V_{TH}$ variation 40mV | Fail | Fail | Fail | Fail | Fail | Fail |

NONVOLATILE DIGITAL COMPUTING WITH FERROELECTRIC FET

CROSS-REFERENCE TO RELATED APPLICATIONS

This Application is related to and claims the benefit of priority to U.S. Provisional Application Ser. No. 62/504,775 filed on May 11, 2017, the entire contents of which is incorporated herein by reference.

STATEMENT REGARDING FEDERALLY SPONSORED RESEARCH AND DEVELOPMENT

This invention was made with government support under Grant No. HR0011-13-3-0002 awarded by the Department of Defense/Defense Advanced Research Projects Agency (DARPA). The government has certain rights in the invention.

FIELD OF THE INVENTION

Embodiments of the invention relate to nonvolatile a memory (NVM) device that can be configured for logic switching and/or digital computing. For example, embodiments of the NVM device can be configured as any one or combination of a memory cell, a D flip flop (DFF), a Backup and Restore circuit (B&R circuit), and/or a latch for a DFF.

BACKGROUND OF THE INVENTION

Conventional nonvolatile memories tend to require a large amount of energy for suitable operation. The energy consumed during backup and restore operations can be factors that lead to this large energy requirement. During backup and restore operations, high static current, long backup times to survive power supply variations, and/or long restore times to cover supply recovery ramp can lead to a high total energy per backup and restore operation. Conventional nonvolatile memories can also be plagued with limited speed, limited endurance, and/or limited use of dynamic energy or power.

Not only can the effects of such limitations result in wasted energy consumption, these and other limitations exhibited by conventional nonvolatile memories may hinder implementation of energy saving techniques. This inability to implement energy saving techniques can be exacerbated during frequent data access operations when the conventional nonvolatile memory is used as a memory cell during computation and/or logic switching.

Examples of conventional nonvolatile memories and logic switching devices can be appreciated from U.S. Patent Publication No. 2001/0011743, U.S. Patent Publication No. 2004/0041186, U.S. Patent Publication No. 2009/0190430, U.S. Patent Publication No. 2011/0147807, U.S. Patent Publication No. 2012/0014169, and U.S. Patent Publication No. 2015/0089293.

SUMMARY OF THE INVENTION

Embodiments include nonvolatile a memory (NVM) device that can be configured for logic switching and/or digital computing. For example, embodiments of the NVM device can be configured as any one or combination of a memory cell, a D flip flop (DFF), a Backup and Restore circuit (B&R circuit), and/or a latch for a DFF.

Any of the NVM devices can have a Fe field effect transistors (FeFET) configured to exploit the $I_{DS}$-$V_G$ hysteresis of the steep switch at low voltage for logic memory synergy. The FeFET-based devices can be configured to include a wide hysteresis, a steep hysteresis edge, and high ratio between the two $I_{DS}$ states at $V_G$=0. This can be achieved by shifting the hysteresis of the FeFET by Vth engineering and tuning other parameters by adjusting the ferroelectric layer thickness and ferroelectric area. In some embodiments, the hysteresis can be shifted to center the hysteresis window around $V_G$=0, which may provide extra non-volatility to the FeFET-based device. Some embodiments can be configured to operate on higher ON-state current and lower OFF-state current to provide faster restore operations, as well as provide immunity to device variations.

Embodiments of the FeFET-based devices can be used to produce nonvolatile DFFs that maintain their state during power outages. These DFFs, used as nonvolatile memories, can facilitate computing without the loss of computation states during a power failure, which can be achieved by nonvolatile processing techniques of embedding the FeFET-based device on a memory chip so that the FeFET-based device can serve as a logic transistor. In some embodiments, the DFFs can be configured to operate with external backup and restore control signals. In some embodiments, the DFFs can be configured to operate without external backup and restore control signals, which can be achieved by the addition of transistors to the nonvolatile memory cell design. Embodiments of the DFF can be configured to consume negligible static current in backup and in restore operations, be energy efficient, have low latency backup and restore operations, and have low energy-delay overhead.

In at least one embodiment, a nonvolatile memory (NVM) device can be made having a circuit topology with at least one Fe field effect transistor (FeFET) configured to exhibit a wide current-voltage (I-V) hysteresis covering zero gate bias.

In at least one embodiment, the NVM device circuit topology can be configured as a backup and restore circuit (B&R circuit). The B&R circuit can include a first transistor, $M_1$, $M_1$ having an $M_1$-source, an $M_1$-gate, and an $M_1$-drain. The B&R circuit can include a second transistor, $M_2$, $M_2$ having an $M_2$-source, an $M_2$-gate, and an $M_2$-drain. The B&R circuit can include a third transistor, $M_3$, $M_3$ having an $M_3$-source, an $M_3$-gate, and an $M_3$-drain. The B&R circuit can include a fourth transistor, $M_4$, $M_4$ having an $M_4$-source, an $M_4$-gate, and an $M_4$-drain. The B&R circuit can include a fifth transistor, $M_5$, $M_5$ having an $M_5$-source, an $M_5$-gate, and an $M_5$-drain. The B&R circuit can include a sixth transistor, $M_6$, $M_6$ having an $M_6$-source, an $M_6$-gate, and an $M_6$-drain. The B&R circuit can include a seventh transistor, $M_7$, $M_7$ having an $M_7$-source, an $M_7$-gate, and an $M_7$-drain. The B&R circuit can include an eighth transistor, $M_8$, $M_8$ having an $M_8$-source, an $M_8$-gate, and an $M_8$-drain. The B&R circuit can include a first branch and a second branch, the first branch including $M_1$, $M_2$, $M_5$, $M_7$, and a ground, GND, the second branch including $M_3$, $M_4$, $M_6$, and $M_8$. Each of $M_1$, $M_2$, $M_3$, $M_4$, $M_7$, and $M_8$ can be a metal-oxide-semiconductor field-effect transistor (MOSFET) and each of $M_5$ and $M_6$ can be a FeFET. $M_1$-gate can be connected to a backup control signal input, $B_{kp\_input}$ and $M_3$-gate. $M_1$-drain can be connected to $M_2$-drain. $M_1$-drain can be configured to be connected to a slave latch via the first branch. $M_1$-source can be connected to $M_5$-source and $M_7$-drain. $M_2$-drain can be connected to $M_1$-drain. $M_2$-drain can be configured to be connected to the slave latch via the first branch. $M_2$-gate can be connected to a backup and restore control signal input, $B_{kp}+R_{str}$ and $M_3$-gate. $M_2$-source can be connected to $M_6$-gate, $M_5$-drain, $M_5$-gate, $M_6$-drain, and $M_3$-source. $M_3$-drain can be connected to $M_4$-drain. $M_3$-drain can be configured to be connected to the slave latch via the second branch. $M_3$-gate can be connected to $B_{kp}+R_{str}$ and $M_1$-gate. $M_3$-source can be connected to $M_5$-gate, $M_6$-drain, $M_5$-drain, $M_2$-source, and $M_6$-gate. $M_4$-drain can be connected to $M_3$-drain. $M_4$-drain can be configured to be connected to the slave latch via the second branch. $M_4$-gate can be connected to a backup control signal output, $B_{kp\_output}$. $M_4$-source can be connected to $M_6$-source and $M_8$-drain. $M_5$-drain can be connected to $M_2$-source, $M_5$-gate, $M_6$-gate, $M_6$-drain, and $M_3$-source. $M_5$-gate can be connected to $M_3$-source, $M_6$-drain, $M_6$-gate, $M_2$-source, and $M_5$-drain. $M_5$-source can be connected to $M_7$-drain and $M_1$-source. $M_6$-drain can be connected to $M_3$-source, $M_5$-gate, $M_6$-gate, $M_5$-drain, and $M_2$-source. $M_6$-gate can be connected to $M_2$-source, $M_5$-drain, $M_5$-gate, $M_6$-drain, and $M_3$-source. $M_6$-source can be connected to $M_4$-source and $M_8$-drain. $M_7$-drain can be connected to $M_1$-source and $M_5$-source. $M_7$-gate can be connected to a restore input control signal, $R_{str}$. $M_7$-source can be connected to GND via the first branch. $M_8$-drain can be connected to $M_4$-source and $M_6$-source. $M_8$-gate can be connected to $M_7$-gate. $M_8$-source can be connected to GND via the second branch.

In at least one embodiment, the NVM device the circuit topology can be configured as a D-Flip Flop (DFF). The DFF can include a master latch, a slave latch, and a backup and restore circuit (B&R circuit). The master latch can include a first master inverter $M_{INV1}$, a second master inverter, $M_{INV2}$, a third master inverter, $M_{INV3}$, and a master transmission gate, $M_{GATE}$. Input of $M_{INV1}$ can be connected to a data input signal, D. Output of $M_{INV1}$ can be connected to input of $M_{INV2}$. Input of $M_{INV2}$ can be connected to output of $M_{INV1}$. Output of $M_{INV2}$ can be connected to input of $M_{INV3}$. Input of $M_{INV3}$ can be connected to output of $M_{INV2}$. Output of $M_{INV3}$ can be connected to input of $M_{GATE}$. Input of $M_{GATE}$ can be connected to output of $M_{INV3}$. Output of $M_{GATE}$ can be connected to input of $M_{INV2}$ and output of $M_{INV1}$. The slave latch can include a first slave inverter, $S_{INV1}$, a second slave inverter, $S_{INV2}$, a third slave inverter, $S_{INV3}$, and a slave transmission gate, $S_{GATE}$. Input of $S_{INV1}$ can be connected to output of $M_{INV2}$. Input of $S_{INV2}$ can be connected to output of $S_{INV1}$. Output of $S_{INV2}$ can be connected to input of $S_{INV3}$ and to a data output Q. Input of $S_{INV3}$ can be connected to output of $S_{INV2}$. Output of $S_{INV3}$ can be connected to input of $S_{GATE}$. Output of $S_{GATE}$ can be connected to input of $S_{INV2}$ and output of $S_{INV1}$. The B&R circuit can include a first transistor, $M_1$, $M_1$ having an $M_1$-source, an $M_1$-gate, and an $M_1$-drain. The B&R circuit can include second transistor, $M_2$, $M_2$ having an $M_2$-source, an $M_2$-gate, and an $M_2$-drain. The B&R circuit can include a third transistor, $M_3$, $M_3$ having an $M_3$-source, an $M_3$-gate, and an $M_3$-drain. The B&R circuit can include a fourth transistor, $M_4$, $M_4$ having an $M_4$-source, an $M_4$-gate, and an $M_4$-drain. The B&R circuit can include a fifth transistor, $M_5$, $M_5$ having an $M_5$-source, an $M_5$-gate, and an $M_5$-drain. The B&R circuit can include a sixth transistor, $M_6$, $M_6$ having an $M_6$-source, an $M_6$-gate, and an $M_6$-drain. The B&R circuit can include a seventh transistor, $M_7$, $M_7$ having an $M_7$-source, an $M_7$-gate, and an $M_7$-drain. The B&R circuit can include an eighth transistor, $M_8$, $M_8$ having an $M_8$-source, an $M_8$-gate, and an $M_8$-drain. The B&R circuit can include a first branch and a second branch, the first branch including $M_1$, $M_2$, $M_5$, $M_7$, and a ground, GND, the second branch including $M_3$, $M_4$, $M_6$, and $M_8$. Each of $M_1$, $M_2$, $M_3$, $M_4$, $M_7$, and $M_8$ can be a metal-oxide-semiconductor field-effect transistor (MOSFET) and each of $M_5$ and $M_6$ can be FeFET. $M_1$-gate can be connected to a backup control signal input, $B_{kp\_input}$ and $M_3$-gate. $M_1$-drain can be connected to $M_2$-drain. $M_1$-drain can be configured to be connected to the slave latch via the first branch. $M_1$-source can be connected to $M_5$-source and $M_7$-drain. $M_2$-drain can be connected to $M_1$-drain. $M_2$-drain can be configured to be connected to the slave latch via the first branch. $M_2$-gate can be connected to a backup and restore control signal input, $B_{kp}+R_{str}$ and $M_3$-gate. $M_2$-source can be connected to $M_6$-gate, $M_5$-drain, $M_5$-gate, $M_6$-drain, and $M_3$-source. $M_3$-drain can be connected to $M_4$-drain. $M_3$-drain can be configured to be connected to the slave latch via the second branch. $M_3$-gate can be connected to $B_{kp}+R_{str}$ and $M_1$-gate. $M_3$-source can be connected to $M_5$-gate, $M_6$-drain, $M_5$-drain, $M_2$-source, and $M_6$-gate. $M_4$-drain can be connected to $M_3$-drain. $M_4$-drain can be configured to be connected to the slave latch via the second branch. $M_4$-gate can be connected to a backup control signal output, $B_{kp\_output}$. $M_4$-source can be connected to $M_6$-source and $M_8$-drain. $M_5$-drain can be connected to $M_2$-source, $M_5$-gate, $M_6$-gate, $M_6$-drain, and $M_3$-source. $M_5$-gate can be connected to $M_3$-source, $M_6$-drain, $M_6$-gate, $M_2$-source, and $M_5$-drain. $M_5$-source can be connected to $M_7$-drain and $M_1$-source. $M_6$-drain can be connected to $M_3$-source, $M_5$-gate, $M_6$-gate, $M_5$-drain, and $M_2$-source. $M_6$-gate can be connected to $M_2$-source, $M_5$-drain, $M_5$-gate, $M_6$-drain, and $M_3$-source. $M_6$-source can be connected to $M_4$-source and $M_8$-drain. $M_7$-drain can be connected to $M_1$-source and $M_5$-source. $M_7$-gate can be connected to a restore input control signal, $R_{str}$. $M_7$-source can be connected to GND via the first branch. $M_8$-drain can be connected to $M_4$-source and $M_6$-source. $M_8$-gate can be connected to $M_7$-gate. $M_8$-source can be connected to GND via the second branch.

In at least one embodiment the NVM device the circuit topology can be configured as a latch configured to have a differential-driving input pair D/DN. The latch can include a first transistor, $M_1$, $M_1$ having an $M_1$-source, an $M_1$-gate, and an $M_1$-drain. The latch can include a second transistor, $M_2$, $M_2$ having an $M_2$-source, an $M_2$-gate, and an $M_2$-drain. The latch can include a third transistor, $M_3$, $M_3$ having an $M_3$-source, an $M_3$-gate, and an $M_3$-drain. The latch can include a fourth transistor, $M_4$, $M_4$ having an $M_4$-source, an $M_4$-gate, and an $M_4$-drain. The latch can include a fifth transistor, $M_5$, $M_5$ having an $M_5$-source, an $M_5$-gate, and an $M_5$-drain. The latch can include a sixth transistor, $M_6$, $M_6$ having an $M_6$-source, an $M_6$-gate, and an $M_6$-drain. The latch can include a seventh transistor, $M_7$, $M_7$ having an $M_7$-source, an $M_7$-gate, and an $M_7$-drain. The latch can include an eighth transistor, $M_8$, $M_8$ having an $M_8$-source, an $M_8$-gate, and an $M_8$-drain. Each of $M_1$, $M_2$, $M_3$, $M_4$, $M_7$, and $M_8$ can be a metal oxide semiconductor field effect transistor (MOSFET). Each of $M_5$ and $M_6$ can be a FeFET. $M_1$-drain can be connected to $M_3$-gate, $M_3$-source, $M_4$-source, $M_4$-gate, a data output Q, $M_2$-drain, $M_5$-gate, $M_7$-gate, $M_5$-drain, a data output QN, $M_6$-drain, $M_6$-gate, and $M_8$-gate. $M_1$-gate can be connected to a clock driver CLK. $M_1$-source can be connected to a data input D. $M_2$-drain can be connected to $M_3$-gate, $M_3$-source, $M_4$-source, $M_4$-gate, data output Q, $M_1$-drain, $M_5$-gate, $M_7$-gate, $M_5$-drain, data output QN, $M_6$-drain, $M_6$-gate, and $M_8$-gate. $M_2$-gate can be connected to $M_1$-gate. $M_2$-source can be connected to a data input DN. $M_3$-drain can be connected to a voltage supply $V_{DD}$. $M_3$-gate can be connected to $M_3$-source, $M_4$-source, $M_4$-gate, data output Q, $M_1$-drain, $M_2$-drain, $M_5$-gate, $M_7$-gate, $M_5$-drain, data output QN, $M_6$-drain, $M_6$-gate, and $M_8$-gate. $M_3$-source can be connected to $M_3$-gate, $M_4$-source, $M_4$-gate, data output Q, $M_1$-drain, $M_2$-drain, $M_5$-gate, $M_7$-gate, $M_5$-drain, data output QN, $M_6$-drain, $M_6$-gate, and $M_8$-gate. $M_4$-drain can be connected to $V_{DD}$. $M_4$-gate can be connected to $M_3$-source, $M_4$-source, $M_3$-gate, data output Q, $M_1$-drain, $M_2$-drain, $M_5$-gate, $M_7$-gate, $M_5$-drain, data output QN, $M_6$-drain, $M_6$-gate, and $M_8$-gate. $M_4$-source can be connected to $M_3$-source, $M_4$-gate, $M_3$-gate, data output Q, $M_1$-drain, $M_2$-drain, $M_5$-gate, $M_7$-gate, $M_5$-drain, data output QN, $M_6$-drain, $M_6$-gate, and $M_8$-gate. $M_5$-drain be connected to $M_4$-source, $M_3$-source, $M_4$-gate, $M_3$-gate, data output Q, $M_1$-drain, $M_2$-drain, $M_5$-gate, $M_7$-gate, $M_5$-drain, data output QN, $M_6$-drain, $M_6$-gate, and $M_8$-gate. $M_5$-gate can be connected to $M_4$-source, $M_3$-source, $M_4$-gate, $M_3$-gate, data output Q, $M_1$-drain, $M_2$-drain, $M_5$-drain, $M_7$-gate, $M_5$-drain, data output QN, $M_6$-drain, $M_6$-gate, and $M_8$-gate. $M_5$-source can be connected to $M_7$-drain. $M_6$-drain can be connected to $M_4$-source, $M_3$-source, $M_4$-gate, $M_3$-gate, data output Q, $M_1$-drain, $M_2$-drain, $M_5$-gate, $M_7$-gate, $M_5$-drain, data output QN, $M_5$-drain, $M_6$-gate, and $M_8$-gate. $M_6$-gate can be connected to $M_4$-source, $M_3$-source, $M_4$-gate, $M_3$-gate, data output Q, $M_1$-drain, $M_2$-drain, $M_5$-gate, $M_7$-gate, $M_5$-drain, data output QN, $M_5$-drain, $M_6$-drain, and $M_8$-gate. $M_6$-source can be connected to $M_8$-drain. $M_7$-drain can be connected to $M_5$-source. $M_7$-gate can be connected to $M_6$-gate, $M_4$-source, $M_3$-source, $M_4$-gate, $M_3$-gate, data output Q, $M_1$-drain, $M_2$-drain, $M_5$-gate, $M_5$-drain, data output QN, $M_5$-drain, $M_6$-drain, and $M_8$-gate. $M_7$-source can be connected to ground, GND. $M_8$-drain can be connected to $M_6$-source. $M_8$-gate can be connected to $M_7$-gate, $M_6$-gate, $M_4$-source, $M_3$-source, $M_4$-gate, $M_3$-gate, data output Q, $M_1$-drain, $M_2$-drain, $M_5$-gate, $M_5$-drain, data output QN, $M_5$-drain, and $M_6$-drain. $M_8$-source can be connected to GND.

In at least one embodiment, the NVM device circuit topology can be configured as a latch configured to have an input D. The latch can include a first transistor, $M_1$, $M_1$ having an $M_1$-source, an $M_1$-gate, and an $M_1$-drain. The latch can include a second transistor, $M_2$, $M_2$ having an $M_2$-source, an $M_2$-gate, and an $M_2$-drain. The latch can include a third transistor, $M_3$, $M_3$ having an $M_3$-source, an $M_3$-gate, and an $M_3$-drain. The latch can include a fourth transistor, $M_4$, $M_4$ having an $M_4$-source, an $M_4$-gate, and an $M_4$-drain. The latch can include a fifth transistor, $M_5$, $M_5$ having an $M_5$-source, an $M_5$-gate, and an $M_5$-drain. The latch can include a sixth transistor, $M_6$, $M_6$ having an $M_6$-source, an $M_6$-gate, and an $M_6$-drain. The latch can include a seventh transistor, $M_7$, $M_7$ having an $M_7$-source, an $M_7$-gate, and an $M_7$-drain. The latch can include an eighth transistor, $M_8$, $M_8$ having an $M_8$-source, an $M_8$-gate, and an $M_8$-drain. The latch can include a ninth transistor, $M_9$, $M_9$ having an $M_9$-source, an $M_9$-gate, and an $M_9$-drain. The latch can include a tenth transistor, $M_{10}$, $M_{10}$ having an $M_{10}$-source, an $M_{10}$-gate, and an $M_{10}$-drain. The latch can include an eleventh transistor, $M_{11}$, $M_{11}$ having an $M_{11}$-source, an $M_{11}$-gate, and an $M_{11}$-drain. The latch can include a twelfth transistor, $M_{12}$, $M_{12}$ having an $M_{12}$-source, an $M_{12}$-gate, and an $M_{12}$-drain. The latch can include a thirteenth transistor, $M_{5b}$, $M_{5b}$ having an $M_{5b}$-source, an $M_{5b}$-gate, and an $M_{5b}$-drain. The latch can include a fourteenth transistor, $M_{6b}$, $M_{6b}$ having an $M_{6b}$-source, an $M_{6b}$-gate, and an $M_{6b}$-drain. Each of $M_1$, $M_2$, $M_3$, $M_4$, $M_7$, $M_8$, $M_9$, $M_{10}$, and $M_{11}$ can be a metal oxide semiconductor field effect transistor (MOSFET). Each of $M_5$ and $M_6$ can be a FeFET. $M_1$-drain can be connected to $M_2$-drain and a data input D. $M_1$-gate can be connected to a clock driver, CLK. $M_1$-source can be connected to $M_2$-source, $M_3$-gate, $M_5$-gate, $M_7$-gate, $M_{11}$-source, $M_{12}$-source, $M_3$-source, $M_9$-source, $M_{10}$-source, $M_5$-drain, and $M_{5b}$-drain. $M_2$-drain can be connected to $M_1$-drain and data input D. $M_2$-gate can be connected to CLK. $M_2$-source can be connected to $M_1$-source, $M_3$-gate, $M_5$-gate, $M_7$-gate, $M_{11}$-source, $M_{12}$-source, $M_3$-source, $M_9$-source, $M_{10}$-source, $M_5$-drain, and $M_{5b}$-drain. $M_3$-drain can be connected to a $V_{DD}$. $M_3$-gate can be connected to $M_1$-source, $M_2$-source, $M_5$-gate, $M_7$-gate, $M_{11}$-source, $M_{12}$-source, $M_3$-source, $M_9$-source, $M_{10}$-source, $M_5$-drain, and $M_{5b}$-drain. $M_3$-source can be connected to $M_1$-source, $M_2$-source, $M_5$-gate, $M_7$-gate, $M_{11}$-source, $M_{12}$-source, $M_3$-gate, $M_9$-source, $M_{10}$-source, $M_5$-drain, and $M_{5b}$-drain. $M_4$-drain can be connected to a voltage supply, $V_{DD}$. $M_4$-gate can be connected to a data output QN, a data output Q, $M_6$-gate, $M_8$-gate, $M_4$-source, $M_9$-drain, $M_{10}$-drain, $M_{11}$-drain, $M_{12}$-drain, $M_{6b}$-drain, and $M_6$-drain. $M_4$-source can be connected to data output QN, data output Q, $M_6$-gate, $M_8$-gate, $M_4$-gate, $M_9$-drain, $M_{10}$-drain, $M_{11}$-drain, $M_{12}$-drain, $M_{6b}$-drain, and $M_6$-drain. $M_5$-drain can be connected to $M_1$-source, $M_2$-source, $M_5$-gate, $M_7$-gate, $M_{11}$-source, $M_{12}$-source, $M_3$-source, $M_9$-source, $M_{10}$-source, and $M_{5b}$-drain. $M_5$-gate can be connected to $M_1$-source, $M_2$-source, $M_5$-drain, $M_7$-gate, $M_{11}$-source, $M_{12}$-source, $M_3$-source, $M_9$-source, $M_{10}$-source, $M_{5b}$-gate, and $M_{5b}$-drain. $M_5$-source can be connected to $M_7$-drain. $M_{5b}$-drain can be connected to $M_1$-source, $M_2$-source, $M_5$-gate, $M_7$-gate, $M_{11}$-source, $M_{12}$-source, $M_3$-source, $M_9$-source, $M_{10}$-source, and $M_5$-drain. $M_{5b}$-gate can be connected to $M_5$-gate. $M_{5b}$-source can be connected to ground, GND. $M_6$-drain can be connected to data output QN, data output Q, $M_6$-gate, $M_8$-gate, $M_4$-source, $M_9$-drain, $M_{10}$-drain, $M_{11}$-drain, $M_{12}$-drain, $M_{6b}$-drain, and $M_4$-gate. $M_6$-gate can be connected to data output QN, data output Q, $M_6$-drain, $M_{6b}$-gate, $M_8$-gate, $M_4$-source, $M_9$-drain, $M_{10}$-drain, $M_{11}$-drain, $M_{12}$-drain, $M_{6b}$-drain, and $M_4$-gate. $M_6$-source can be connected to $M_8$-drain. $M_{6b}$-drain can be connected to data output QN, data output Q, $M_6$-gate, $M_8$-gate, $M_4$-source, $M_9$-drain, $M_{10}$-drain, $M_{11}$-drain, $M_{12}$-drain, $M_4$-gate, and $M_6$-drain. $M_{6b}$-gate can be connected to $M_6$-gate. $M_{6b}$-source can be connected to GND. $M_7$-drain can be connected to $M_5$-source. $M_7$-gate can be connected to $M_1$-source, $M_2$-source, $M_5$-gate, $M_5$-drain, $M_{11}$-source, $M_{12}$-source, $M_3$-source, $M_9$-source, $M_{10}$-source, and $M_{5b}$-drain. $M_7$-source can be connected to GND. $M_8$-drain can be connected to $M_6$-source. $M_8$-gate can be connected to data output QN, data output Q, $M_6$-gate, $M_4$-gate, $M_4$-source, $M_9$-drain, $M_{10}$-drain, $M_{11}$-drain, $M_{12}$-drain, $M_{6b}$-drain, and $M_6$-drain. $M_8$-source can be connected to GND. $M_9$-drain can be connected to data output QN, data output Q, $M_6$-gate, $M_8$-gate, $M_4$-source, $M_4$-gate, $M_{10}$-drain, $M_{11}$-drain, $M_{12}$-drain, $M_{6b}$-drain, and $M_6$-drain. $M_9$-gate can be connected to $V_{DD}$. $M_9$-source can be connected to $M_1$-source, $M_2$-source, $M_5$-gate, $M_7$-gate, $M_{11}$-source, $M_{12}$-source, $M_3$-source, $M_5$-drain, $M_{10}$-source, and $M_{5b}$-drain. $M_{10}$-drain can be connected to data output QN, data output Q, $M_6$-gate, $M_8$-gate, $M_4$-source, $M_9$-drain, $M_4$-gate, $M_{11}$-drain, $M_{12}$-drain, $M_{6b}$-drain, and $M_6$-drain. $M_{10}$-gate can be connected to GND. $M_{10}$-source can be connected to $M_1$-source, $M_2$-source, $M_5$-gate, $M_7$-gate, $M_{11}$-source, $M_{12}$-source, $M_3$-source, $M_9$-source, $M_5$-drain, and $M_{5b}$-drain. $M_{11}$-drain can be connected to data output QN, data output Q, $M_6$-gate, $M_8$-gate, $M_4$-source, $M_9$-drain, $M_{10}$-drain, $M_4$-gate, $M_{12}$-drain, $M_{6b}$-drain, and $M_6$-drain. $M_{11}$-gate can be connected to CLK. $M_{11}$-source can be connected to $M_1$-source, $M_2$-source, $M_5$-gate, $M_7$-gate, $M_5$-drain, $M_{12}$-source, $M_3$-source, $M_9$-source, $M_{10}$-source, and $M_{5b}$-drain. $M_{12}$-drain can be connected to data output QN, data output Q, $M_6$-gate, $M_8$-gate, $M_4$-source, $M_9$-drain, $M_{10}$-drain, $M_{11}$-drain, $M_4$-gate, $M_{6b}$-drain, and $M_6$-drain. $M_{12}$-gate can be connected to CLK. $M_{12}$-source can be connected to $M_1$-source, $M_2$-source, $M_5$-gate, $M_7$-gate, $M_{11}$-source, $M_5$-drain, $M_3$-source, $M_9$-source, $M_{10}$-source, and $M_{5b}$-drain.

In at least one embodiment the NVM device circuit topology can be configured as a latch configured to have a differential-driving input pair D/DN. The latch can include a first transistor, $M_1$, $M_1$ having an $M_1$-source, an $M_1$-gate, and an $M_1$-drain. The latch can include a second transistor, $M_2$, $M_2$ having an $M_2$-source, an $M_2$-gate, and an $M_2$-drain. The latch can include a third transistor, $M_3$, $M_3$ having an $M_3$-source, an $M_3$-gate, and an $M_3$-drain. The latch can include a fourth transistor, $M_4$, $M_4$ having an $M_4$-source, an $M_4$-gate, and an $M_4$-drain. The latch can include a fifth transistor, $M_5$, $M_5$ having an $M_5$-source, an $M_5$-gate, and an $M_5$-drain. The latch can include a sixth transistor, $M_6$, $M_6$ having an $M_6$-source, an $M_6$-gate, and an $M_6$-drain. The latch can include a seventh transistor, $M_7$. $M_7$ having an $M_7$-source, an $M_7$-gate, and an $M_7$-drain. The latch can include an eighth transistor, $M_8$, $M_8$ having an $M_8$-source, an $M_8$-gate, and an $M_8$-drain. Each of $M_1$, $M_2$, $M_3$, $M_4$, $M_7$, and $M_8$ can be a metal oxide semiconductor field effect transistor (MOSFET). Each of $M_5$ and $M_6$ can be a FeFET. $M_1$-drain can be connected to a data input D. $M_1$-gate can be connected to a clock driver, CLK. $M_1$-source can be connected to $M_5$-gate, $M_3$-gate, $M_5$-source, $M_2$-source, $M_7$-gate, $M_7$-drain, a data output Q, a data output QN, $M_6$-source, $M_8$-drain, $M_8$-gate, $M_6$-gate, and $M_4$-gate. $M_2$-drain can be connected to data input DN. $M_2$-gate can be connected to $M_1$-gate. $M_2$-source can be connected to $M_5$-gate, $M_3$-gate, $M_5$-source, $M_1$-source, $M_7$-gate, $M_7$-drain, a data output Q, a data output QN, $M_6$-source, $M_8$-drain, $M_8$-gate, $M_6$-gate, and $M_4$-gate. $M_3$-drain can be connected to a $V_{DD}$. $M_3$-gate can be connected to $M_5$-gate, $M_1$-source, $M_5$-source, $M_2$-source, $M_7$-gate, $M_7$-drain, data output Q, data output QN, $M_6$-source, $M_8$-drain, $M_8$-gate, $M_6$-gate, and $M_4$-gate. $M_3$-source can be connected to $M_5$-drain. $M_4$-drain can be connected to $V_{DD}$. $M_4$-gate can be connected to $M_5$-gate, $M_3$-gate, $M_5$-source, $M_2$-source, $M_7$-gate, $M_7$-drain, data output Q, data output QN, $M_6$-source, $M_8$-drain, $M_8$-gate, $M_6$-gate, and $M_1$-source. $M_4$-source can be connected to $M_6$-drain. $M_5$-drain can be connected to $M_3$-source. M5-gate can be connected to $M_1$-source, $M_3$-gate, $M_5$-source, $M_2$-source, $M_7$-gate, $M_7$-drain, data output Q, data output QN, $M_6$-source, $M_8$-drain, $M_8$-gate, $M_6$-gate, and $M_4$-gate. $M_5$-source can be connected to $M_5$-gate, $M_3$-gate, $M_1$-source, $M_2$-source, $M_7$-gate, $M_7$-drain, data output Q, data output QN, $M_6$-source, $M_8$-drain, $M_8$-gate, $M_6$-gate, and $M_4$-gate. $M_6$-drain can be connected to $M_4$-source. $M_6$-gate can be connected to $M_5$-gate, $M_3$-gate, $M_5$-source, $M_2$-source, $M_7$-gate, $M_7$-drain, data output Q, data output QN, $M_6$-source, $M_8$-drain, $M_8$-gate, $M_1$-source, and $M_4$-gate. $M_6$-source can be connected to $M_5$-gate, $M_3$-gate, $M_5$-source, $M_2$-source, $M_7$-gate, $M_7$-drain, data output Q, data output QN, $M_1$-source, $M_8$-drain, $M_8$-gate, $M_6$-gate, and $M_4$-gate. $M_7$-drain can be connected to $M_5$-gate, $M_3$-gate, $M_5$-source, $M_2$-source, $M_7$-gate, $M_1$-source, data output Q, data output QN, $M_6$-source, $M_8$-drain, $M_8$-gate, $M_6$-gate, and $M_4$-gate. $M_7$-gate can be connected to $M_5$-gate, $M_3$-gate, $M_5$-source, $M_2$-source, $M_1$-source, $M_7$-drain, data output Q, data output QN, $M_6$-source, $M_8$-drain, $M_8$-gate, $M_6$-gate, and $M_4$-gate. $M_7$-source can be connected to ground, GND. $M_8$-drain can be connected to $M_5$-gate, $M_3$-gate, $M_5$-source, $M_2$-source, $M_7$-gate, $M_7$-drain, data output Q, data output QN, $M_6$-source, $M_1$-source, $M_8$-gate, $M_6$-gate, and $M_4$-gate. $M_8$-gate can be connected to $M_5$-gate, $M_3$-gate, $M_5$-source, $M_2$-source, $M_7$-gate, $M_7$-drain, data output Q, data output QN, $M_6$-source, $M_8$-drain, $M_1$-source, $M_6$-gate, and $M_4$-gate. $M_8$-source can be connected to GND.

In at least one embodiment the NVM device circuit topology can be configured as a latch configured to have a differential-driving input pair D/DN. The latch can include a first transistor, $M_1$, $M_1$ having an $M_1$-source, an $M_1$-gate, and an $M_1$-drain. The latch can include a second transistor, $M_2$, $M_2$ having an $M_2$-source, an $M_2$-gate, and an $M_2$-drain. The latch can include a third transistor, $M_3$, $M_3$ having an $M_3$-source, an $M_3$-gate, and an $M_3$-drain. The latch can include a fourth transistor, $M_4$, $M_4$ having an $M_4$-source, an $M_4$-gate, and an $M_4$-drain. The latch can include a fifth transistor, $M_5$, $M_5$ having an $M_5$-source, an $M_5$-gate, and an $M_5$-drain. The latch can include a sixth transistor, $M_6$, $M_6$ having an $M_6$-source, an $M_6$-gate, and an $M_6$-drain. The latch can include a seventh transistor, $M_7$. $M_7$ having an $M_7$-source, an $M_7$-gate, and an $M_7$-drain. The latch can include an eighth transistor, $M_8$, $M_8$ having an $M_8$-source, an $M_8$-gate, and an $M_8$-drain. The latch can include a ninth transistor, $M_9$, $M_9$ having an $M_9$-source, an $M_9$-gate, and an $M_9$-drain. The latch can include a tenth transistor, $M_{10}$, $M_{10}$ having an $M_{10}$-source, an $M_{10}$-gate, and an $M_{10}$-drain. Each of $M_1$, $M_2$, $M_3$, $M_4$, $M_9$, and $M_{10}$ can be a metal oxide semiconductor field effect transistor (MOSFET). Each of $M_5$, $M_6$, $M_7$, and $M_8$ can be a FeFET. $M_1$-drain can be connected to a data input D. $M_1$-gate can be connected to a clock driver, CLK. $M_1$-source can be connected to $M_5$-gate, $M_3$-gate, $M_2$-source, $M_7$-gate, $M_9$-gate, $M_5$-source, $M_6$-source, a data output Q, $M_6$-gate, $M_4$-gate, $M_7$-drain, $M_8$-drain, a data output QN, $M_8$-gate, and $M_{10}$-gate. $M_2$-drain can be connected to a data input DN. $M_2$-gate can be connected to $M_1$-gate. $M_2$-source can be connected to $M_5$-gate, $M_3$-gate, $M_1$-source, $M_7$-gate, $M_9$-gate, $M_5$-source, $M_6$-source, data output Q, $M_6$-gate, $M_4$-gate, $M_7$-drain, $M_8$-drain, data output QN, $M_8$-gate, and $M_{10}$-gate. $M_3$-drain can be connected to a voltage supply, $V_{DD}$. $M_3$-gate can be connected to $M_5$-gate, $M_1$-source, $M_2$-source, $M_7$-gate, $M_9$-gate, $M_5$-source, $M_6$-source, data output Q, $M_6$-gate, $M_4$-gate, $M_7$-drain, $M_8$-drain, data output QN, $M_8$-gate, and $M_{10}$-gate. $M_3$-source can be connected to $M_5$-drain. $M_4$-drain can be connected to $V_{DD}$. $M_4$-gate can be connected to $M_5$-gate, $M_3$-gate, $M_2$-source, $M_7$-gate, $M_9$-gate, $M_5$-source, $M_6$-source, data output Q, $M_6$-gate, $M_1$-source, $M_7$-drain, $M_8$-drain, data output QN, $M_8$-gate, and $M_{10}$-gate. $M_4$-source can be connected to $M_6$-drain. $M_5$-drain can be connected to $M_3$-source. $M_5$-gate c can be connected to $M_1$-source, $M_3$-gate, $M_2$-source, $M_7$-gate, $M_9$-gate, $M_5$-source, $M_6$-source, data output Q, $M_6$-gate, $M_4$-gate, $M_7$-drain, $M_8$-drain, data output QN, $M_8$-gate, and $M_{10}$-gate. $M_5$-source can be connected to $M_5$-gate, $M_3$-gate, $M_2$-source, $M_7$-gate, $M_9$-gate, $M_1$-source, $M_6$-source, data output Q, $M_6$-gate, $M_4$-gate, $M_7$-drain, $M_8$-drain, data output QN, $M_8$-gate, and $M_{10}$-gate. $M_6$-drain can be connected to $M_4$-source. $M_6$-gate can be connected to $M_5$-gate, $M_3$-gate, $M_2$-source, $M_7$-gate, $M_9$-gate, $M_5$-source, $M_6$-source, data output Q, $M_1$-source, $M_4$-gate, $M_7$-drain, $M_8$-drain, data output QN, $M_8$-gate, and $M_{10}$-gate. $M_6$-source can be connected to $M_5$-gate, $M_3$-gate, $M_2$-source, $M_7$-gate, $M_9$-gate, $M_5$-source, $M_1$-source, data output Q, $M_6$-gate, $M_4$-gate, $M_7$-drain, $M_8$-drain, data output QN, $M_8$-gate, and $M_{10}$-gate. $M_7$-drain can be connected to $M_5$-gate, $M_3$-gate, $M_2$-source, $M_7$-gate, $M_9$-gate, $M_5$-source, $M_6$-source, data output Q, $M_6$-gate, $M_4$-gate, $M_1$-source, $M_8$-drain, data output QN, $M_8$-gate, and $M_{10}$- gate. $M_7$-gate can be connected to $M_5$-gate, $M_3$-gate, $M_2$-source, $M_1$-source, $M_9$-gate, $M_5$-source, $M_6$-source, data output Q, $M_6$-gate, $M_4$-gate, $M_7$-drain, $M_8$-drain, data output QN, $M_8$-gate, and $M_{10}$-gate. $M_7$-source can be connected to $M_9$-drain. $M_{10}$-drain can be connected to $M_8$-source. $M_{10}$-gate can be connected to $M_5$-gate, $M_3$-gate, $M_2$-source, $M_7$-gate, $M_9$-gate, $M_5$-source, $M_6$-source, data output Q, $M_6$-gate, $M_4$-gate, $M_7$-drain, $M_8$-drain, data output QN, $M_8$-gate, and $M_1$-source. $M_{10}$-source can be connected to ground, GND.

In at least one embodiment the NVM device circuit topology can be configured as a D-Flip Flop (DFF). The DFF can include a master latch, a slave latch, and a backup and restore circuit (B&R circuit). The slave latch can include a first transistor, $M_1$, $M_1$ having an $M_1$-source, an $M_1$-gate, and an $M_1$-drain. The slave latch can include a second transistor, $M_2$, $M_2$ having an $M_2$-source, an $M_2$-gate, and an $M_2$-drain. The slave latch can include a third transistor, $M_3$, $M_3$ having an $M_3$-source, an $M_3$-gate, and an $M_3$-drain. The slave latch can include a fourth transistor, $M_4$, $M_4$ having an $M_4$-source, an $M_4$-gate, and an $M_4$-drain. The slave latch can include a fifth transistor, $M_5$, $M_5$ having an $M_5$-source, an $M_5$-gate, and an $M_5$-drain. The slave latch can include a sixth transistor, $M_6$, $M_6$ having an $M_6$-source, an $M_6$-gate, and an $M_6$-drain. The slave latch can include a seventh transistor, $M_7$, $M_7$ having an $M_7$-source, an $M_7$-gate, and an $M_7$-drain. The slave latch can include an eighth transistor, $M_8$, $M_8$ having an $M_8$-source, an $M_8$-gate, and an $M_8$-drain. Each of $M_1$, $M_2$, $M_3$, $M_4$, $M_7$, and $M_8$ can be a metal oxide semiconductor field effect transistor (MOSFET). Each of $M_5$ and $M_6$ can be a FeFET. $M_1$-drain can be connected to $M_3$-gate, $M_3$-source, $M_4$-source, $M_4$-gate, a data output Q, $M_2$-drain, $M_5$-gate, $M_7$-gate, $M_5$-drain, a data output QN, $M_6$-drain, $M_6$-gate, and $M_8$-gate. $M_1$-gate can be connected to a clock driver CLK. $M_1$-source can be connected to a data input D. $M_2$-drain can be connected to $M_3$-gate, $M_3$-source, $M_4$-source, $M_4$-gate, data output Q, $M_5$-gate, $M_7$-gate, $M_5$-drain, data output QN, $M_6$-drain, $M_6$-gate, and $M_8$-gate. $M_2$-gate can be connected to $M_1$-gate. $M_2$-source can be connected to a data input DN. $M_3$-drain can be connected to a voltage supply $V_{DD}$. $M_3$-gate can be connected to $M_3$-source, $M_4$-source, $M_4$-gate, data output Q, $M_2$-drain, $M_5$-gate, $M_7$-gate, $M_5$-drain, data output QN, $M_6$-drain, $M_6$-gate, and $M_8$-gate. $M_3$-source can be connected to $M_3$-gate, $M_4$-source, $M_4$-gate, data output Q, $M_2$-drain, $M_5$-gate, $M_7$-gate, $M_5$-drain, data output QN, $M_6$-drain, $M_6$-gate, and $M_8$-gate. $M_4$-drain can be connected to $V_{DD}$. $M_4$-gate can be connected to $M_3$-source, $M_4$-source, $M_3$-gate, data output Q, $M_2$-drain, $M_5$-gate, $M_7$-gate, $M_5$-drain, data output QN, $M_6$-drain, $M_6$-gate, and $M_8$-gate. $M_4$-source can be connected to $M_3$-source, $M_4$-gate, $M_3$-gate, data output Q, $M_2$-drain, $M_5$-gate, $M_7$-gate, $M_5$-drain, data output QN, $M_6$-drain, $M_6$-gate, and $M_8$-gate. $M_5$-drain be connected to $M_4$-source, $M_3$-source, $M_4$-gate, $M_3$-gate, data output Q, $M_2$-drain, $M_5$-gate, $M_7$-gate, $M_5$-drain, data output QN, $M_6$-drain, $M_6$-gate, and $M_8$-gate. $M_5$-gate can be connected to $M_4$-source, $M_3$-source, $M_4$-gate, $M_3$-gate, data output Q, $M_2$-drain, $M_5$-drain, $M_7$-gate, $M_5$-drain, data output QN, $M_6$-drain, $M_6$-gate, and $M_8$-gate. $M_5$-source can be connected to $M_7$-drain. $M_6$-drain can be connected to $M_4$-source, $M_3$-source, $M_4$-gate, $M_3$-gate, data output Q, $M_1$-drain, $M_2$-drain, $M_5$-gate, $M_7$-gate, $M_5$-drain, data output QN, $M_5$-drain, $M_6$-gate, and $M_8$-gate. $M_6$-gate can be connected to $M_4$-source, $M_3$-source, $M_4$-gate, $M_3$-gate, data output Q, $M_1$-drain, $M_2$-drain, $M_5$-gate, $M_7$-gate, $M_5$-drain, data output QN, $M_5$-drain, $M_6$-drain, and $M_8$-gate. $M_6$-source can be connected to $M_8$-drain. $M_7$-drain can be connected to $M_5$-source. $M_7$-gate can be connected to $M_6$-gate, $M_4$-source, $M_3$-source, $M_4$-gate, $M_3$-gate, data output Q, $M_1$-drain, $M_2$-drain, $M_5$-gate, $M_5$-drain, data output QN, $M_5$-drain, $M_6$-drain, and $M_8$-gate. $M_7$-source can be connected to ground, GND. $M_8$-drain can be connected to $M_6$-source. $M_8$-gate can be connected to $M_7$-gate, $M_6$-gate, $M_4$-source, $M_3$-source, $M_4$-gate, $M_3$-gate, data output Q, $M_1$-drain, $M_2$-drain, $M_5$-gate, $M_5$-drain, data output QN, $M_5$-drain, and $M_6$-drain. $M_8$-source can be connected to GND.

In at least one embodiment $M_1$ can be replaced with a first slave transmission gate, $S_{GATE1}$ and $M_2$ can be replaced with a second slave transmission gate, $S_{GATE2}$. Output of $S_{GATE1}$ can be connected to $M_3$-gate, $M_3$-source, $M_4$-source, $M_4$-gate, data output Q, $S_{GATE2}$ output, $M_5$-gate, $M_7$-gate, $M_5$-drain, data output QN, $M_6$-drain, $M_6$-gate, and $M_8$-gate. Output of $S_{GATE2}$ can be connected to $M_3$-gate, $M_3$-source, $M_4$-source, $M_4$-gate, data output Q, $S_{GATE1}$ output, $M_5$-gate, $M_7$-gate, $M_5$-drain, data output QN, $M_6$-drain, $M_6$-gate, and $M_8$-gate. The master latch can be connected to the slave latch via $S_{GATE1}$ and $S_{GATE2}$.

The master latch can have a first master transmission gate $M_{GATE1}$, a first master inverter, $M_{INV1}$, a second master inverter, $M_{INV2}$, and a second master transmission gate, $M_{GATE2}$. Input of $M_{GATE1}$ can be connected to a data input signal, D. Output of $M_{GATE1}$ can be connected to input of $M_{INV1}$ and input of $S_{GATE1}$. Input of $M_{INV1}$ can be connected to output of $M_{GATE1}$. Output of $M_{INV1}$ can be connected to input of $M_{INV2}$ and input of $S_{GATE2}$. Input of $M_{INV2}$ can be connected to output of $M_{INV1}$. Output of $M_{INV2}$ can be connected to input of $M_{GATE2}$. Input of $M_{GATE2}$ can be connected to output of $M_{INV2}$. Output of $M_{GATE2}$ can be connected to input of $M_{GATE1}$ and output of $M_{INV1}$.

$M_1$ can be replaced with a first slave inverter, $S_{INV1}$ and $M_2$ can be replaced with a second slave inverter, $S_{INV2}$. Output of $S_{INV1}$ can be connected to $M_3$-gate, $M_3$-source, $M_4$-source, $M_4$-gate, data output Q, $S_{INV2}$ output, $M_5$-gate, $M_7$-gate, $M_5$-drain, data output QN, $M_6$-drain, $M_6$-gate, and $M_8$-gate. Output of $S_{INV2}$ can be connected to $M_3$-gate, $M_3$-source, $M_4$-source, $M_4$-gate, data output Q, $S_{INV1}$ output, $M_5$-gate, $M_7$-gate, $M_5$-drain, data output QN, $M_6$-drain, $M_6$-gate, and $M_8$-gate.

The master latch can be connected to the slave latch via $S_{INV1}$ and $S_{INV2}$. The master latch can have a first master transmission gate $M_{GATE1}$, a first master inverter, $M_{INV1}$, a second master inverter, $M_{INV2}$, and a second master transmission gate, $M_{GATE2}$. Input of $M_{GATE1}$ can be connected to a data input signal, D. Output of $M_{GATE1}$ can be connected to input of $M_{INV1}$ and input of $S_{INV1}$. Input of $M_{INV1}$ can be connected to output of $M_{GATE1}$. Output of $M_{INV1}$ can be connected to input of $M_{INV2}$ and input of $S_{INV2}$. Input of $M_{INV2}$ can be connected to output of $M_{INV1}$. Output of $M_{INV2}$ can be connected to input of $M_{GATE2}$. Input of $M_{GATE2}$ can be connected to output of $M_{INV2}$. Output of $M_{GATE2}$ can be connected to input of $M_{GATE1}$ and output of $M_{INV1}$.

In at least one embodiment the NVM device circuit topology can be configured as a D-Flip Flop (DFF). The DFF can include a master latch, a slave latch, and a backup and restore circuit (B&R circuit). The slave latch can include a first transistor, $M_1$, $M_1$ having an $M_1$-source, an $M_1$-gate, and an $M_1$-drain. The slave latch can include a second transistor, $M_2$, $M_2$ having an $M_2$-source, an $M_2$-gate, and an $M_2$-drain. The slave latch can include a third transistor, $M_3$, $M_3$ having an $M_3$-source, an $M_3$-gate, and an $M_3$-drain. The slave latch can include a fourth transistor, $M_4$, $M_4$ having an $M_4$-source, an $M_4$-gate, and an $M_4$-drain. The slave latch can include a fifth transistor, $M_5$, $M_5$ having an $M_5$-source, an $M_5$-gate, and an $M_5$-drain. The slave latch can include a sixth transistor, $M_6$, $M_6$ having an $M_6$-source, an $M_6$-gate, and an $M_6$-drain. The slave latch can include a seventh transistor, $M_7$, $M_7$ having an $M_7$-source, an $M_7$-gate, and an $M_7$-drain. The slave latch can include an eighth transistor, $M_8$, $M_8$ having an $M_8$-source, an $M_8$-gate, and an $M_8$-drain. The slave latch can include a ninth transistor, $M_9$, $M_9$ having an $M_9$-source, an $M_9$-gate, and an $M_9$-drain. The slave latch can include a tenth transistor, $M_{10}$, $M_{10}$ having an $M_{10}$-source, an $M_{10}$-gate, and an $M_{10}$-drain. The slave latch can include an eleventh transistor, $M_{11}$, $M_{11}$ having an $M_{11}$-source, an $M_{11}$-gate, and an $M_{11}$-drain. The slave latch can include a twelfth transistor, $M_{12}$, $M_{12}$ having an $M_{12}$-source, an $M_{12}$-gate, and an $M_{12}$-drain. The slave latch can include a thirteenth transistor, $M_{5b}$, $M_{5b}$ having an $M_{5b}$-source, an $M_{5b}$-gate, and an $M_{5b}$-drain. The slave latch can include a fourteenth transistor, $M_{6b}$, $M_{6b}$ having an $M_{6b}$-source, an $M_{6b}$-gate, and an $M_{6b}$-drain. Each of $M_1$, $M_2$, $M_3$, $M_4$, $M_7$, $M_8$, $M_9$, $M_{10}$, and $M_{11}$ can be a metal oxide semiconductor field effect transistor (MOSFET). Each of $M_5$ and $M_6$ can be a FeFET. $M_1$-drain can be connected to $M_2$-drain and a data input D. $M_1$-gate can be connected to a clock driver, CLK. $M_1$-source can be connected to $M_2$-source, $M_3$-gate, $M_5$-gate, $M_7$-gate, $M_{11}$-source, $M_{12}$-source, $M_3$-source, $M_9$-source, $M_{10}$-source, $M_5$-drain, and $M_{5b}$-drain. $M_2$-drain can be connected to $M_1$-drain and data input D. $M_2$-gate can be connected to CLK. $M_2$-source can be connected to $M_1$-source, $M_3$-gate, $M_5$-gate, $M_7$-gate, $M_{11}$-source, $M_{12}$-source, $M_3$-source, $M_9$-source, $M_{10}$-source, $M_5$-drain, and $M_{5b}$-drain. $M_3$-drain can be connected to a $V_{DD}$. $M_3$-gate can be connected to $M_1$-source, $M_2$-source, $M_5$-gate, $M_7$-gate, $M_{11}$-source, $M_{12}$-source, $M_3$-source, $M_9$-source, $M_{10}$-source, $M_5$-drain, and $M_{5b}$-drain. $M_3$-source can be connected to $M_1$-source, $M_2$-source, $M_5$-gate, $M_7$-gate, $M_{11}$-source, $M_{12}$-source, $M_3$-gate, $M_9$-source, $M_{10}$-source, $M_5$-drain, and $M_{5b}$-drain. $M_4$-drain can be connected to a voltage supply, $V_{DD}$. $M_4$-gate can be connected to a data output QN, a data output Q, $M_6$-gate, $M_8$-gate, $M_4$-source, $M_9$-drain, $M_{10}$-drain, $M_{11}$-drain, $M_{12}$-drain, $M_{6b}$-drain, and $M_6$-drain. $M_4$-source can be connected to data output QN, data output Q, $M_6$-gate, $M_8$-gate, $M_4$-gate, $M_9$-drain, $M_{10}$-drain, $M_{11}$-drain, $M_{12}$-drain, $M_{6b}$-drain, and $M_6$-drain. $M_5$-drain can be connected to $M_1$-source, $M_2$-source, $M_5$-gate, $M_7$-gate, $M_{11}$-source, $M_{12}$-source, $M_3$-source, $M_9$-source, $M_{10}$-source, and $M_{5b}$-drain. $M_5$-gate can be connected to $M_1$-source, $M_2$-source, $M_5$-drain, $M_7$-gate, $M_{11}$-source, $M_{12}$-source, $M_3$-source, $M_9$-source, $M_{10}$-source, $M_{5b}$-gate, and $M_{5b}$-drain. $M_5$-source can be connected to $M_7$-drain. $M_{5b}$-drain can be connected to $M_1$-source, $M_2$-source, $M_5$-gate, $M_7$-gate, $M_{11}$-source, $M_{12}$-source, $M_3$-source, $M_9$-source, $M_{10}$-source, and $M_5$-drain. $M_{5b}$-gate can be connected to $M_5$-gate. $M_{5b}$-source can be connected to ground, GND. $M_6$-drain can be connected to data output QN, data output Q, $M_6$-gate, $M_8$-gate, $M_4$-source, $M_9$-drain, $M_{10}$-drain, $M_{11}$-drain, $M_{12}$-drain, $M_{6b}$-drain, and $M_4$-gate. $M_6$-gate can be connected to data output QN, data output Q, $M_6$-drain, $M_{6b}$-gate, $M_8$-gate, $M_4$-source, $M_9$-drain, $M_{10}$-drain, $M_{11}$-drain, $M_{12}$-drain, $M_{6b}$-drain, and $M_4$-gate. $M_6$-source can be connected to $M_8$-drain. $M_{6b}$-drain can be connected to data output QN, data output Q, $M_6$-gate, $M_8$-gate, $M_4$-source, $M_9$-drain, $M_{10}$-drain, $M_{11}$-drain, $M_{12}$-drain, $M_4$-gate, and $M_6$-drain. $M_{6b}$-gate can be connected to $M_6$-gate. $M_{6b}$-source can be connected to GND. $M_7$-drain can be connected to $M_5$-source. $M_7$-gate can be connected to $M_1$-source, $M_2$-source, $M_5$-gate, $M_5$-drain, $M_{11}$-source, $M_{12}$-source, $M_3$-source, $M_9$-source, $M_{10}$-source, and $M_{5b}$-drain. $M_7$-source can be connected to GND. $M_8$-drain can be connected to $M_6$-source. $M_8$-gate can be connected to data output QN, data output Q, $M_6$-gate, $M_4$-gate, $M_4$-source, $M_9$-drain, $M_{10}$-drain, $M_{11}$-drain, $M_{12}$-drain, $M_{6b}$-drain, and $M_6$-drain. $M_8$-source can be connected to GND. $M_9$-drain can be connected to data output QN, data output Q, $M_6$-gate, $M_8$-gate, $M_4$-source, $M_4$-gate, $M_{10}$-drain, $M_{11}$-drain, $M_{12}$-drain, $M_{6b}$-drain, and $M_6$-drain. $M_9$-gate can be connected to $V_{DD}$. $M_9$-source can be connected to $M_1$-source, $M_2$-source, $M_5$-gate, $M_7$-gate, $M_{11}$-source, $M_{12}$-source, $M_3$-source, $M_5$-drain, $M_{10}$-source, and $M_{5b}$-drain. $M_{10}$-drain can be connected to data output QN, data output Q, $M_6$-gate, $M_8$-gate, $M_4$-source, $M_9$-drain, $M_4$-gate, $M_{11}$-drain, $M_{12}$-drain, $M_{6b}$-drain, and $M_6$-drain. $M_{10}$-gate can be connected to GND. $M_{10}$-source can be connected to $M_1$-source, $M_2$-source, $M_5$-gate, $M_7$-gate, $M_{11}$-source, $M_{12}$-source, $M_3$-source, $M_9$-source, $M_5$-drain, and $M_{5b}$-drain. $M_{11}$-drain can be connected to data output QN, data output Q, $M_6$-gate, $M_8$-gate, $M_4$-source, $M_9$-drain, $M_{10}$-drain, $M_4$-gate, $M_{12}$-drain, $M_{6b}$-drain, and $M_6$-drain. $M_{11}$-gate can be connected to CLK. $M_{11}$-source can be connected to $M_1$-source, $M_2$-source, $M_5$-gate, $M_7$-gate, $M_5$-drain, $M_{12}$-source, $M_3$-source, $M_9$-source, $M_{10}$-source, and $M_{5b}$-drain. $M_{12}$-drain can be connected to data output QN, data output Q, $M_6$-gate, $M_8$-gate, $M_4$-source, $M_9$-drain, $M_{10}$-drain, $M_{11}$-drain, $M_4$-gate, $M_{6b}$-drain, and $M_6$-drain. $M_{12}$-gate can be connected to CLK. $M_{12}$-source can be connected to $M_1$-source, $M_2$-source, $M_5$-gate, $M_7$-gate, $M_{11}$-source, $M_5$-drain, $M_3$-source, $M_9$-source, $M_{10}$-source, and $M_{5b}$-drain.

Each of $M_1$ and $M_2$ can be replaced with a slave inverter, $S_{INV}$. Output of $S_{INV}$ can be connected to $M_3$-gate, $M_5$-gate, $M_7$-gate, $M_{11}$-source, $M_{12}$-source, $M_3$-source, $M_9$-source, $M_{10}$-source, $M_5$-drain, and $M_{5b}$-drain.

The master latch can be connected to the slave latch via $S_{INV}$. The master latch can have a first master inverter $M_{INV1}$, a second master inverter, $M_{INV2}$, a third master inverter, $M_{INV3}$, and a master transmission gate, $M_{GATE}$. Input of $M_{INV1}$ can be connected to a data input signal, D. Output of $M_{INV1}$ can be connected to input of $M_{INV2}$. Input of $M_{INV2}$ can be connected to output of $M_{INV1}$. Output of $M_{INV2}$ can be connected to input of $M_{INV3}$ and input of $S_{INV}$. Input of $M_{INV3}$ can be connected to output of $M_{INV2}$. Output of $M_{INV3}$ can be connected to input of $M_{GATE}$. Input of $M_{GATE}$ can be connected to output of $M_{INV3}$. Output of $M_{GATE}$ can be connected to input of $M_{INV2}$ and output of $M_{INV1}$.

In at least one embodiment the NVM device circuit topology can be configured as a 2-transistor (2T) memory cell. The 2T-memory cell can include a first transistor $T_1$, a second transistor $T_2$, a bit line, BL, a first Wordline, WLW, and a second Wordline, WLR. $T_1$ can be a metal oxide semiconductor field effect transistor (MOSFET) and $T_2$ can be a FeFET. $T_1$ having a $T_1$-source, a $T_1$-gate, and a $T_1$-drain. $T_2$ having a $T_2$-source, a $T_2$-gate, and a $T_2$-drain. WLW can be configured to receive and/or transmit a write signal for write operations. WLR can be configured to receive and/or transmit a read signal for read operations. $T_2$-drain can be connected to BL and WLW. $T_2$-gate can be connected to WLW. $T_2$-source can be connected to $T_1$-drain. $T_1$-gate can be connected to WLR and BL. $T_1$-source can be connected to ground, GND.

The memory cell can include a plurality of 2T-memory cells arrange in a memory cell array. The memory cell array can include a first 2T-memory cell, a second 2T-memory cell, a third 2T-memory cell, a third 2T-memory cell, a fourth 2T-memory cell, a fifth 2T-memory cell, a sixth 2T-memory cell, a seventh 2T-memory cell, and an eighth 2T-memory cell, each memory cell having a $T_1$ and a $T_2$, wherein $T_1$ can be a MOSFET and $T_2$ can be a FeFET. The first 2T-memory cell can have a first $T_1$ and a first $T_2$. The second 2T-memory cell can have a second $T_1$ and a second $T_2$. The third 2T-memory cell can have a third $T_1$ and a third $T_2$. The fourth 2T-memory cell can have a fourth $T_1$ and a fourth $T_2$. The fifth 2T-memory cell can have a fifth $T_1$ and a fifth $T_2$. The sixth 2T-memory cell 124 can have a sixth $T_1$ and a sixth $T_2$. The seventh 2T-memory cell can have a seventh $T_1$ and a seventh $T_2$. The eighth 2T-memory cell 124 can have an eighth $T_1$ and a eighth $T_2$. The memory cell array can include a first BL, BL1, a second BL, BL2, a third BL, BL3, and a fourth BL, BL4. The memory cell array can include a first WLW, WLW1, a second WLW, WLW2, a first WLR, WLR1, and a second WLR, WLR2, wherein each of WLW1 and WLW2 can be configured to receive and/or transmit a write signal for write operations, and each of WLR1 and WLR2 can be configured to receive and/or transmit a read signal for read operations. The first cell $T_2$-drain can be connected to BL1 and WLW1. The first cell $T_2$-gate can be connected to WLW1. The first cell $T_2$-source can be connected to first cell $T_1$-drain. The first cell $T_1$-gate can be connected to WLR1 and BL1. The first cell $T_1$-source can be connected to ground, GND. The second cell $T_2$-drain can be connected to BL2 and WLW1. The second cell $T_2$-gate can be connected to WLW1. The second cell $T_2$-source can be connected to second cell $T_1$-drain. The second cell $T_1$-gate can be connected to WLR1 and BL2. The second cell $T_1$-source can be connected to GND. The third cell $T_2$-drain can be connected to BL3 and WLW1. The third cell $T_2$-gate can be connected to WLW1. The third cell $T_2$-source can be connected to third cell $T_1$-drain. The third cell $T_1$-gate can be connected to WLR1 and BL3. The third cell $T_1$-source can be connected to GND. The fourth cell $T_2$-drain can be connected to BL4 and WLW1. The fourth cell $T_2$-gate can be connected to WLW1. The fourth cell $T_2$-source can be connected to fourth cell $T_1$-drain. The fourth cell $T_1$-gate can be connected to WLR1 and BL4. The fourth cell $T_1$-source can be connected to GND. The fifth cell $T_2$-drain can be connected to BL1 and WLW2. The fifth cell $T_2$-gate can be connected to WLW2. The fifth cell $T_2$-source can be connected to fifth cell $T_1$-drain. The fifth cell $T_1$-gate can be connected to WLR2 and BL1. The fifth cell $T_1$-source can be connected to GND. The sixth cell $T_2$-drain can be connected to BL2 and WLW2. The sixth cell $T_2$-gate can be connected to WLW2. The sixth cell $T_2$-source can be connected to sixth cell $T_1$-drain. The sixth cell $T_1$-gate can be connected to WLR2 and BL2. The sixth cell $T_1$-source can be connected to GND. The seventh cell $T_2$-drain can be connected to BL3 and WLW2. The seventh cell $T_2$-gate can be connected to WLW2. The seventh cell $T_2$-source can be connected to seventh cell $T_1$-drain. The seventh cell $T_1$-gate can be connected to WLR2 and BL3. The seventh cell $T_1$-source can be connected to GND. The eighth cell $T_2$-drain can be connected to BL4 and WLW2. The eighth cell $T_2$-gate can be connected to WLW2. The eighth cell $T_2$-source can be connected to eighth cell $T_1$-drain. The eighth cell $T_1$-gate can be connected to WLR2 and BL4. The eighth cell $T_1$-source can be connected to GND.

In at least one embodiment the NVM device circuit topology can be configured as a 3-transistor (3T) memory cell. The 3T-memory cell can include a first transistor, $T_1$, a second transistor, $T_2$, a third transistor $T_3$, a first bit line, BLW, a second bit line, BLR, a Wordline Write, WLW, a Wordline Read, WLR, and a Wordline-Readline, WLRL. Each of $T_1$ and $T_3$ can be a metal oxide semiconductor field effect transistor (MOSFET), and $T_2$ can be a FeFET. $T_1$ can have a $T_1$-source, a $T_1$-gate, and a $T_1$-drain. $T_2$ can have a $T_2$-source, a $T_2$-gate, and a $T_2$-drain. $T_3$ can have a $T_3$-source, a $T_3$-gate, and a $T_3$-drain. $T_1$-drain can be connected to $T_2$-gate. $T_1$-gate can be connected to WLW. $T_1$-source can be connected to BLW. $T_2$-drain can be connected to $T_3$-source. $T_2$-gate can be connected to $T_1$-drain. $T_2$-source can be connected to WLRW. $T_3$-drain can be connected to BLR. $T_3$-gate can be connected to WLR. $T_3$-source can be connected to $T_2$-drain. At least one of BLW, WLW, and WLRW can be connected to GND. WLR can be connected to a voltage supply, $V_{DD}$.

In at least one embodiment the NVM device circuit topology can be configured as a 3-transistor (3T) memory cell. The 3T-memory cell can include a first transistor, $T_1$, a second transistor, $T_2$, a third transistor $T_3$, a bit line, BL, a Wordline Write, WLW, a Wordline Read, WLR, and a Wordline-Readline, WLRL. Each of $T_1$ and $T_3$ can be a metal oxide semiconductor field effect transistor (MOSFET), and $T_2$ can be a FeFET. $T_1$ can have a $T_1$-source, a $T_1$-gate, and a $T_1$-drain. $T_2$ can have a $T_2$-source, a $T_2$-gate, and a $T_2$-drain. $T_3$ can have a $T_3$-source, a $T_3$-gate, and a $T_3$-drain. $T_1$-drain can be connected to $T_2$-gate. $T_1$-gate can be connected to WLW. $T_1$-source can be connected to BL. $T_2$-drain can be connected to $T_3$-drain. $T_2$-gate can be connected to $T_1$-drain. $T_2$-source can be connected to WLRW. $T_3$-drain can be connected to $T_2$-drain. $T_3$-gate can be connected to WLR. $T_3$-source can be connected to BL.

In at least one embodiment the NVM device circuit topology can be configured as a backup and restore circuit (B&R circuit). The B&R circuit can include a first transistor, $M_1$, $M_1$ having an $M_1$-source, an $M_1$-gate, and an $M_1$-drain. The B&R circuit can include a second transistor, $M_2$, $M_2$ having an $M_2$-source, an $M_2$-gate, and an $M_2$-drain. The B&R circuit can include a third transistor, $M_3$, $M_3$ having an $M_3$-source, an $M_3$-gate, and an $M_3$-drain. The B&R circuit can include a fourth transistor, $M_4$, $M_4$ having an $M_4$-source, an $M_4$-gate, and an $M_4$-drain. The B&R circuit can include a first branch can include $M_1$, $M_3$, and ground, GND. The B&R circuit can include a second branch can include $M_2$, $M_4$, and GND. Each of $M_1$ and $M_2$ can be a metal oxide semiconductor field effect transistor (MOSFET). Each of $M_3$ and $M_4$ can be a FeFET. $M_1$-drain can be connected to $M_3$-source. $M_1$-gate can be connected to a restore signal input signal and $M_2$-gate. $M_1$-source can be connected to GND. $M_2$-drain can be connected to $M_4$-source. $M_2$-gate can be connected to $M_1$-gate. $M_3$-drain configured to be connected to a slave latch via the first branch. $M_3$-drain can be connected to $M_4$-gate, $M_4$-drain, $M_3$-gate, and to the second branch. $M_3$-gate can be connected to $M_4$-gate, $M_4$-drain, $M_3$-drain, and to the second branch. $M_3$-source can be connected to $M_1$-drain. $M_4$-drain configured to be connected to the slave latch via the second branch. $M_4$-drain can be connected to $M_3$-gate, $M_3$-drain, $M_4$-gate, and to the first branch. $M_4$-gate can be connected to $M_3$-gate, $M_3$-drain, $M_4$-drain, and to the first branch. $M_4$-source can be connected to $M_2$-drain.

In at least one embodiment the NVM device circuit topology can be configured as a D-Flip Flop (DFF). The DFF can include a master latch, a slave latch, and a backup and restore circuit (B&R circuit). The master latch can include a first master inverter $M_{INV1}$, a second master inverter, $M_{INV2}$, a third master inverter, $M_{INV3}$, and a master transmission gate, $M_{GATE}$. Input of $M_{INV1}$ can be connected to a data input signal, D. Output of $M_{INV1}$ can be connected to input of $M_{INV2}$. Input of $M_{INV2}$ can be connected to output of $M_{INV1}$. Output of $M_{INV2}$ can be connected to input of $M_{INV3}$. Input of $M_{INV3}$ can be connected to output of $M_{INV2}$. Output of $M_{INV3}$ can be connected to input of $M_{GATE}$. Input of $M_{GATE}$ can be connected to output of $M_{INV3}$. Output of $M_{GATE}$ can be connected to input of $M_{INV2}$ and output of $M_{INV1}$. The slave latch can include a first slave inverter, $S_{INV1}$, a second slave inverter, $S_{INV2}$, a third slave inverter, $S_{INV3}$, and a slave transmission gate, $S_{GATE}$. Input of $S_{INV1}$ can be connected to output of $M_{INV2}$. Input of $S_{INV2}$ can be connected to output of $S_{INV1}$. Output of $S_{INV2}$ can be connected to input of $S_{INV3}$ and to a data output Q. Input of $S_{INV3}$ can be connected to output of $S_{INV2}$. Output of $S_{INV3}$ can be connected to input of $S_{GATE}$. Output of $S_{GATE}$ can be connected to input of $S_{INV2}$ and output of $S_{INV1}$. The B&R circuit can include a first transistor, $M_1$, $M_1$ having an $M_1$-source, an $M_1$-gate, and an $M_1$-drain. The B&R circuit can include a second transistor, $M_2$, $M_2$ having an $M_2$-source, an $M_2$-gate, and an $M_2$-drain. The B&R circuit can include a third transistor, $M_3$, $M_3$ having an $M_3$-source, an $M_3$-gate, and an $M_3$-drain. The B&R circuit can include a fourth transistor, $M_4$, $M_4$ having an $M_4$-source, an $M_4$-gate, and an $M_4$-drain. The B&R circuit can include a first branch having $M_1$, $M_3$, and ground, GND. The B&R circuit can include a second branch having $M_2$, $M_4$, and GND. Each of $M_1$ and $M_2$ can be a metal oxide semiconductor field effect transistor (MOSFET). Each of $M_3$ and $M_4$ can be a FeFET. $M_1$-drain can be connected to $M_3$-source. $M_1$-gate can be connected to a restore signal input signal and $M_2$-gate. $M_1$-source can be connected to GND. $M_2$-drain can be connected to $M_4$-source. $M_2$-gate can be connected to $M_1$-gate. $M_3$-drain configured to be connected to a slave latch via the first branch. $M_3$-drain can be connected to $M_4$-gate, $M_4$-drain, $M_3$-gate, and to the second branch. $M_3$-gate can be connected to $M_4$-gate, $M_4$-drain, $M_3$-drain, and to the second branch. $M_3$-source can be connected to $M_1$-drain. $M_4$-drain configured to be connected to the slave latch via the second branch. $M_4$-drain can be connected to $M_3$-gate, $M_3$-drain, $M_4$-gate, and to the first branch. $M_4$-gate can be connected to $M_3$-gate, $M_3$-drain, $M_4$-drain, and to the first branch. $M_4$-source can be connected to $M_2$-drain.

$M_3$-drain can be connected to output of $S_{GATE}$, output of $S_{INV1}$, and input of $S_{INV2}$. $M_4$-drain can be connected to input of $S_{INV3}$, output of $S_{INV2}$, and data output Q.

Further features, aspects, objects, advantages, and possible applications of the present invention will become apparent from a study of the exemplary embodiments and examples described below, in combination with the Figures, and the appended claims.

BRIEF DESCRIPTION OF THE DRAWINGS

The above and other objects, aspects, features, advantages and possible applications of the present innovation will be more apparent from the following more particular description thereof, presented in conjunction with the following drawings. Like reference numbers used in the drawings may identify like components.

FIG. 17 is a graph showing the impact on backup latency due to variations,

FIG. 18 is a graph showing the impact on backup energy,

FIG. 19 is a graph showing the impact on restore latency, and

FIG. 20 is a graph showing the impact on restore energy.

FIG. 60 is a graph showing yield simulation results considering $V_{TH}$ variation at different supply voltages for an embodiment of a latch and an embodiment of a DFF.

DETAILED DESCRIPTION OF THE INVENTION

The following description is of exemplary embodiments that are presently contemplated for carrying out the present invention. This description is not to be taken in a limiting sense, but is made merely for the purpose of describing the general principles and features of the present invention. The scope of the present invention is not limited by this description.

Embodiments include nonvolatile a memory (NVM) device 100 that can be configured for logic switching and/or digital computing. For example, embodiments of the NVM device 100 can be configured as any one or combination of a memory cell 124, a D flip flop (DFF) 120, a Backup and Restore circuit (B&R circuit) 116, and/or a latch 118, 122 for a DFF 120.

Figure 1:
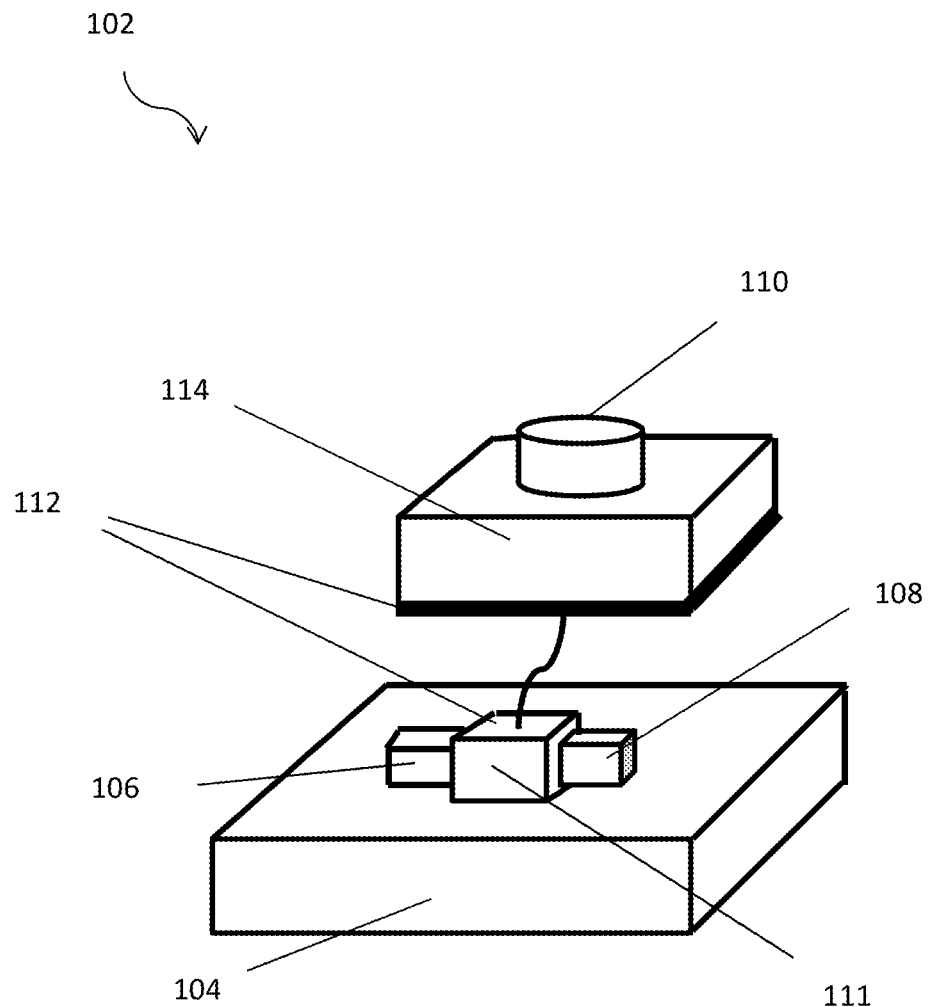
FIG. 1 is an exemplary schematic showing an exemplary device structure of an embodiment of a P-type noncapacitive field effect transistor (NCFET) with externally connected BiFeO3 ferroelectric material.
Figure 2:
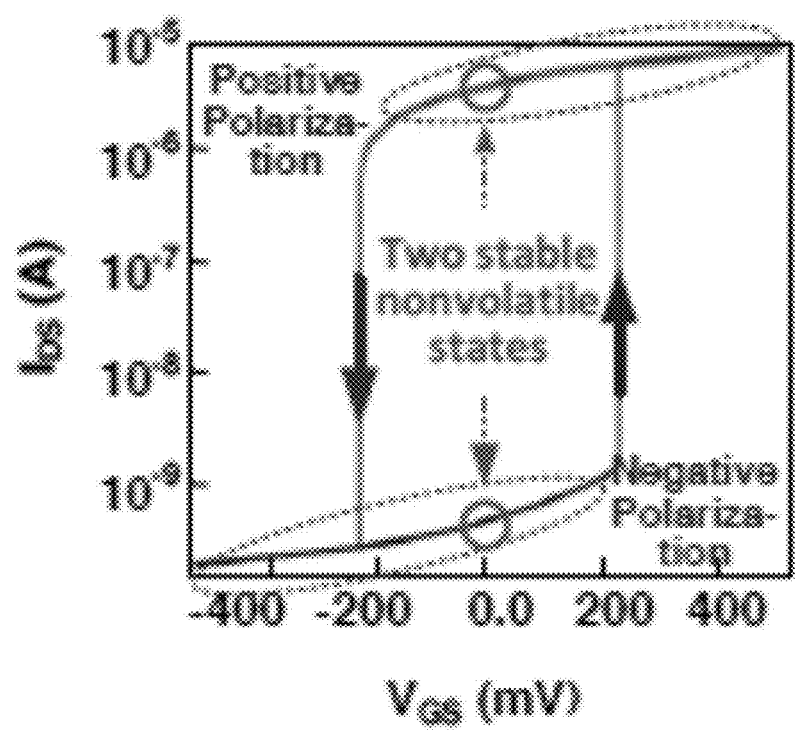
FIG. 2 is a graph showing an $I_D$-$V_G$ hysteresis curve with two stable nonvolatile states at $V_{GS}$=0 for an embodiment of a NCFET.
Figure 3:
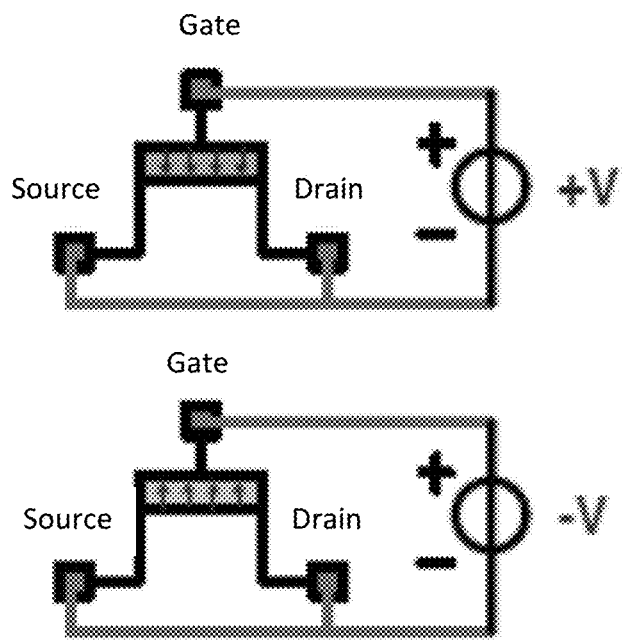
FIG. 3 is an exemplary schematic showing polarization switching by the gate voltage for embodiment of a NCFET.

Referring to FIGS. 1-3, in some embodiments, the NVM device 100 can include at least one field effect transistor (FET) 102. The FET 102 can include a substrate 104 having a drain 106, a source 108, and a gate 110 formed thereon. The drain 106, source 108, and gate 110 can be separate by a metal layer 112. Embodiments of the FET 102 can be a ferroelectric FET (FeFET) 102. For example, the FeFET 102 may include a ferroelectric layer 114 within the gate 110 of the FET 102. It should be noted that a FeFET 102 can be referred to as a negative capacitance or differential capacitance FET (NCFET) because its charge decreases as the applied voltage increases within a certain voltage range. The FeFET 102 can be configured to exhibit a wide current-voltage (I-V) hysteresis covering zero gate bias. This may be achieved by tuning at least a portion of the thickness of the ferroelectric layer.

Topologies for embodiments of the NVM devices 100 disclosed herein can include at least one FeFET 102 configured to have a wide current-voltage (I-V) hysteresis covering zero gate bias. For example, circuit topologies of embodiments of the NVM devices 100 can be configured to exploit the wide hysteresis feature that can be obtained from the use of an embodiment of the FeFET 102. Embodiments of the FeFET 102 can be configured to behave concurrently as a nonvolatile memory and a logic device with inherent compatibility with Boolean signaling. These and other features can reduce the complexity and energy consumption of the interface with logic gates. Additionally, embodiments of the FeFET 102 can provide a memory operation without static current during a write operation. In some embodiments, the FeFET 102, when used embodiments of the NVM devices 100 can be configured to exhibit a steep hysteresis edge and a high ratio between the two drain-source current states ($I_{DS}$ states) at a gate voltage ($V_G$)=0. These two states can be the two locally stable states shown in FIG. 2. The I-V curve of FIG. 2 was obtained based on the LK-equation modeling method, with 10 nm predictive technology model (PTM) complementary metal-oxide-semiconductor (CMOS) FinFET as the integrated MOSFET. A FinFET is a tri-gate transistor in which the gate 110 is formed on at least two sides of the channel 111. The LK-equation coefficients are: alpha=−1.05e9 m/F, beta=1e7 $m^5/F/coul^2$, and gamma=6e11 $m^9/F/coul^4$. One state can switch to the other by applying a sufficiently high-amplitude positive or negative $V_{GS}$ that exceeds the coercive voltage, as shown with an N-type FeFET in FIG. 3.

Figure 4:
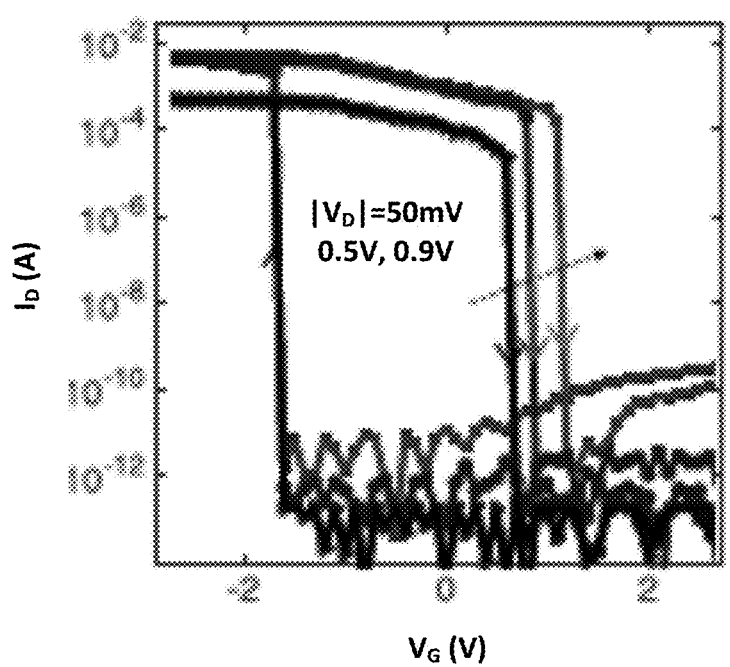
FIG. 4 is a graph showing an $I_D$-$V_G$ hysteresis curve around $V_G$=0 for an embodiment of a P-type NCFET.

Capacitance matching may be beneficial to obtain the characteristics in FIGS. 2-3. In addition, $V_{TH}$ shifting in the baseline MOSFET can be done to locate the hysteresis window around $V_G$=0. This can include centering the hysteresis at $V_G$=0. The shifting of $V_{TH}$ described herein can be done to generate NVM devices 100 with added non-volatility, as compared to conventional nonvolatile memory devices. As can be seen in FIG. 4 embodiments of the NVM device 100 can be generated that provide steep hysteresis edges with a slope below 10 mV/decade for above 7 orders in magnitude between the two $I_{DS}$ hysteresis states at $V_G$=0. A steep-slope transition edge can be used to provide a wide gate voltage range in which the polarization of the NVM device 100 stays stable against noise. In addition, NVM devices 100 can be generated with a higher ON-state current and a lower OFF-state current. A higher ON-state current and a lower OFF-state current can lead to faster restore and immunity to device variations.

Embodiments of the NVM device 100 can be configured as a B&R circuit 116 and/or a DFF 120 having an embodiment of the DFF 120 as part of its accessory circuitry. Such a NVM device 100 can be configured to maintain its state during a power outage and/or during an intermittent power supply. This can be useful for nonvolatile computing (e.g., prevent computation progress loss due to either an unexpected or scheduled power outage). For example, embodiments of the B&R circuit 116 and/or a DFF 120 can be used for backing up memory and DFF states to on-chip nonvolatile memory elements. Nonvolatile computing techniques can also be useful for energy harvesting, and in particular energy harvesting with Internet-of-Things (IoT) applications where frequent check-pointing is generally required under the notoriously intermittent supply provided by energy harvesting mechanisms. Nonvolatile computing techniques, via in situ backup methods, can also provide more energy savings in power-gating applications (e.g., cut off leakage power for higher energy efficiency).

Figure 5:
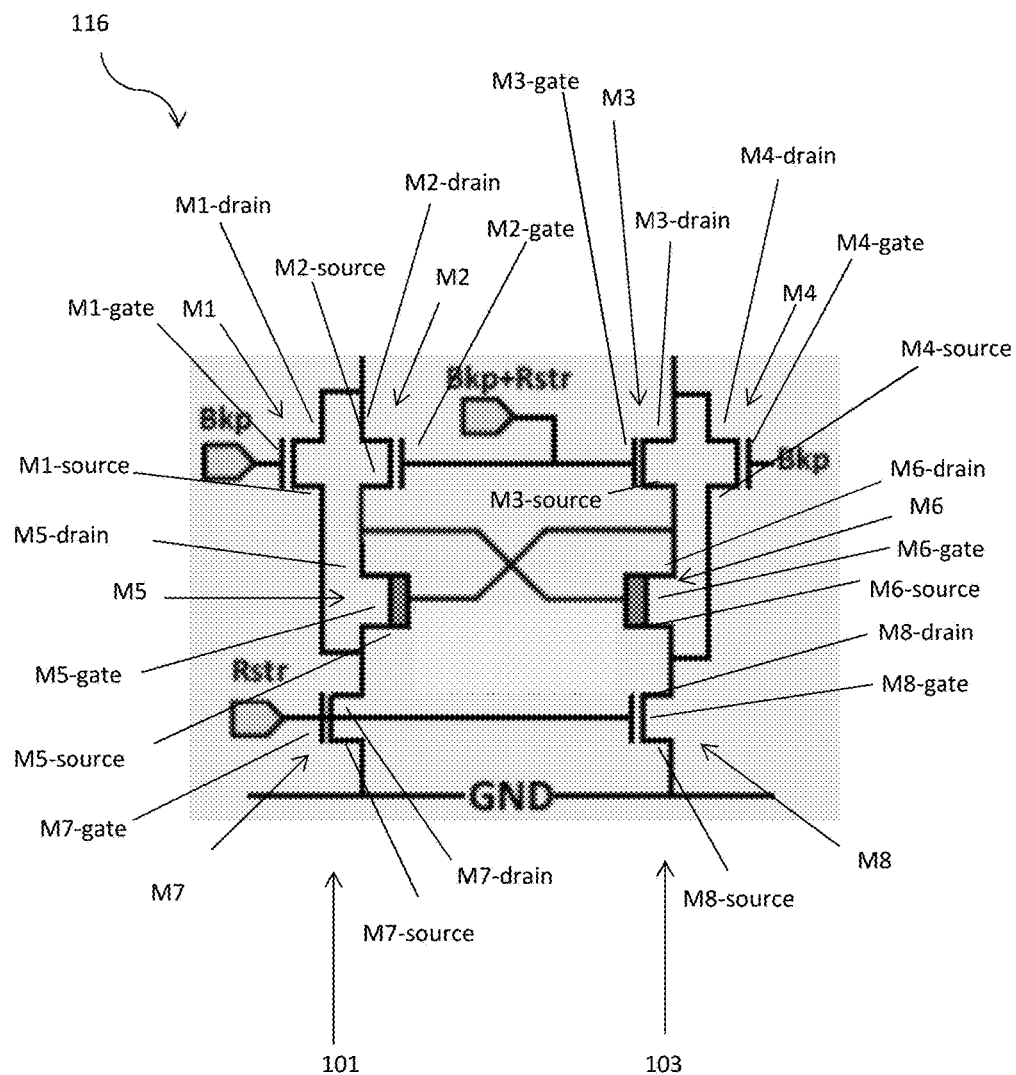
FIG. 5 is an exemplary schematic showing an embodiment of a backup and restore (B&R) circuit.

FIG. 5 shows an embodiment of a B&R circuit 116. The B&R circuit 116 can have a first transistor, $M_1$. $M_1$ can have an $M_1$-source, an $M_1$-gate, and an $M_1$-drain. The B&R circuit 116 can have a second transistor, $M_2$. $M_2$ can have an $M_2$-source, an $M_2$-gate, and an $M_2$-drain. The B&R circuit 116 can have a third transistor, $M_3$. $M_3$ can have an $M_3$-source, an $M_3$-gate, and an $M_3$-drain. The B&R circuit 116 can have a fourth transistor, $M_4$. $M_4$ can have an $M_4$-source, an $M_4$-gate, and an $M_4$-drain. The B&R circuit 116 can have a fifth transistor, $M_5$. $M_5$ can have an $M_5$-source, an $M_5$-gate, and an $M_5$-drain. The B&R circuit 116 can have a sixth transistor, $M_6$. $M_6$ can have an $M_6$-source, an $M_6$-gate, and an $M_6$-drain. The B&R circuit 116 can have a seventh transistor, $M_7$. $M_7$ can have an $M_7$-source, an $M_7$-gate, and an $M_7$-drain. The B&R circuit 116 can have an eighth transistor, $M_8$. $M_8$ can have an $M_8$-source, an $M_8$-gate, and an $M_8$-drain. Any one or combination of the transistors of the B&R circuit 116 can be a metal oxide semiconductor field effect transistor (MOSFET) or a FeFET 102.

The B&R circuit 116 can further include a first branch 101 and a second branch 103. The first branch 101 can include $M_1$, $M_2$, $M_5$, $M_7$, and GND. The second branch 103 can include $M_3$, $M_4$, $M_6$, and $M_8$. Depending on the inputs, either the first branch 101 or the second branch 103 operates as a backup branch or a restore branch. For example, when the first branch 101 operates as a backup branch, the second branch 103 operates as a restore branch. When the first branch 101 operates as a restore branch, the second branch 103 operates as a backup branch. Particular note should be made to the cross-coupled circuit connection between $M_5$ and the second branch 103 and $M_6$ and the first branch 101. This can facilitate backup and restore operations in only one step without static current consumptions.

In some embodiments, the B&R circuit 116 can be connected to a slave latch 118. (See FIG. 6). This can be done to generate a DFF 120. For example, the first branch 101 and the second branch 103 can be connected to a slave latch 118 to form a DFF 120.

In at least one embodiment, $M_1$, $M_2$, $M_3$, $M_4$, $M_7$, and $M_8$ are MOSFETs. In at least one embodiment, $M_5$ and $M_6$ are FeFETs 102. $M_1$-gate can be connected to a backup control signal input, $B_{kp\_input}$ and $M_3$-gate. $M_1$-drain can be connected to $M_2$-drain. $M_1$-drain can be configured to be connected to a slave latch 118, which can be via the first branch 101. $M_1$-source can be connected to $M_5$-source and $M_7$-drain. $M_2$-drain can be connected to $M_1$-drain. $M_2$-drain can be configured to be connected to the slave latch 118, which can be via the first branch 101. $M_2$-gate can be connected to a backup and restore control signal input, $B_{kp}+R_{str}$ and $M_3$-gate. $M_2$-source can be connected to $M_6$-gate, $M_5$-drain, $M_5$-gate, $M_6$-drain, and $M_3$-source. $M_3$-drain can be connected to $M_4$-drain. $M_3$-drain can be configured to be connected to the slave latch 118, which can be via the second branch 103. $M_3$-gate can be connected to $B_{kp}+R_{str}$ and $M_1$-gate. $M_3$-source can be connected to $M_5$-gate, $M_6$-drain, $M_5$-drain, $M_2$-source, and $M_6$-gate. $M_4$-drain can be connected to $M_3$-drain. $M_4$-drain can be configured to be connected to the slave latch 118, which can be via the second branch 103. $M_4$-gate can be connected to a backup control signal output, $B_{kp\_output}$. $M_4$-source can be connected to $M_6$-source and $M_8$-drain. $M_5$-drain can be connected to $M_2$-source, $M_5$-gate, $M_6$-gate, $M_6$-drain, and $M_3$-source. $M_5$-gate can be connected to $M_3$-source, $M_6$-drain, $M_6$-gate, $M_2$-source, and $M_5$-drain. $M_5$-source can be connected to $M_7$-drain and $M_1$-source. $M_6$-drain can be connected to $M_3$-source, $M_5$-gate, $M_6$-gate, $M_5$-drain, and $M_2$-source. $M_6$-gate can be connected to $M_2$-source, $M_5$-drain, $M_5$-gate, $M_6$-drain, and $M_3$-source. $M_6$-source can be connected to $M_4$-source and $M_8$-drain. $M_7$-drain can be connected to $M_1$-source and $M_5$-source. $M_7$-gate can be connected to a restore input control signal, $R_{str}$. $M_7$-source can be connected to ground, GND, which can be via the first branch 101. $M_8$-drain can be connected to $M_4$-source and $M_6$-source. $M_8$-gate can be connected to $M_7$-gate. $M_8$-source can be connected to GND, which can be via the second branch 103.

Figure 6:
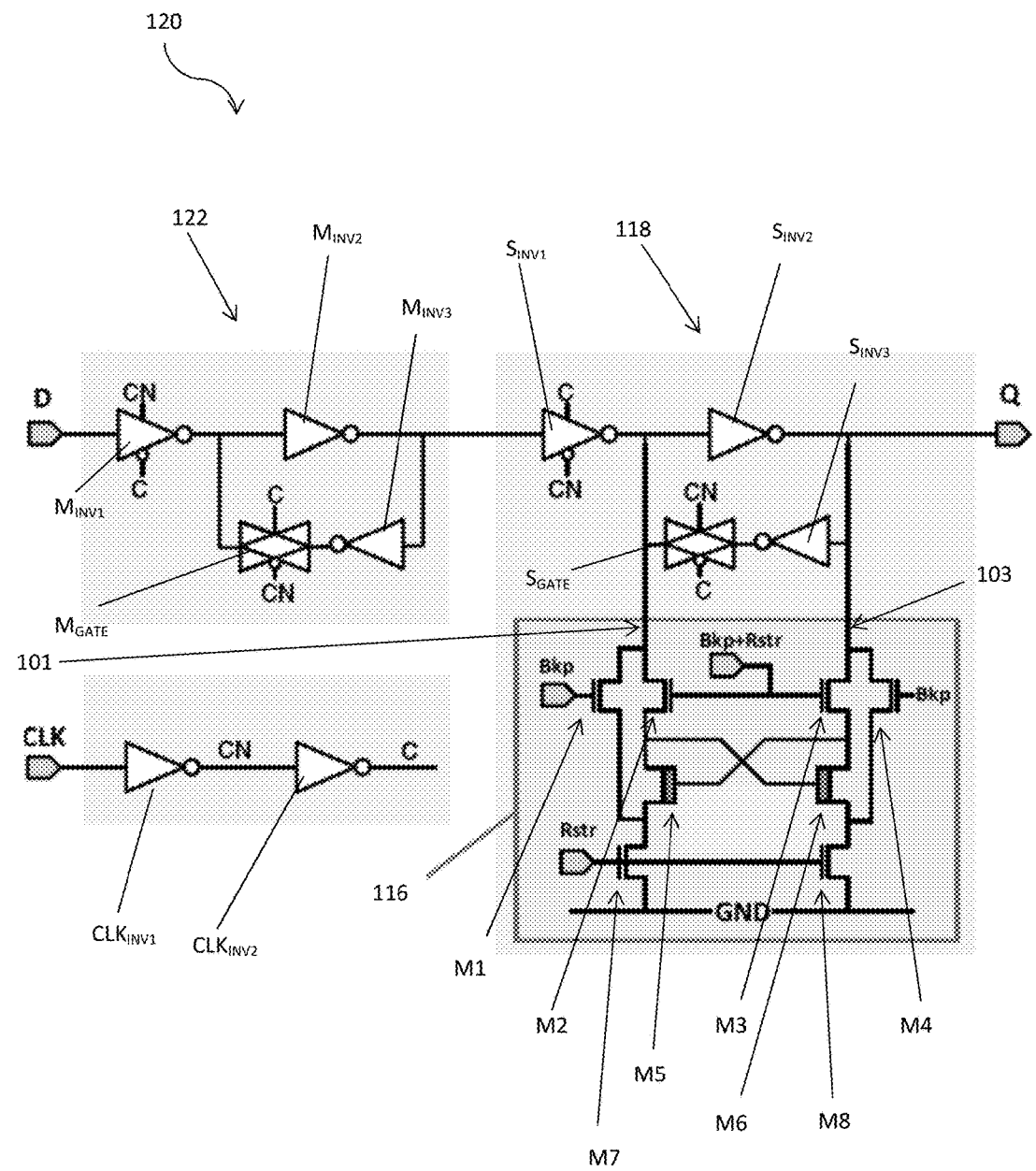
FIG. 6 is an exemplary schematic showing an embodiment of a D flip flop (DFF).

Referring to FIG. 6, in some embodiments the B&R circuit 116 can be used to generate a DFF 120. For example, embodiments of the DFF 120 can include a master latch 122 and a slave latch 118 in connection with an embodiment of the B&R circuit 116. In some embodiments, the DFF 120 can include a master latch 122 and a slave latch 118 in connection with the B&R circuit 116, and be configured for digital computing operations (e.g., backup and restore purposes). In at least one embodiment, the back and restore operations can be associated with the slave latch 118 only.

The master latch 122 can have a first master inverter $M_{INV1}$, a second master inverter, $M_{INV2}$, a third master inverter, $M_{INV3}$, and a master transmission gate, $M_{GATE}$. The input of $M_{INV1}$ can be connected to a data input signal, D. The output of $M_{INV1}$ can be connected to the input of $M_{INV2}$. The input of $M_{INV2}$ can be connected to the output of $M_{INV1}$. The output of $M_{INV2}$ can be connected to the input of $M_{INV3}$. The input of $M_{INV3}$ can be connected to the output of $M_{INV2}$. The output of $M_{INV2}$ can be connected to the input of $M_{GATE}$. The input of $M_{GATE}$ can be connected to the output of $M_{INV3}$. The output of $M_{GATE}$ can be connected to the input of $M_{INV2}$ and the output of $M_{INV1}$.

The slave latch 118 can have a first slave inverter, $S_{INV1}$, a second slave inverter, $S_{INV2}$, a third slave inverter, $S_{INV3}$, and a slave transmission gate, $S_{GATE}$. The input of $S_{INV1}$ can be connected to the output of $M_{INV2}$. The input of $S_{INV2}$ can be connected to the output of $S_{INV1}$. The output of $S_{INV2}$ can be connected to the input of $S_{INV3}$ and to a data output Q. The input of $S_{INV3}$ can be connected to the output of $S_{INV2}$. The output of $S_{INV3}$ can be connected to the input of $S_{GATE}$. The output of $S_{GATE}$ can be connected to the input of $S_{INV2}$ and the output of $S_{INV1}$.

A clock driver, CLK can be used to generate an in-phase clock signal, c, and opposite-phase clock signal, cn, for $M_{INV1}$, $M_{GATE}$, $S_{INV1}$, and/or $S_{GATE}$. Embodiments of the CLK can include a first clock inverter, $CLK_{INV1}$, having an output connected to an input of a second clock inverter, $CLK_{INV2}$. $CLK_{INV1}$ can be configured to generate cn. $CLK_{INV2}$ can be configured to generate c. Each of $M_{GATE}$ and $S_{GATE}$ can be a gate circuit for transmitting or blocking the output signal from the master latch 122 or slave latch 118, respectively, in response to the clock signal from CLK. For example, the DFF 120 can be configured such that each of $M_{GATE}$ and $S_{GATE}$ passes the output signal of the master latch 122 or slave latch 118, respectively, when the clock signal is HIGH (e.g., $M_{GATE}$ or $S_{GATE}$ becomes conductive). Each of $M_{GATE}$ and $S_{GATE}$ can be configured to block the output signal of the master latch 116 or slave latch 118, respectively, when the clock signal is LOW (e.g., $M_{GATE}$ or $S_{GATE}$ becomes non-conductive).

Each of $M_1$-drain and $M_2$-drain can be connected to the output of $S_{GATE}$, the output of $S_{INV1}$, and the input of $S_{INV2}$. For example, the first branch 101 can be connected to the output of $S_{GATE}$, the output of $S_{INV1}$, and the input of $S_{INV2}$.

Each of $M_3$-drain and $M_4$-drain can be connected to the input of $S_{INV3}$, the output of $S_{INV2}$, and data output Q. For example, the second branch 103 can be connected to the input of $S_{INV3}$, the output of $S_{INV2}$, and data output Q.

In some embodiments, when both $B_{kp}$ and $R_{str}$ are low, the interface transistors ($M_1$, $M_2$, $M_3$, and $M_4$) between the slave latch 118 and the B&R circuit 116 are turned OFF by the gate signal $B_{kp}$ and $R_{str}$. This can cause the master latch 122 and slave latch 118 portions of the DFF 120 to function the same as a conventional positive-edge triggered DFF.

Figure 7:
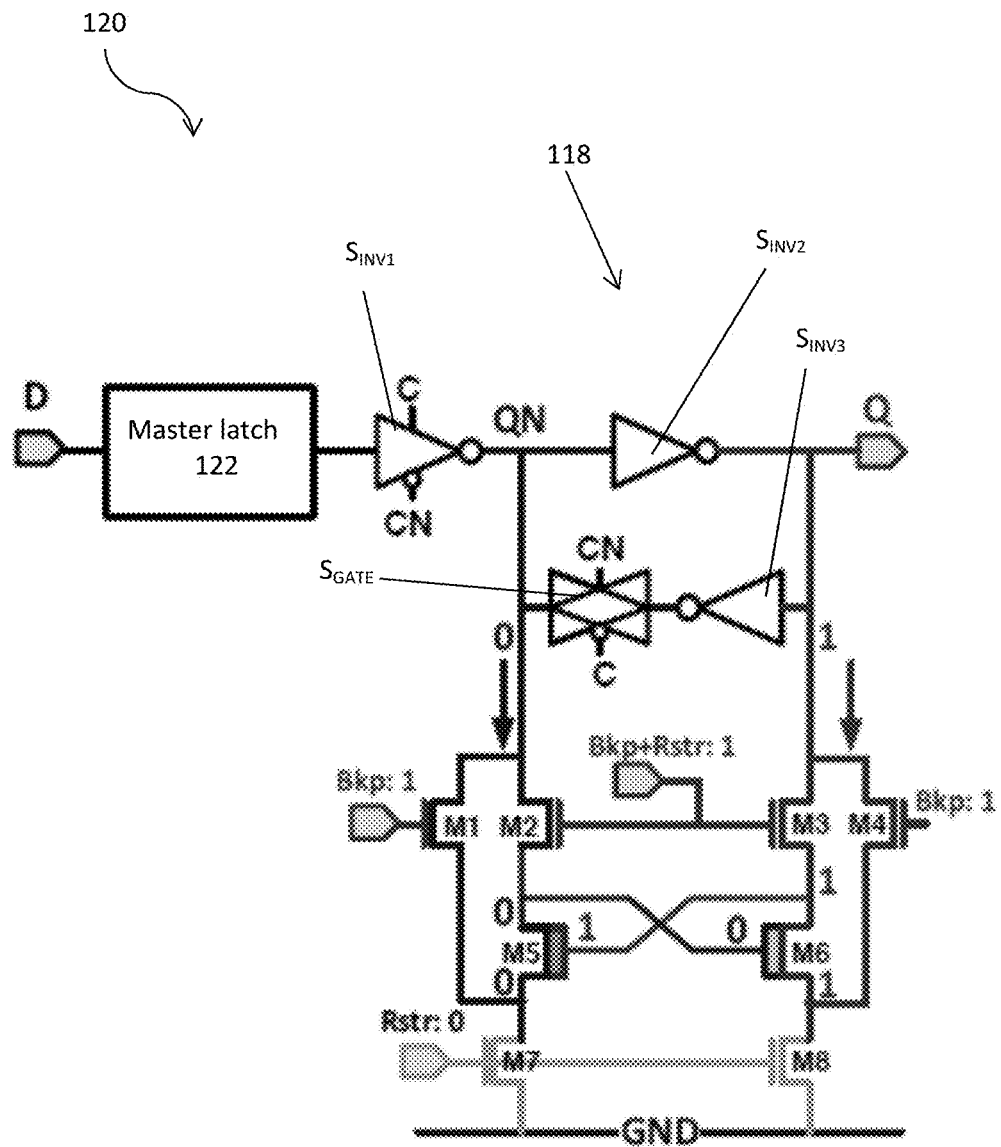
FIG. 7 is an exemplary schematic showing an exemplary process flow for an embodiment of the DFF in a backup operation.

FIG. 7 shows the DFF 120 circuit state transition in the slave latch 118 during a backup operation. In a backup operation, a feedback network is generates. For example, when a supply outage is about to come, the backup control signal $B_{kp}$ becomes high and turns ON the interface transistors ($M_1$, $M_2$, $M_3$, and $M_4$). Note that the pull-down transistors ($M_7$ and $M_8$), gated by $R_{str}$, are turned OFF. Using Q='1' (corresponding to a high supply voltage, $V_{DD}$) and QN='0' (corresponding to GND), the feedback network quickly biases $M_5$ and $M_6$ to switch to (or maintain) a positive polarization for $M_5$ and a negative polarization for $M_6$, respectively. The polarization switching is straightforward as the $M_5$-gate is biased at voltage levels opposite to $M_5$-drain and $M_5$-source (e.g., $V_{DD}$-$V_{TH}$ for a high voltage level and GND at a low level). Additionally, $M_6$-gate is biased at voltage levels opposite to $M_6$-drain and $M_6$-source terminals (e.g, $V_{DD}$-$V_{TH}$ for a high voltage level and GND at a low level). After the polarization switching is accomplished, the removal of $V_{DD}$ (the removal of $V_{DD}$ being a supply outage) will not affect the stored polarization states, regardless of the $B_{kp}$ and $R_{str}$ control signal levels. Note that the backup operation does not need to change the polarization if the state of the previous backup is the same. Operations with Q='0' (corresponding to GND) and QN='1' (corresponding to a high supply voltage, $V_{DD}$) would be similar.

Figure 8:
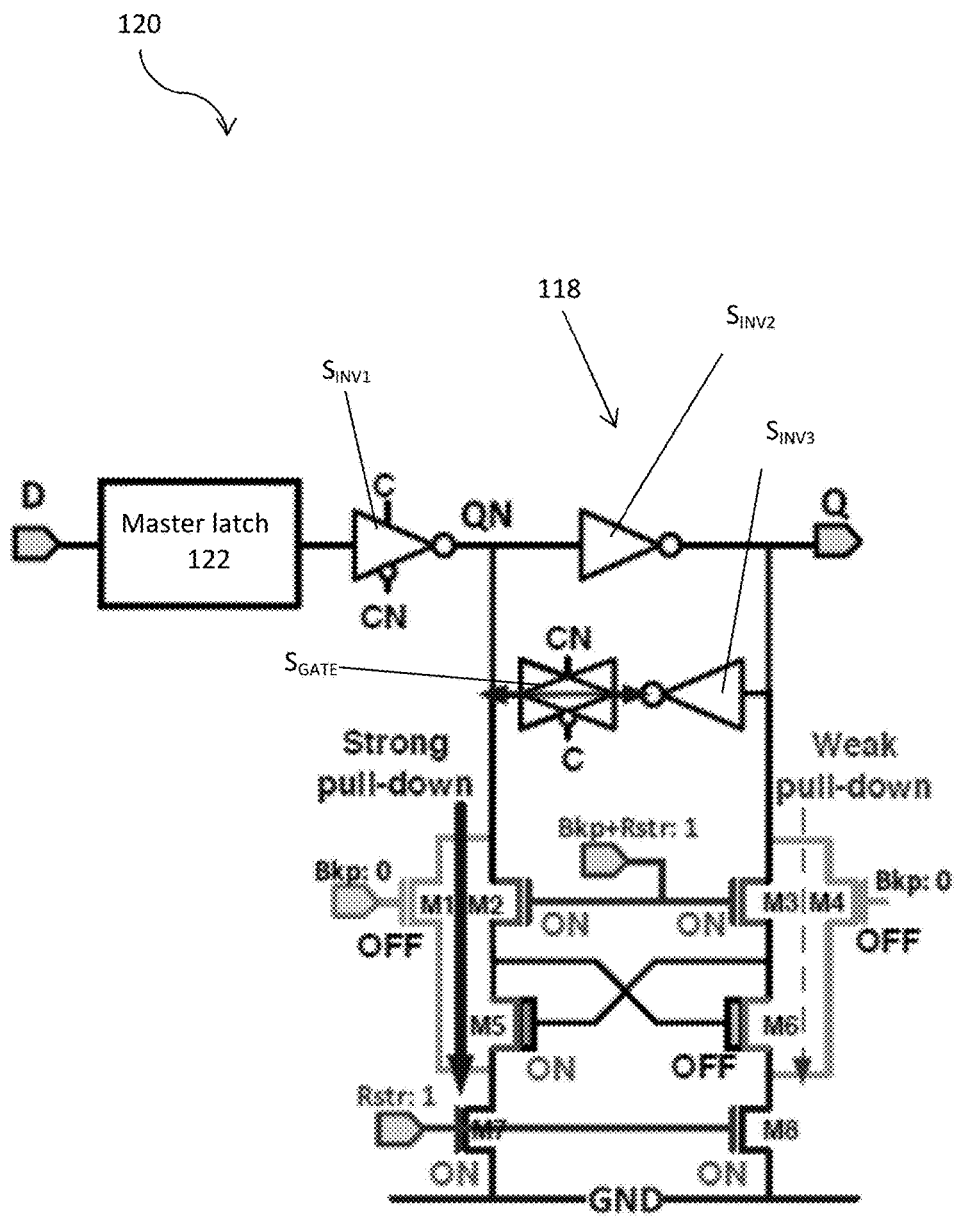
FIG. 8 shows an exemplary process flow for an embodiment of the DFF in a restore operation.

FIG. 8 shows the DFF 120 circuit state transition for a restore operation. During the entire restore operation, the CLK and $B_{kp}$ are set to be low (C='0' and CN='1'), and $R_{str}$ is set to be high. This can guarantee that the slave latch 118 is isolated from the master latch 122. As a result, the sensed resistance from node Q and to GND and from QN to $V_{DD}$ determines the final settled Q and QN voltage levels. For the positively polarized FeFET (either $M_5$ or $M_6$) its drain-to-source resistance is orders of magnitude lower than the other negatively polarized FeFET (either $M_6$ or $M_5$), which leads to a much stronger pull-down effect on the settling of the branch within which $M_5$ or $M_6$ is located. The positive feedback network can further enhance the difference in magnitude, and finally lead to a full settling down as $V_{DD}$ recovers.

Figure 9:
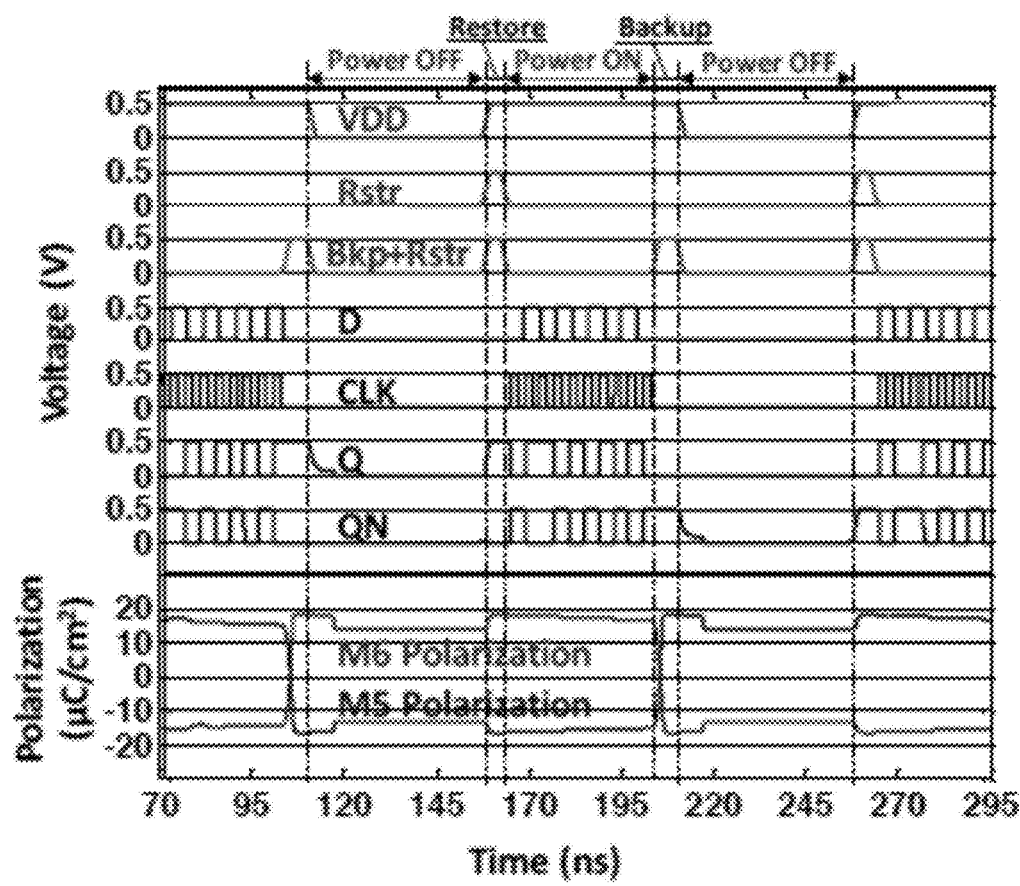
FIG. 9 a graph showing transient waveform snapshots of an embodiment of the DFF 120 with the CLK period equal to ~4 ns during normal "Power On" operations. A few nS after power supply goes off, the internal nodes Q and QN were manually pulled down to ground to mimic real scenarios.

FIG. 9 is a transient waveform snapshot, showing operations of an embodiment of the DFF 120 with a steady $V_{DD}$ and backup and restore operations due to power failures. The clock frequency was set to 0.25 GHz when the power supply was stable. It should be noted, however, that the clock frequency can be much faster because the isolated accessory backup and restore circuitry has negligible impact on the normal operation. To prevent the backup and restore operations from being interrupted, however, CLK can be kept low. The polarization state, as shown in FIG. 9 remains stable in the power-OFF periods. Thanks to the simple timing requirement and the small control load, there is no need for a second supply network to deliver power for the control signals.

It should be noted that embodiments of the DFF 120 and/or B&R circuit 116 can be built with P-type transistors connecting to $V_{DD}$ with effective control signals at a low voltage.

Any one or combination of the parameters of any one or combination of FeFETs 102 can be tuned by adjusting the thickness, $T_{FE}$, of the ferroelectric layer 114 and/or the area, $A_{FE}$, of the ferroelectric layer 114. Adjusting $T_{FE}$ and/or $A_{FE}$ cab facilitate generating an NVM device 100 with improved energy-delay overhead during normal operations, improved backup and restore energy and delay, improved retention time, and improved yield and reliability. Improving the backup and restore energy can be beneficial for NVM devices 100 used in energy-harvesting systems experiencing intermittent power supplies. Conventional nonvolatile memory devices are limited in improvements to overall energy efficiency, as more energy spent for backup and restore operations generally results in less energy for computation. For example, for check-pointing applications, the backup and restore energy indicates a certain period of power-off time (break-even time (BET)), below which no energy savings could be achieved. Improved backup and restore time can also be beneficial for some applications when a fast response is preferred (e.g., fine-time-granularity power-gating scenarios and fast-response processors).

Figure 10:
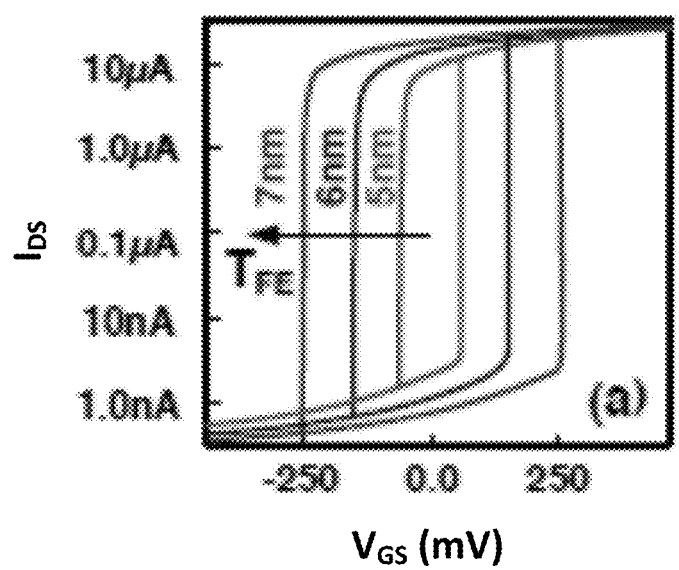
FIG. 10 is a graph showing the impact on $I_{DS}$-$V_{GS}$ curves by varying ferroelectric layer thickness ($T_{FE}$) (baseline 6 nm) on an embodiment of the NCFET.
Figure 11:
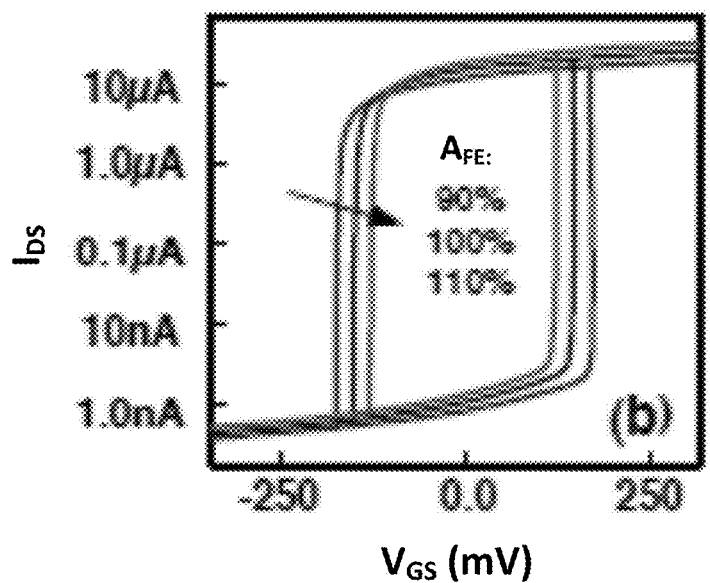
FIG. 11 is a graph showing the impact on $I_{DS}$-$V_{GS}$ curves by of changing ferroelectric layer area ($A_{FE}$) (baseline 100% of 378 nm$^2$) on an embodiment of the NCFET.
Figure 12:
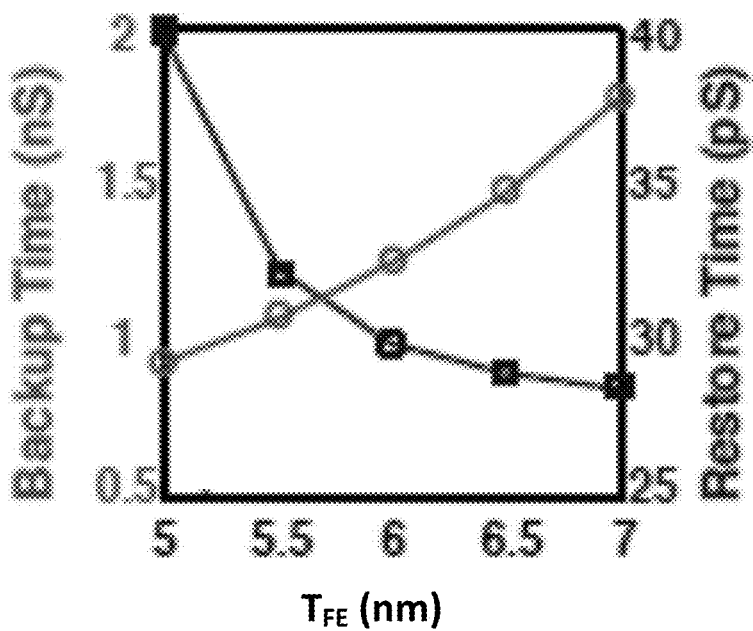
FIG. 12 is a graph showing the impact on backup time and restore time by varying $T_{FE}$ on an embodiment of the NCFET.
Figure 13:
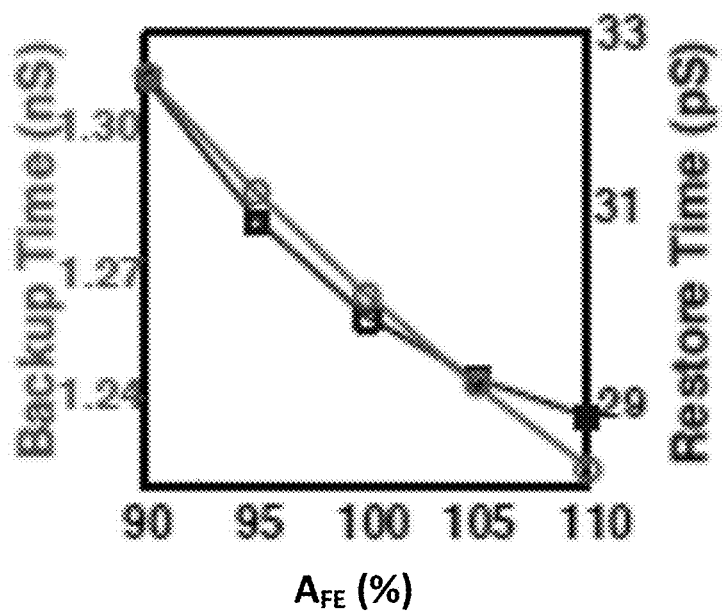
FIG. 13 is a graph showing the impact on backup time and restore time by varying $A_{FE}$ on an embodiment of the NCFET.
Figure 14:
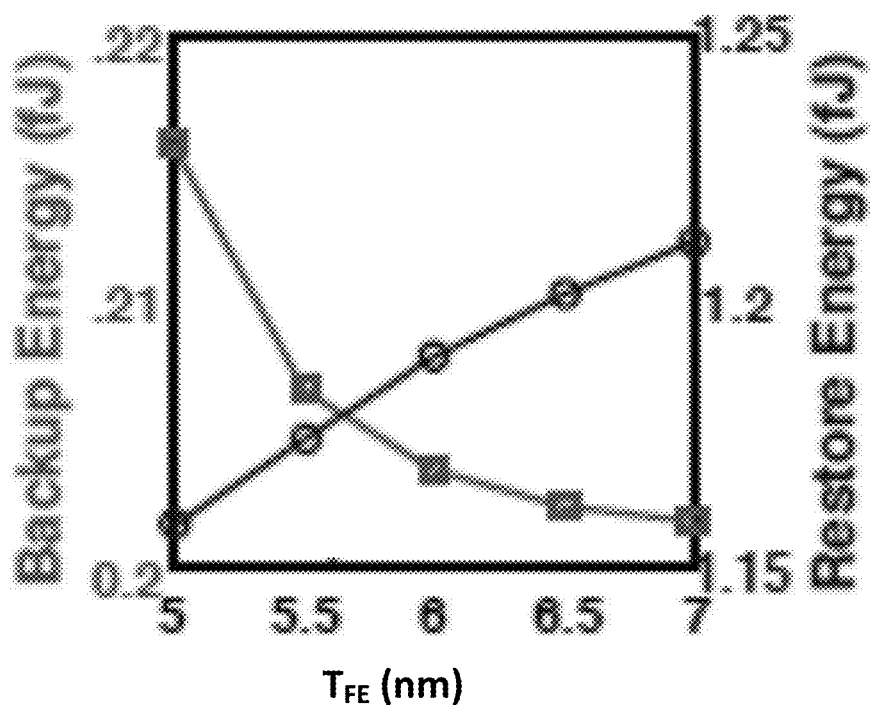
FIG. 14 is a graph showing the impact on backup energy and restore energy by varying $T_{FE}$ on an embodiment of the NCFET.
Figure 15:
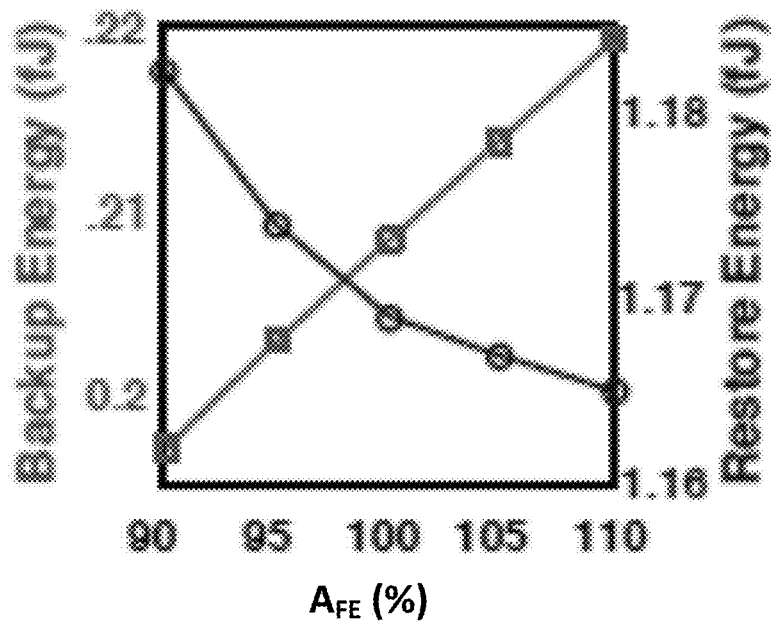
FIG. 15 is a graph showing the impact on backup energy and restore energy by varying $A_{FE}$ on an embodiment of the NCFET.

FIG. 10 shows the impact on $I_{DS}$-$V_{GS}$ curves by varying $T_{FE}$ (baseline 6 nm) on an embodiment of the FeFET 102. FIG. 11 shows the impact on $I_{DS}$-$V_{GS}$ curves by of changing $A_{FE}$ (baseline 100% of 378 nm$^2$) on an embodiment of the FeFET 102. FIG. 12 shows the impact on backup time and restore time by varying $T_{FE}$ on an embodiment of the FeFET 102. FIG. 13 shows the impact on backup time and restore time by varying $A_{FE}$ on an embodiment of the FeFET 102. FIG. 14 shows the impact on backup energy and restore energy by varying $T_{FE}$ on an embodiment of the FeFET 102. FIG. 15 shows the impact on backup energy and restore energy by varying $A_{FE}$ on an embodiment of the FeFET 102. In FIGS. 10-15, $V_{DD}$=0.5V, kinetic coefficient ρ=0.25, alpha=−1.05e9 m/F, beta=1e7 m$^5$/F/coul$^2$, and gamma=6e11 m$^9$/F/coul$^4$.

FIGS. 10-15 show how changes in $T_{FE}$ and $A_{FE}$ affect the I-V characteristics and the performance of a DFF 120 using an embodiment of the FeFET 102. It can be seen that increasing $T_{FE}$ can increase the coercive voltage or energy barrier to flip the polarization, leading to longer retention time and more time to switch the polarization. A larger $T_{FE}$ can also reduce the restore time with a higher ON/OFF resistance ratio and a lower ON-state resistance. It can also be seen that variation of $T_{FE}$ from 5 nm to 7 nm slightly affects the backup and restore energy by less than 10%. Meanwhile, decreasing $A_{FE}$ also changes the capacitance matching between CFE and CMOS, leading to a different I-V with a higher coercive voltage, a lower ON-state current, and longer polarization switching time. Considering the inevitable $T_{FE}$ and $A_{FE}$ variations in the fabrication process, $T_{FE}$ and $A_{FE}$ should be carefully optimized considering the supply voltage range, the retention model, and the application requirements on the retention time, and backup and restore energy and latency.

A design performance evaluation using SPICE simulations was conducted using an embodiment of the DFF 120. $T_{FE}$ was set to 6 nm and $A_{FE}$ was set to 378 nm$^2$ (equal to 3×fin_width×channel_length) for one fin, for the optimized tradeoff. These parameter values, unless otherwise stated, were be used in the performance evaluation. A physics-based ferroelectric capacitance model in was employed to build FeFETs 102 with 10 nm PTM CMOS FinFET as the integrated MOSFET for the simulation. In the model, the ferroelectric material was calibrated by experimental results of lead zirconium titanate (PZT) films on hafnium oxide (HfO$_2$) buffer. To reflect different polarization switching speed, in the FeFET model, the kinetic coefficient ρ was varied from 0.04 to 0.25. The baseline CMOS volatile DFF (a conventional DFF, which is annotated as CMOS DFF in FIG. 16) was optimized with the minimum area and a similar clock-to-Q delay between '0' and '1' outputs (the number of fins for N-type MOS (NMOS) and P-type MOS (PMOS) is 1 and 2, respectively). The DFFs 120 were simulated with a 2.0 fF load capacitor and 20 ps rising and falling time for D and CLK inputs.

Figure 16:
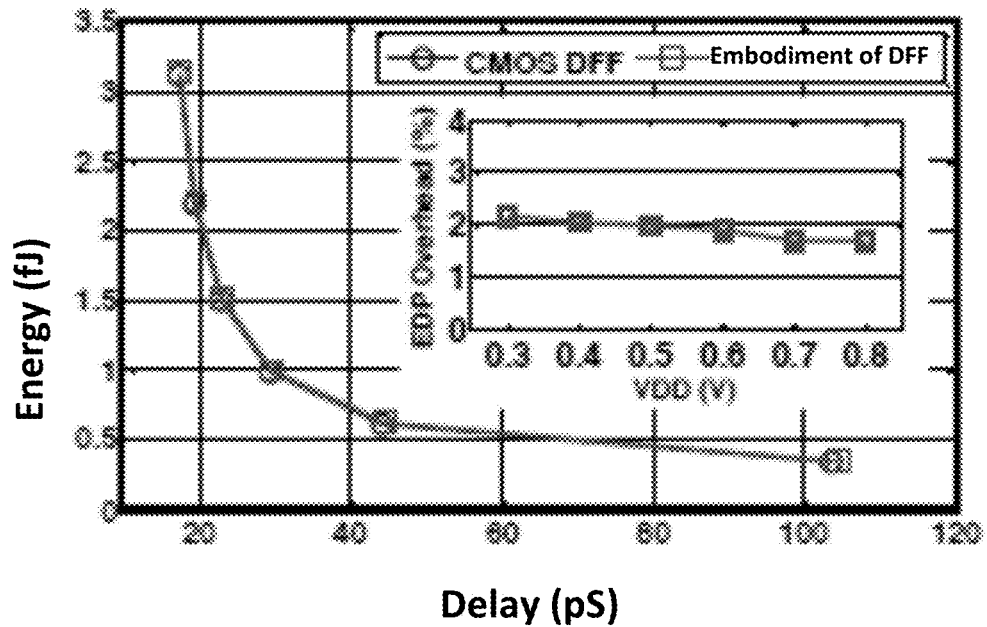
FIG. 16 is a graph showing energy-delay performance overhead of an embodiment of a DFF under a supply voltage from 0.30 V to 0.80 V, wherein the kinetic coefficient ρ is 0.25.
Figure 17:
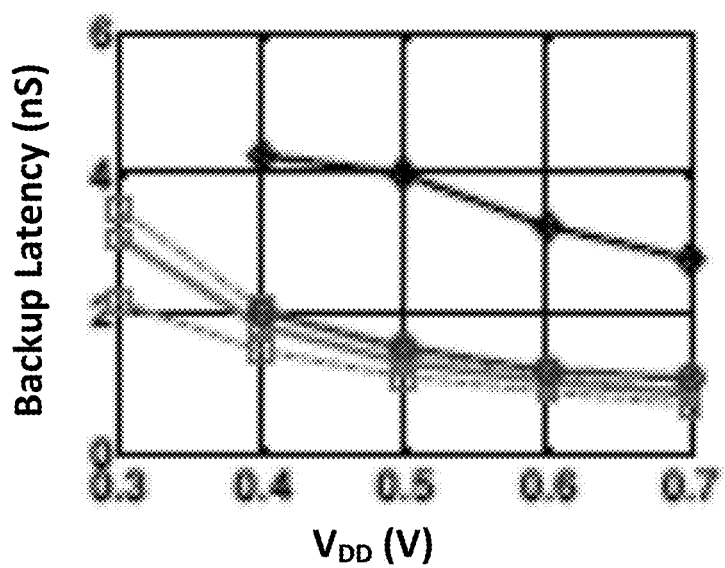
FIGS. 17-20 are is graphs showing performance indicators for an embodiment of a DFF in regards to local mismatches in ferroelectric layer thickness and area in NCFETs used to make the DFF.
Figure 18:
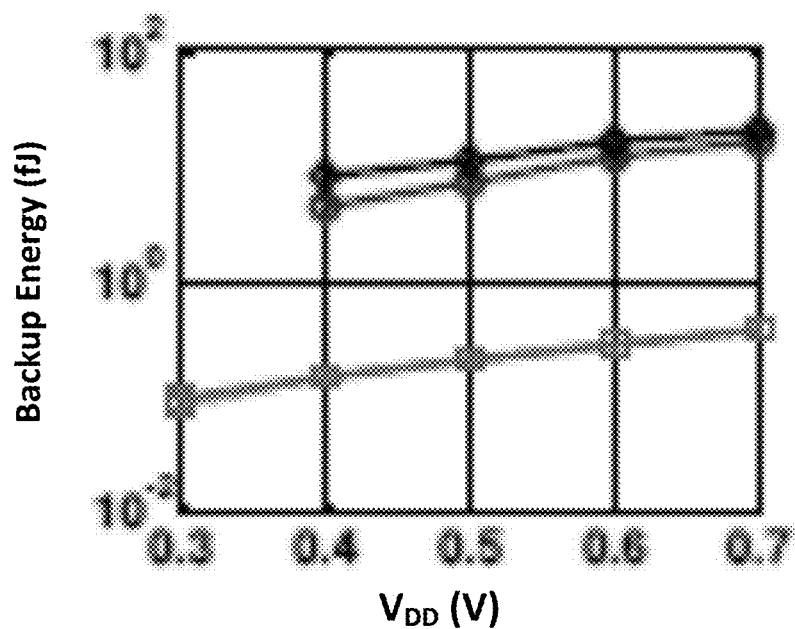
Figure 19:
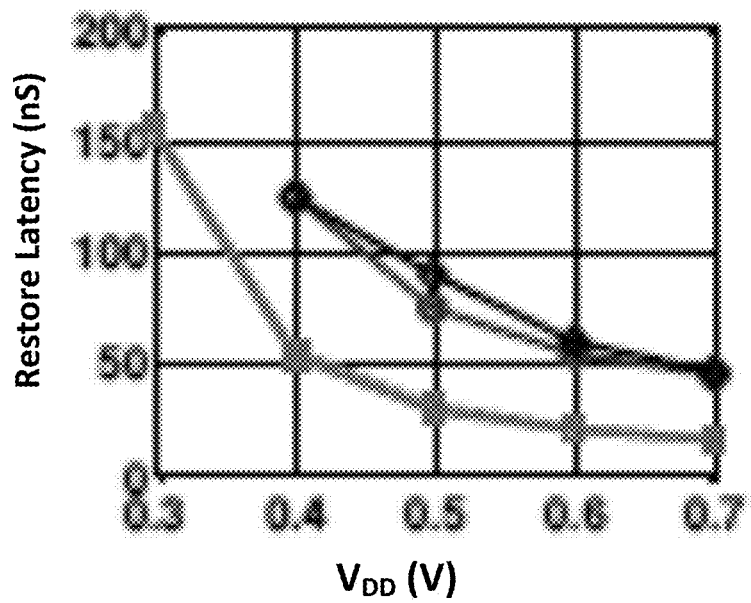
Figure 20:
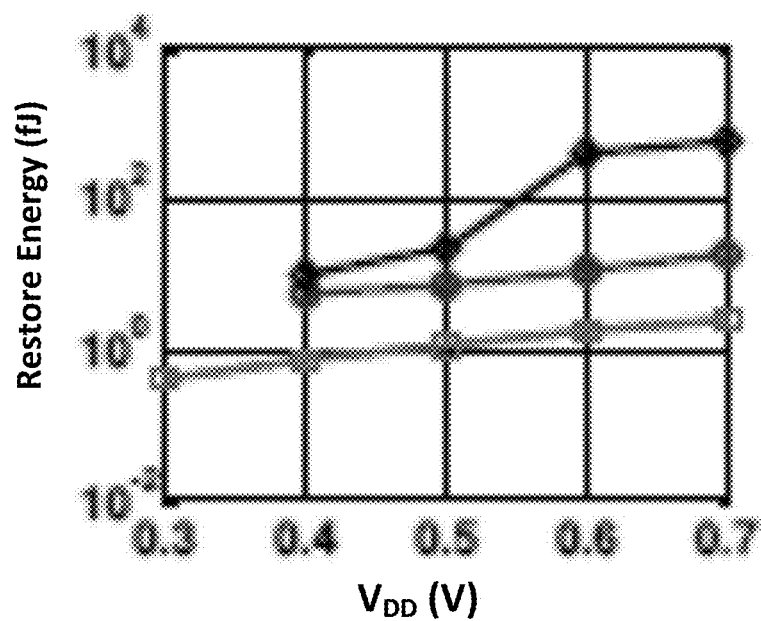

It is contemplated that for DFFs 120 used in practical applications, energy-delay performance would be critical because the DFF 120 would still operate with a steady supply for a large portion of time. Therefore, it is meaningful that the additional acquired non-volatility does not cause high energy-delay overheads. FIG. 16 shows these overheads over the baseline CMOS volatile DFF design. Due to the normally-OFF configuration of the backup and restore circuitry, the energy-delay product (EDP) overhead is lower than 2.1% for $V_{DD}$s above 0.4 V. If a larger-size baseline DFF is used, this EDP overhead becomes even more negligible, because the backup and restore circuitry does not need to be scaled up by the same ratio due to the low (high) OFF-state (ON-state) FeFET resistance. In addition, thanks to the normally-OFF configuration, the additional backup and restore operations have little impact on the DFF setup time and hold time requirement.

With semiconductor manufacturing, a process corner is a design-of-experiments technique that refers to a variation of fabrication parameters. Process corners represent the extremes of these parameter variations within which a circuit that has been etched onto the wafer must function correctly. A circuit running on devices fabricated at these process corners may run slower or faster than specified and at lower or higher temperatures and voltages, but defining bounds of these variations provides a means to measure whether the circuit is able to function satisfactorily. In order to verify the robustness of a circuit design, corner lots can be fabricated (e.g., groups of wafers with process parameters adjusted according to extremes), and used for testing. Shmoo plots can be used to identify the boundary limit beyond which a device begins to fail. Corner-lot analysis can be an effective means of testing in digital electronics. The naming convention of the process corners includes identifying three process corners: 1) typical-typical (TT) process corner, the slow-slow (SS) process corner, and a fast-fast (FF) process corner. Existing nonvolatile memory and DFF designs suffer from the non-idealities of the nonvolatile storage devices inside, especially the variations and low resistance ratio between different states of resistive memory devices. In such approaches, the worst-corner devices often greatly limit the overall system performance. For example, write pulse duration for conventional devices is much longer than average to ensure high yield, resulting in high energy consumption. Therefore, it is important to analyze how the DFF 120 performs with FeFET variations.

FIGS. 10-15 demonstrate how embodiments of the DFF 120 behave with global $T_{FE}$ and $A_{FE}$ variations (all devices vary from the design target by the same amount). FIGS. 17-20 provide more scenarios and data analyses to account for local mismatches (i.e., the two FeFETs in one DFF 120 having different $T_{FE}$). In FIGS. 17-20, the curves with square indictors are for three sets of the DFF 120, where the results represent operating in a range of $V_{DD}$ with $T_{FE}$ diverting away from 6 nm by −10% to +5%. The curves with oval indicators are for conventional DFF devices. The curves with triangle indicators are for conventional iron capacitive (FeCap) DFF devices. These simulation results show that the major impact was on the backup latency in low $V_{DD}$ scenarios, while the impact on other metrics was comparatively much less significant than that brought by a different supply voltage. The impact of additional noise that causes a non-zero initial Q/QN voltage opposite to the desired value was also analyzed through comprehensive simulations. Noise up to 200 mV was fully tolerable for correct operations, even with the above mentioned local FeFET mismatches. Such unwanted initial charge at Q or QN will be quickly discharged by the restore branches. Proper timing, the low ON-state and high OFF-state resistance of the FeFETs at different polarization states enable this feature.

The kinetic coefficient ρ affects the polarization switching time significantly. Different practical kinetic coefficient values were adopted in the simulations to reflect different polarization switching times, as shown in Table 1.

TABLE 1

Performance Comparisons between DFF Designs

|  | Conventional device measured | Conventional device simulated | Conventional device simulated* | Embodiment of the disclosed DFF** |
|---|---|---|---|---|
| Tech. size | 130 nm | 710 nm | 180 nm | 10 nm |
| Voltage | 1.5 V | 1.0 V | 1.8 V | 0.3 V-0.8 V |
| Material | PZT Capacitive device | MJT | ReRAM | 6 nm HfO2, PZT P = 0.04, ρ = 0.10, ρ = 0.25 |
| $T_{Backup+Restore}$ | 2.67 μS | >10 μS | 1.3 μS | 277 pS, 583 pS, 1.29 pS |
| $E_{Backup+Restore}$ | 2.4 pJ | 382 fJ | 735 fJ | 1.38 fJ |
| Break-Even Time | / | 0.83 7 μS@25° C. | 1.47 mS | 55.9 nS |

*The results are for a conventional topology DFF of operating at 0.8 V supply (rise to 2.4 V for ReRAM write) for the shortest break-even time.
**Backup and restore performance in this table is simulated at 0.5 V supply.
MJT = multi-junction technology
ReRAM = resistive Random Access Memory The data in FIGS. 17-20 show a comparison of the backup and restore performance of the DFF 120 with conventional DFF designs. The graphs show that the DFF 120 exhibits more than 6.0× reduction in the restore energy and 30× reduction in the backup energy. The DFF 120 also performs better in backup latency, and significantly outperforms the others with more than 50% reduction in restore latency. In addition, the DFF 120 works with general DFFs based on master-slave latch topologies, which is superior to a design that only works when the baseline DFF has set/reset ports. During restore operations, conventional DFF designs could not fully eliminate the static current when the FeFET of that DFF was in the low-resistance state. The improvement with the DFF 120 stem from the deeply embedded logic-in-memory operation due to the simple circuit structure that can carry out the backup and restore operations in only one step without static current consumptions.

Table 1 also summarizes the DFF 120 overall performance in comparison with the conventional designs. One of the strongest advantages of the DFF 120 over conventional designs is the orders of magnitude lower energy for backup and restore operations. Such energy savings partly come from the capability of FeFETs 102 to operate effectively at a lower voltage. Two more important factors are: (a) the fundamentally different 3-terminal FeFET device operating in a novel cross-coupled circuitry that avoids static FeFET drain-source current during backup and restore operations; (b) FeFETs of a small size that can still ensure fast and robust operations with a high ON/OFF state resistance ratio even in the presence of significant local and global variations. In contrast, existing resistive memory elements in conventional DFF designs are continuously drawing current (because of their inherent two-terminal device feature) for a long period of time to ensure yield (because of required-write-time duration variations with a much lower resistance ratio). For capacitive nonvolatile memory devices, their power inefficiency arises from a complex access interface and a large capacitance value. The low-energy backup and restore operations in the DFF 120, however, enables higher-efficiency nonvolatile computing applications. For energy harvesting systems with an intermittent supply, the saved backup and restore energy could be used for computing, leading to more forward progress and higher quality of service (QoS). For general power-gating systems, the lower backup and restore energy leads to a shorter break-even time (BET) versus the leakage energy of an idle unit, indicating significant expansion of opportunity for energy savings from fine-grained power-gating.

As noted herein, FeFETs 102, exhibiting steep-switching capability at a low voltage and the associated benefits for implementing energy-efficient Boolean logic, can be exploited to generate embodiments of the B&R circuit 116 and/or embodiments of the DFF 120. Embodiments of the DFF 120 consumes negligible static current in backup and restore operations, and remains robust even with significant global and local ferroelectric material variations across a wide 0.3 V-0.8 V supply voltage range, allowing the DFF 120 to achieve energy-efficient and low-latency backup and restore operations. Embodiments of the DFF 120 can have an ultra-low energy-delay overhead, below 2.1% in normal operations, and can operate using the same voltage supply as the Boolean logic elements with which it connects. This can facilitate energy-efficient nonvolatile computing in energy-harvesting and power-gating applications.

Embodiments of the NVM device 100 can be configured as a latch 118, 122. For example, any of the slave latches 118 and/or master latches 122 can include an embodiment of the FeFET 102 to provide an embedded logic-in-memory operation (i.e., an intrinsic nonvolatile area-efficient latch). Embodiments of the latch 118, 122 can be used to provide an improved DFF 120.

For example, conventional on-chip state backup solutions for DFF have a bottleneck of significant energy and/or latency penalties that can limit overall energy efficiency and computing progress. In addition, existing techniques generally rely on external controls that can limit compatibility and increases system complexity. Accordingly, advancements in nonvolatile computing can be achieved by use of an embodiment of an intrinsic nonvolatile area-efficient latch 118, 122 and/or DFF 120. Some embodiments of the latch 118, 122 and/or DFF 120 can be designed using embodiments of the FeFET 102. Some embodiments of the NVM device 100 using an embodiment of the latch 118, 122 and/or an embodiment of the DFF 102 can operate to consume fJ-level energy and ns-level intrinsic latency for a backup plus restore operation (e.g., 2.4 fJ in energy and 1.1 ns in time for a DFF 120 with a supply power of 0.80V).

Figure 21:
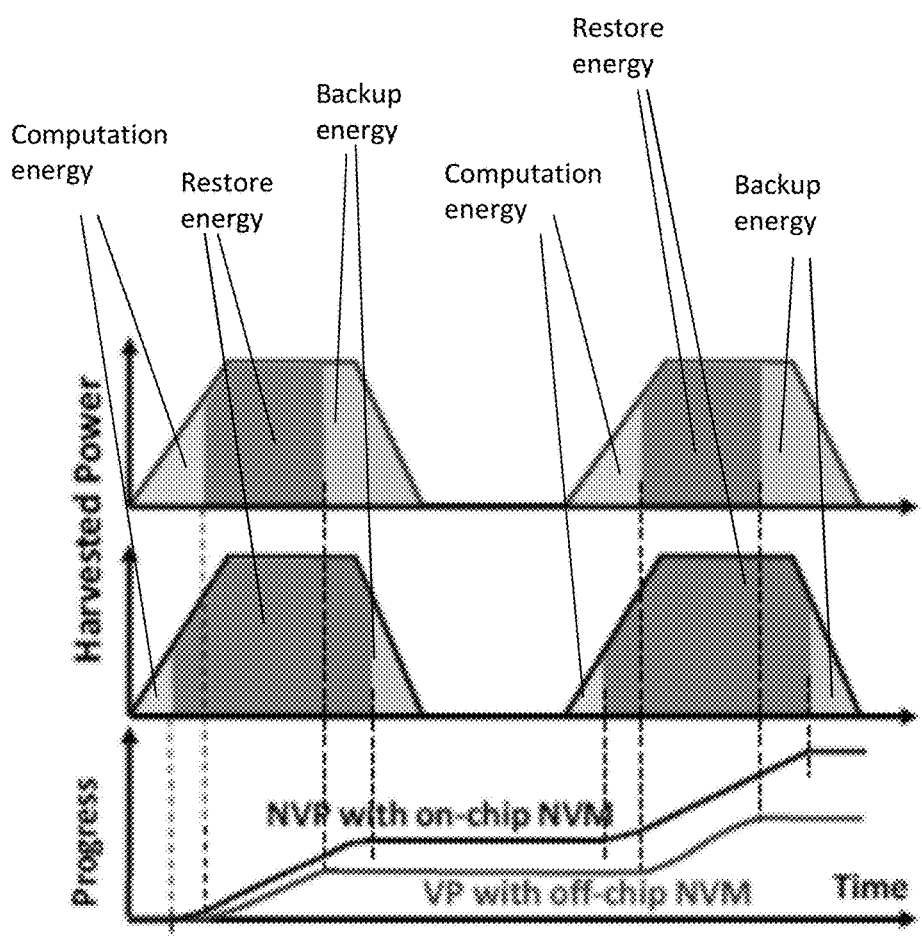
FIG. 21 is a graph showing a sample of power income versus time for a typical VLSI computing system for computation energy, restore energy, and backup energy.
Figure 22:
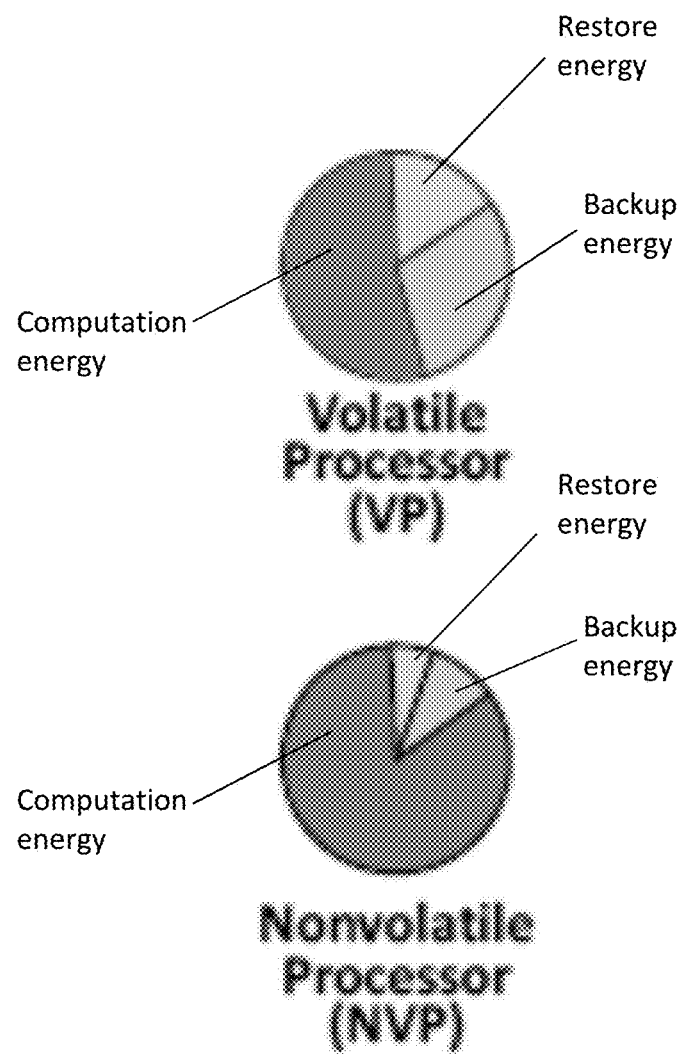
FIG. 22 is a graph showing energy harvesting utilization for a conventional volatile processor and a non-volatile processor.

Scheduled power-gating of very large scale integration (VLSI) computing systems has been widely adopted in both low-power portable devices and high-performance cloud server centers to cut off static leakage power. With such systems states of the registers and flip-flops in the pipelining logic should be backed up to prevent loss of computation status if the supply is removed. Similarly, mandatory state backup and restore operations can be required for battery-less portable devices powered by energy-harvesting techniques. This is because the ambient energy sources, such as vibration, photovoltaics, and radio, are essentially intermittent even with sophisticated design methods. FIG. 21 shows a sample of power income versus time for a typical VLSI computing system for computation energy, restore energy, and backup energy. The power outage failures have a strong impact on the computation progress and the overall energy efficiency of IoT computing. On the one hand, the computing system will lose its computation states if these states are not successfully backed up before the power failure. With conventional systems, even when techniques of check-pointing are applied to reduce the chance of progress loss, significant overheads of energy and latency still exist for each backup and restore operation. (See FIG. 22). If the backup data are stored into out-of-chip nonvolatile memory, huge energy and latency are noticeable, mainly caused by the long-distance data transmission and constrained parallelism. It is also noted that, although a larger energy storage capacitor buffer can be used to smooth the power trace, it cannot reduce the amount of energy for each backup or restore operation. A larger capacitor also results in larger leakage current and more accumulating time to respond till it reaches an appropriate voltage level for supply regulation.

Figure 23:
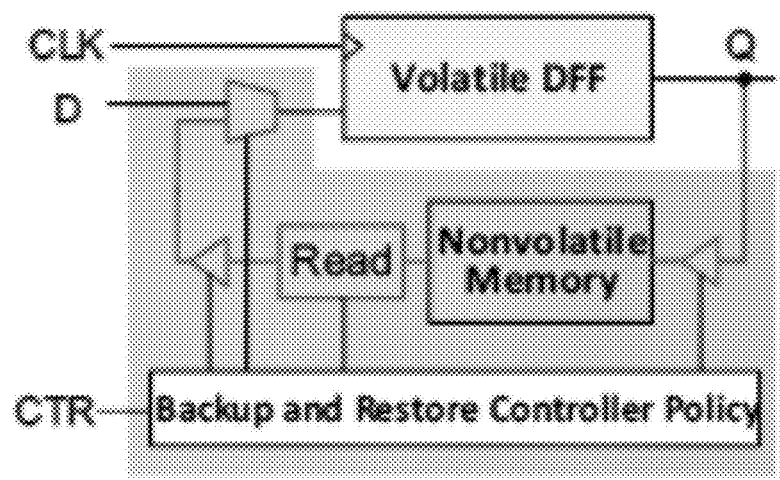
FIG. 23 is an exemplary schematic showing a set up for a conventional DFF device.

Embedding nonvolatile memory (NVM) into the same chip can improve nonvolatile processing (NVP) by generated a DFF 120 configured to back up the computation states of each DFF into a local on-chip NVM. Table 2 summarizes some existing DFF designs based on ferroelectric capacitor devices, MTJ devices, ReRAM devices, and compares the pros and cons against an embodiment of the DFF 120. If distributed NVM cells and interface circuitry are placed close to each DFF to build a nonvolatile DFF for local parallel backup, as illustrated in FIG. 23, the backup/restore operation will be much faster but still consume high energy because of the duplicated interface circuit between the DFF and NVM cells. The high current one nonvolatile DFF backup/restore operation also limits the plausible parallelism.

TABLE 2

Performance Comparison of Conventional DFF Designs to an Embodiment of an Intrinsic Nonvolatile Area-efficient DFF Device

| | Conventional DFF Devices | | | | | Embodiment of the DFF |
|---|---|---|---|---|---|---|
| Year | 2014 | 2014 | 2014 | 2013 | 2016 | 2018 |
| Feature size | 130 nm | 130 nm | 45 nm | 180 nm | 10 nm | 10 nm |
| Nonvolatile material | PZT Capacitor | PZT Capacitor | MTJ | Al/TiO$_2$/Al ReRAM | NCFET with HfO$_2$ and PZT | |
| Retention Time | 10 hours to 10 years; varying by design | | ~10 years | ~10 years | Same as PZT capacitor in theory | |
| Endurance | Varying by material; possibly >10$_{15}$ | | >10$^{15}$ | 10$^5$-10$^{10}$; 10$^{15}$ by 2014 | Same as PZT capacitor in theory | |
| Voltage | 1.5 V | 1.5 V | 1.1 V | 1.8 V | 0.4 V-0.8 V | 0.4 V-1.0 V |
| Area overhead | 64% | 49% | -2% | — | -35% | 25% more transistors |
| Backup time | 1.64 μs | 2.22 μs | 909 ps | 10 ns @2.4 V | 1.4 ns @0.5 V | 1.0 ns @0.8 V |
| Restore time | 1.25 μs | 2.2 μs | 177 ps | 1.3 μs @0.4 V | 75 ps @0.5 V | 56 ps @0.8 V |
| Backup energy | 2.4 pJ | 3.44 pJ in total | 82.2 fJ | 735 fJ | 7.0 fJ @0.5 V | 1.3 fJ @0.8 V |
| Restore energy | 2.34 pJ | | — | 735 fJ | 9.0 fJ @0.5 V | 1.1 fJ @0.8 V |
| Additional Control | Needed | Needed | Needed | Needed | Needed | Not Needed |

In addition, backup and restore control for distributed NV-DFFs can require additional wiring with more area and energy consumption. In addition, the processor architecture and the software needed to adapt to the control limits the compatibility of existing software and makes the operating system or processor design complicated. Furthermore, a backup triggered too early or too late will waste energy that could otherwise be saved, or result in a backup failure and rolling back in progress. These problems with conventional DFF devices are exacerbated due to the inherent nature of intermittency and unpredictability in ambient power sources.

Figure 24:
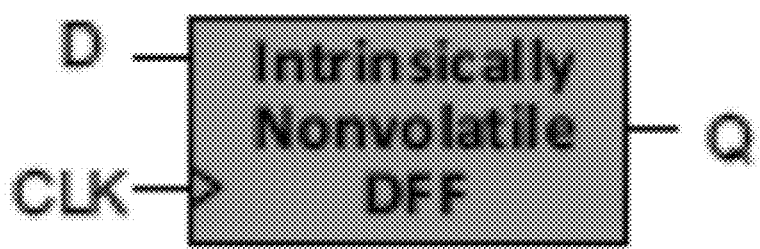
FIG. 24 is an exemplary schematic showing an exemplary set up for an embodiment of an intrinsic nonvolatile area-efficient DFF device.

As will be explained in detail, embodiments of the latches 118, 122 and DFFs 120 disclosed herein can be configured to have only a few extra transistors added to a conventional CMOS design, leading to a compact cell design. No additional circuitry or a different supply voltage is needed for sensing or driving functions, as would otherwise be necessary for conventional DFFs. In addition, embodiments of the latches 118, 122 and DFFs 120 can be free from external backup and restore controls because all backup and restore operations are carried out autonomously. This can improve compatibility and reduce complexity of existing logic designs with drop-in replacement of latches and DFFs, as shown in FIG. 24. Obviating external controls can significantly reduce the control overhead for check-pointing and power-gating.

Embodiments of the disclosed latches 118, 122 and DFFs 120 can be fast and energy-efficient, with similar delay and energy consumption to conventional volatile designs under a stable supply. Typical energy and latency for a backup plus restore operation are only at levels of fJ and ns, respectively. Note that the restore time also depends on the supply voltage recovery time. The operations could be even faster with kinetic coefficient improvement in the FeFET 102. With such a low energy and delay overhead, the utilization of harvested energy for the purpose of computing can be significantly improved. For the same reason, check-pointing and power-gating can be carried out in fine grain as needed with significantly reduced energy and delay penalties.

Figure 25:
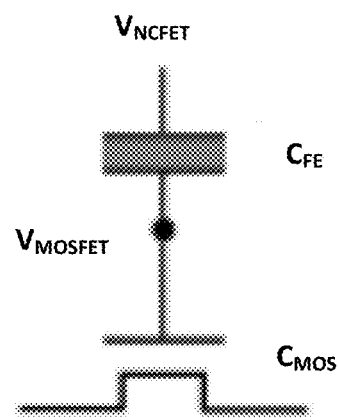
FIG. 25 is an exemplary schematic showing an exemplary schematic for an embodiment of an N-type FeFET.
Figure 26:
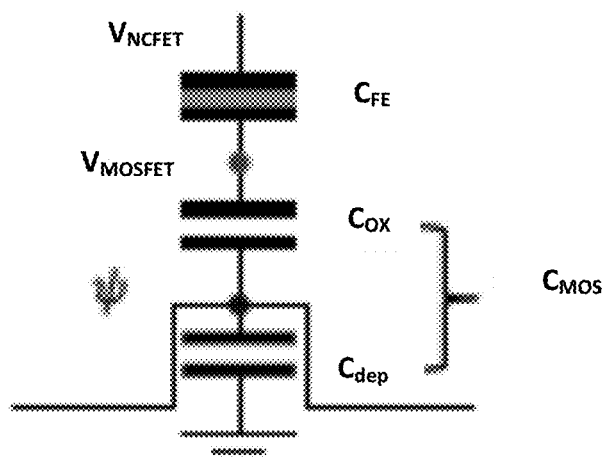
FIG. 26 is an exemplary schematic showing an exemplary schematic for a capacitance network of an embodiment of an N-type FeFET.
Figure 27:
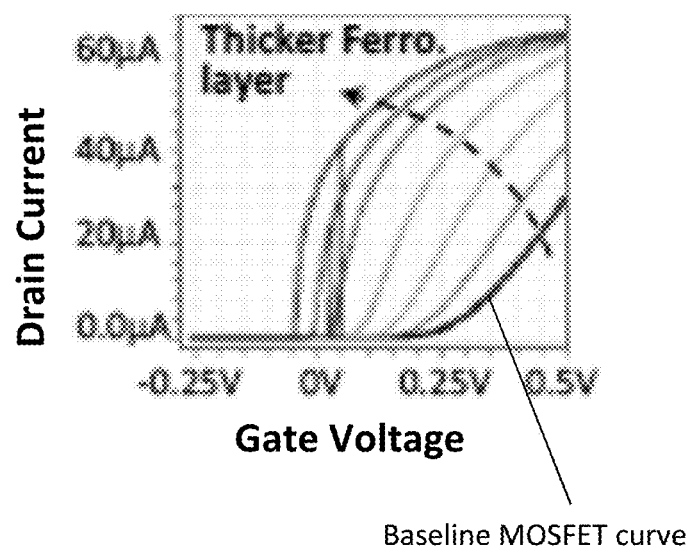
FIG. 27 is a graph showing $I_{DS}$-$V_G$ curves demonstrating steep-switching and hysteresis with the baseline MOSFET curve.
Figure 28:
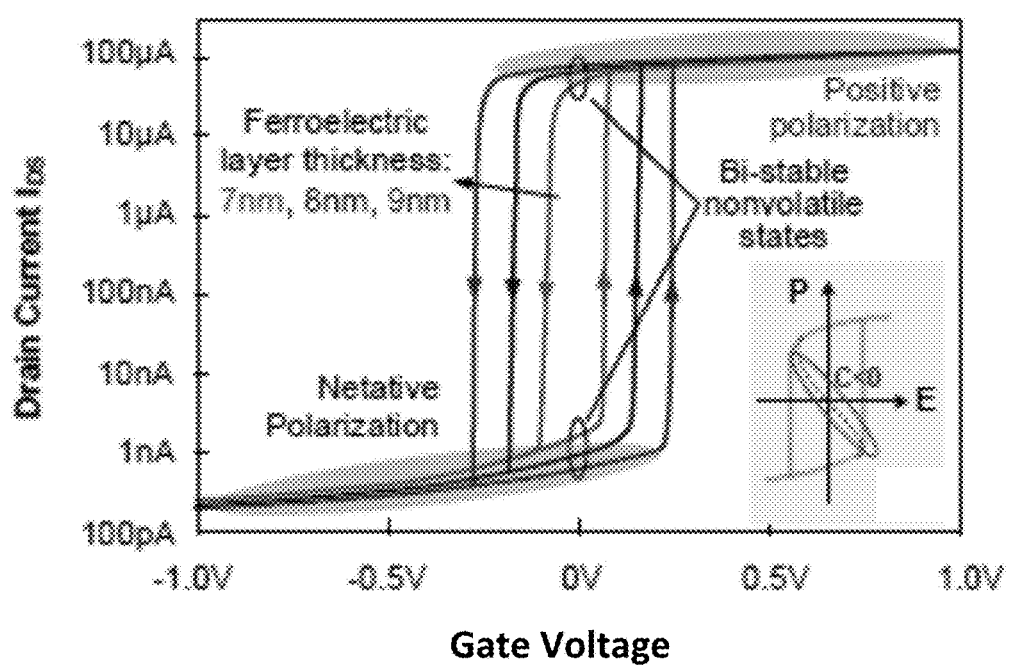
FIG. 28 is a graph showing the effect of tuning ferroelectric negative capacitance of an embodiment of a FeFET.

Many ferroelectric materials, such as PbTiO, BaTiO, Pb(ZrTi)O, HfZrO, etc., can be used to generate an embodiment of the FeFET 102. FIGS. 25-27 illustrates a simplified concept for an embodiment of the FeFET 102 with the negative capacitor connected to the internal MOSFET gate capacitor. One interesting phenomenon that fits well with Boolean logic computation is the boosted voltage change $\Delta V_{MOSFET}$ at the internal MOSFET gate induced by an external FeFET gate voltage change $\Delta V_{NCFET}$ with $|C_{FE}|>C_{MOS}$, in which $C_{FE}$ and $C_{MOS}$ represent the ferroelectric negative capacitance and the MOSFET gate capacitance, respectively. The voltage gain at the internal MOSFET gate over the overall applied NCFET gate voltage could be approximated by $G=\Delta V_{MOSFET}/\Delta V_{NCFET}=C_{FE}/(C_{FE}+C_{MOS})=|C_{FE}|/|(C_{FE}|-C_{MOS})>1$. This indicates a steep switching that enables a lower supply to achieve the same ON-OFF ratio, as shown in FIG. 27. Tuning $C_{FE}$, so that $|C_{FE}|<C_{MOS}$ within some voltage range, the hysteresis loop in the $I_{DS}$-$V_{GS}$ can be made to expand to the negative $V_{GS}$ range. (See FIG. 28). The mechanism behind this is the polarization P versus electric-field E hysteresis of the ferroelectric capacitor shown FIG. 28. The charge $Q_{FE}$ of the ferroelectric capacitor is a function of E and P in the way of $Q_{FE}=\varepsilon E+P$, where $\varepsilon$ is the permittivity of the vacuum, and P is typically $>>\varepsilon E$. The switching of P is electrically determined by E and a switching occurs when the applied voltage exceeds the coercive voltage. Before the polarization switching occurs, $C_{FE}$ is positive. As $V_{NCFET}$ increases from 0V to close to the IDS-VGS rising edge, the voltage across the ferroelectric material $V_{FE}$ increases from the initial value of 0 to close to the coercive voltage. As $V_{NCFET}$ further increases, $V_{FE}$ steps beyond the coercive voltage, and $C_{FE}$ becomes negative, leading to the unstable negative total series capacitance of $C_{FE}$ and $C_{MOS}$ that triggers a very steep switching of $I_{DS}$ until $C_{FE}$ settles to be positive again. The outbound trip is similar. In both outbound and inbound curves away from the switching edges, a relatively flat $I_{DS}$-$V_{GS}$ may be observed if $C_{FE}$ (being positive in this region) is much smaller than $C_{MOS}$, because $\Delta V_{MOS}=\Delta V_{NCFET}\times C_{FE}/(C_{FE}+C_{MOS})\approx 0$. Such a hysteresis feature covering $V_{GS}=0V$ indicates a stable remnant polarization when power is removed. Actually, a zero-polarization of the ferroelectric material is not stable as the free energy is not the lowest. It is also noted that the hysteresis width is a function of the dynamics of both $C_{FE}$ and $C_{MOS}$, and could be typically tuned by varying the ferroelectric layer thickness, as observed in FIGS. 27 and 28.

Figure 29:
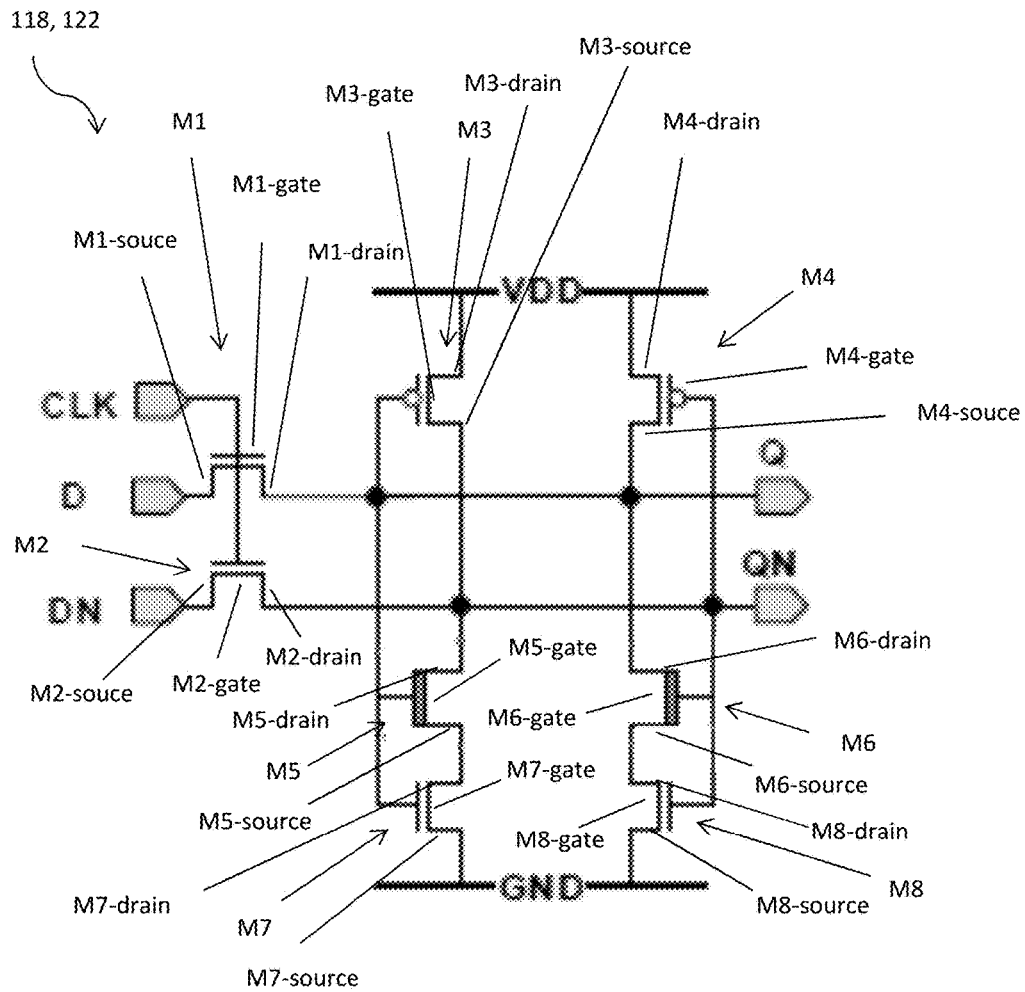
FIG. 29 is an exemplary schematic showing an embodiment of a slave latch configured with a differential-driving input pair D/DN using N-type FeFETs.

Referring to FIG. 29, in at least one embodiment, the latch can be configured as a latch 118, 120 that may be used to form an embodiment of a DFF 120. In one embodiment, the latch 118, 122 can be configured with a differential-driving input pair D/DN, as shown in FIG. 29. The latch 118, 122 can have a first transistor, $M_1$. $M_1$ can have an $M_1$-source, an $M_1$-gate, and an $M_1$-drain. The latch 118, 122 can have a second transistor, $M_2$. $M_2$ can have an $M_2$-source, an $M_2$-gate, and an $M_2$-drain. The latch 118, 122 can have a third transistor, $M_3$. $M_3$ can have an $M_3$-source, an $M_3$-gate, and an $M_3$-drain. The latch 118, 122 can have a fourth transistor, $M_4$. $M_4$ can have an $M_4$-source, an $M_4$-gate, and an $M_4$-drain. The slave latch 118 can have a fifth transistor, $M_5$. $M_5$ can have an $M_5$-source, an $M_5$-gate, and an $M_5$-drain. The latch 118, 122 can have a sixth transistor, $M_6$. $M_6$ can have an $M_6$-source, an $M_6$-gate, and an $M_6$-drain. The latch 118, 122 can have a seventh transistor, $M_7$. $M_7$ can have an $M_7$-source, an $M_7$-gate, and an $M_7$-drain. The latch 118, 122 can have an eighth transistor, $M_8$. $M_8$ can have an $M_8$-source, an $M_8$-gate, and an $M_8$-drain. Any one or combination of the transistors of the slave latch 118 can be a metal oxide semiconductor field effect transistor (MOSFET) or a FeFET 102.

In at least one embodiment, $M_1$, $M_2$, $M_3$, $M_4$, $M_7$, and $M_8$ are MOSFETs. In at least one embodiment, $M_5$ and $M_6$ are FeFETs 102. $M_1$-drain can be connected to $M_3$-gate, $M_3$-source, $M_4$-source, $M_4$-gate, data output Q, $M_2$-drain, $M_5$-gate, $M_7$-gate, $M_5$-drain, data output QN, $M_6$-drain, $M_6$-gate, and $M_8$-gate. $M_1$-gate can be connected to a clock driver CLK. $M_1$-source can be connected to a data input D. $M_2$-drain can be connected to $M_3$-gate, $M_3$-source, $M_4$-source, $M_4$-gate, data output Q, $M_1$-drain, $M_5$-gate, $M_7$-gate, $M_5$-drain, data output QN, $M_6$-drain, $M_6$-gate, and $M_8$-gate. $M_2$-gate can be connected to $M_1$-gate. $M_2$-source can be connected to a data input DN. $M_3$-drain can be connected to a voltage supply $V_{DD}$. $M_3$-gate can be connected to $M_3$-source, $M_4$-source, $M_4$-gate, data output Q, $M_1$-drain, $M_2$-drain, $M_5$-gate, $M_7$-gate, $M_5$-drain, data output QN, $M_6$-drain, $M_6$-gate, and $M_8$-gate. $M_3$-source can be connected to $M_3$-gate, $M_4$-source, $M_4$-gate, data output Q, $M_1$-drain, $M_2$-drain, $M_5$-gate, $M_7$-gate, $M_5$-drain, data output QN, $M_6$-drain, $M_6$-gate, and $M_8$-gate. $M_4$-drain can be connected to $V_{DD}$. $M_4$-gate can be connected to $M_3$-source, $M_4$-source, $M_3$-gate, data output Q, $M_1$-drain, $M_2$-drain, $M_5$-gate, $M_7$-gate, $M_5$-drain, data output QN, $M_6$-drain, $M_6$-gate, and $M_8$-gate. $M_4$-source can be connected to $M_3$-source, $M_4$-gate, $M_3$-gate, data output Q, $M_1$-drain, $M_2$-drain, $M_5$-gate, $M_7$-gate, $M_5$-drain, data output QN, $M_6$-drain, $M_6$-gate, and $M_8$-gate. $M_5$-drain can be connected to $M_4$-source, $M_3$-source, $M_4$-gate, $M_3$-gate, data output Q, $M_1$-drain, $M_2$-drain, $M_5$-gate, $M_7$-gate, $M_5$-drain, data output QN, $M_6$-drain, $M_6$-gate, and $M_8$-gate. $M_5$-gate can be connected to $M_4$-source, $M_3$-source, $M_4$-gate, $M_3$-gate, data output Q, $M_1$-drain, $M_2$-drain, $M_5$-drain, $M_7$-gate, $M_5$-drain, data output QN, $M_6$-drain, $M_6$-gate, and $M_8$-gate. $M_5$-source can be connected to $M_7$-drain. $M_6$-drain can be connected to $M_4$-source, $M_3$-source, $M_4$-gate, $M_3$-gate, data output Q, $M_1$-drain, $M_2$-drain, $M_5$-gate, $M_7$-gate, $M_5$-drain, data output QN, $M_5$-drain, $M_6$-gate, and $M_8$-gate. $M_6$-gate can be connected to $M_4$-source, $M_3$-source, $M_4$-gate, $M_3$-gate, data output Q, $M_1$-drain, $M_2$-drain, $M_5$-gate, $M_7$-gate, $M_5$-drain, data output QN, $M_5$-drain, $M_6$-drain, and $M_8$-gate. $M_6$-source can be connected to $M_8$-drain. $M_7$-drain can be connected to $M_5$-source. $M_7$-gate can be connected to $M_6$-gate, $M_4$-source, $M_3$-source, $M_4$-gate, $M_3$-gate, data output Q, $M_1$-drain, $M_2$-drain, $M_5$-gate, $M_5$-drain, data output QN, $M_5$-drain, $M_6$-drain, and $M_8$-gate. $M_7$-source can be connected to GND. $M_8$-drain can be connected to $M_6$-source. $M_8$-gate can be connected to $M_7$-gate, $M_6$-gate, $M_4$-source, $M_3$-source, $M_4$-gate, $M_3$-gate, data output Q, $M_1$-drain, $M_2$-drain, $M_5$-gate, $M_5$-drain, data output QN, $M_5$-drain, and $M_6$-drain. $M_8$-source can be connected to GND.

Figure 30:
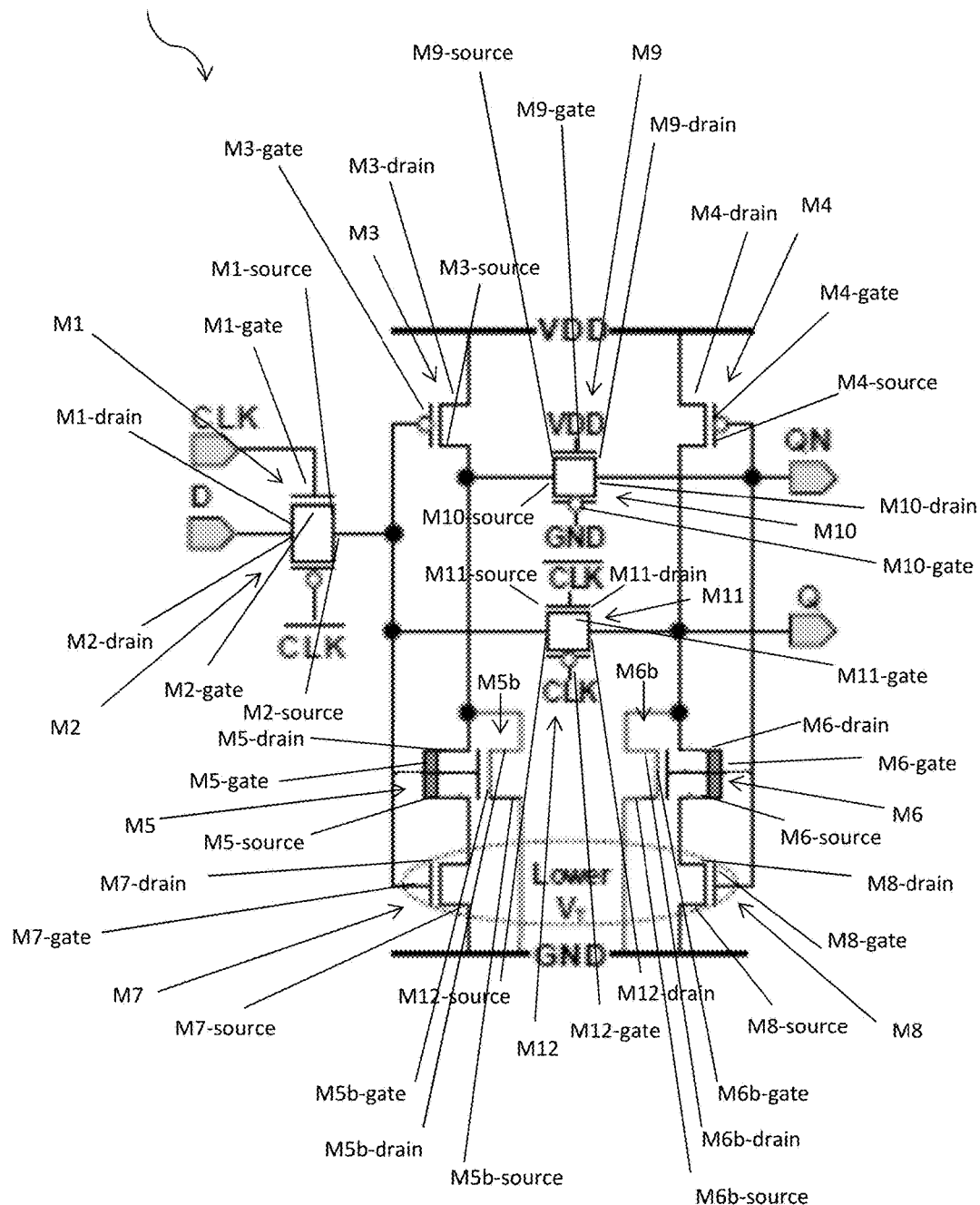
FIG. 30 is an exemplary schematic showing an embodiment of a slave latch configured with a driving input D.

Referring to FIG. 30, in at least one embodiment, the latch 118, 122 can be configured as a latch 118, 122 that may be used to form an embodiment of a DFF 120. The latch 118, 122 can be configured with an input D, as shown in FIG. 30. With the topology of FIG. 30, $M_7$ and $M_8$ can have a lower $V_{TH}$ for higher yield. The latch 118, 122 can have a first transistor, $M_1$. $M_1$ can have an $M_1$-source, an $M_1$-gate, and an $M_1$-drain. The latch 118, 122 can have a second transistor, $M_2$. $M_2$ can have an $M_2$-source, an $M_2$-gate, and an $M_2$-drain. The latch 118, 122 can have a third transistor, $M_3$. $M_3$ can have an $M_3$-source, an $M_3$-gate, and an $M_3$-drain. The latch 118, 122 can have a fourth transistor, $M_4$. $M_4$ can have an $M_4$-source, an $M_4$-gate, and an $M_4$-drain. The latch 118, 122 can have a fifth transistor, $M_5$. $M_5$ can have an $M_5$-source, an $M_5$-gate, and an $M_5$-drain. The latch 118, 122 can have a sixth transistor, $M_6$. $M_6$ can have an $M_6$-source, an $M_6$-gate, and an $M_6$-drain. The latch 118, 122 can have a seventh transistor, $M_7$. $M_7$ can have an $M_7$-source, an $M_7$-gate, and an $M_7$-drain. The latch 118, 122 can have an eighth transistor, $M_8$. $M_8$ can have an $M_8$-source, an $M_8$-gate, and an $M_8$-drain. The latch 118, 122 can have a ninth transistor, $M_9$. $M_9$ can have an $M_9$-source, an $M_9$-gate, and an $M_9$-drain. The latch 118, 120 can have a tenth transistor, $M_{10}$. $M_{10}$ can have an $M_{10}$-source, an $M_{10}$-gate, and an $M_{10}$-drain. The latch 118, 122 can have an eleventh transistor, $M_{11}$. $M_{11}$ can have an $M_{11}$-source, an $M_{11}$-gate, and an $M_{11}$-drain. The latch 118, 122 can have a twelfth transistor, $M_{12}$. $M_{12}$ can have an $M_{12}$-source, an $M_{12}$-gate, and an $M_{12}$-drain. The latch 118, 122 can have a thirteenth transistor, $M_{5b}$. $M_{5b}$ can have an $M_{5b}$-source, an $M_{5b}$-gate, and an $M_{5b}$-drain. The latch 118, 122 can have a fourteenth transistor, $M_{6b}$. $M_{6b}$ can have an $M_{6b}$-source, an $M_{6b}$-gate, and an $M_{6b}$-drain. Any one or combination of the transistors of the slave latch 118 can be a metal oxide semiconductor field effect transistor (MOSFET) or a FeFET 102.

In at least one embodiment, $M_1$, $M_2$, $M_3$, $M_4$, $M_7$, $M_8$, $M_9$, $M_{10}$, and $M_{11}$ are MOSFETs. In at least one embodiment, $M_5$ and $M_6$ are FeFETs 102. $M_1$-drain can be connected to $M_2$-drain and data input D. $M_1$-gate can be connected to a clock driver CLK. $M_1$-source can be connected to $M_2$-source, $M_3$-gate, $M_5$-gate, $M_7$-gate, $M_{11}$-source, $M_{12}$-source, $M_3$-source, $M_9$-source, $M_{10}$-source, $M_5$-drain, and $M_{5b}$-drain. $M_2$-drain can be connected to $M_1$-drain and data input D. $M_2$-gate can be connected to CLK. $M_2$-source can be connected to $M_1$-source, $M_3$-gate, $M_5$-gate, $M_7$-gate, $M_{11}$-source, $M_{12}$-source, $M_3$-source, $M_9$-source, $M_{10}$-source, $M_5$-drain, and $M_{5b}$-drain. $M_3$-drain can be connected to $V_{DD}$. $M_3$-gate can be connected to $M_1$-source, $M_2$-source, $M_5$-gate, $M_7$-gate, $M_{11}$-source, $M_{12}$-source, $M_3$-source, $M_9$-source, $M_{10}$-source, $M_5$-drain, and $M_{5b}$-drain. M3-source can be connected to $M_1$-source, $M_2$-source, $M_5$-gate, $M_7$-gate, $M_{11}$-source, $M_{12}$-source, $M_3$-gate, $M_9$-source, $M_{10}$-source, $M_5$-drain, and $M_{5b}$-drain. $M_4$-drain can be connected to $V_{DD}$. $M_4$-gate can be connected to data output QN, data output Q, $M_6$-gate, $M_8$-gate, $M_4$-source, $M_9$-drain, $M_{10}$-drain, $M_{11}$-drain, $M_{12}$-drain, $M_{6b}$-drain, and $M_6$-drain. $M_4$-source can be connected to data output QN, data output Q, $M_6$-gate, $M_8$-gate, $M_4$-gate, $M_9$-drain, $M_{10}$-drain, $M_{11}$-drain, $M_{12}$-drain, $M_{6b}$-drain, and $M_6$-drain. $M_5$-drain can be connected to $M_1$-source, $M_2$-source, $M_5$-gate, $M_7$-gate, $M_{11}$-source, $M_{12}$-source, $M_3$-source, $M_9$-source, $M_{10}$-source, and $M_{5b}$-drain. $M_5$-gate can be connected to $M_1$-source, $M_2$-source, $M_5$-drain, $M_7$-gate, $M_{11}$-source, $M_{12}$-source, $M_3$-source, $M_9$-source, $M_{10}$-source, $M_{5b}$-gate, and $M_{5b}$-drain. $M_5$-source can be connected to $M_7$-drain. $M_{5b}$-drain can be connected to $M_1$-source, $M_2$-source, $M_5$-gate, $M_7$-gate, $M_{11}$-source, $M_{12}$-source, $M_3$-source, $M_9$-source, $M_{10}$-source, and $M_5$-drain. $M_{5b}$-gate can be connected to $M_5$-gate. $M_{5b}$-source can be connected to GND. $M_6$-drain can be connected to data output QN, data output Q, $M_6$-gate, $M_8$-gate, $M_4$-source, $M_9$-drain, $M_{10}$-drain, $M_{11}$-drain, $M_{12}$-drain, $M_{6b}$-drain, and $M_4$-gate. $M_6$-gate can be connected to data output QN, data output Q, $M_6$-drain, $M_{6b}$-gate, $M_8$-gate, $M_4$-source, $M_9$-drain, $M_{10}$-drain, $M_{11}$-drain, $M_{12}$-drain, $M_{6b}$-drain, and $M_4$-gate. $M_6$-source can be connected to $M_8$-drain. $M_{6b}$-drain can be connected to data output QN, data output Q, $M_6$-gate, $M_8$-gate, $M_4$-source, $M_9$-drain, $M_{10}$-drain, $M_{11}$-drain, $M_{12}$-drain, $M_4$-gate, and $M_6$-drain. $M_{6b}$-gate can be connected to $M_6$-gate. $M_{6b}$-source can be connected to GND. $M_7$-drain can be connected to $M_5$-source. $M_7$-gate can be connected to $M_1$-source, $M_2$-source, $M_5$-gate, $M_5$-drain, $M_{11}$-source, $M_{12}$-source, $M_3$-source, $M_9$-source, $M_{10}$-source, and $M_{5b}$-drain. $M_7$-source can be connected to GND. $M_8$-drain can be connected to $M_6$-source. $M_8$-gate can be connected to data output QN, data output Q, $M_6$-gate, $M_4$-gate, $M_4$-source, $M_9$-drain, $M_{10}$-drain, $M_{11}$-drain, $M_{12}$-drain, $M_{6b}$-drain, and $M_6$-drain. $M_8$-source can be connected to GND. $M_9$-drain can be connected to data output QN, data output Q, $M_6$-gate, $M_8$-gate, $M_4$-source, $M_4$-gate, $M_{10}$-drain, $M_{11}$-drain, $M_{12}$-drain, $M_{6b}$-drain, and $M_6$-drain. $M_9$-gate can be connected to $V_{DD}$. $M_9$-source can be connected to $M_1$-source, $M_2$-source, $M_5$-gate, $M_7$-gate, $M_{11}$-source, $M_{12}$-source, $M_3$-source, $M_5$-drain, $M_{10}$-source, and $M_{5b}$-drain. $M_{10}$-drain can be connected to data output QN, data output Q, $M_6$-gate, $M_8$-gate, $M_4$-source, $M_9$-drain, $M_4$-gate, $M_{11}$-drain, $M_{12}$-drain, $M_{6b}$-drain, and $M_6$-drain. $M_{10}$-gate can be connected to GND. $M_{10}$-source can be connected to $M_1$-source, $M_2$-source, $M_5$-gate, $M_7$-gate, $M_{11}$-source, $M_{12}$-source, $M_3$-source, $M_9$-source, $M_5$-drain, and $M_{5b}$-drain. $M_{11}$-drain can be connected to data output QN, data output Q, $M_6$-gate, $M_8$-gate, $M_4$-source, $M_9$-drain, $M_{10}$-drain, $M_4$-gate, $M_{12}$-drain, $M_{6b}$-drain, and $M_6$-drain. $M_{11}$-gate can be connected to CLK. $M_{11}$-source can be connected to $M_1$-source, $M_2$-source, $M_5$-gate, $M_7$-gate, $M_5$-drain, $M_{12}$-source, $M_3$-source, $M_9$-source, $M_{10}$-source, and $M_{5b}$-drain. $M_{12}$-drain can be connected to data output QN, data output Q, $M_6$-gate, $M_8$-gate, $M_4$-source, $M_9$-drain, $M_{10}$-drain, $M_{11}$-drain, $M_4$-gate, $M_{6b}$-drain, and $M_6$-drain. $M_{12}$-gate can be connected to CLK. $M_{12}$-source can be connected to $M_1$-source, $M_2$-source, $M_5$-gate, $M_7$-gate, $M_{11}$-source, $M_5$-drain, $M_3$-source, $M_9$-source, $M_{10}$-source, and $M_{5b}$-drain.

Figure 31:
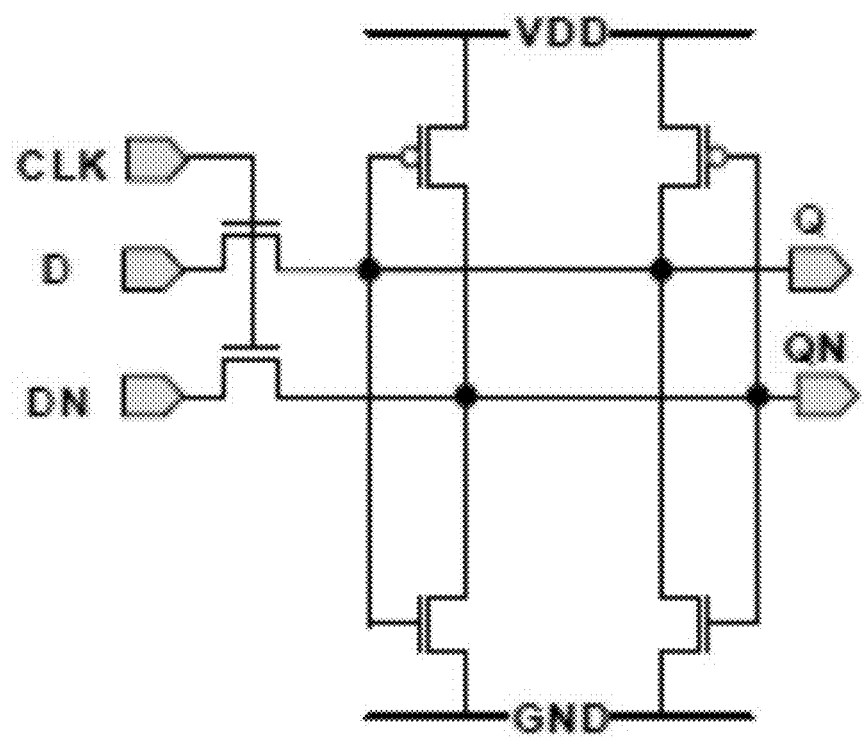
FIG. 31 is a conventional CMOS volatile latch that was used as a baseline to compare to the latch topology of FIG. 29.
Figure 32:
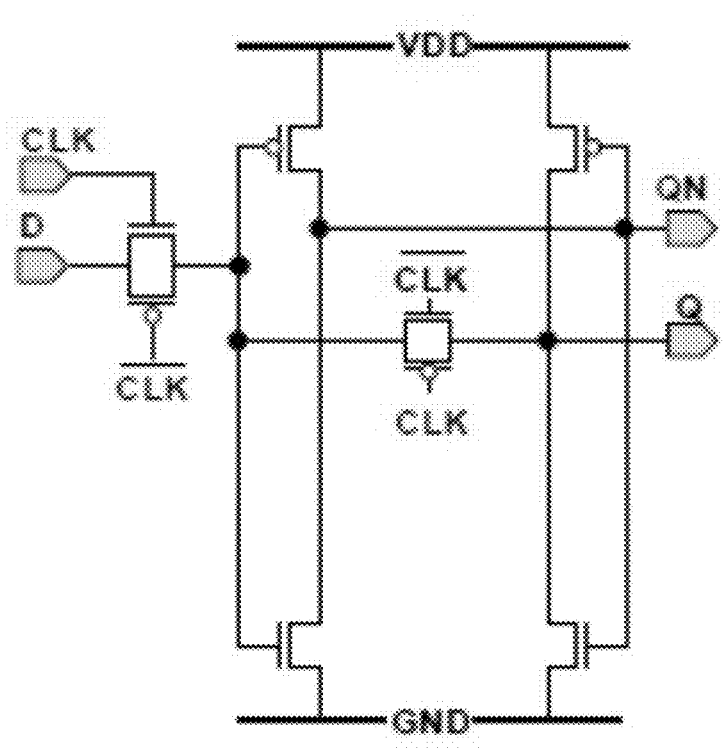
FIG. 32 is an exemplary schematic showing a conventional CMOS volatile latch that was used as a baseline to compare to the latch topology of FIG. 30.

FIG. 31 is a conventional CMOS volatile latch that was used as a baseline to compare to the latch topology of FIG. 29. FIG. 32 is a conventional CMOS volatile latch that was used as a baseline to compare to the latch topology of FIG. 30. As will be explained herein, the conventional volatile latches behave differently in area, energy per switching, delay, etc. When the power supply is steady, the logical transfer function for each of them is the same, as shown in Table 3. The latch 118, 122 of FIG. 29 has two extra N-type FeFETs over the CMOS counterpart design. Both latches are designed with sufficient input driving strength so as to overwrite the state by the input pair D/DN directly, when the clock signal CLK is high. When CLK is high, it connects the input differential signals D and DN to the output ports of Q and QN, respectively.

TABLE 3

Function Table for Latch Topologies of FIGS. 29-32

| Scenarios | Operations |
| --- | --- |
| VDD = '1'; CLK = '1' | Q follows D |
| VDD = '1'; CLK = '0' | Q holds |
| VDD = '0' | Q = 0 |
| VDD = '0'→'1'; CLK = '0' | Q restores to stored state (NV-Latch) |

Figure 33:
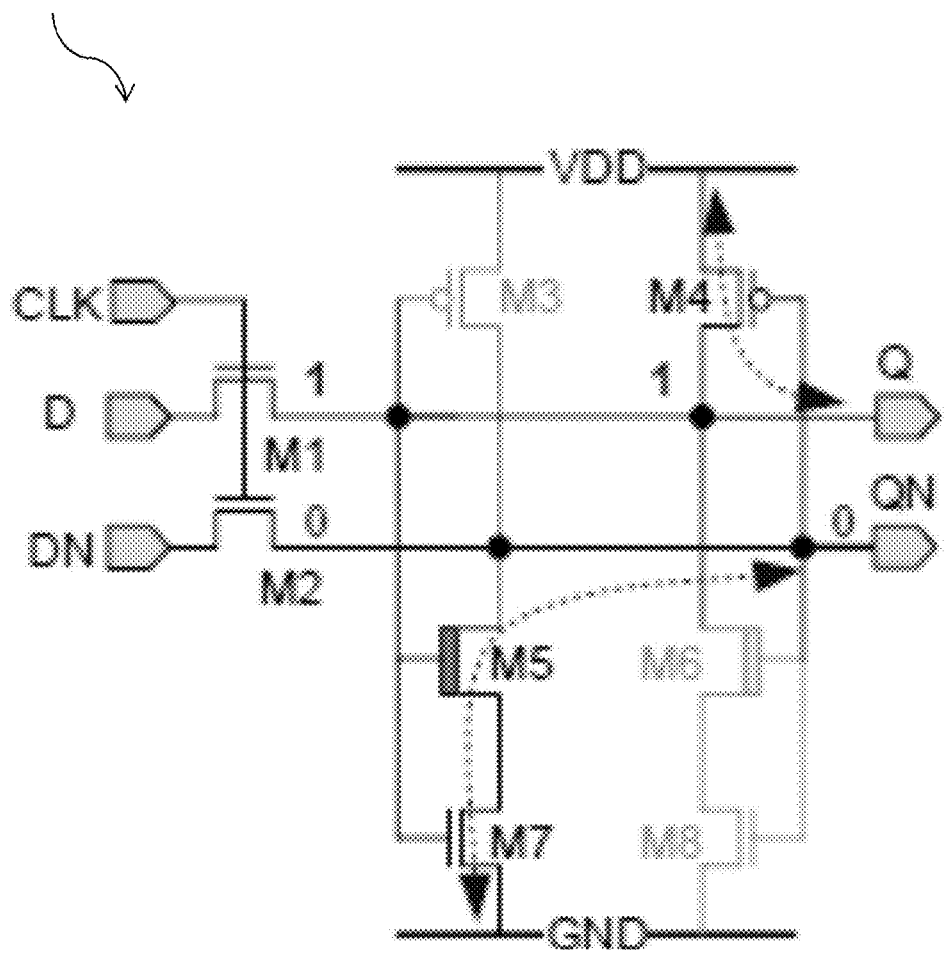
FIG. 33 is an exemplary schematic showing an exemplary steady state operation of the latch topology of FIG. 29.
Figure 34:
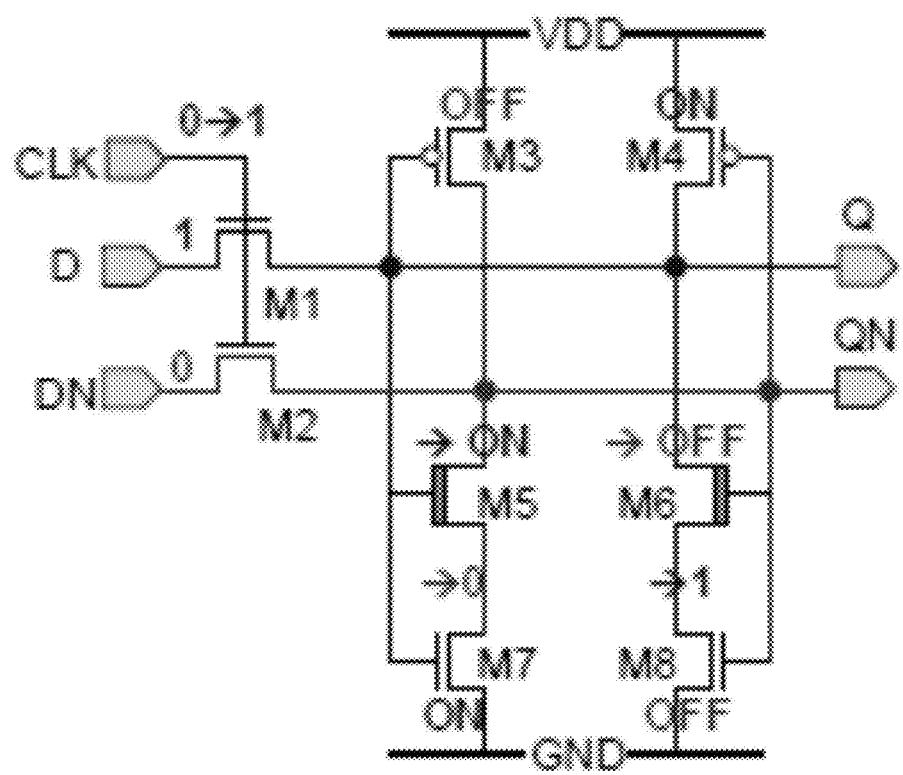
FIG. 34 is an exemplary schematic showing an exemplary transition state operation of the latch topology of FIG. 29.

FIG. 33 shows an exemplary steady state operation of the latch topology of FIG. 29 with CLK being high, using Q as logically '1' (representing $V_{DD}$ in voltage) and QN as logically '0' (representing GND in voltage). Controlled by Q or QN, $M_3$ and Mg are turned OFF, and $M_4$ and $M_7$ are turned ON. For $M_5$, its gate voltage is high, and the drain connecting to QN is low, its source is discharged to GND by $M_7$. As a result, $M_5$ is turned ON and stays at the positive polarization state with low drain-source resistance. For $M_6$, it stays OFF at the negative polarization state with high drain-source resistance. It is noted that, a low voltage of GND at QN will turn OFF $M_8$, and set $M_6$ as negatively polarized (high drain-source resistance): if $M_6$ was at a previous positive polarization (low drain-source resistance) state, $M_6$ source would be charged to Q, which is $V_{DD}$, by $M_6$. As a result, the drain-source voltage of $M_6$ becomes $-V_{DD}$. After that, $M_6$ will remain negative in its polarization even if its source node is slowly discharged by $M_8$.

Figure 35:
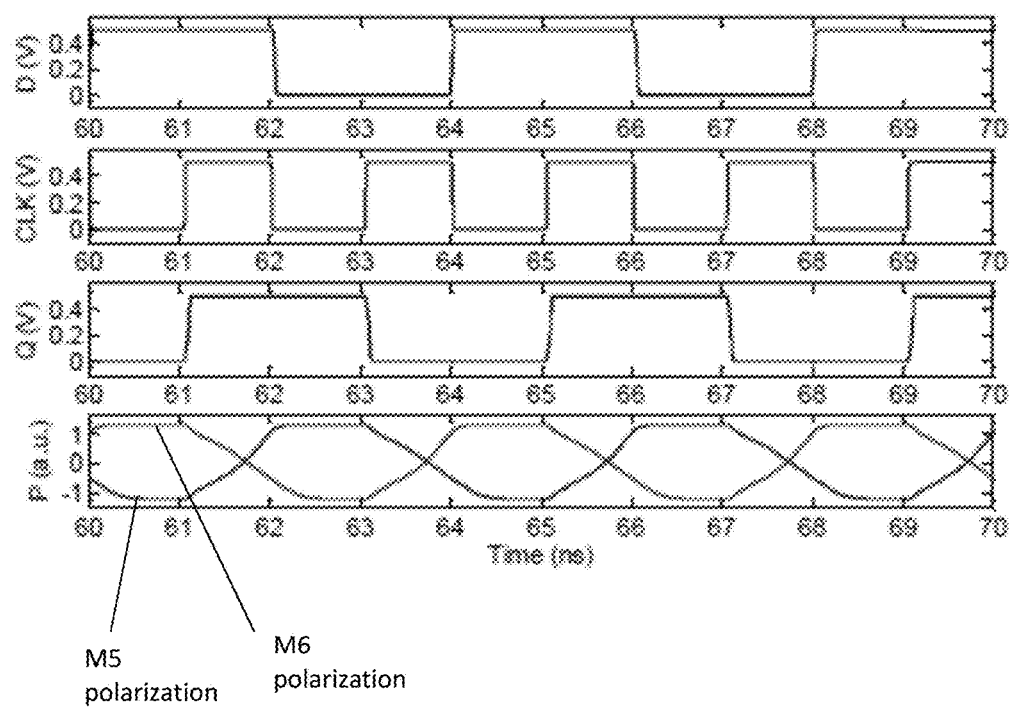
FIG. 35 is a graph showing transient waveforms for sample and hold operations with a steady supply for an embodiment of the latch.

FIG. 35 shows the transient waveforms for an embodiment of a latch topology shown in FIG. 29 for sample and hold operations with a steady supply. The last P plot indicates "polarization" of the $M_5$ and $M_6$. At time t1 around 61 ns, when the input D is steadily '1', the rising CLK turns ON the switches and the latch output Q switches from the previous state of '0' to follow the input D with '1', along with the observable polarization switching of $M_5$ and $M_6$. At time t2 around 62 ns, the clock CLK turns to '0' and the latch holds the state even if D changes. At time t3 around 62.5 ns, the polarization switching is accomplished and stays stable until the latch samples the next different input state.

Figure 36:
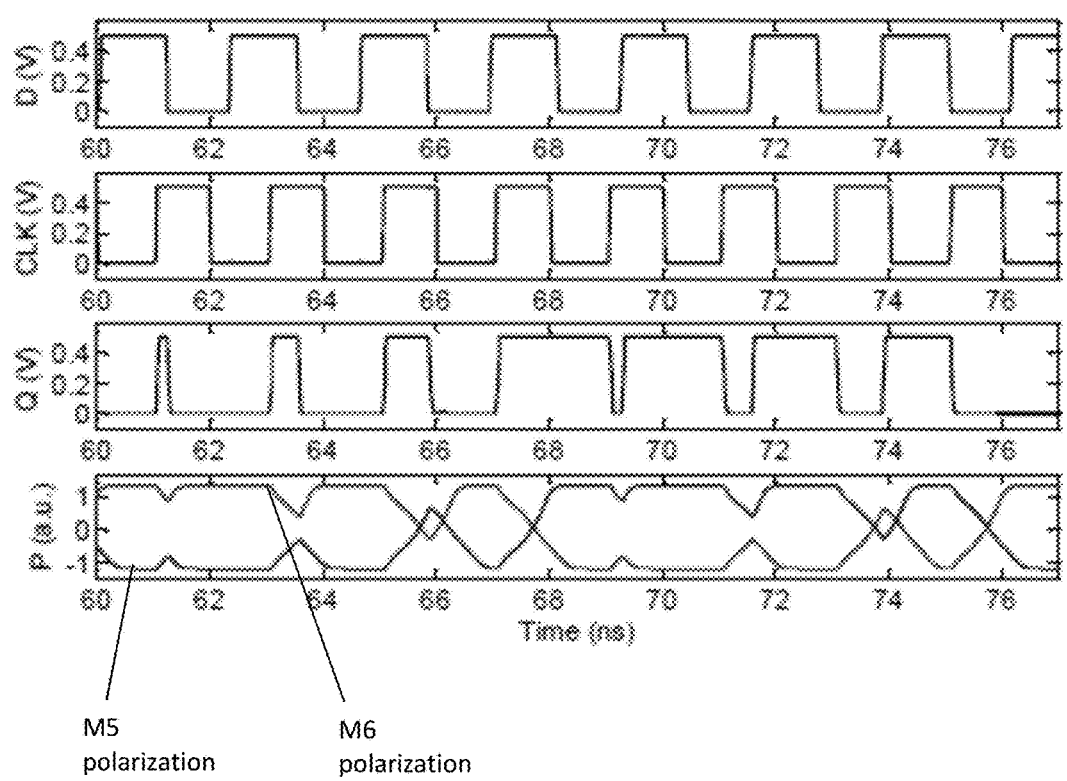
FIG. 36 is a graph showing the polarization switching progress for an embodiment of the latch with a higher data-rate.

In FIG. 35, all polarization switching could successfully finish before the next switching due to sufficient time window before the next switching event. In FIG. 36, with the given input pattern of D and CLK, the duration of the total time of Q to stay at the new state (i.e., '1' from 60 ns to 67 ns) is too short for the polarization switching to finish. FIG. 36 shows the polarization switching progress for an embodiment of the latch with a higher data-rate. The last P plot indicates "polarization" of $M_5$ M6 for an embodiment of a latch topology shown in FIG. 29. As can be seen from FIG. 36, none of them in this 7 ns period of time succeeds in switching the polarization state, until after 67 ns when Q stays at '1' for more than 0.5 nS. Such a phenomenon of a polarization switching speed being lower than the input data rate actually reveals the possibility of having a pseudo-floating '0' of Q at the latch output, with high resistance to $V_{DD}$ (with turned-OFF PMOS) and also medium-to-high resistance to GND (due to partially turned-OFF FeFET in series with a turned-on NMOS). Note that a psued-floating '1' does not exist because a Q output of '1' is always securely connected to $V_{DD}$ by the PMOS.

The pseudo-floating '0' has three major effects. First, functionality will stay correct with proper noise shielding. This is because a short period of ns in time of being pseudo-floating will not have the state corrupted if external coupling noise is properly isolated. For example, most standard embedded dynamic random access memory (DRAM) cells have a retention time of a few microseconds at the internal floating MOSFET gate. After the polarization switching finishes in the order of ns or sub-ns, this pseudo-floating '0' becomes a steady '0' connecting to GND. Second, endurance will improve. Although existing research has not yet found out a fundamental bottleneck in improving the endurance or aging effects of ferroelectric materials, existing ferroelectric materials degrade faster in terms of number of full-swing switching cycles than CMOS transistors. The way above of slower polarization switching helps to reduce the number of full-swing switching activities, which improves the endurance of FeFETs. Third, delay and energy performance may also improve. First, considering the conventional volatile CMOS latch in FIG. 31, in order to overwrite the previous '0' state of Q to be '1', the new input datum of '1' has to "fight" with the pulling down transistor in the latch. Such a racing condition causes significant power consumption until the switching completes. On the contrary, with the latch topology of FIG. 29, considering the pseudo-floating '0' Q due to the higher resistance from Q to GND through the not-fully-ON FeFET, overwriting this '0' to be '1' has less short current or racing conditions, which improves the speed and energy performance. It is also noted that, using a high threshold NMOS transistor could also mitigate the racing "fight" but could not provide equally low pull-down resistance after the polarization switching finishes.

Figure 37:
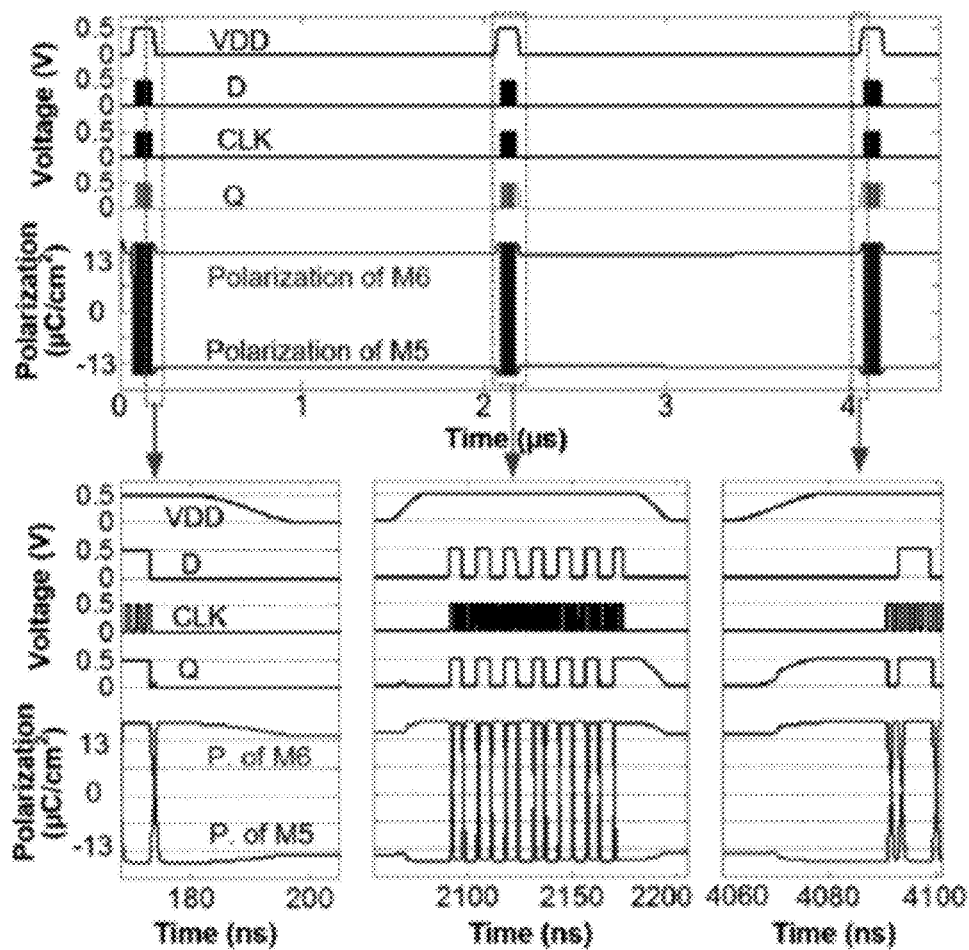
FIG. 37 is a graph showing transient waveforms with backup and restore operations due to power failures for an embodiment of the latch.

FIG. 37 shows the transient waveforms with backup and restore operations due to power failures for the latch topology of FIG. 29. At around 180 nS and 2,175 ns, backup of '0' and '1' is carried out, respectively; at around 2,100 ns and 4,080 ns, restore of '0' and '1' is observed, respectively. The simulation is accompanied with close to a 2 ns power-down window to mimic really field scenarios.

The latch topology shown in FIG. 29 utilizes N-type FeFETs 102. It is contemplated to use P-type FeFETs 102 (see FIG. 38), or both N-type FeFETs 102 and P-type FeFETs 102 (see FIG. 39). The operations of such latch topologies would be similar.

Figure 38:
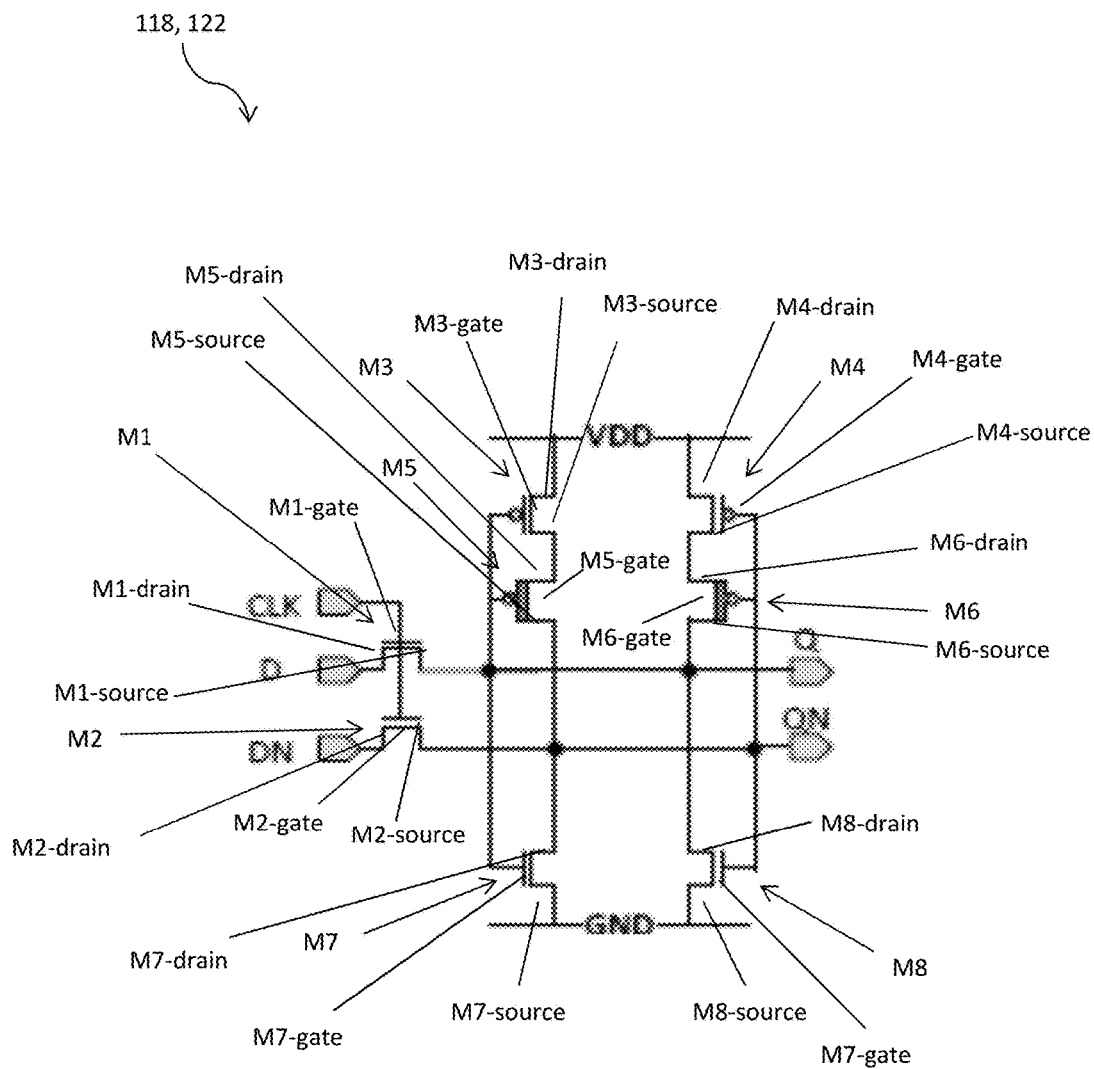
FIG. 38 is an exemplary schematic showing an embodiment of a slave latch configured with a differential-driving input pair D/DN using P-type FeFETs.

Referring to FIG. 38, the latch 118, 122 can have a first transistor, $M_1$. $M_1$ can have an $M_1$-source, an $M_1$-gate, and an $M_1$-drain. The latch 118, 122 can have a second transistor, $M_2$. $M_2$ can have an $M_2$-source, an $M_2$-gate, and an $M_2$-drain. The latch 118, 122 can have a third transistor, $M_3$. $M_3$ can have an $M_3$-source, an $M_3$-gate, and an $M_3$-drain. The latch 118, 122 can have a fourth transistor, $M_4$. $M_4$ can have an $M_4$-source, an $M_4$-gate, and an $M_4$-drain. The latch 118, 122 can have a fifth transistor, $M_5$. $M_5$ can have an $M_5$-source, an $M_5$-gate, and an $M_5$-drain. The latch 118, 122 can have a sixth transistor, $M_6$. $M_6$ can have an $M_6$-source, an $M_6$-gate, and an $M_6$-drain. The latch 118, 122 can have a seventh transistor, $M_7$. $M_7$ can have an $M_7$-source, an $M_7$-gate, and an $M_7$-drain. The latch 118, 122 can have an eighth transistor, $M_8$. $M_8$ can have an $M_8$-source, an $M_8$-gate, and an $M_8$-drain. Any one or combination of the transistors of the slave latch 118 can be a metal oxide semiconductor field effect transistor (MOSFET) or a FeFET 102.

In at least one embodiment, $M_1$, $M_2$, $M_3$, $M_4$, $M_7$, and $M_8$ are MOSFETs. In at least one embodiment, $M_5$ and $M_6$ are FeFETs 102. M1-drain can be connected to data input D. $M_1$-gate can be connected to CLK. $M_1$-source can be connected to $M_5$-gate, $M_3$-gate, $M_5$-source, $M_2$-source, $M_7$-gate, $M_7$-drain, data output Q, data output QN, $M_6$-source, $M_8$-drain, $M_8$-gate, $M_6$-gate, and $M_4$-gate. $M_2$-drain can be connected to data input DN. $M_2$-gate can be connected to $M_1$-gate. $M_2$-source can be connected to $M_5$-gate, $M_3$-gate, $M_5$-source, $M_1$-source, $M_7$-gate, $M_7$-drain, data output Q, data output QN, $M_6$-source, $M_8$-drain, $M_8$-gate, $M_6$-gate, and $M_4$-gate. $M_3$-drain can be connected to $V_{DD}$. $M_3$-gate can be connected to $M_5$-gate, $M_1$-source, $M_5$-source, $M_2$-source, $M_7$-gate, $M_7$-drain, data output Q, data output QN, $M_6$-source, $M_8$-drain, $M_8$-gate, $M_6$-gate, and $M_4$-gate. $M_3$-source can be connected to $M_5$-drain. $M_4$-drain can be connected to $V_{DD}$. $M_4$-gate can be connected to $M_5$-gate, $M_3$-gate, $M_5$-source, $M_2$-source, $M_7$-gate, $M_7$-drain, data output Q, data output QN, $M_6$-source, $M_8$-drain, $M_8$-gate, $M_6$-gate, and $M_1$-source. $M_4$-source can be connected to $M_6$-drain. $M_5$-drain can be connected to $M_3$-source. $M_5$-gate can be connected to $M_1$-source, $M_3$-gate, $M_5$-source, $M_2$-source, $M_7$-gate, $M_7$-drain, data output Q, data output QN, $M_6$-source, $M_8$-drain, $M_8$-gate, $M_6$-gate, and $M_4$-gate. $M_5$-source can be connected to $M_5$-gate, $M_3$-gate, $M_1$-source, $M_2$-source, $M_7$-gate, $M_7$-drain, data output Q, data output QN, $M_6$-source, $M_8$-drain, $M_8$-gate, $M_6$-gate, and $M_4$-gate. $M_6$-drain can be connected to $M_4$-source. $M_6$-gate can be connected to $M_5$-gate, $M_3$-gate, $M_5$-source, $M_2$-source, $M_7$-gate, $M_7$-drain, data output Q, data output QN, $M_6$-source, $M_8$-drain, $M_8$-gate, $M_1$-source, and $M_4$-gate. $M_6$-source can be connected to $M_5$-gate, $M_3$-gate, $M_5$-source, $M_2$-source, $M_7$-gate, $M_7$-drain, data output Q, data output QN, $M_1$-source, $M_8$-drain, $M_8$-gate, $M_6$-gate, and $M_4$-gate. $M_7$-drain can be connected to $M_5$-gate, $M_3$-gate, $M_5$-source, $M_2$-source, $M_7$-gate, $M_1$-source, data output Q, data output QN, $M_6$-source, $M_8$-drain, $M_8$-gate, $M_6$-gate, and $M_4$-gate. $M_7$-gate can be connected to $M_5$-gate, $M_3$-gate, $M_5$-source, $M_2$-source, $M_1$-source, $M_7$-drain, data output Q, data output QN, $M_6$-source, $M_8$-drain, $M_8$-gate, $M_6$-gate, and $M_4$-gate. $M_7$-source can be connected to GND. $M_8$-drain can be connected to $M_5$-gate, $M_3$-gate, $M_5$-source, $M_2$-source, $M_7$-gate, $M_7$-drain, data output Q, data output QN, $M_6$-source, $M_1$-source, $M_8$-gate, $M_6$-gate, and $M_4$-gate. $M_8$-gate can be connected to $M_5$-gate, $M_3$-gate, $M_5$-source, $M_2$-source, $M_7$-gate, $M_7$-drain, data output Q, data output QN, $M_6$-source, $M_8$-drain, $M_1$-source, $M_6$-gate, and $M_4$-gate. $M_8$-source can be connected to GND.

Figure 39:
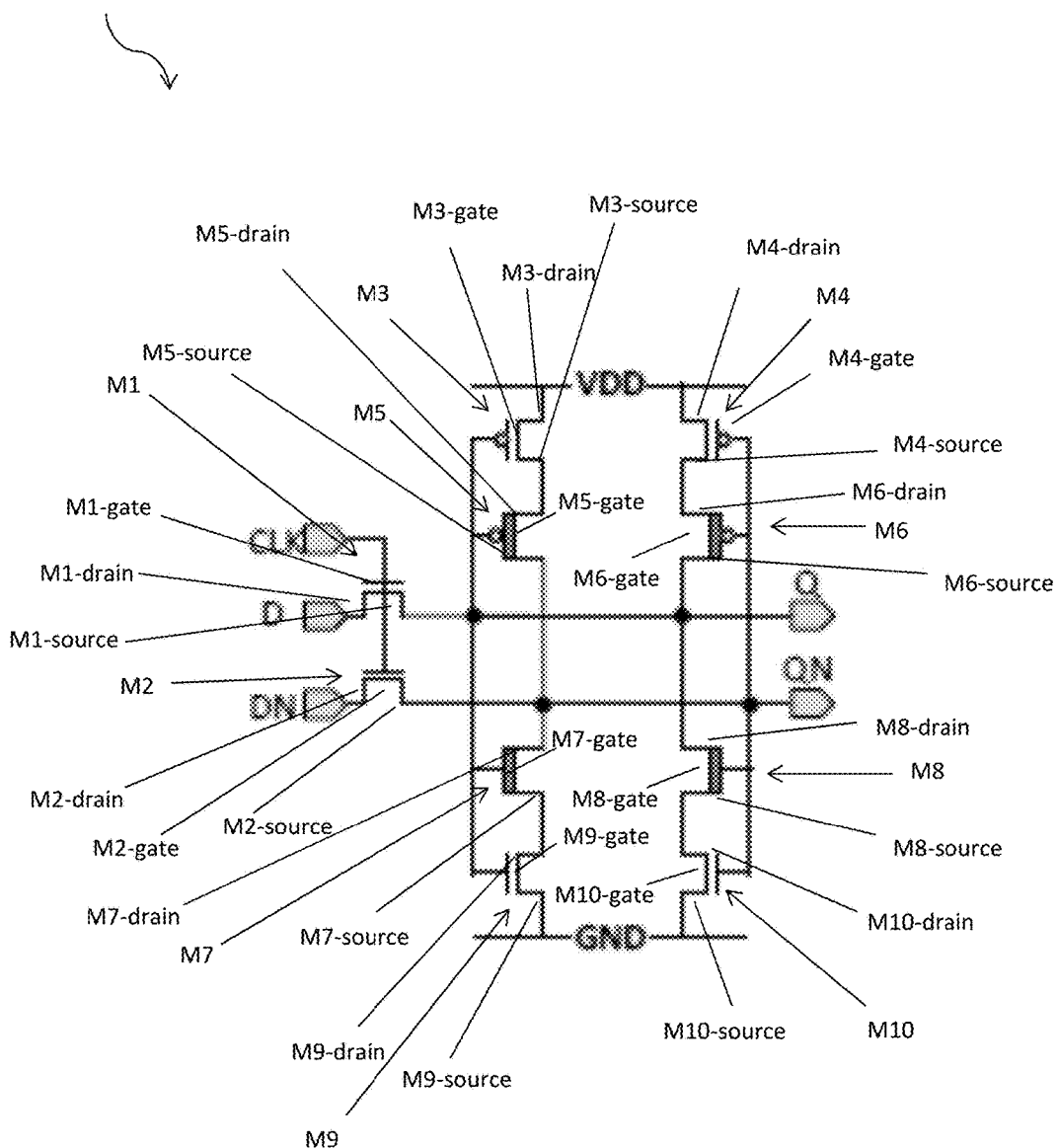
FIG. 39 is an exemplary schematic showing an embodiment of a slave latch configured with a differential-driving input pair D/DN using both N-type FeFETs and P-type FeFETs.

Referring to FIG. 39, the latch 118, 122 can have a first transistor, $M_1$. $M_1$ can have an $M_1$-source, an $M_1$-gate, and an $M_1$-drain. The latch 118, 122 can have a second transistor, $M_2$. $M_2$ can have an $M_2$-source, an $M_2$-gate, and an $M_2$-drain. The latch 118, 122 can have a third transistor, $M_3$. $M_3$ can have an $M_3$-source, an $M_3$-gate, and an $M_3$-drain. The latch 118, 122 can have a fourth transistor, $M_4$. $M_4$ can have an $M_4$-source, an $M_4$-gate, and an $M_4$-drain. The latch 118, 122 can have a fifth transistor, $M_5$. $M_5$ can have an $M_5$-source, an $M_5$-gate, and an $M_5$-drain. The latch 118, 122 can have a sixth transistor, $M_6$. $M_6$ can have an $M_6$-source, an $M_6$-gate, and an $M_6$-drain. The latch 118, 122 can have a seventh transistor, $M_7$. $M_7$ can have an $M_7$-source, an $M_7$-gate, and an $M_7$-drain. The latch 118, 122 can have an eighth transistor, $M_8$. $M_8$ can have an $M_8$-source, an $M_8$-gate, and an $M_8$-drain. The latch 118, 122 can have a ninth transistor, $M_9$. $M_9$ can have an $M_9$-source, an $M_9$-gate, and an $M_9$-drain. The latch 118, 122 can have a tenth transistor, $M_{10}$. $M_{10}$ can have an $M_{10}$-source, an $M_{10}$-gate, and an $M_{10}$-drain. Any one or combination of the transistors of the slave latch 118 can be a metal oxide semiconductor field effect transistor (MOSFET) or a FeFET 102.

In at least one embodiment, $M_1$, $M_2$, $M_3$, $M_4$, $M_9$, and $M_{10}$ are MOSFETs. In at least one embodiment, $M_5$, $M_6$, $M_7$, and $M_8$ are FeFETs 102. $M_1$-drain can be connected to data input D. $M_1$-gate can be connected to CLK. $M_1$-source can be connected to $M_5$-gate, $M_3$-gate, $M_2$-source, $M_7$-gate, $M_9$-gate, $M_5$-source, $M_6$-source, data output Q, $M_6$-gate, $M_4$-gate, $M_7$-drain, $M_8$-drain, data output QN, $M_8$-gate, and $M_{10}$-gate. $M_2$-drain can be connected to data input DN. $M_2$-gate can be connected to $M_1$-gate. $M_2$-source can be connected to $M_5$-gate, $M_3$-gate, $M_1$-source, $M_7$-gate, $M_9$-gate, $M_5$-source, $M_6$-source, data output Q, $M_6$-gate, $M_4$-gate, $M_7$-drain, $M_8$-drain, data output QN, $M_8$-gate, and $M_{10}$-gate. $M_3$-drain can be connected to $V_{DD}$. $M_3$-gate can be connected to $M_5$-gate, $M_1$-source, $M_2$-source, $M_7$-gate, $M_9$-gate, $M_5$-source, $M_6$-source, data output Q, $M_6$-gate, $M_4$-gate, $M_7$-drain, $M_8$-drain, data output QN, $M_8$-gate, and $M_{10}$-gate. $M_3$-source can be connected to $M_5$-drain. $M_4$-drain can be connected to $V_{DD}$. $M_4$-gate can be connected to $M_5$-gate, $M_3$-gate, $M_2$-source, $M_7$-gate, $M_9$-gate, $M_5$-source, $M_6$-source, data output Q, $M_6$-gate, $M_1$-source, $M_7$-drain, $M_8$-drain, data output QN, $M_8$-gate, and $M_{10}$-gate. $M_4$-source can be connected to $M_6$-drain. $M_5$-drain can be connected to $M_3$-source. $M_5$-gate can be connected to $M_1$-source, $M_3$-gate, $M_2$-source, $M_7$-gate, $M_9$-gate, $M_5$-source, $M_6$-source, data output Q, $M_6$-gate, $M_4$-gate, $M_7$-drain, $M_8$-drain, data output QN, $M_8$-gate, and $M_{10}$-gate. $M_5$-source can be connected to $M_5$-gate, $M_3$-gate, $M_2$-source, $M_7$-gate, $M_9$-gate, $M_1$-source, $M_6$-source, data output Q, $M_6$-gate, $M_4$-gate, $M_7$-drain, $M_8$-drain, data output QN, $M_8$-gate, and $M_{10}$ gate. $M_6$-drain can be connected to $M_4$-source. $M_6$-gate can be connected to $M_5$-gate, $M_3$-gate, $M_2$-source, $M_7$-gate, $M_9$-gate, $M_5$-source, $M_6$-source, data output Q, $M_1$-source, $M_4$-gate, $M_7$-drain, $M_8$-drain, data output QN, $M_8$-gate, and $M_{10}$-gate. $M_6$-source can be connected to $M_5$-gate, $M_3$-gate, $M_2$-source, $M_7$-gate, $M_9$-gate, $M_5$-source, $M_1$-source, data output Q, $M_6$-gate, $M_4$-gate, $M_7$-drain, $M_8$-drain, data output QN, $M_8$-gate, and $M_{10}$-gate. $M_7$-drain can be connected to $M_5$-gate, $M_3$-gate, $M_2$-source, $M_7$-gate, $M_9$-gate, $M_5$-source, $M_6$-source, data output Q, $M_6$-gate, $M_4$-gate, $M_1$-source, $M_8$-drain, data output QN, $M_8$-gate, and $M_{10}$-gate. $M_7$-gate can be connected to $M_5$-gate, $M_3$-gate, $M_2$-source, $M_1$-source, $M_9$-gate, $M_5$-source, $M_6$-source, data output Q, $M_6$-gate, $M_4$-gate, $M_7$-drain, $M_8$-drain, data output QN, $M_8$-gate, and $M_{10}$-gate. $M_7$-source can be connected to $M_9$-drain. $M_{10}$-drain can be connected to $M_8$-source. $M_{10}$-gate can be connected to $M_5$-gate, $M_3$-gate, $M_2$-source, $M_7$-gate, $M_9$-gate, $M_5$-source, $M_6$-source, data output Q, $M_6$-gate, $M_4$-gate, $M_7$-drain, $M_8$-drain, data output QN, $M_8$-gate, and $M_1$-source. $M_{10}$-source can be connected to GND.

In terms of the physical layout design, the overhead of the FeFETs 102 in embodiments of the latches of FIGS. 29, 30, 38, and 39 can be mitigated by properly sharing the drain and source active region without the need for adding additional contacts for the drain and source terminals of the FeFETs 102.

Figure 40:
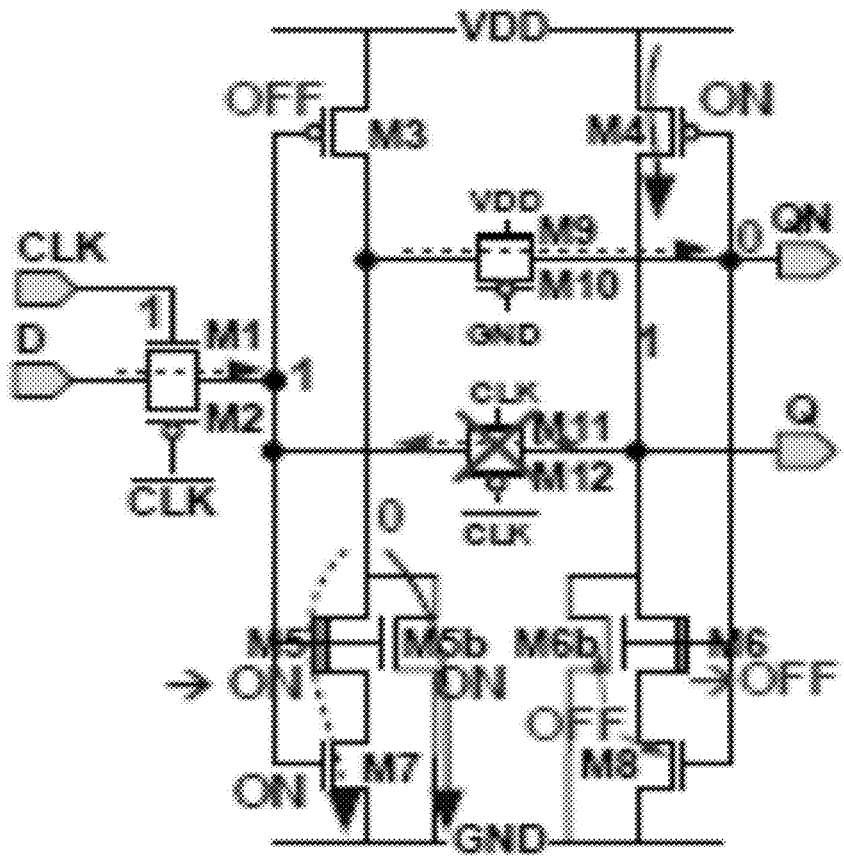
FIG. 40 is an exemplary schematic illustrating the operating mechanism of the latch topology of FIG. 30 during sampling, showing charging and discharging routes.
Figure 41:
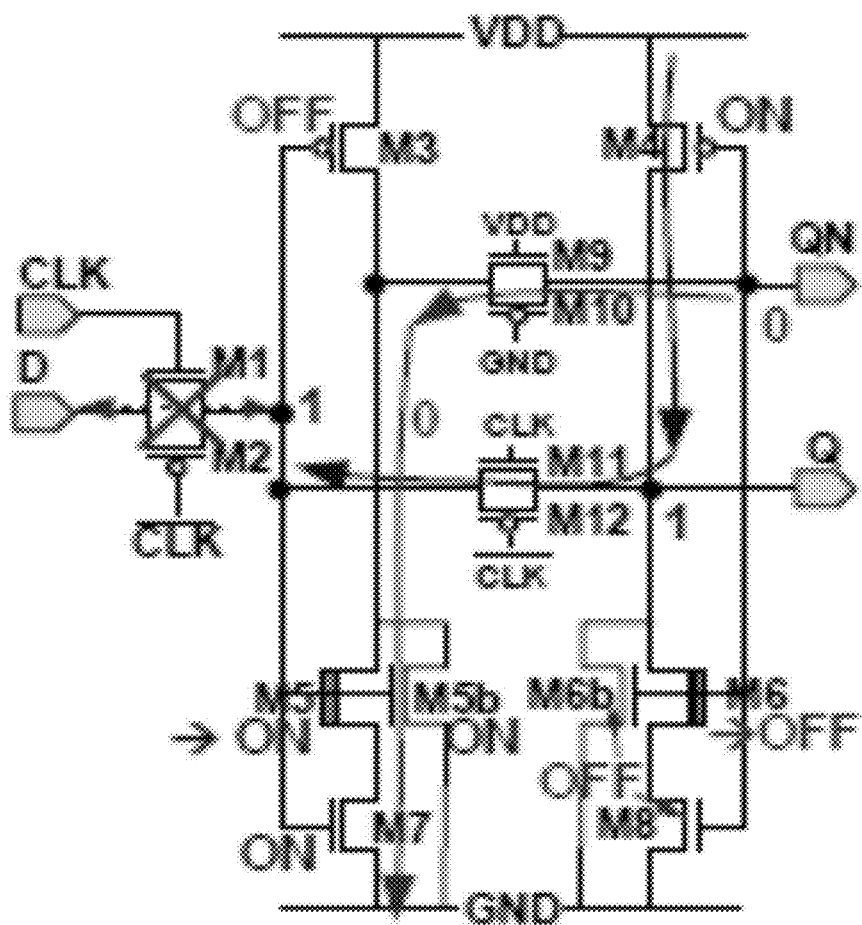
FIG. 41 is an exemplary schematic illustrating the operating mechanism of the latch topology of FIG. 30 in a hold phase, showing charging and discharging routes.

FIG. 40 illustrates the operating mechanism of the latch topology of FIG. 30 during sampling, showing charging and discharging routes. FIG. 41 illustrates the operating mechanism of the latch topology of FIG. 30 in a hold phase, showing charging and discharging routes. FIGS. 40-41 illustrate the operation theory of an embodiment of the latch topology of FIG. 30. During the sampling phase (high CLK), $M_3$ and $M_{5b}$ form an inverter that can provide a fast settling output of QN and no pseudo-floating status. The always-on CMOS switch consisting of $M_9$ and $M_{10}$ delivers QN to drive the second inverter to provide Q. The feedback loop of the switch is turned OFF to prevent racing short current during this sampling phase, and will be turned on to form a stable closed loop during the hold phase (low CLK), as shown in FIG. 41. The restore operation is similar to the latch topology of FIG. 29, by sensing a different Q or QN to ground resistance and continuing to settle down to $V_{DD}$ or GND in the feedback loop.

Figure 42:
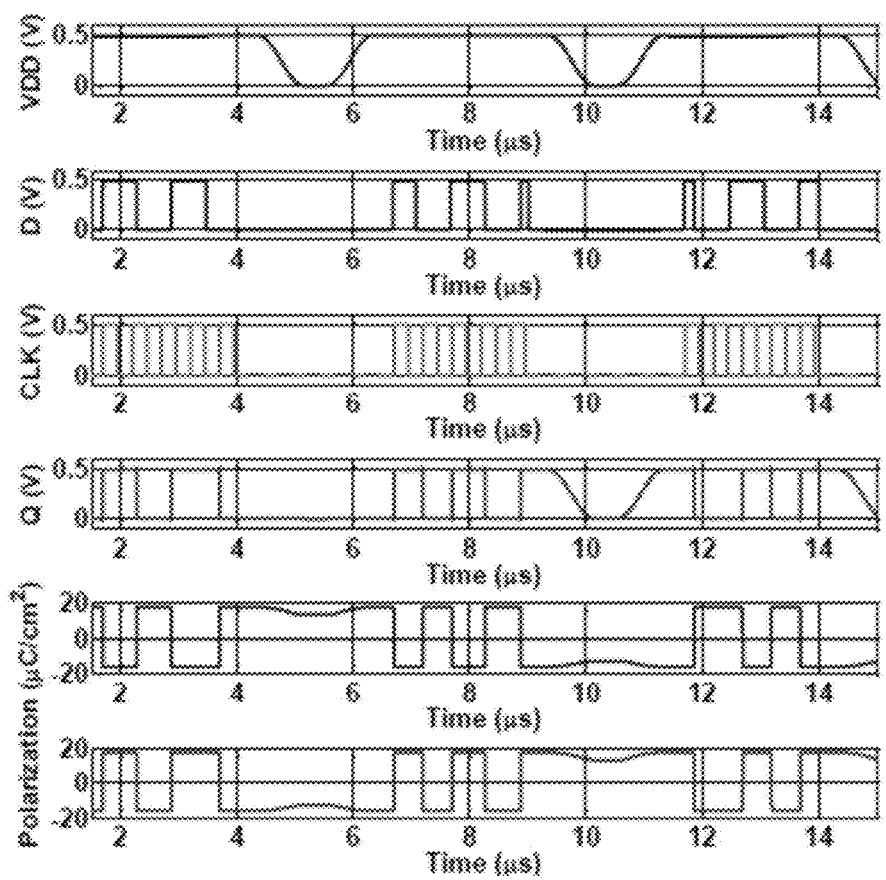
FIG. 42 is a graph showing the transient simulation waveforms of the latch topology of FIG. 30.

FIG. 42 shows the transient simulation waveforms of the latch topology of FIG. 30. Along with the normal sampling and hold operations with a stable $V_{DD}$, it also shows successful backup and restore operations of Q='0' and Q='1' during the power outages around 5 μs and 10 μs, respectively.

Figure 43:
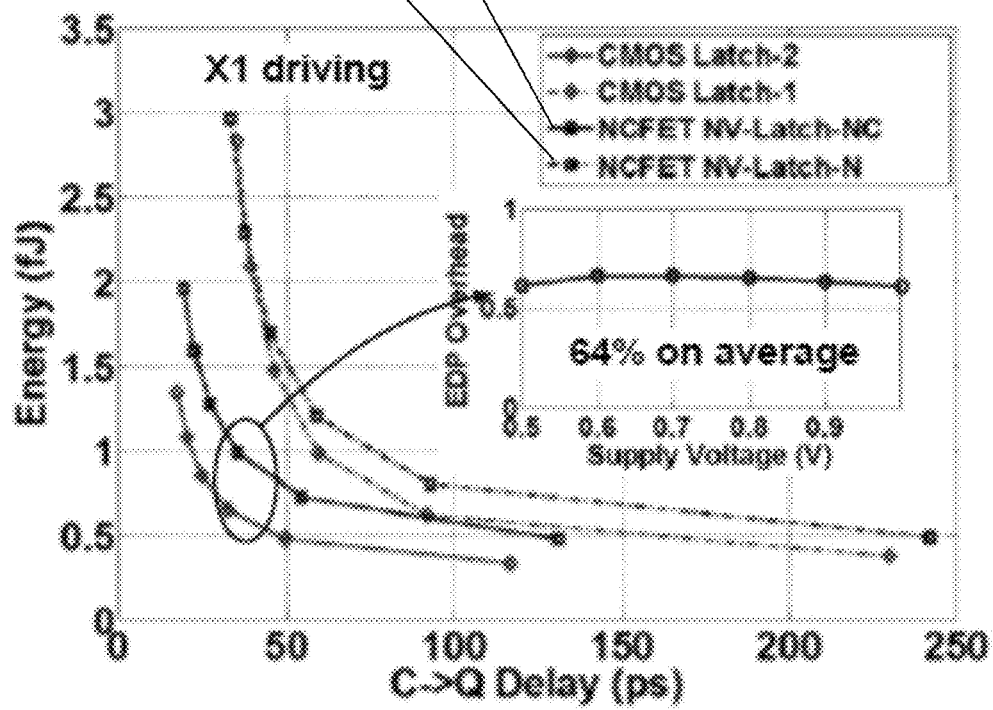
FIG. 43 is a graph showing energy versus delay comparison between CMOS latches and embodiments of the latches for ×1 fan-out driving strength. $V_{DD}$ ranges from 1.0V to 0.5V from left to right.
Figure 44:
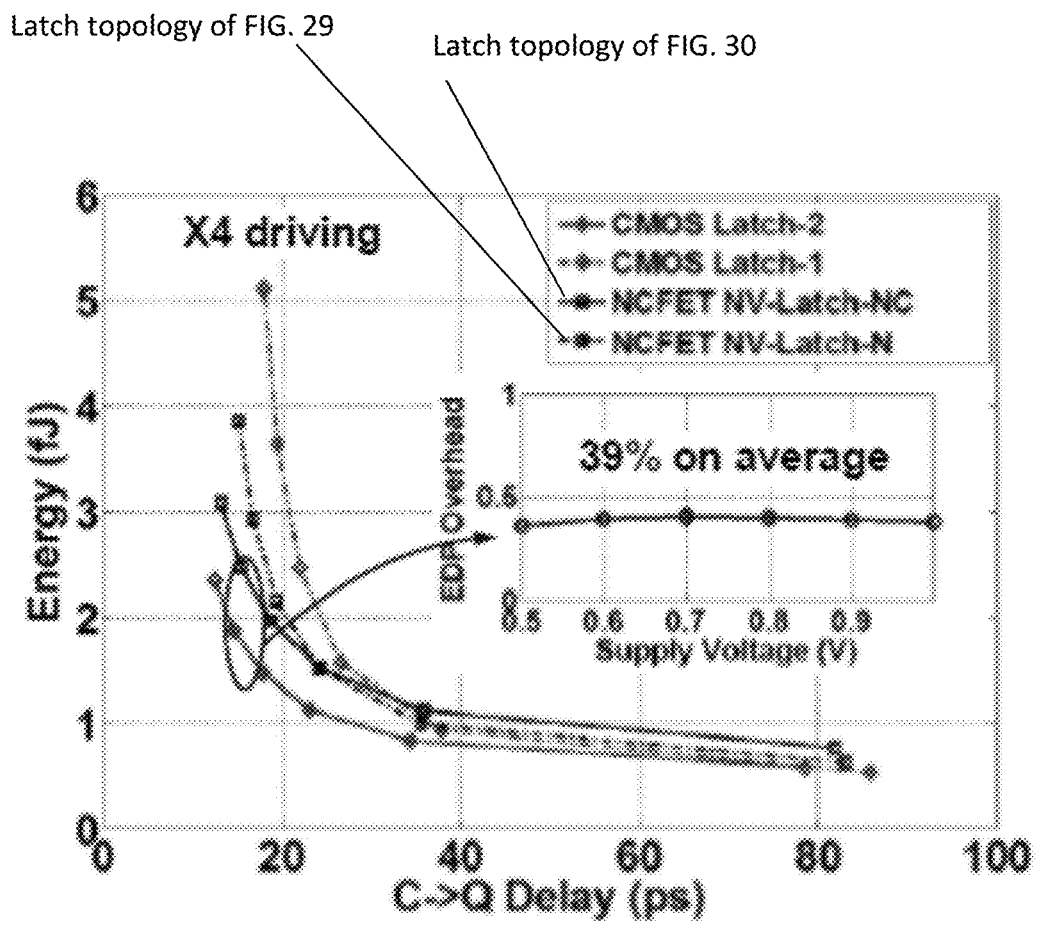
FIG. 44 is a graph showing energy versus delay comparison between CMOS latches and embodiments of the latches for ×4 fan-out driving strength (only CMOS transistors are increased to ×4). $V_{DD}$ ranges from 1.0V to 0.5V from left to right.
Figure 45:
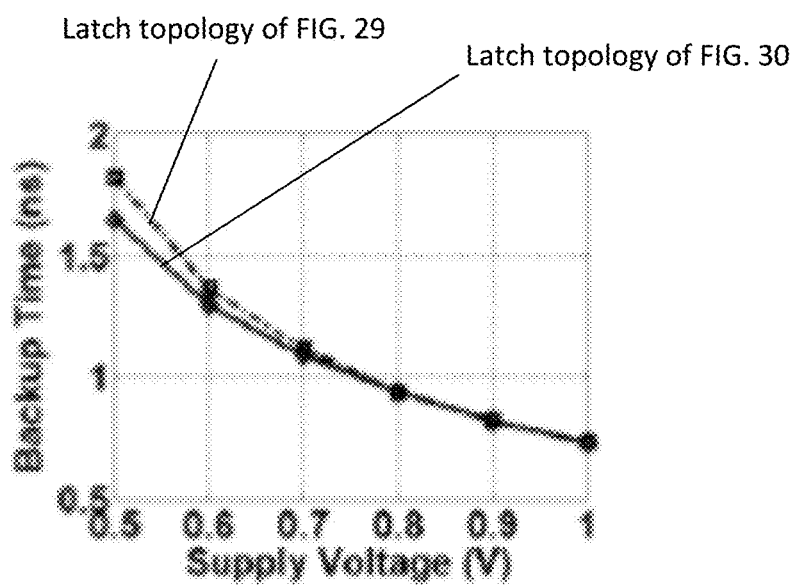
FIG. 45 is a graph showing supply voltage as a function of backup time for an embodiment of a latch.
Figure 46:
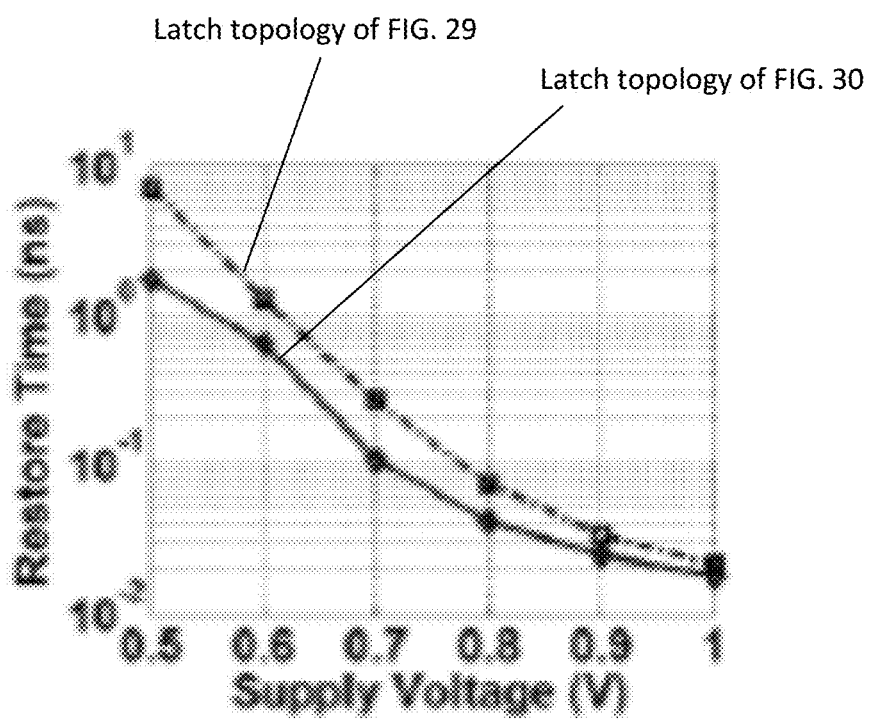
FIG. 46 is a graph showing supply voltage as a function of restore time for an embodiment of a latch.
Figure 47:
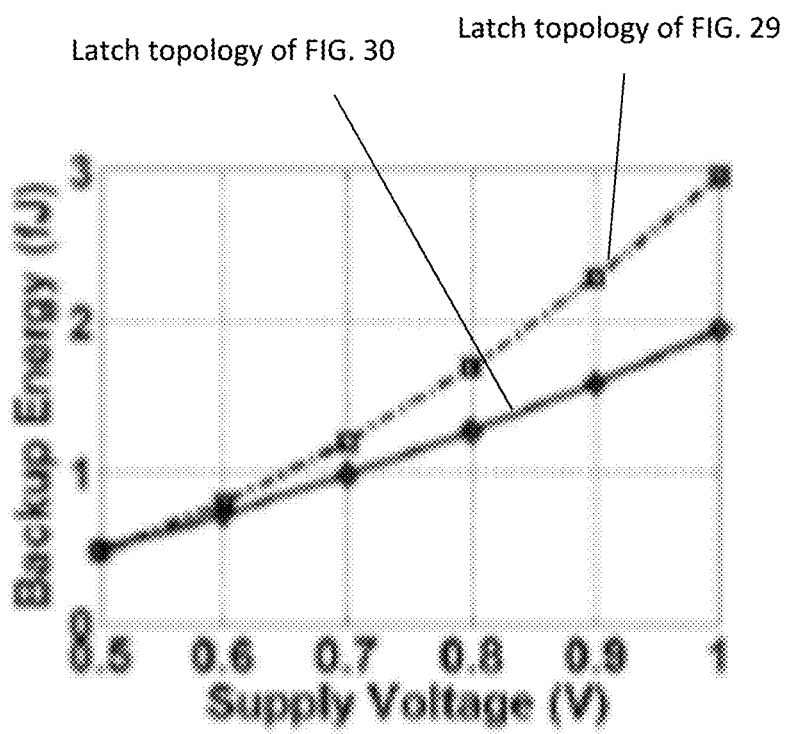
FIG. 47 is a graph showing supply voltage as a function of backup energy for an embodiment of a latch.
Figure 48:
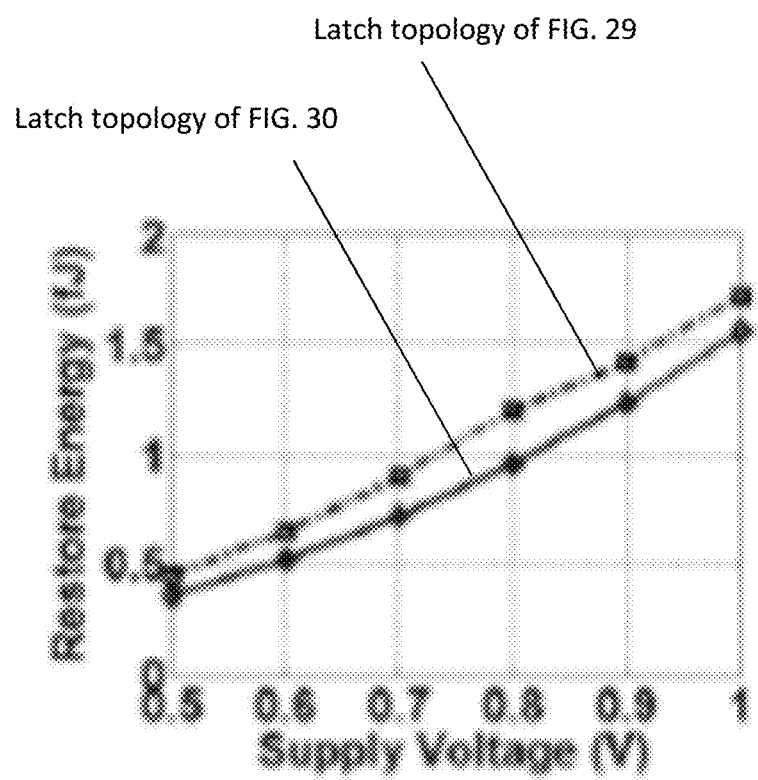
FIG. 48 is a graph showing supply voltage as a function of restore energy for an embodiment of a latch.

FIGS. 43-44 summarize the simulated energy vs CLK-to-Q delay performance of embodiments of the latch with ×1 and ×4 driving capabilities at different supply voltages, in comparison with the conventional CMOS volatile latches. Simulations were carried out with 1.0 fF capacitor load, and an input rise and fall time of 20 ps for the input clock, D, and DN. Energy consumption included clocking and D/DN driving. While being aware that embodiments of the latches could operate at higher frequencies, in this section of evaluation, all polarization switching was fully completed, and the energy in FIGS. 43-44 includes the energy for Q/QN setup and also polarization switching as a backup operation. As the supply voltage reduces, simulation results summarized in FIGS. 43-44 show that the energy per switching reduces and the delay increases. Embodiments of the latches have about 64% and 39% extra energy-delay product (EDP) over the CMOS latch. If there is no need for a complete polarization switching (in cases with a high data rate), it consumes less energy for each switching event.

FIGS. 45-48 show the energy and time for backup and restore operations for embodiments of the latch. As supply voltage increases, backup and restore time decreases, and backup and restore energy increases. Being an intrinsic nonvolatile latch, simulation results in FIGS. 45-48 also show that the latches are very fast and energy-efficient for backup and restore operations. For example, under 0.8V $V_{DD}$, the backup time is lower than 1.0 ns, and the intrinsic restore time is lower than 75 ns for both each embodiment of the latch. It is noted that the intrinsic restore time is obtained with an assumption of very fast supply voltage recovery in a few ps. In real scenarios the supply voltage recovers slower (usually much larger than ns) and the capability of fast intrinsic restore operation guarantees that the overall restore operation closely follow the supply recovery. The restore energy is obtained based on 0.8 μs supply voltage ramp-up time to mimic real scenarios. Meanwhile, the backup and restore energy is lower than 3.0 fJ for the entire operating range of 0.5V to 1.0V. This can enable extremely low-energy backup and restore operations of the entire processor being carried out autonomously and in parallel without worrying about the peak current.

Figure 49:
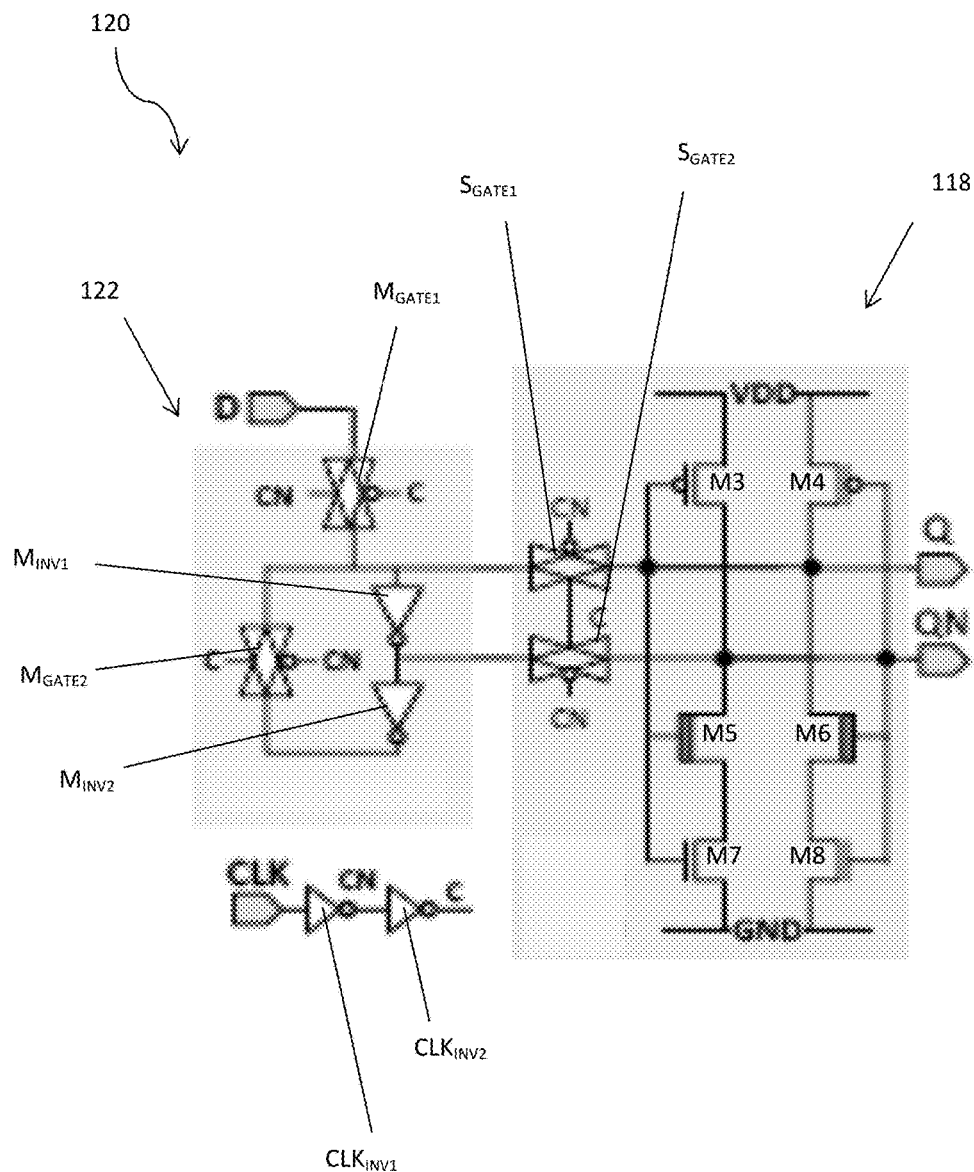
FIG. 49 is an exemplary schematic showing an embodiment of a DFF with its slave latch replaced with an embodiment of the latch topology of FIG. 29.

In some embodiments an improved DFF 120 can be generated by replacing any one or combination of its master latch and slave latch with an embodiment of the latch 118, 122 disclosed herein. FIG. 49 shows an embodiment of a DFF 120 with its slave latch 118 replaced with an embodiment of the latch topology of FIG. 29. The same topology of the latch in FIG. 29 can be used but with a first slave transmission gate, $S_{GATE1}$, in place of $M_1$ and a second transmission gate, $S_{GATE2}$, in place of $M_2$. For example, the output of $S_{GATE1}$ can be connected to $M_3$-gate, $M_3$-source, $M_4$-source, $M_4$-gate, data output Q, $S_{GATE2}$ output, $M_5$-gate, $M_7$-gate, $M_5$-drain, data output QN, $M_6$-drain, $M_6$-gate, and $M_8$-gate. The output of $S_{GATE2}$ can be connected to $M_3$-gate, $M_3$-source, $M_4$-source, $M_4$-gate, data output Q, $S_{GATE1}$ output, $M_5$-gate, $M_7$-gate, $M_5$-drain, data output QN, $M_6$-drain, $M_6$-gate, and $M_8$-gate.

The master latch 122 can be connected to the slave latch 118 via $S_{GATE1}$ and $S_{GATE2}$. For example, the master latch 122 can have a first master transmission gate $M_{GATE1}$, a first master inverter, $M_{INV1}$, a second master inverter, $M_{INV2}$, and a second master transmission gate, $M_{GATE2}$. The input of $M_{GATE1}$ can be connected to a data input signal, D. The output of $M_{GATE1}$ can be connected to the input of $M_{INV1}$ and the input of $S_{GATE1}$. The input of $M_{INV1}$ can be connected to the output of $M_{GATE1}$. The output of $M_{INV1}$ can be connected to the input of $M_{INV2}$ and the input of $S_{GATE2}$. The input of $M_{INV2}$ can be connected to the output of $M_{INV1}$. The output of $M_{INV2}$ can be connected to the input of $M_{GATE2}$. The input of $M_{GATE2}$ can be connected to the output of $M_{INV2}$. The output of $M_{GATE2}$ can be connected to the input of $M_{GATE1}$ and the output of $M_{INV1}$. From this topology, the master latch 122 and slave latch 118 can be connected with switches.

Figure 50:
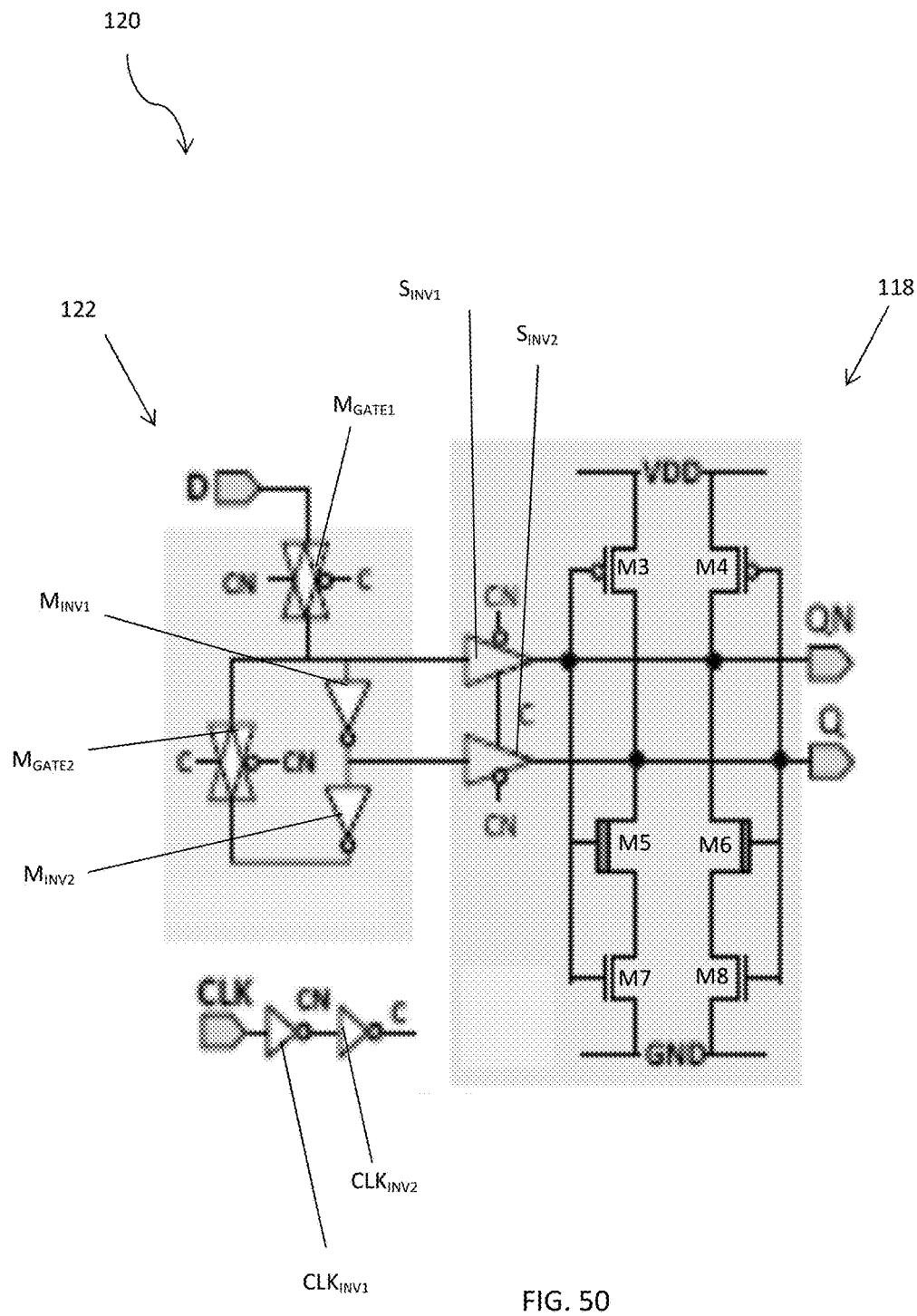
FIG. 50 is an exemplary schematic showing another embodiment of a DFF with its slave latch replaced with an embodiment of the latch topology of FIG. 29.

FIG. 50 shows another embodiment of a DFF 120 with its slave latch 122 replaced with an embodiment of the latch topology of FIG. 29. The same topology of the latch in FIG. 29 can be used but with a first slave inverter, $S_{INV1}$, in place of $M_1$ and a second slave inverter, $S_{INV2}$, in place of $M_2$. For example, the output of $S_{INV1}$ can be connected to $M_3$-gate, $M_3$-source, $M_4$-source, $M_4$-gate, data output Q, $S_{INV2}$ output, $M_5$-gate, $M_7$-gate, $M_5$-drain, data output QN, $M_6$-drain, $M_6$-gate, and $M_8$-gate. The output of $S_{INV2}$ can be connected to $M_3$-gate, $M_3$-source, $M_4$-source, $M_4$-gate, data output Q, $S_{INV1}$ output, $M_5$-gate, $M_7$-gate, $M_5$-drain, data output QN, $M_6$-drain, $M_6$-gate, and $M_8$-gate.

The master latch 122 can be connected to the slave latch 118 via $S_{INV1}$ and $S_{INV2}$. For example, the master latch 122 can have a first master transmission gate $M_{GATE1}$, a first master inverter, $M_{INV1}$, a second master inverter, $M_{INV2}$, and a second master transmission gate, $M_{GATE2}$. The input of $M_{GATE1}$ can be connected to a data input signal, D. The output of $M_{GATE1}$ can be connected to the input of $M_{INV1}$ and the input of $S_{INV1}$. The input of $M_{INV1}$ can be connected to the output of $M_{GATE1}$. The output of $M_{INV1}$ can be connected to the input of $M_{INV2}$ and the input of $S_{INV2}$. The input of $M_{INV2}$ can be connected to the output of $M_{INV1}$. The output of $M_{INV2}$ can be connected to the input of $M_{GATE2}$. The input of $M_{GATE2}$ can be connected to the output of $M_{INV2}$. The output of $M_{GATE2}$ can be connected to the input of $M_{GATE1}$ and the output of $M_{INV1}$. From this topology, the master latch 122 and slave latch 118 can be connected with clocked inverters for isolation.

Figure 51:
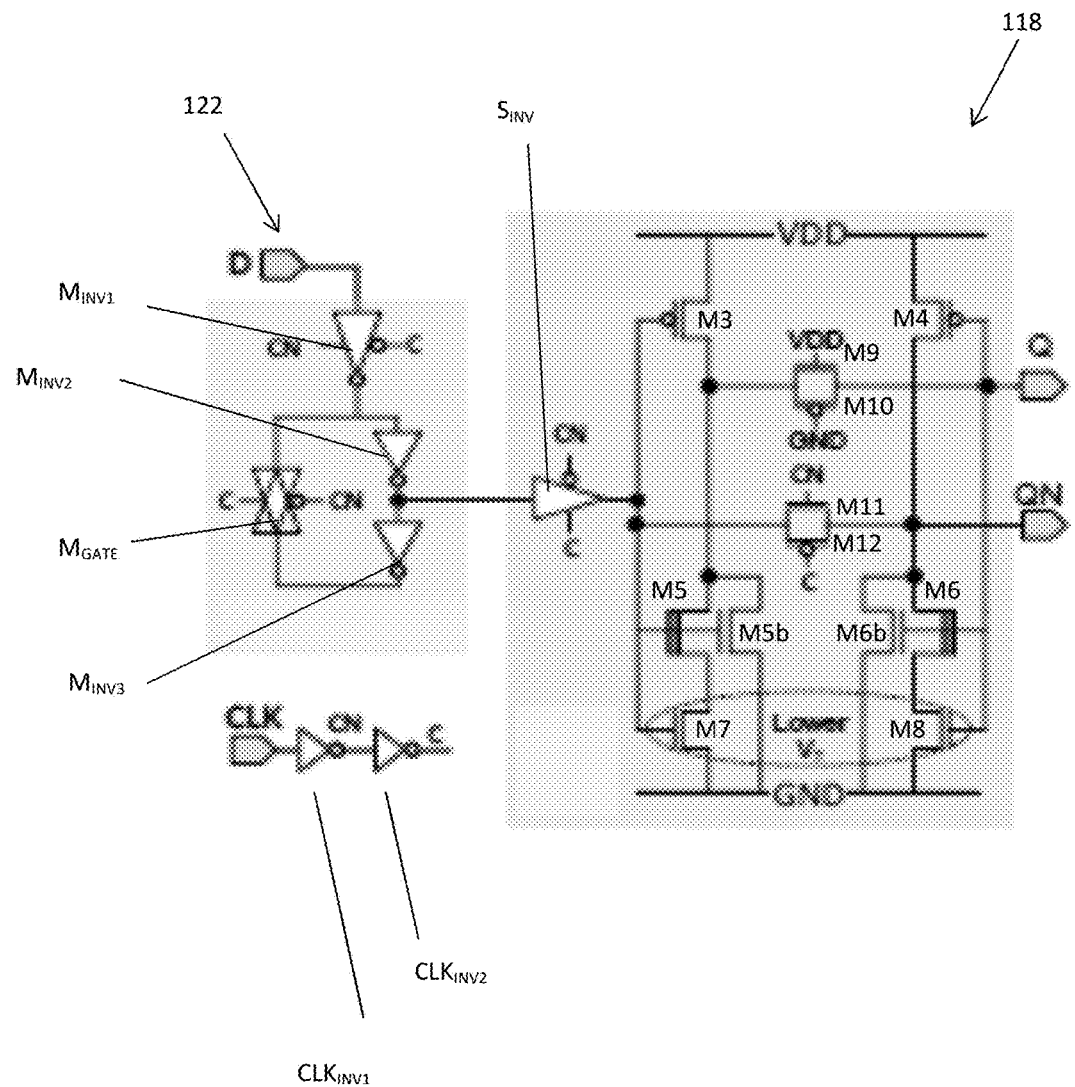
FIG. 51 is an exemplary schematic showing another embodiment of a DFF with its slave latch replaced with an embodiment of the latch topology of FIG. 30.

FIG. 51 shows another embodiment of a DFF 120 with its slave latch 122 replaced with an embodiment of the latch topology of FIG. 30 The same topology of the latch in FIG. 30 can be used but with a slave inverter, $S_{INV}$, in place of $M_1$ and $M_2$. For example, the output of $S_{INV}$ can be connected to $M_3$-gate, $M_5$-gate, $M_7$-gate, $M_{11}$-source, $M_{12}$-source, $M_3$-source, $M_9$-source, $M_{10}$-source, $M_5$-drain, and $M_{5b}$-drain.

The master latch 122 can be connected to the slave latch 118 via $S_{INV}$. For example, the master latch 122 can have a first master inverter $M_{INV1}$, a second master inverter, $M_{INV2}$, a third master inverter, $M_{INV3}$, and a master transmission gate, $M_{GATE}$. The input of $M_{INV1}$ can be connected to a data input signal, D. The output of $M_{INV1}$ can be connected to the input of $M_{INV2}$. The input of $M_{INV2}$ can be connected to the output of $M_{INV1}$. The output of $M_{INV2}$ can be connected to the input of $M_{INV3}$ and the input of $S_{INV}$. The input of $M_{INV3}$ can be connected to the output of $M_{INV2}$. The output of $M_{INV3}$ can be connected to the input of $M_{GATE}$. The input of $M_{GATE}$ can be connected to the output of $M_{INV3}$. The output of $M_{GATE}$ can be connected to the input of $M_{INV2}$ and the output of $M_{INV1}$.

With reference to FIGS. 49-52, embodiments of the DFF 120 can be configured as a positive-edge-triggered DFF, wherein making the slave latch 118 nonvolatile can simplify clocking during restore, as the slave latch 118 is isolated from the input data when CLK is low (i.e., in hold/restore phase). With the topology of FIG. 49, the structure is simple and has the minimum overhead in terms of number of additional transistors (as compared to the conventional topology of FIG. 52). However, the driving strength of the master latch 122 should be sufficient to make sure a new state could be set up in time for the slave latch 118. Also, the possible bleeding current from D through an input switch would affect the timing behavior. FIG. 50 uses clocked inverters as a buffer to drive the slave latch 118 and to isolate the possible bleeding current between master and slave stages. With the designs in FIGS. 51 and 52, clocked inverters instead of CMOS switches are used to drive the master latch and slave latch to provide better kick-back isolation between the two stages and the driver of D. It is noted, however, that the DFF 120 of FIG. 51 has only 6 more transistors than the conventional CMOS DFF of FIG. 52, with a total of 30 transistors including a local clock driver.

Figure 52:
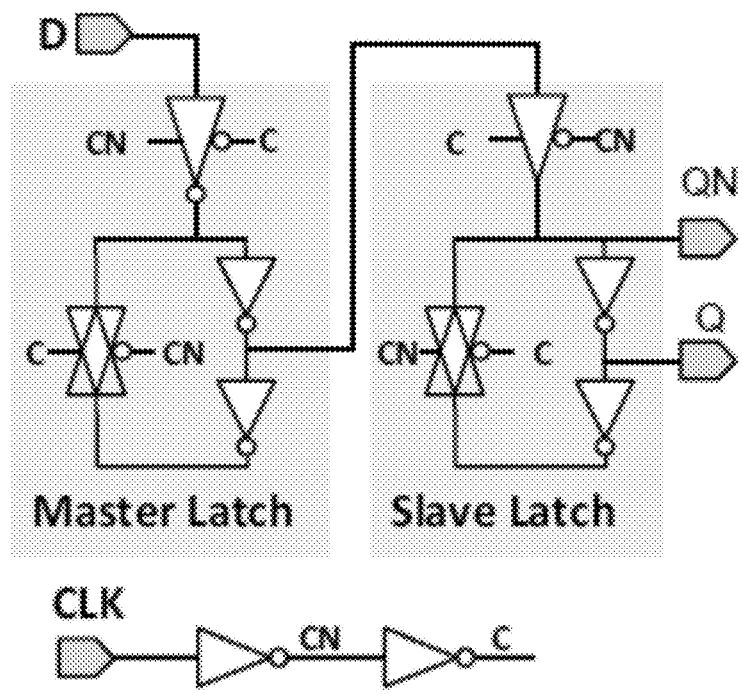
FIG. 52 is an exemplary schematic showing a conventional CMOS DFF for comparison to an embodiment of the DFF disclosed herein.

The setup and hold time of the DFF 120 with the topology in FIG. 51 will be almost identical to that of the conventional CMOS volatile DFF in FIG. 52. This property can stem from a master latch of the same structure and size being used in both designs that features a clocked inverter to provide isolation.

Figure 53:
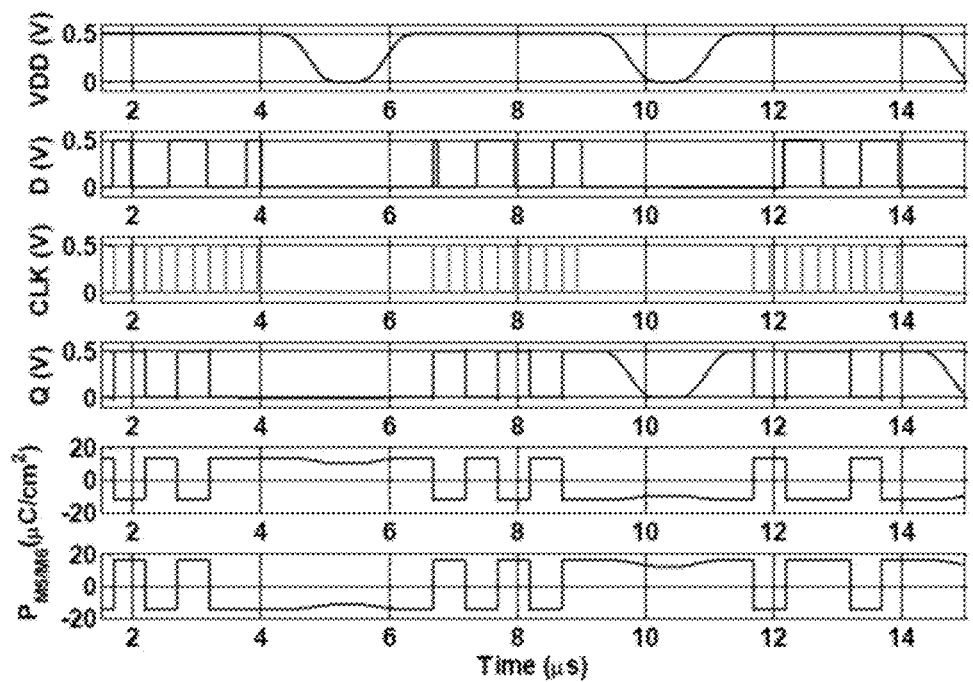
FIG. 53 is a graph showing the transient simulation waveforms of an embodiment of the DFF.

FIG. 53 shows the transient simulation waveforms of an embodiment of the DFF 120. With a steady $V_{DD}$, embodiments of the DFF 120 can carry out the positive-edge-triggered sample-and-hold operations. The intrinsic nonvolatility of latch topologies disclosed herein is inherited to the DFF 120. As shown in FIG. 53, during power failures, the polarization of the FeFETs 102 maintains stable. When power supply recovers, the restore operations automatically restore the output Q and QN to its previous state before the power failure. In FIG. 53, the backup and restore operations for bit '0' and bit '1' are shown around 4-6 μs and 9-11 μs, respectively.

Figure 54:
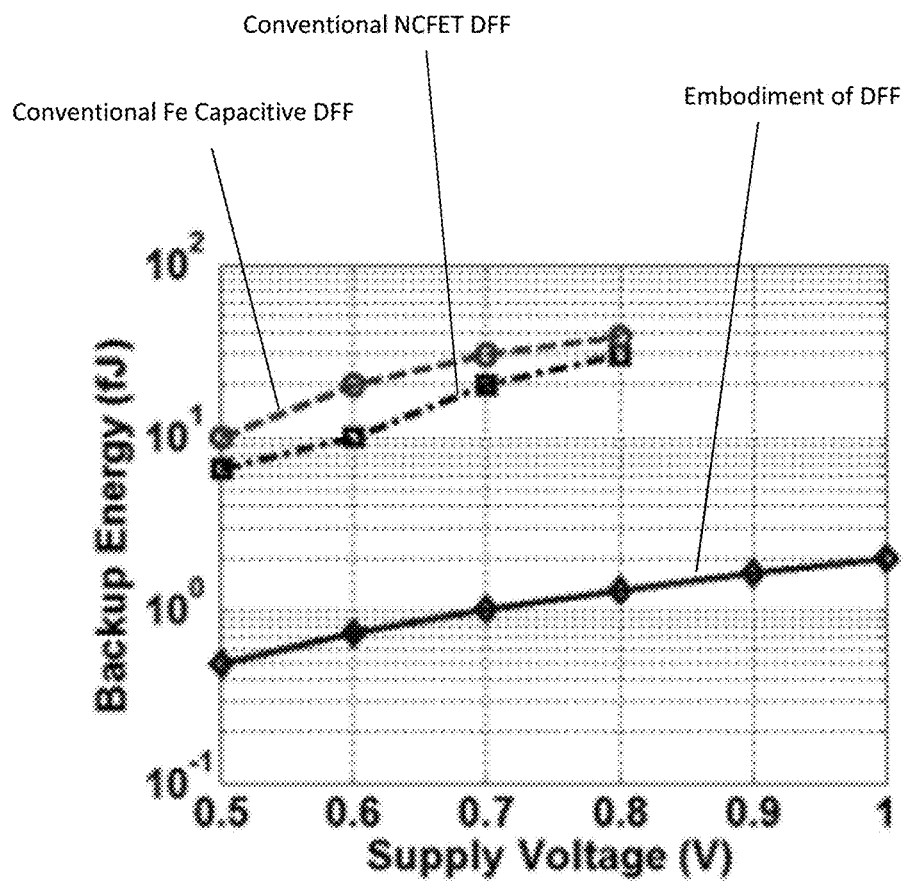
FIG. 54 is a graph showing supply voltage as a function of backup energy for an embodiment of a DFF compared to conventional DFFs.
Figure 55:
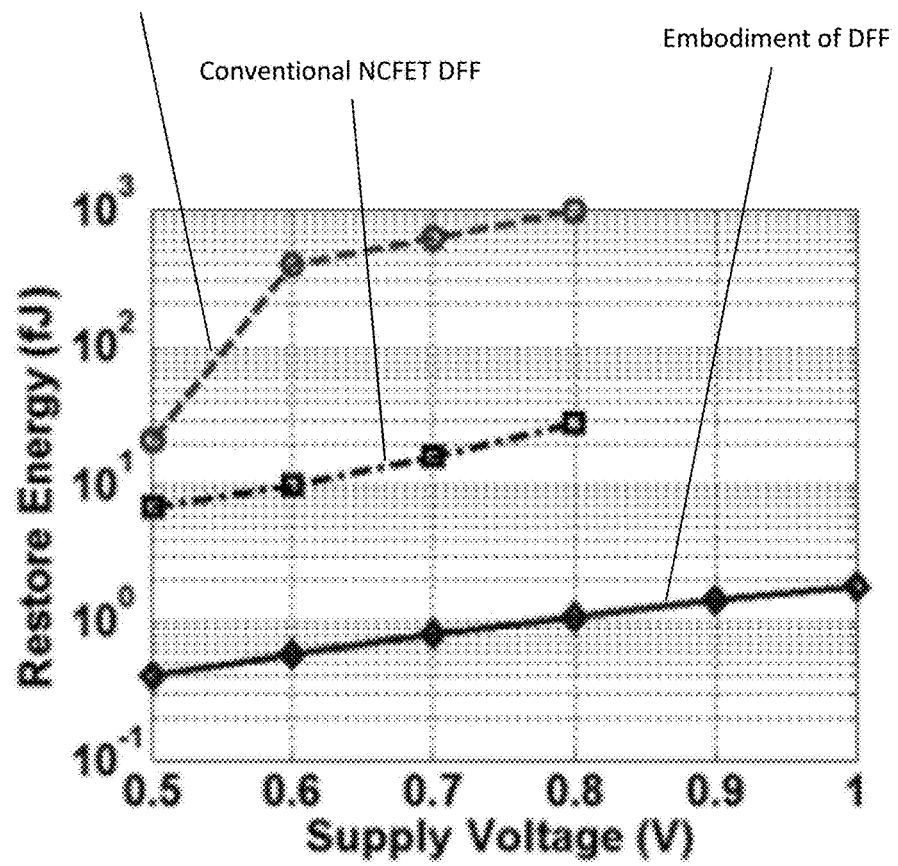
FIG. 55 is a graph showing supply voltage as a function of restore energy for an embodiment of a DFF compared to conventional DFFs.
Figure 56:
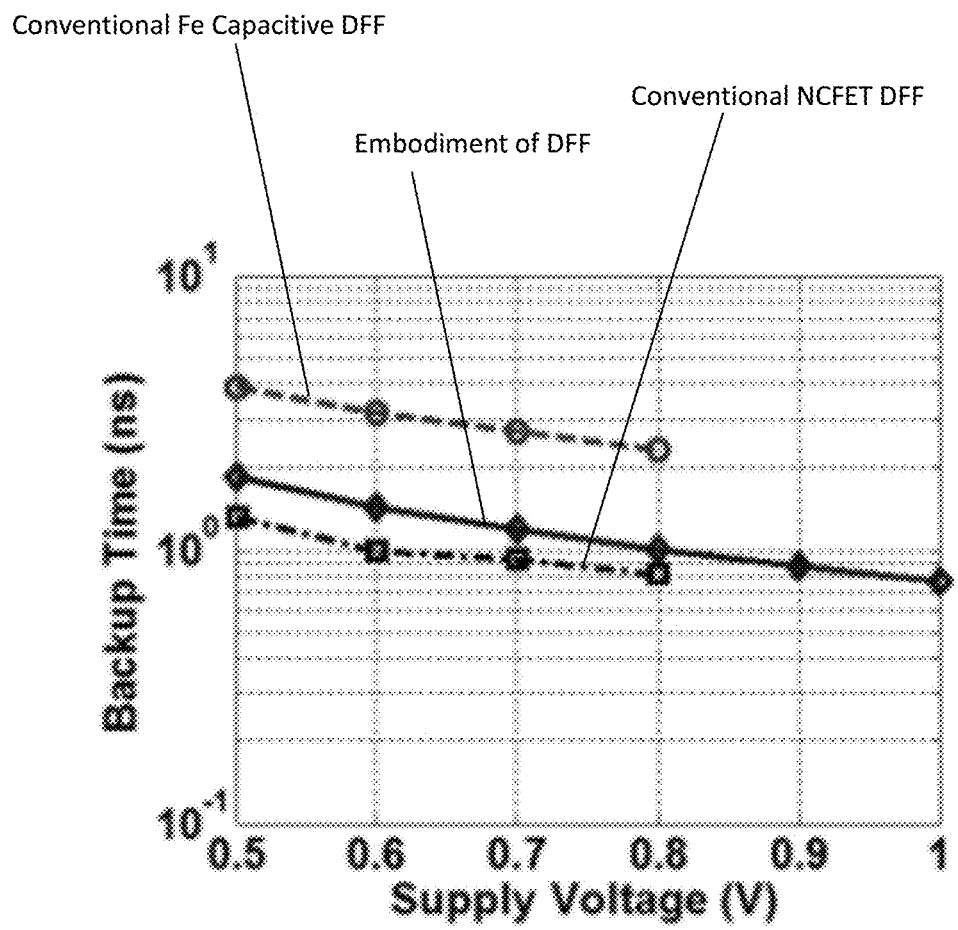
FIG. 56 is a graph showing supply voltage as a function of backup time for an embodiment of a DFF compared to conventional DFFs.
Figure 57:
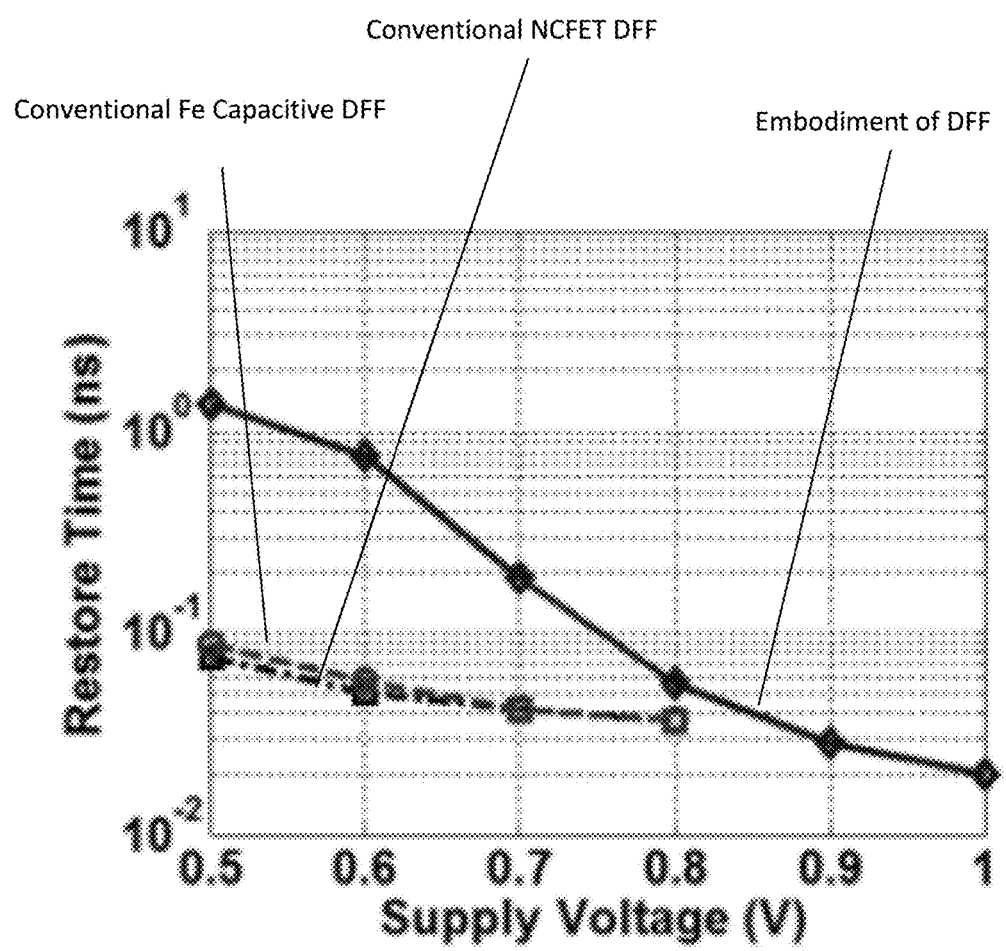
FIG. 57 is a graph showing supply voltage as a function of restore time f for an embodiment of a DFF compared to conventional DFFs.

FIGS. 54-57 compare the backup and restore performance metrics of an embodiment of the DFF with a conventional DFF design based on ferroelectric capacitor and another conventional DFF design based on a NCFET DFF. FIG. 54 shows supply voltage as a function of backup energy for an embodiment of a DFF 120 compared to conventional DFFs. FIG. 55 shows supply voltage as a function of restore energy for an embodiment of a DFF 120 compared to conventional DFFs. FIG. 56 shows supply voltage as a function of backup time for an embodiment of a DFF 120 compared to conventional DFFs. FIG. 57 shows supply voltage as a function of restore time f for an embodiment of a DFF 120 compared to conventional DFFs. Conventional designs used more complex backup and restore circuit schemes, need multiple steps to carry out the operations, may cause static leakage current if the polarization state is positive (low-resistance state). Some conventional DFF designs can causes tens of times higher energy overheads. Conversely, embodiments of the DFF 120 a significant amount of energy could be saved for backup and restore operations, which can be due to the removal of the complex driving and sensing schemes for the ferroelectric capacitor. Thanks to the deeply embedded logic-in-memory operation in the disclosed simple and effective circuit structure, embodiments of the DFF 120 facilitate low-energy operations.

It is also noted that embodiments of the DFF 120 has lower backup and restore speed than conventional DFFs. This can be due to the adoption of low-power (high $V_{TH}$) CMOS transistors to achieve low leakage current for low-power IoT applications. For example, conventional NCFET based DFFs have around 0.12 µW static leakage power when operating at 0.8V supply, while the embodiments of the DF 120 can have less than 0.2 nW at 0.8V. The backup and restore speed of embodiments of the DFF 120 are sufficiently fast for most if not all scenarios, as charging and discharging the supply network on the chip following a power failure and recovery usually takes much longer time than a few nanoseconds. The adoption of high $V_{TH}$ MOS-FETs in the main signal routes can also improve the reliability during backup and restore operations.

Figure 58:
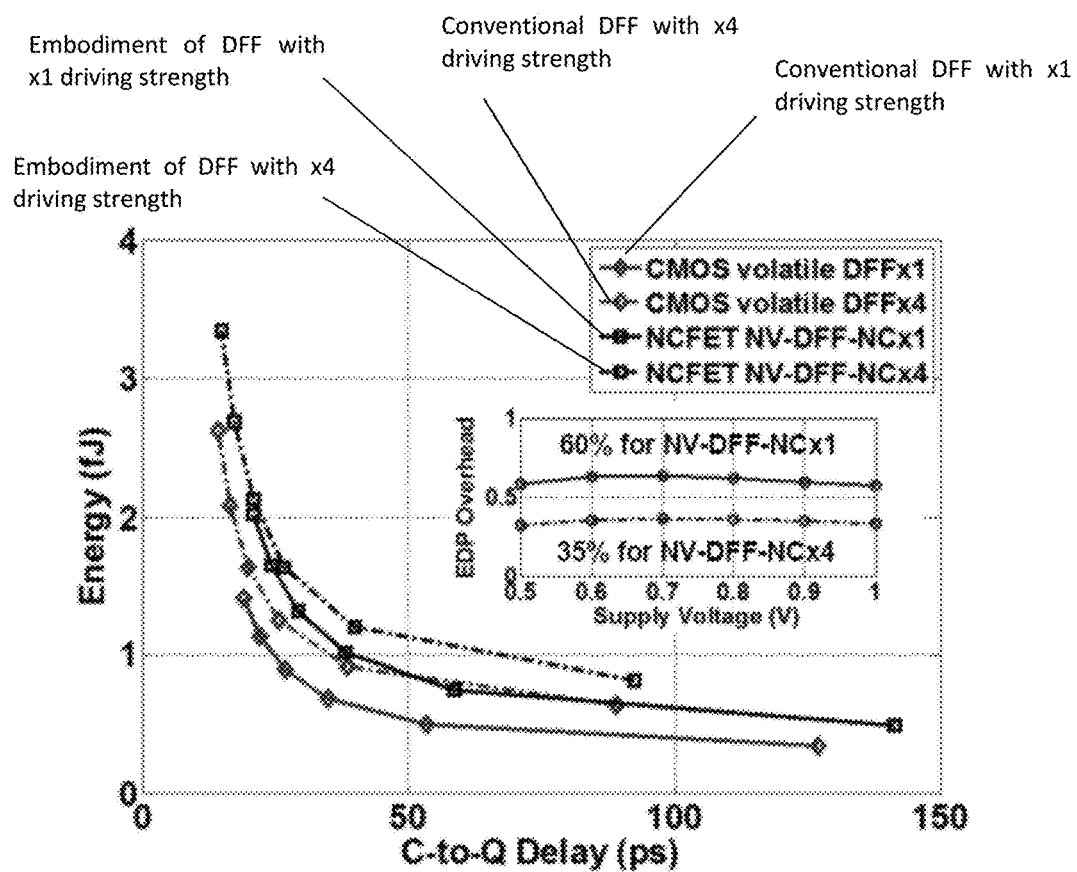
FIG. 58 is a graph comparing the energy versus delay between embodiments of the DFF and conventional DFF designs.

FIG. 58 compares the energy versus delay between embodiments of the DFF 120 and conventional DFF designs. Embodiments of the DFF 120 have around 35% energy-delay-product overhead. Note that the energy here includes the backup energy consumed after Q/QN settles down. For applications with a higher bit-rate or dynamic frequency scaling (DFS) in which the clock cycle is shorter than the polarization switching time, the energy overhead could be much smaller. More importantly, for many IoT applications in which the processor is normally idle, most energy is consumed by the stand-by leakage. In these scenarios, a moderate energy overhead is fairly acceptable.

Additional advantages of embodiments of the DFF 120 over some conventional DFF devices can stem from the fact that the conventional DFF devices may be two-terminal devices, wherein the change of their memory state requires a static current or voltage across them for a certain period of time. Such static current, especially considering the widened time window for write operations due to the impact of device variations, significant amount of energy will be consumed by them. Furthermore, the great scalability, low-voltage operation, high ON-OFF ratio, and the unique external-control-free feature, highlight additional advantage of embodiments of the DFF 120.

Given an FEFET 102 structure and the ferroelectric material, the tunable FeFET design parameter is the ferroelectric layer thickness $T_{FE}$. During device optimizations, the first concern is the retention time. For FeFET memory devices, it depends on the energy barrier between the two polarization states. Increasing $T_{FE}$ can helps increasing the coercive voltage that is required to change the polarization. However, it results in a larger minimum required supply voltage, which indicates more energy consumption each time the polarization is switched.

It is noted that the restore functionality of the embodiments of the latches 118, 122 and DFFs 120 depends on the difference of the sensed resistance from Q/QN to GND or $V_{DD}$, which indicates that the sensitivity of the sensed resistance may be critical for yield. For simplicity, only the sensed resistance to GND, i.e. RQ2GND, was analyzed. For en embodiment of the DFF 120, the sensed resistance can be defined as the sum of the series FeFET drain-source resistance RFeFET and the NMOS drain-source resistance RCMOS. When storing a different latch bit information, the key difference in the initial sensed resistance, without considering process non-idealities, varies in RFeFET. As a result, the ratio of RQ2GND between the two branches in the latch can be:

$$\Gamma = R_{Q2GND,'1'} / R_{Q2GND,'0'}$$
$$= (R_{NCFET,'1'} + R_{CMOS,'1'}) / (R_{NCFET,'0'} + R_{CMOS,'0'})$$
$$\approx R_{CMOS,'1'} / (R_{NCFET,'0'} + R_{CMOS,'0'}).$$

Figure 59:
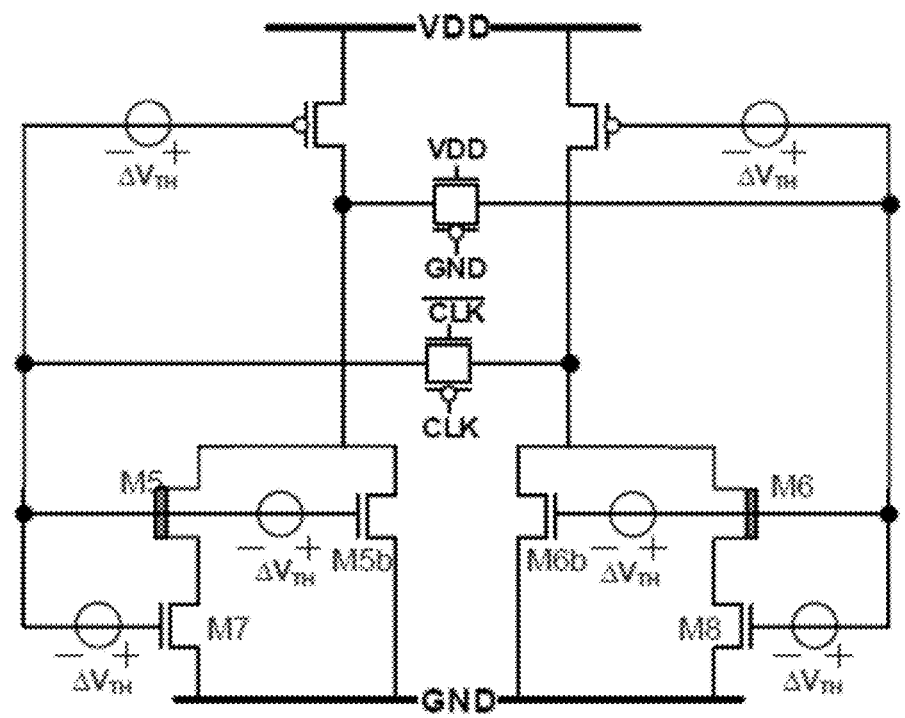
FIG. 59 is an exemplary schematic showing a simulation setup for analyzing the impact of $V_{TH}$ variation on an embodiment

A smaller $\Gamma$ will lead to more stable restore operation and is more noise-resistant. A small RCMOS or a large RFeFET, '0' is thus helpful. Considering the orders of difference in the ON-OFF resistance of RFeFET, the approximation in the equation above is rather safe. For this purpose, $T_{FE}$ is set to be 8 nm so as to provide large ON-OFF state resistance while enabling low-voltage operation. Since the degradation of $\Gamma$ can be easily caused by the variation of the NMOS initial resistance, RCMOS,'0' and RCMOS,'1', analysis should be carried out. This is especially important for designs of the DFF 120, because another parallel branch (see $M_{5b}$ and $M_{6b}$) is affecting $\Gamma$, too. The difference in RCMOS, '0' and RCMOS,'1' mainly comes from device size mismatch and threshold voltage $V_{TH}$ variation $\Delta V_{TH}$. By manually adding an opposite in-series gate driving voltage to the gate, as shown in FIG. 59, the impact of $\Delta V_{TH}$ can be quantified through a series of simulations. The results are summarized in FIG. 60, with $V_{DD}$ ramp-up time equal to 0.8 µs to mimic typical real scenarios. The results show that, within the 0.5V to 1.0V supply voltage range, the design is reliable with $\Delta V_{TH}$ no more than 30 mV. Note that this result provides a fairly large margin for design, as all the MOS-FETs in FIG. 59 are having an unfavorable direction of $V_{TH}$ variation if the FeFETs on the left and right branches store a negative and positive polarization state, respectively.

It is also interesting to find out, that the variation impact is independent on the supply voltage within the given range of 0.5V to 1.0V. This is because of the relatively long rising time for the supply voltage to recover, and the fact that the initial restore trend is almost equal for scenarios with different $V_{DD}$. To provide a small $\Gamma$, the latch is designed in a way that all CMOS transistors have a higher $V_{TH}$ than the bottom two transistors connecting to FeFETs (e.g., $M_7$ and $M_8$). By doing this, the following goals could be achieved: (i) The resistance of $M_7$ and $M_{5b}$, or that of $M_8$ and $M_{6b}$, plays a less significant role than that of FeFETs, as $M_7$ is in series with the FeFET, and $M_{5b}$ is in parallel with the FeFET. This will help built the correct rising trend of Q and QN when $V_{DD}$ starts to recover. (ii) Static leakage current of the latch will not increase. This can be guaranteed by a proper FeFET design with a high OFF-state resistance. Given a certain ferroelectric material and transistor structure, this OFF-state resistance could be tuned by varying $T_{FE}$ and the width of FeFET 102. The large inherent ON-OFF resistance ratio will help to reduce the impact of FeFET variation.

Embodiments of the DFF 120 could be strongly complementary to existing power-gating approaches in both low and high-performance systems. In aggressive, high speed systems using fine-grained, low-latency power-gating techniques, the ability to power-gate stateful units up to and including entire processor cores within a handful of cycles would both expand the scope of what can be power-gated and simplify design constraints. While the impact of no need for backup and restore control for power-gating is still not yet fully explored, it is promising to open up new possibilities for further energy savings and architecture optimizations due to the reduced control complexity. On the energy-harvesting end of the spectrum, one apparent benefit is the reduced backup and restore energy consumption and latency, which improves the utilization of harvested energy for the purpose computation. The intrinsic non-volatility ensures no missing backup without the need for backup control, leading to prevention of roll-back operations in the computation progress. While there are already works on nonvolatile processor optimizations, further architecture-level optimizations would be useful to capture the intrinsic non-volatility of FeFET flip-flops. Meanwhile, it has been shown that the recovery time in NVPs after a power emergency are sometimes dominated by the recovery of analog components, such as ensuring PLL stability. While this limits the impact of the rapid recovery time that NC-DFFs have in such systems, their rapid, completely distributed and low energy backup properties may allow power gating of data path and other digital components fast enough to divert energy during shorter or less severe power emergencies in order to preserve analog functionality, using embodiments of the DFF 120F cycle-latency (at NVP frequencies) power gating potential to shave microseconds off recovery times.

Embodiments of the NMV device 100 can be configured as a memory cell 124. Embodiments of the memory cell 124 can be configured with a 2-transistor FeFET 102 topology between the Wordline and the Readline (2T-memory cell 124) or a 3-transistor FeFET 102 topology between the Wordline and Readline (3T-memory cell 124). Embodiments of the memory cell 124 can facilitate an improved memory access method.

For example, embodiments of the memory cell 124 can include at least one FeFET 102 to provide intrinsic nonvolatility, compatibility with commercial CMOS processes, both high ON-state current and low OFF-state current, and/or merged logic-memory functionality, which can facilitate convenient writing and nondestructive reading for the memory cell 124. Embodiments of the memory cell 124 can have high energy-efficiency and high write speed, along with improved performance and energy versus latency tradeoffs for writes. Embodiments of the memory cell 124 can support voltage-mode sensing for read access, which can broaden design space flexibility in support of different application scenarios.

As noted herein, nonvolatile memory arrays can be used to reduce or eliminate static leakage power in embedded memories by completely shutting down the power supply while retaining the stored data and computation progress. Conventional nonvolatile devices can be limited by requiring the write operation to depend on the voltage change at the FeFET gate only and not concurrently at the FeFET drain and source. This can require a doubled gate driving voltage range to set the memory state, resulting in multi-supply overheads and loss of energy efficiency. In addition, a voltage-mode read is not supported with conventional topologies for nonvolatile devices, causing high design overheads for read access in some scenarios due to bit-line current sensing and voltage clamping.

Figure 61:
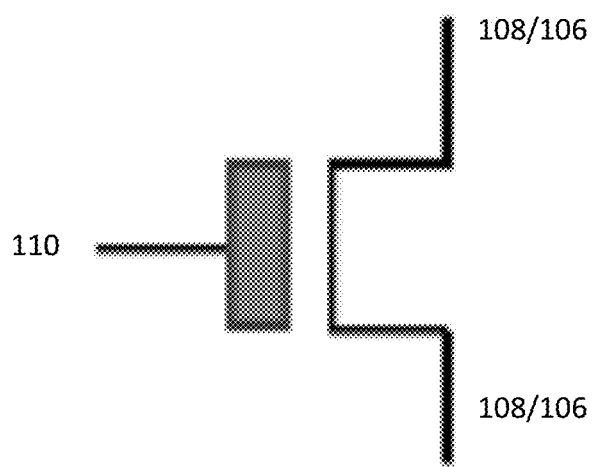
FIG. 61 is an exemplary schematic showing a schematic for an N-type FeFET.
Figure 62:
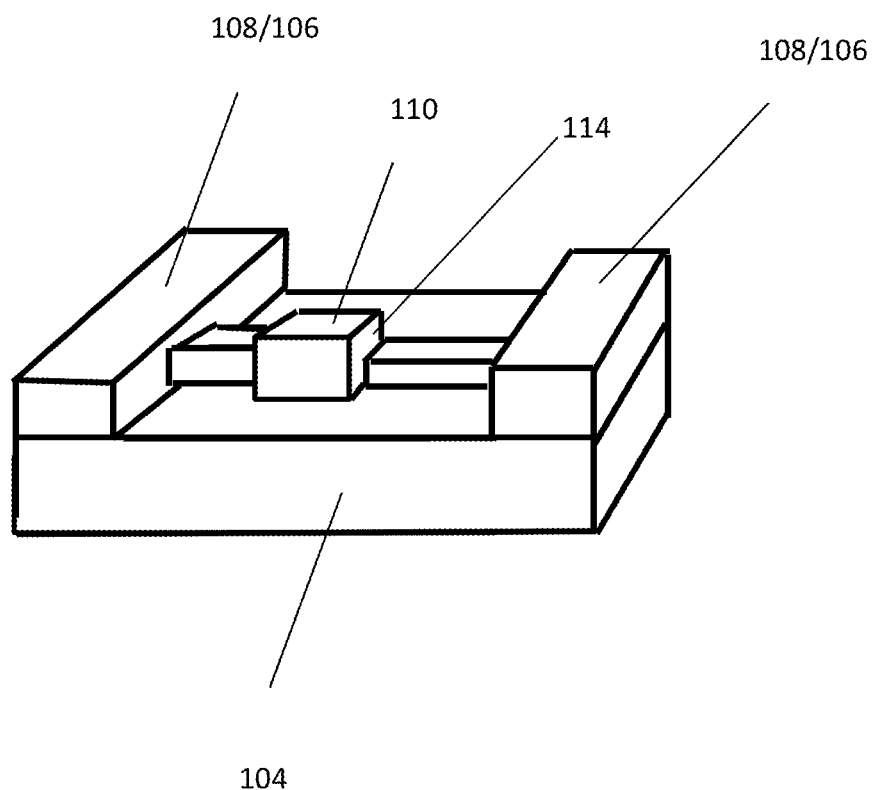
FIG. 62 is an exemplary schematic showing a fin-structured FeFET device.
Figure 63:
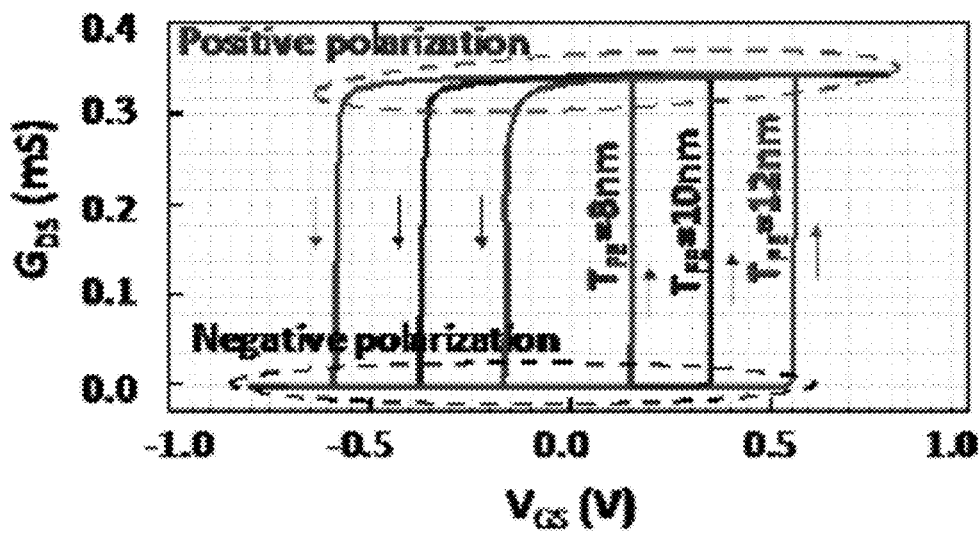
FIG. 63 is a graph showing a typical hysteretic $G_{DS}$-$V_{GS}$ extracted form one fin of a fin-structured FeFET device at $V_{DS}$=10 mV.

FIGS. 61-63 show a FeFET 102 in a fin structure, which can be a MOSFET with an extra ferroelectric gate insulator, such as doped hafnium dioxide. FIG. 61 shows a schematic for an N-type FeFET 102, FIG. 62 shows a fin-structured FeFET device, and FIG. 63 shows a typical hysteretic $G_{DS}$-$V_{GS}$ extracted form one fin of a fin-structured FeFET device at $V_{DS}$=10 MV. FeFET device parameters for the LK equation were: $\alpha$=−1.05×109 m/F, $\beta$=1×107 m5/F/C2, and $\gamma$=6×1011 m9/F/C4. The ferroelectric material was adopted in this structure for the purpose of steep switching behavior with a sub-threshold swing (SS) lower than 60 mV/dec so that the transistor could be used to build lower-power logic gates. Making use of the voltage booting function of the negative capacitance of the ferroelectric material can be done to increase the internal MOSFET gate voltage. In addition, as noted herein, increasing the ferroelectric layer thickness ($T_{FE}$), when the negative ferroelectric capacitance is smaller than the positive MOSFET gate capacitance, a hysteresis appears and may exhibit distinct ON and OFF states with zero gate-source voltage ($V_{GS}$) based on the direction of the ferroelectric material polarization.

For conventional logic gates, hysteresis should be strictly controlled or minimized to comply with the logic operation. On the contrary, it is intriguing to use the hysteresis for low-power NVM applications.

Figure 64:
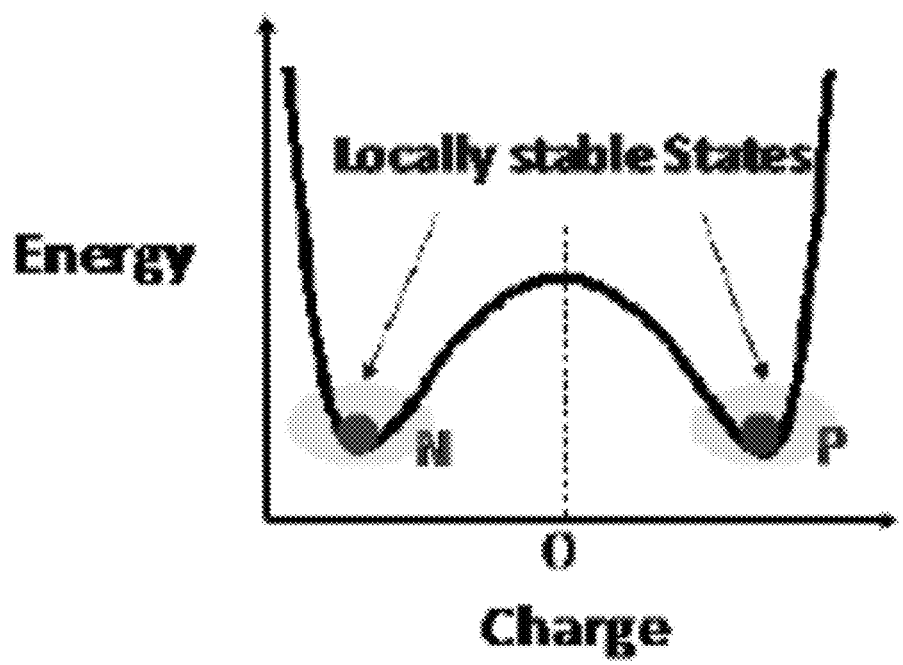
FIG. 64 is a graph showing an exemplary energy landscape plot for an embodiment of a FeFET.
Figure 65:
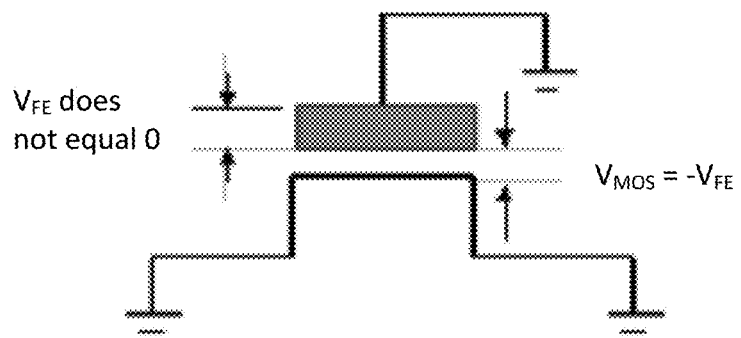
FIG. 65 is a graph showing static internal states with an embodiment of the FeFET biased at $V_{GS}$=0.

FIG. 64 shows an exemplary energy landscape plot for an embodiment of a FeFET 102. FIG. 65 shows static internal states with an embodiment of the FeFET 102 biased at $V_{GS}$=0. The polarization state of the ferroelectric material is stable at zero $V_{GS}$. As the energy landscape plot in FIG. 64 shows, the stable polarization state stays close to the two lowest-energy region. For a zero-$V_{GS}$ FeFET in the OFF (or ON) state, a stable positive (or negative) voltage across the ferroelectric layer, $V_{FE}$, and accordingly a negative (or positive) internal gate-source voltage of the internal MOSFET, $V_{MOS}$, lead to different $G_{DS}$ states.

The two nonvolatile $G_{DS}$ states in FIG. 65 show over four orders of difference in magnitude, leading to low-cost sensing schemes to distinguish the state difference. This is superior to existing nonvolatile devices. The sharp transitioning between different states also helps to maintain a larger noise margin. These advantages come from FeFET 102 features of: (i) the settling-down transition behavior in the energy landscape as a passive amplification for $V_{MOS}$, and (ii) the gain of the internal MOSFET from $V_{MOS}$ to sensed current $I_{DS}$. For conventional nonvolatile devices. no MOSFET gain is intrinsically provided and sensing the ferroelectric material is more complex and sensitive to the external bit-line parasitic capacitance.

With proper MOSFET work function engineering and ferroelectric material design that matches the MOSFET properties, e.g. the gate capacitance, it is possible to locate the FeFET I-V hysteresis window around zero $V_{GS}$ with embodiments of the FeFET 102. By tuning $T_{FE}$, the hysteresis width could also be optimized to work under a proper supply voltage, as shown in FIG. 63.

Embodiments of the FeFET 102 can have integrated the NVM storage and the logic transistor operating as a memory state amplifying reader. Such integration not only provides the opportunity to design a simplified low-power sensing scheme, but also opens up new space for future memory-oriented computing.

The polarization switching can be accomplished by applying a positive or negative voltage across the ferroelectric layer 114. Different from the state change in resistive memory devices, no static DC current is consumed for embodiments of the FeFET 102 (biased with $V_{DS}$=0V). Furthermore, when considering the resistive memory device variations of required write pulse duration, even more energy could be saved.

It should be noted that the ferroelectric material in FeFETs could be the same as that in ferroelectric random access memory (FeRAM) devices, leading to similar memory features of retention time, endurance, etc. Yet, the FeFET memory read operation is non-destructive, which outperforms FeRAM. In addition, FeFET is fundamentally superior to FeRAM with better distinguishability and access interface.

Figure 66:
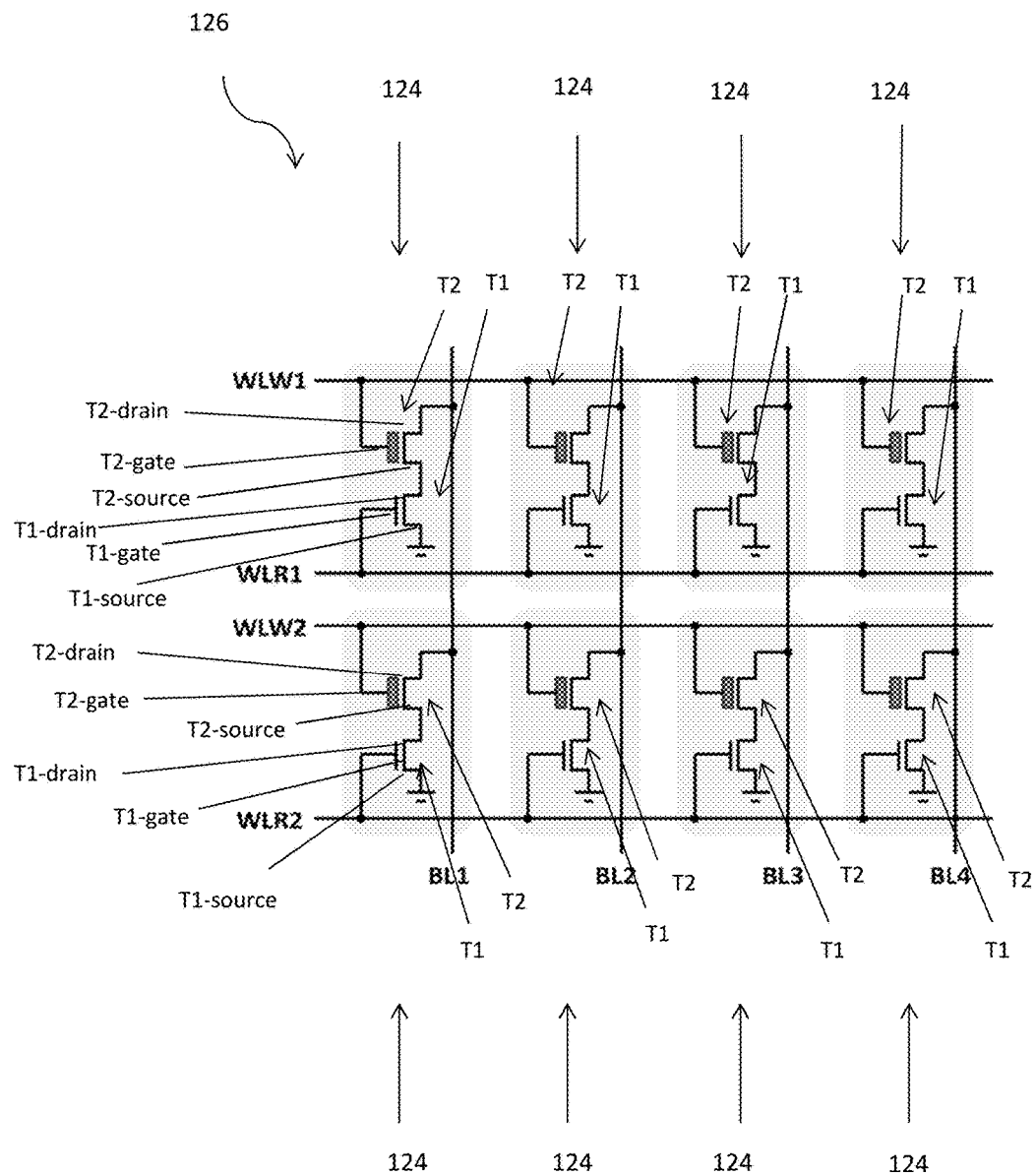
FIG. 66 is an exemplary schematic showing an embodiment of a 2T-memory cell.

Referring to FIG. 66, embodiments of the 2T-memory cell 124 can include a first transistor $T_1$, a second transistor $T_2$, a bit line, BL, a first Wordline, WLW, and a second Wordline, WLR. $T_1$ can be a MOSFET. $T_1$ can have a $T_1$-source, a $T_1$-gate, and a $T_1$-drain. $T_2$ can be a FeFET 102. $T_2$ can have a $T_2$-source, a $T_2$-gate, and a $T_2$-drain. WLW can be configured to receive and/or transmit a write signal for write operations. WLR can be configured to receive and/or transmit a read signal for read operations. $T_2$-drain can be connected to BL and WLW. $T_2$-gate can be connected to WLW. $T_2$-source can be connected to $T_1$-drain. $T_1$-gate can be connected to WLR and BL. $T_1$-source can be connected to GND.

Some embodiments can include a plurality of 2T-memory cells 124. For example, a memory cell array 126 can include a first 2T-memory cell 124, a second 2T-memory cell 124, a third 2T-memory cell 124, etc. In at least one embodiment, the memory cell array 126 can include a first 2T-memory cell 124, a second 2T-memory cell 124, a third 2T-memory cell 124, a fourth 2T-memory cell 124, a fifth 2T-memory cell 124, a sixth 2T-memory cell 124, a seventh 2T-memory cell 124, and an eighth 2T-memory cell 124. The memory cell array 126 can have a first BL, BL1, a second BL, BL2, a third BL, BL3, and a fourth BL, BL4. The memory cell array 126 can have a first WLW, WLW1, a second WLW, WLW2, a first WLR, WLR1, and a second WLR, WLR2. Each memory cell 124 can have a $T_1$ and a $T_2$, wherein $T_1$ is a MOSFET and $T_2$ is a FeEFT 102. For example, the first 2T-memory cell 124 can have a first $T_1$ and a first $T_2$. The second 2T-memory cell 124 can have a second $T_1$ and a second $T_2$. The third 2T-memory cell 124 can have a third $T_1$ and a third $T_2$. The fourth 2T-memory cell 124 can have a fourth $T_1$ and a fourth $T_2$. The fifth 2T-memory cell 124 can have a fifth $T_1$ and a fifth $T_2$. The sixth 2T-memory cell 124 can have a sixth $T_1$ and a sixth $T_2$. The seventh 2T-memory cell 124 can have a seventh $T_1$ and a seventh $T_2$. The eighth 2T-memory cell 124 can have an eighth $T_1$ and a eighth $T_2$. Each of WLW1 and WLW2 can be configured to receive and/or transmit a write signal for write operations. Each of WLR1 and WLR2 can be configured to receive and/or transmit a read signal for read operations.

For the first 2T-memory cell 124, first cell $T_2$-drain can be connected to BL1 and WLW1. First cell $T_2$-gate can be connected to WLW1. First cell $T_2$-source can be connected to first cell $T_1$-drain. First cell $T_1$-gate can be connected to WLR1 and BL1. First cell $T_1$-source can be connected to GND. For the second 2T-memory cell 124, second cell $T_2$-drain can be connected to BL2 and WLW1. Second cell $T_2$-gate can be connected to WLW1. Second cell $T_2$-source can be connected to second cell $T_1$-drain. Second cell $T_1$-gate can be connected to WLR1 and BL2. Second cell $T_1$-source can be connected to GND. For the third 2T-memory cell 124, third cell $T_2$-drain can be connected to BL3 and WLW1. Third cell $T_2$-gate can be connected to WLW1. Third cell $T_2$-source can be connected to third cell $T_1$-drain. Third cell $T_1$-gate can be connected to WLR1 and BL3. Third cell $T_1$-source can be connected to GND. For the fourth 2T-memory cell 124, fourth cell $T_2$-drain can be connected to BL4 and WLW1. Fourth cell $T_2$-gate can be connected to WLW1. Fourth cell $T_2$-source can be connected to fourth cell $T_1$-drain. Fourth cell $T_1$-gate can be connected to WLR1 and BL4. Fourth cell $T_1$-source can be connected to GND. For the fifth 2T-memory cell 124, fifth cell $T_2$-drain can be connected to BL1 and WLW2. Fifth cell $T_2$-gate can be connected to WLW2. Fifth cell $T_2$-source can be connected to fifth cell $T_1$-drain. Fifth cell $T_1$-gate can be connected to WLR2 and BL1. Fifth cell $T_1$-source can be connected to GND. For the sixth 2T-memory cell 124, sixth cell $T_2$-drain can be connected to BL2 and WLW2. Sixth cell $T_2$-gate can be connected to WLW2. Sixth cell $T_2$-source can be connected to sixth cell $T_1$-drain. Sixth cell $T_1$-gate can be connected to WLR2 and BL2. Sixth cell $T_1$-source can be connected to GND. For the seventh 2T-memory cell 124, seventh cell $T_2$-drain can be connected to BL3 and WLW2. Seventh cell $T_2$-gate can be connected to WLW2. Seventh cell $T_2$-source can be connected to seventh cell $T_1$-drain. Seventh cell $T_1$-gate can be connected to WLR2 and BL3. Seventh cell $T_1$-source can be connected to GND. For the eighth 2T-memory cell 124, eighth cell $T_2$-drain can be connected to BL4 and WLW2. Eighth cell $T_2$-gate can be connected to WLW2. Eighth cell $T_2$-source can be connected to eighth cell $T_1$-drain. Eighth cell $T_1$-gate can be connected to WLR2 and BL4. Eighth cell $T_1$-source can be connected to GND.

Figure 67:
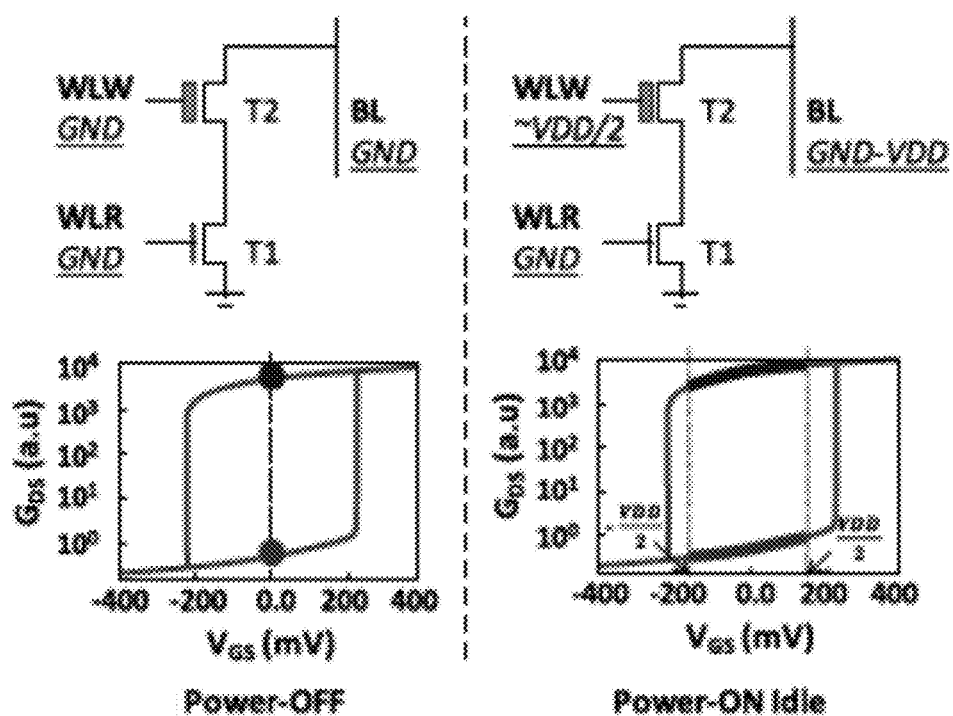
FIG. 67 is an exemplary schematic showing the operating status of the 2T-memory cell 1 of FIG. 66 in power-off mode and in power-on idle mode.

FIG. 67 shows the operating status of the 2T-memory cell 124 of FIG. 66 in terms of $G_{DS}$ versus $VG_S$. In the power-off mode, the bit line and word lines are grounded and the FeFETs 102 stay with $G_{DS}$ being high or low as illustrated in the power-OFF mode. With the power turned on, the cells in rows not being read or written are in the idle mode with WLW voltage set to about $V_{DD}/2$ and WLR to GND. Thus, this idle-mode cell does not deliver a DC current or affect the BL sensing result. Note that $V_{BL}$ could vary from GND to $V_{DD}$ as BL could be controlled by other active rows being read or written. In this case, the FeFET 102 operating point could be in a consecutive region (as opposed to single pinpoints) in the $G_{DS}$ versus $V_{GS}$ curve. To prevent the idle-mode FeFET polarization state being flipped, the stable hysteresis region should safely cover this range through device-circuit co-design methods like tuning $T_{FE}$.

Figure 68:
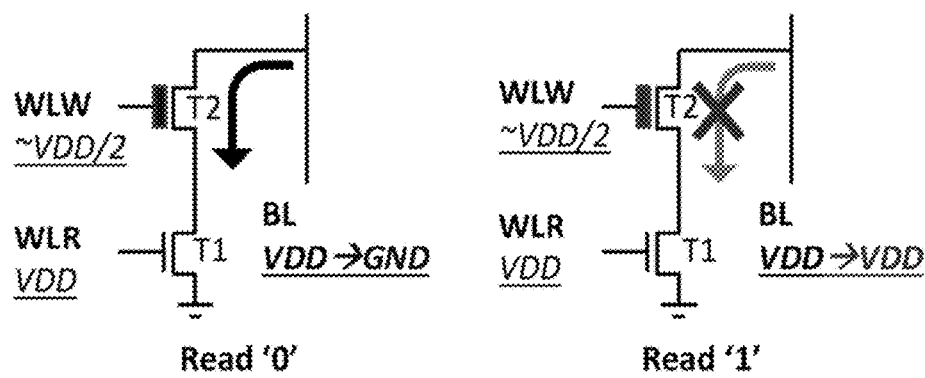
FIG. 68 is an exemplary schematic showing the operating status of the 2T-memory cell 1 of FIG. 66 in voltage-mode read '0' and voltage-mode read '1'.

Embodiments of the memory cell array 126 can operate with a row-wise read. FIG. 68 shows an exemplary read operation with pre-charged BL. $V_{WLW}$ is set to about $V_{DD}/2$ to keep the FeFET polarization unchanged. $V_{WLR}$ is set to $V_{DD}$ to turn on $T_1$. The memory cell array 126 topology supports both voltage-sensing and current-sensing read. In a voltage-sensing read, BL can be pre-charged, to $V_{DD}$ or some other voltage above GND. When WLR is enabled to turn on $T_1$, $V_{BL}$ may remain high if $T_2$ is in the OFF state, or discharge quickly to GND if $T_2$ is in the ON state. Such a difference in BL settling behavior could be conveniently sensed with a voltage sense amplifier connecting to BL. In addition, the memory read result may be achieved before BL eventually settles down to GND, as long as the sense amplifier could effectively tell the voltage difference of $V_{BL}$ between the two memory read scenarios.

If current-sensing read is adopted, the bit line voltage $V_{BL}$ should be fixed, and the current from the bit line to the ground through the cell in the selected row can be sensed by a current sense amplifier, similar to existing resistive memory array sensing schemes. This can help to reduce the sensing latency by avoiding charging and discharging the long bit-line parasitic capacitance for a large-size array. The capability of supporting both sensing modes provides more case-to-case design flexibility.

Figure 69:
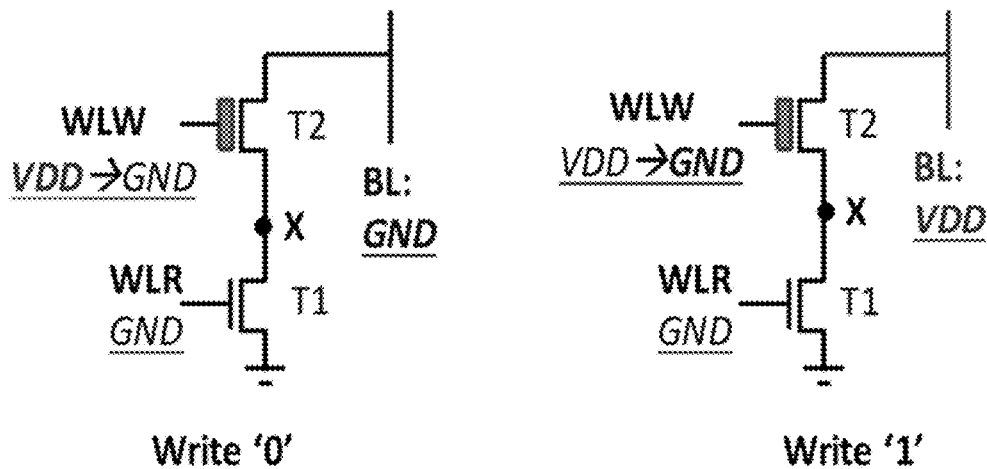
FIG. 69 is an exemplary schematic showing the operating status of the 2T-memory cell 1 of FIG. 66 in voltage-mode write '0' and voltage-mode write '1'.

FIG. 69 shows an exemplary write operation setup. $V_{BL}$ can be set to GND and $V_{DD}$ to write '0' and '1', respectively. $V_{WLR}$ can be set to GND to turn off $T_1$. $V_{WLW}$ can be set to $V_{DD}$ in the first phase and then GND in the second phase. As WLW is shared with all bits in the word, such a two-phase write method enables writing different values for different bits in the same word line. To write '0', the FeFET polarization switching to the desired positive state occurs during the first phase with $V_{WLW}=V_{DD}$. Setting $V_{WLW}$ to be beyond the hysteresis rising edge (with $T_2$ source voltage at GND) triggers the polarization switching. To write '1', the FeFET polarization switching occurs for the desired negative state.

If the polarization state of the $T_2$ is positive, the internal node X would charge to $V_{DD}$ by BL through the ON-state of $T_2$. Then, when $V_{WLW}$ becomes GND in the second phase, $T_2$ is biased with $V_G$=GND, $V_S$=$V_D$=$V_{DD}$, leading to a polarization switching to be negative. It is noted that, $V_{WLW}$ could also be set to GND and $V_{DD}$ in the first and second write phases, respectively.

Figure 70:
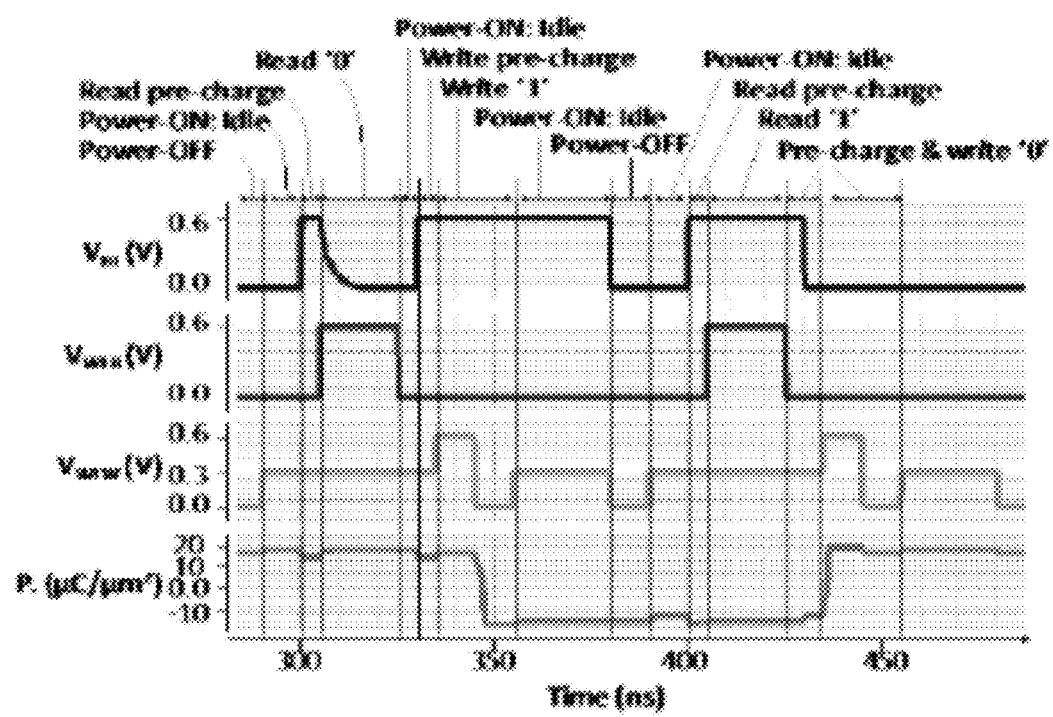
FIG. 70 is a graph showing a snapshot of a SPICE transient simulation waveform of an embodiment of the memory cell array, showing polarization statuses for the FeFET transistors in the array.

FIG. 70 is a snapshot of a SPICE transient simulation waveform of an embodiment of the memory cell array 126, showing polarization statuses for the FeFET transistors. For the simulation, $T_{FE}$ is 8 nm. ρ was 0.25 and $V_{DD}$ was 0.6V. The polarization switching speed in FIG. 70 was based on a relatively large ρ and consequently a slow FeFET. The switching speed could be much faster with a smaller ρ. The read latency in FIG. 70 depends on the bit line parasitic capacitance, which increases as the array size increases.

Figure 71:
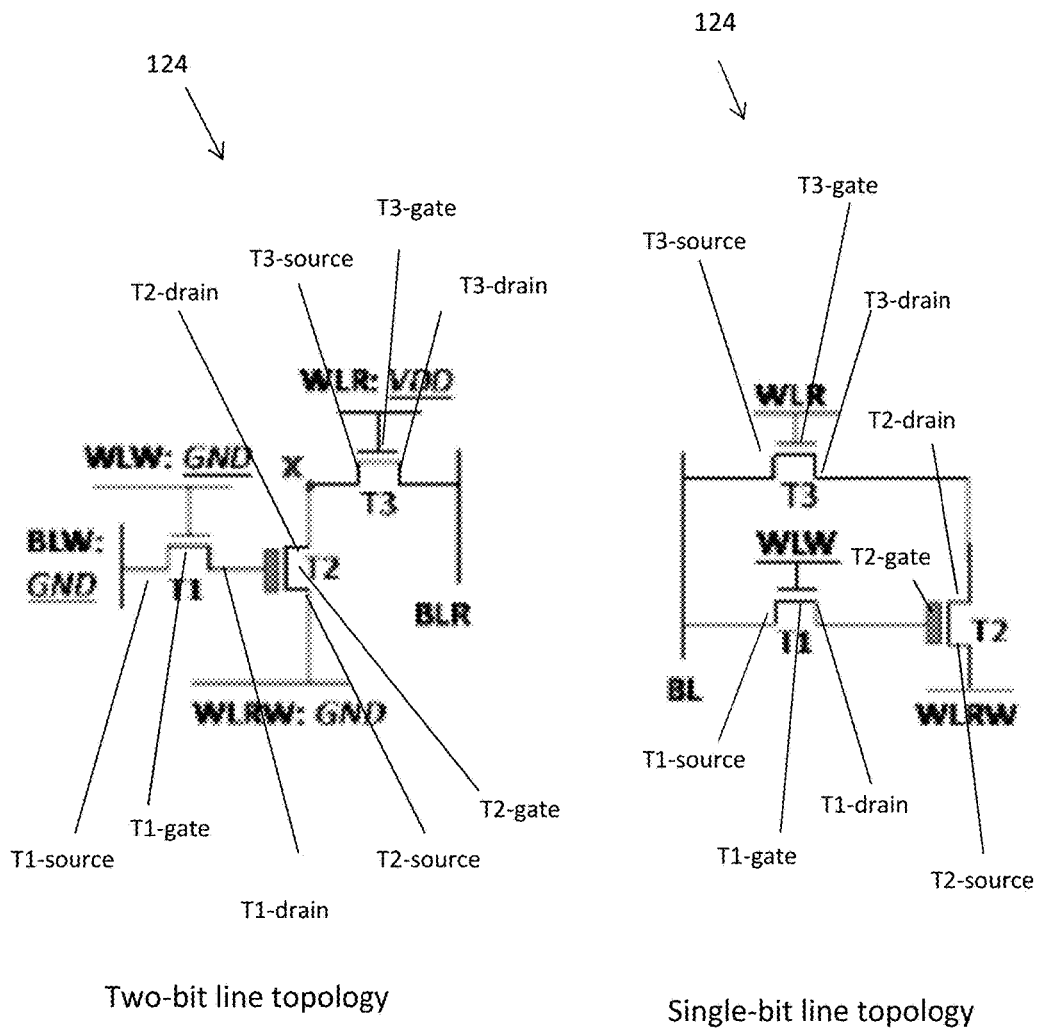
FIG. 71 is an exemplary schematic showing an embodiment of a 3T-memory cell having a two-bit line topology and a single-bit line topology.

Embodiments of a 3T-memory cell 124 can provide additional design flexibility in certain scenarios. FIG. 71 shows an embodiment of a 3T-memory cell 124, with the 3T-memory cell 124 in a two-bit line topology and a single-bit line topology for a voltage-sensing read mode.

The 3T-memory cell 124 having a two-bit line topology can have a first transistor, $T_1$, a second transistor, $T_2$, a third transistor $T_3$, a first bit line, BLW, a second bit line, BLR, a WLW, a WLR, and a Wordline-Readline, WLRL. $T_1$ and $T_3$ can be MOSFETs. $T_2$ can be a FeFET 102. $T_1$ can have a $T_1$-source, a $T_1$-gate, and a $T_1$-drain. $T_2$ can have a $T_2$-source, a $T_2$-gate, and a $T_2$-drain. $T_3$ can have a $T_3$-source, a $T_3$-gate, and a $T_3$-drain. $T_1$-drain can be connected to $T_2$-gate. $T_1$-gate can be connected to WLW. $T_1$-source can be connected to BLW. $T_2$-drain can be connected to $T_3$-source. $T_2$-gate can be connected to $T_1$-drain. $T_2$-source can be connected to WLRW. $T_3$-drain can be connected to BLR. $T_3$-gate can be connected to WLR. $T_3$-source can be connected to $T_2$-drain. Any one or combination of BLW, WLW, and WLRW can be connected to GND. WLR can be connected to $V_{DD}$.

The 3T-memory cell 124 can have one write-access N-type MOS transistor $T_1$ controlled by the write-access word line WLW, one read-access N-type MOS transistor $T_3$ controlled by the read-access word line WLR, and to storage N-type FeFET $T_2$ connecting to the wordline WLRW for both read and write. The cell 124 uses two bit lines: BLR for read and BLW for write. In power-OFF and idle modes, all word lines and bit lines could be safely grounded. Both voltage sensing and current sensing could be used to perform read. In the voltage-sensing read, $T_3$ can be turned ON, and WLRW set to GND. The pre-charged $V_{BLR}$ will remain almost unchanged with an OFF-state $T_2$ or drop quickly to GND with an ON-state $T_2$. A voltage thresholding of $V_{BLR}$ could provide the sensing result for a voltage-mode sensing scheme. In the current-mode sensing scheme, $V_{BLR}$ can be fixed and $T_3$ turned ON. Thus, the current delivered by the cell can be sensed at the bit line, providing another meaningful option for energy-delay optimization in a larger memory array.

The 3T-memory cell 124 having a single-bit line topology can have a first transistor, $T_1$, a second transistor, $T_2$, a third transistor $T_3$, a bit line, BL, a WLW, a WLR, and a WLRL. $T_1$ and $T_3$ can be MOSFETs. $T_2$ can be a FeFET 102. $T_1$ can have a $T_1$-source, a $T_1$-gate, and a $T_1$-drain. $T_2$ can have a $T_2$-source, a $T_2$-gate, and a $T_2$-drain. $T_3$ can have a $T_3$-source, a $T_3$-gate, and a $T_3$-drain. $T_1$-drain can be connected to $T_2$-gate. $T_1$-gate can be connected to BL. $T_2$-drain can be connected to $T_3$-drain. $T_2$-gate can be connected to $T_1$-drain. $T_2$-source can be connected to WLRW. $T_3$-drain can be connected to $T_2$-drain. $T_3$-gate can be connected to WLR. $T_3$-source can be connected to BL.

Figure 72:
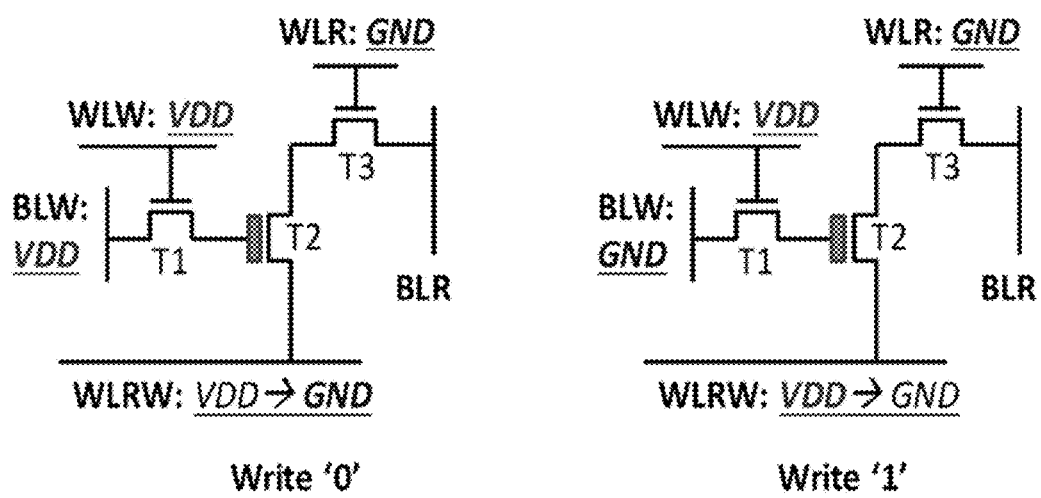
FIG. 72 is an exemplary schematic showing an embodiment of a 3T-memory cell in write mode using a two-step write method.

FIG. 72 shows an embodiment of a 3T-memory cell 124 having a two-bit line topology in write mode using a two-step write method. A row-wise write operation is shown when $T_3$ is turned OFF, $T_1$ is turned ON, BLW set to GND, and $V_{DD}$ to write '1' and write '0'. A two-phase voltage setting for WLRW can be adopted, changing from $V_{DD}$ to GND. Write operation for '1' and '0' occurs in the $V_{DD}$ phase with $V_{GS}$=−$V_{DD}$ and GND phase with $V_{GS}$=+$V_{DD}$, respectively. If the two bit lines are merged into one to form the single-bit line topology, bit line BL would inherit the BLW setting of the two-bit line topology. $V_{WLRW}$ could be GND in the first phase and $V_{DD}$ in the second phase for the write.

Figure 73:
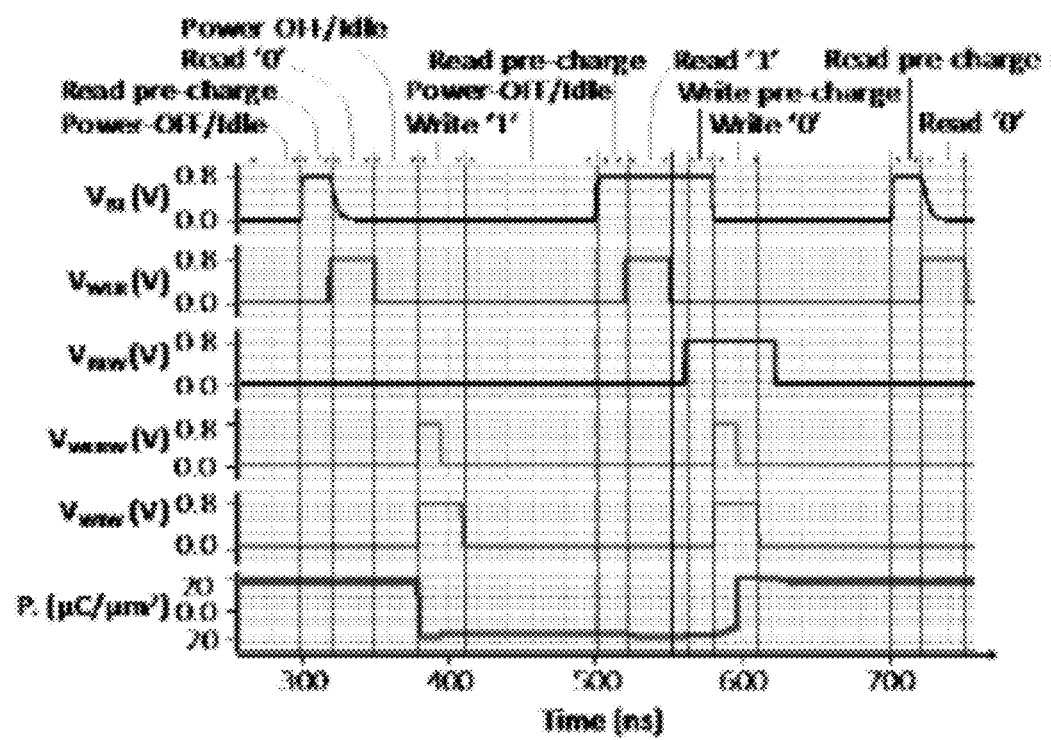
FIG. 73 is a graph showing SPICE transient simulation waveforms for an embodiment of the memory cell.

FIG. 73 shows SPICE transient simulation waveforms for an embodiment of the cell 124. For the simulation, $T_{FE}$ was 10 nm, ρ was 0.1, and $V_{DD}$ was 0.8V. Voltage-sensing mode read was applied. An optional write pre-charge of write bit line BLW was adopted so that $V_{BLW}$ was set slightly prior to the setting of word lines. In practice, this would improve the write latency as the polarization switching in the write operation can start as soon as the word line is ready. In the simulations, a 50 fF parasitic capacitor was assumed for each bit, a 10 nm FeFET model was used, based on the LK equation with PZT as the ferroelectric material.

Figure 74:
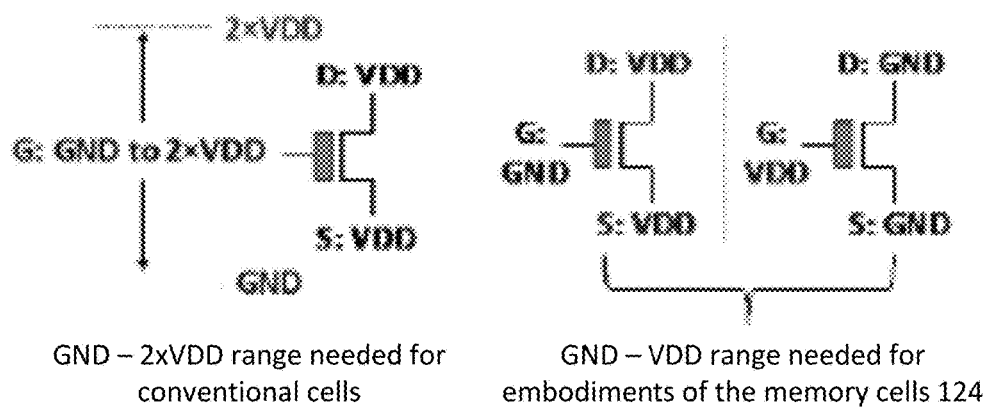
FIG. 74 is an exemplary schematic showing a comparison between supply voltage ranges required for write for a conventional memory cell and for an embodiment of the memory cell.

For fair comparison, no negative supply was used. For the conventional cell designs, the use of negative supply voltage of −$V_{DD}$ was prevented by equally shifting up all supply and biasing voltages by $V_{DD}$, as shown in FIG. 74. Different from embodiments of the memory cell 124 disclosed herein, conventional cell designs have the same and fixed drain and source voltage during writing '0' and '1', resulting in the need of a doubled voltage range, as illustrated in FIG. 74. Note that this supply voltage range is 2×$V_{DD}$ even if the negative supply is kept in the conventional cell design. Embodiments of the memory cell 124 were also evaluated with $T_{FE}$=12 nm for a wider FeFET hysteresis window to extend the supply voltage operation range.

The write energy is the average energy consumed to write '1' and '0' from a different prior state. The write operation latency covers a different period of time between the embodiments of the memory cell 124 and conventional cell designs. For embodiments of the For the memory cell 124 that adopt two-phase write, it is the sum of latency in writing '0' and '1'. For the conventional cell designs, the write operation latency is defined as the maximum latency to write '0' and write '1'.

Figure 75:
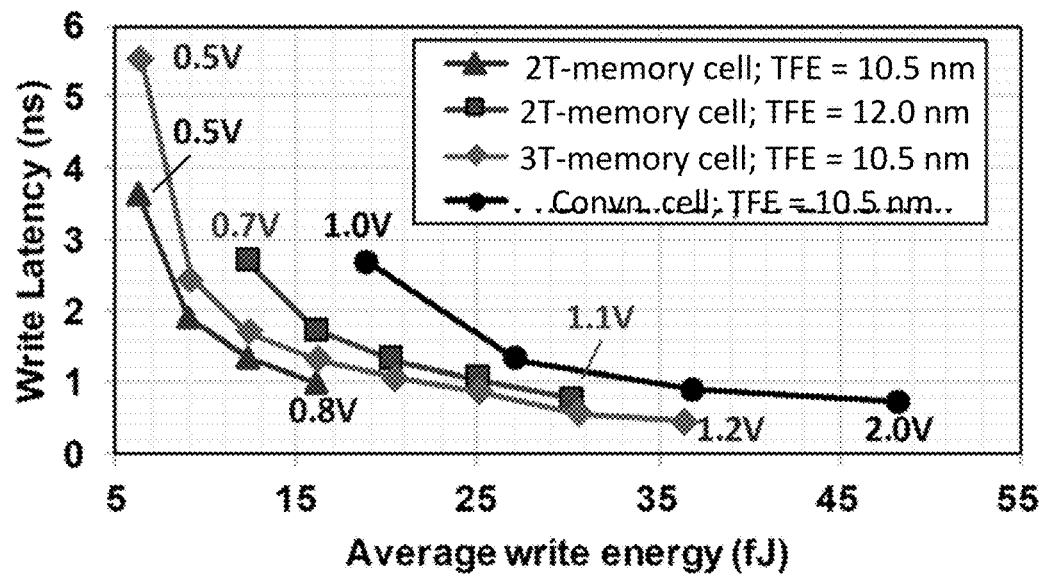
FIG. 75 is a graph showing the simulated write energy per cell versus the write latency for embodiments of the memory cell, as compared to a conventional memory cell.

FIG. 75 shows the simulated write energy per cell versus the write latency for embodiments of the memory cell, as compared to a conventional memory cell. In addition to low write energy and latency of the disclosed designs, a few observations are manifest: First, a higher supply voltage leads to less latency and more energy consumption. Due to no-DC-current write, no more than 2% of the average write energy is consumed to switch the polarization. Second, the 2T-memory cell 124 with a higher $T_{FE}$ of 12 nm has higher write latency than that 2T-memory cell 124 with 10.5 nm $T_{FE}$, even under the same supply voltage. This is because of a different ferroelectric energy landscape and wider hysteresis width. Third, the 3T-memory cell 124 with 10.5 nm $T_{FE}$ has the write energy-latency curve that lies in between the two curve segments of the 2T-memory cell 124. At the higher-voltage segment, the 3T-memory cell 124 has lower latency than the 2T-memory cell 124 with $T_{FE}$=12 nm, mainly because of an intrinsically faster FeFET. At the lower-voltage segment, the 3T-memory cell 124 has higher write latency than the 2T-memory cell 124 with $T_{FE}$=10.5 nm, mainly because of the write mechanism differences: before WLW is effectively triggered, the 2T-memory cell 124 can use a prior read operation and BL preset to set the desired voltage for both drain and source of the FeFET. While the 3T-memory cell 124 has neither the source nor drain of the FeFET preset (after a read operation, the internal node X is desired to be GND but charged to $V_{DD}$, and is desired to be $V_{DD}$ but was discharged to GND). Last, conventional cells have the highest write energy. This is mainly because of the required doubled voltage to charge the bit line. In addition, it also results in higher voltage stress on the write-access transistor, which may induce a stability problem and also a power problem as the drain-body or source-body interface diode may be turned on with a high voltage across it.

Figure 76:
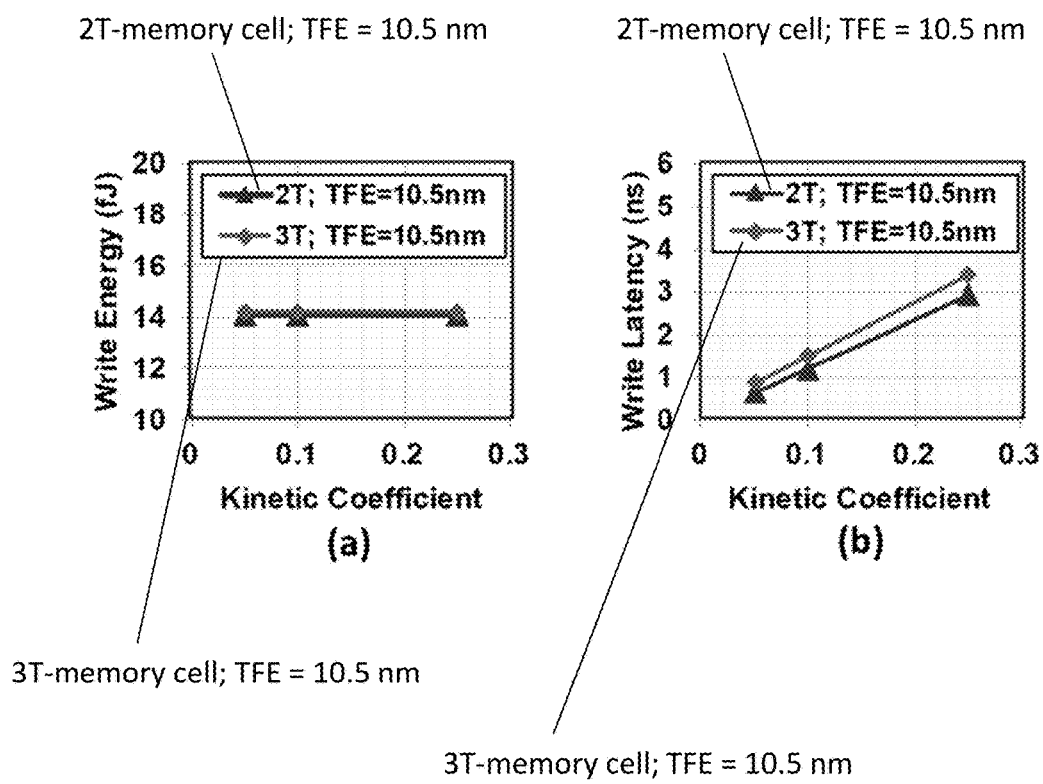
FIG. 76 is a graph showing energy and latency for an embodiment of the memory cell as a function of ρ.

It should be noted that, the write latency was based on ρ set as 0.1. The energy and latency as a function of ρ are provided in FIG. 76, wherein the left side plot if for a fixed ρ and the right side plot is for a varying ρ at $V_{DD}$=07.5V. The write energy is almost constant and unrelated to the polarization switching speed, while the write latency strongly linearly reacts to the kinetic coefficient, as is expected.

The current-sensing read performance was not simulated as it strongly depends on the current sense amplifier design. Therefore, only the voltage-sensing read operations were evaluated. The read operation energy is the average energy consumed to read '1' and '0'. As reading '1' does not noticeably change the bit line voltage, the read operation latency is actually equal to the latency for the read of '0', which is defined as the delay from the effective word line triggering point (with 50% voltage change) to the point when the read bit line voltage has reduced by 150 mV. Practically, a voltage difference of 150 mV could be sensed with a voltage-mode amplifier that does not require a high gain.

Figure 77:
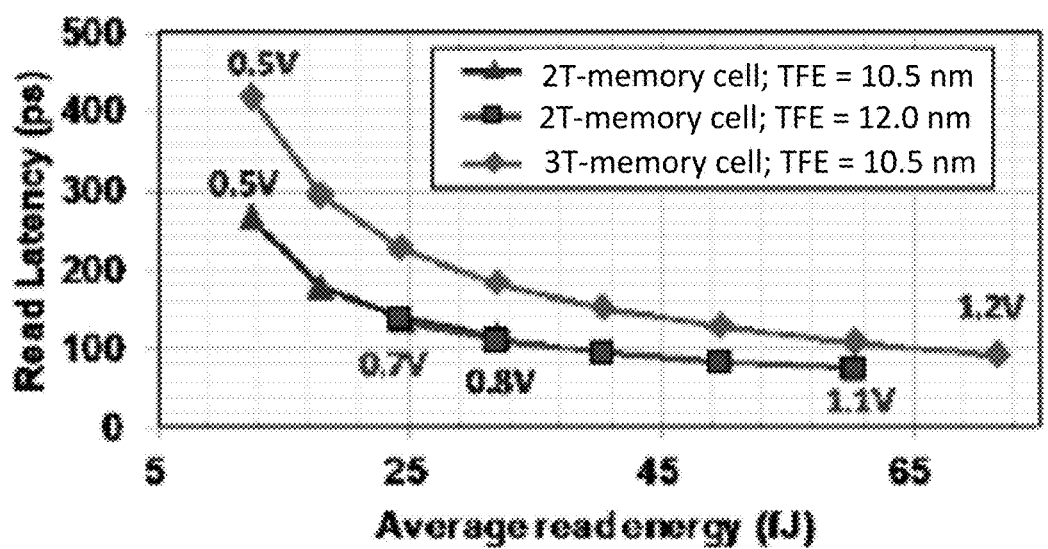
FIG. 77 is a graph showing the simulated read energy per cell versus read latency for an embodiment of the memory cell.

FIG. 77 shows the simulated read energy per cell versus read latency for an embodiment of the memory cell 124. Data for a conventional memory cell was is not included as it does not support voltage-mode sensing. Thanks to the ultra-low OFF-state current and high ON-state current, ultra-low read energy and latency are achieved for embodiments of the memory cell 124. In addition, the following conclusions could be reached: First, most read energy is consumed in pre-charging the bit line capacitance. For read, pre-charging the bit line is required for both '0' and '1'. In contrast, for write, pre-charging of the bit line is required only for writing '1' in the 2T and 3T topologies. Consequently, more energy is consumed by read than write. Second, the read latency reduces as the supply voltage increases. This is because the read access transistors have lower resistance and discharge the bit line faster. For the 2T topology with different $T_{FE}$, the read latency difference is not quite significant at 0.7V and 0.8V because the discharging current is mainly limited by the read access MOSFET and the FeFET is not the bottleneck element. Third, the 2T topology has relatively lower read latency than the 3T topology. This is because (i) the 2T topology is biased at $V_{DD}$/2 at the FeFET gate while the 3T topology is biased with GND at the FeFET gate; (ii) the 2T topology always has $V_{GS}=V_{DD}$ for the access NMOS while the 3T topology has $V_{GS}=V_{DD}$ only at the beginning point for the read access transistor $T_3$. It is also feasible to use a lower voltage to pre-charge the bit line for read to reduce the read energy consumption as long as the sensing scheme is not the bottleneck.

Table 4 summarizes the benchmarking results, where the comparison of embodiment so of the memory cell's 124 access performance, density, peripheral circuitry requirement is displayed. It is also interesting to consider the OFF-to-Ready energy, which is the energy needed to wake up a cell array 126 from completely OFF state to the idle state ready for read and write. With the 2T topology, considering some idle-state biasing voltage settings are non-zero, the memory controller has to raise its voltage level accordingly and thus consumes extra energy. Embodiments of the 3T topology can operate with the largest supply voltage range, and does not require an extra supply voltage of $V_{DD}/2$ or $2 \times V_{DD}$, making it a good fit in scenarios when multi-supply is not available.

TABLE 4

Comparison of a Conventional Memory Cell and Embodiments of The Disclosed Memory Cells 124

| Specifications | Conv. Cell | 2T-Topology | 3T-Topology |
|---|---|---|---|
| Number of transistors | 2 | 2 | 3 |
| Low voltage operation | No | Yes | Yes |
| Write energy | Medium | Low | Low |
| Write speed [&] | Medium | High | High |
| Current-mode read speed [#] | High | High | High |
| Current-mode read energy [#] | Low | Low | Low |
| Voltage-mode read speed | — | High | High |
| Voltage-mode read energy | — | Low | Low |
| OFF-to-Ready energy | High | Medium | Low |
| Additional supply voltage | 2 VDD | ~½ VDD | Not Needed |

[&] Write speed is compared based on the similar write energy consumption;
[#] Current-mode read speed and energy are roughly evaluated based the amount of sensed current in the OFF state and the ON state.

Embodiments of the NVM device 100 can be configured as a 4T-topology (4T) B&R circuitry 116. For example, the B&R circuitry 116 can include only four transistors. This can be done to reduce area overhead. Some embodiments can include an improved DFF 120 by incorporating an embodiment of the 4T B&R circuitry 116. With embodiments of the 4T B&R circuitry 116, the transistor number of B&R circuitry is lowered, and the backup control can be embedded into the supply voltage modulation with lowered routing cost. The energy-delay product overhead in the normal-mode operation can be below 5%. Embodiments of the DFF 120 with such a 4T B&R circuitry 116 can provide area- and energy-efficient nonvolatile computing for power-gating and energy-harvesting applications.

Power gating for idle digital circuits is an effective low-power design approach to reducing the leakage power by shutting down the supply. This can be a useful for both portable and server processors whose design optimizations often get tangled up with the battery life and the thermal limit, respectively. In practice, power-gated DFF states need to be saved in nonvolatile memories.

One key optimization for DFF backup and restore operations can be to focus on lowering the consumed energy. Another key optimization for DFFs can be to reduce the area overhead. This can have a significant impact in modern processors where complex pipelining logic and sometimes large register cache files are already adopted based on many flip-flops. Embodiments of the 4T B&R circuitry 116 and/or DFF 120 have a reduced the area overhead. In addition, the backup control is embedded into the supply voltage modulation, which reduces the routing cost since there is no need for an extra backup control signal.

Figure 78:
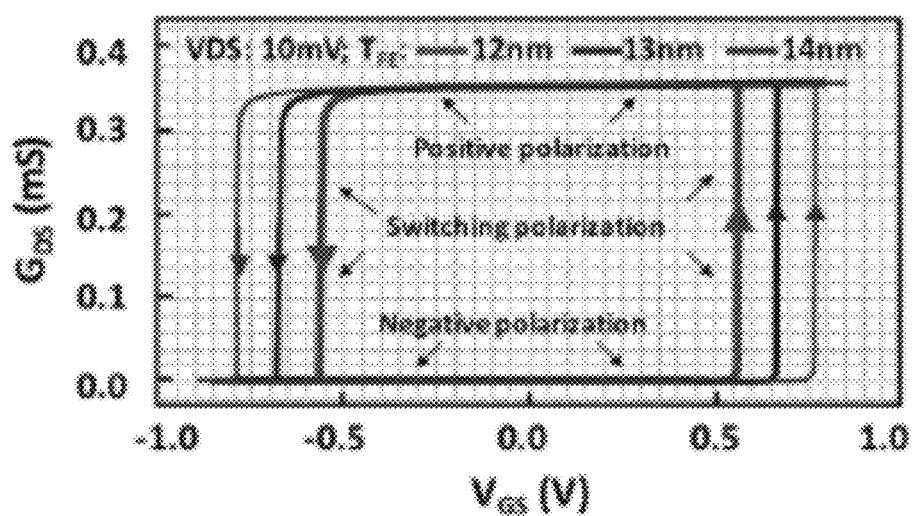
FIG. 78 is a graph showing typical 10 nm n-type FeFET $G_{DS}$-$V_G$ curves with over 5 orders of magnitudes in the sensed drain-source channel conductions ($G_{DS}$) between the bistable ON/OFF nonvolatile states sensed at zero $V_G$.

While FeFETs can be designed hysteresis-free in $I_D$-$V_G$ to comply with the conventional logic gate switching style, embodiments of the B&R circuitry 116 and/or the DFF 120 can utilize the FeFET 102 characteristics of $I_D$-$V_G$ hysteresis. FIG. 78 shows typical 10 nm n-type FeFET $G_{DS}$-$V_G$ curves with over 5 orders of magnitudes in the sensed drain-source channel conductions ($G_{DS}$) between the bistable ON/OFF nonvolatile states sensed at zero $V_G$. Applying $V_{GS}$ beyond the hysteresis edge triggers polarization switching. To ensure a sufficient energy barrier in the hysteresis window for desired noise immunity and retention time, the ferroelectric layer 114 thickness ($T_{FE}$) must be carefully tuned. As disclosed herein, this $T_{FE}$ determines the supply voltage needed in backup operations.

Figure 79:
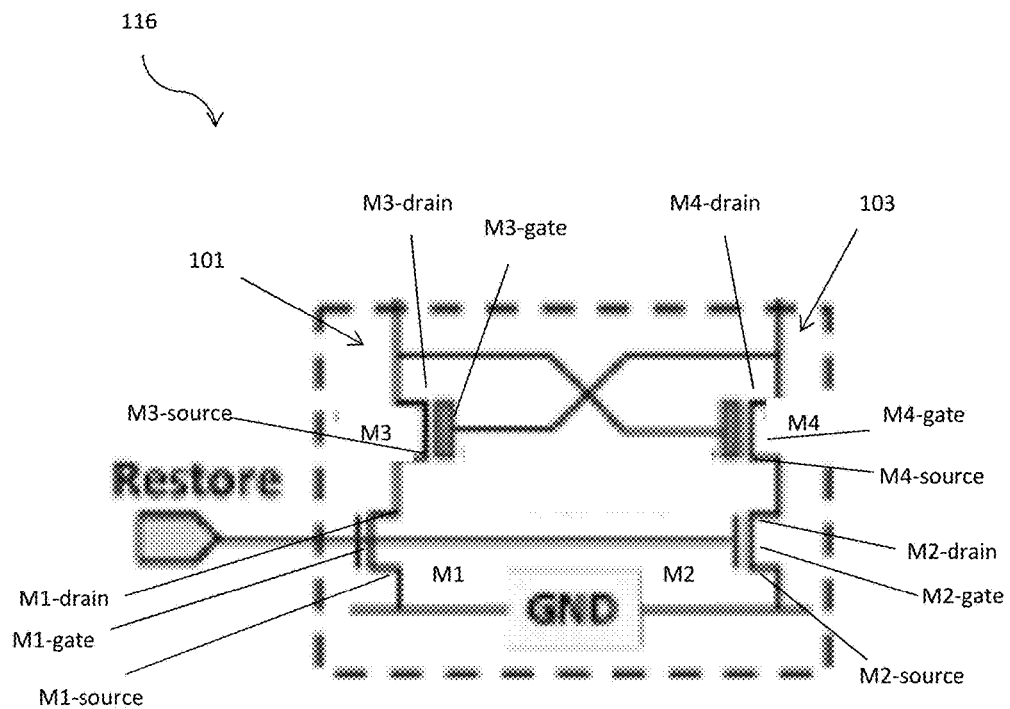
FIG. 79 is an exemplary schematic showing an embodiment of the 4T B&R circuitry.

FIG. 79 shows an embodiment of the 4T B&R circuitry 116. The 4T B&R circuit 116 can have a first transistor, $M_1$. $M_1$ can have an $M_1$-source, an $M_1$-gate, and an $M_1$-drain. The 4T B&R circuit 116 can have a second transistor, $M_2$. $M_2$ can have an $M_2$-source, an $M_2$-gate, and an $M_2$-drain. The 4T B&R circuit 116 can have a third transistor, $M_3$. $M_3$ can have an $M_3$-source, an $M_3$-gate, and an $M_3$-drain. The 4T B&R circuit 116 can have a fourth transistor, $M_4$. $M_4$ can have an $M_4$-source, an $M_4$-gate, and an $M_4$-drain. Any one or combination of the transistors of the 4T B&R circuit 116 can be a metal oxide semiconductor field effect transistor (MOSFET) or a FeFET 102.

The 4T B&R circuit 116 can further include a first branch 101 and a second branch 103. The first branch 101 can include $M_1$, $M_3$, and GND. The second branch 103 can include $M_2$, $M_4$, and GND. Depending on the inputs, either the first branch 101 or the second branch 103 operates as a backup branch or a restore branch. For example, when the first branch 101 operates as a backup branch, the second branch 103 operates as a restore branch. When the first branch 101 operates as a restore branch, the second branch 103 operates as a backup branch. Particular note should be made to the cross-coupled circuit connection between $M_3$ and the second branch 103 and $M_4$ and the first branch 101.

In some embodiments, the B&R circuit 116 can be connected to a slave latch 118. (See FIG. 80). Can be done to generate a DFF 120. For example, the first branch 101 and the second branch 103 can be connected to a slave latch 118 to form a DFF 120.

In at least one embodiment, $M_1$ and $M_2$ are MOSFETs. In at least one embodiment, $M_3$ and $M_4$ are FeFETs 102. $M_1$-drain can be connected to $M_3$-source. $M_1$-gate can be connected to a restore signal input signal and $M_2$-gate. $M_1$-source can be connected to GND. $M_2$-drain can be connected to $M_4$-source. $M_2$-gate can be connected to $M_1$-gate. $M_3$-drain can be configured to be connected to a slave latch 118, which can be via the first branch 101. $M_3$-drain can be connected to $M_4$-gate, $M_4$-drain, $M_3$-gate, and to the second branch 103. $M_3$-gate can be connected to $M_4$-gate, $M_4$-drain, $M_3$-drain, and to the second branch 103. $M_3$-source can be connected to $M_1$-drain. $M_4$-drain can be configured to be connected to the slave latch 118, which can be via the second branch 103. $M_4$-drain can be connected to $M_3$-gate, $M_3$-drain, $M_4$-gate, and to the first branch 103. $M_4$-gate can be connected to $M_3$-gate, $M_3$-drain, $M_4$-drain, and to the first branch 103. $M_4$-source can be connected to $M_2$-drain.

Figure 80:
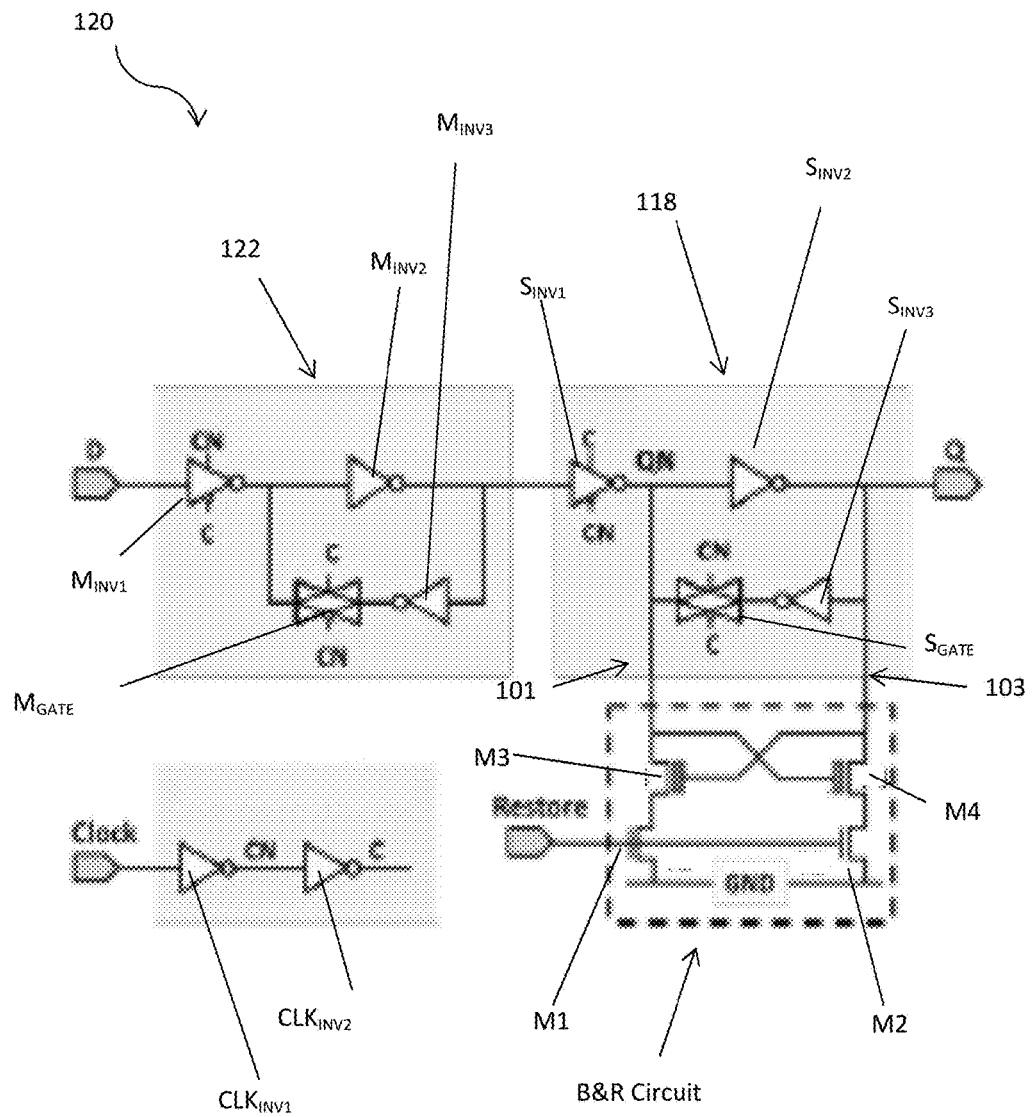
FIG. 80 is an exemplary schematic showing an embodiment of a DFF with an embodiment of the 4T B&R circuitry.

Referring to FIG. 80, in at least one embodiment, the 4T B&R circuit 116 can be configured as a B&R circuit 116 that may be used to form an embodiment of a DFF 120. In some embodiments an improved DFF 120 can be generated by replacing any one or combination of B&R circuit with an embodiment of the 4T B&R circuit 116 disclosed herein. FIG. 80 shows an embodiment of a DFF 120 having a master latch 122 and a slave latch 118 similar to the ones disclosed in FIG. 6 and a 4T B&R circuit 116.

The master latch 122 can have a first master inverter $M_{INV1}$, a second master inverter, $M_{INV2}$, a third master inverter, $M_{INV3}$, and a master transmission gate, $M_{GATE}$. The input of $M_{INV1}$ can be connected to a data input signal, D. The output of $M_{INV1}$ can be connected to the input of $M_{INV2}$. The input of $M_{INV2}$ can be connected to the output of $M_{INV1}$. The output of $M_{INV2}$ can be connected to the input of $M_{INV3}$. The input of $M_{INV3}$ can be connected to the output of $M_{INV2}$. The output of $M_{INV3}$ can be connected to the input of $M_{GATE}$. The input of $M_{GATE}$ can be connected to the output of $M_{INV3}$. The output of $M_{GATE}$ can be connected to the input of $M_{INV2}$ and the output of $M_{INV1}$.

The slave latch 118 can have a first slave inverter, $S_{INV1}$, a second slave inverter, $S_{INV2}$, a third slave inverter, $S_{INV3}$, and a slave transmission gate, $S_{GATE}$. The input of $S_{INV1}$ can be connected to the output of $M_{INV2}$. The input of $S_{INV2}$ can be connected to the output of $S_{INV1}$. The output of $S_{INV2}$ can be connected to the input of $S_{INV3}$ and to a data output Q. The input of $S_{INV3}$ can be connected to the output of $S_{INV2}$. The output of $S_{INV3}$ can be connected to the input of $S_{GATE}$. The output of $S_{GATE}$ can be connected to the input of $S_{INV2}$ and the output of $S_{INV1}$.

A clock driver, CLK, can be used to generate an in-phase clock signal, c, and opposite-phase clock signal, cn, for $M_{INV1}$, $M_{GATE}$, $S_{INV1}$, and/or $S_{GATE}$. Embodiments of the CLK can include a first clock inverter, $CLK_{INV1}$, having an output connected to an input of a second clock inverter, $CLK_{INV2}$. $CLK_{INV1}$ can be configured to generate cn. $CLK_{INV2}$ can be configured to generate c. Each of $M_{GATE}$ and $S_{GATE}$ can be a gate circuit for transmitting or blocking the output signal from the master latch 122 or slave latch 118, respectively, in response to the clock signal from CLK.

$M_3$-drain can be connected to the output of $S_{GATE}$, the output of $S_{INV1}$, and the input of $S_{INV2}$. For example, the first branch 101 can be connected to the output of $S_{GATE}$, the output of $S_{INV1}$, and the input of $S_{INV2}$. $M_4$-drain can be connected to the input of $S_{INV3}$, the output of $S_{INV2}$, and data output Q. For example, the second branch 103 can be connected to the input of $S_{INV3}$, the output of $S_{INV2}$, and data output Q.

Figure 81:
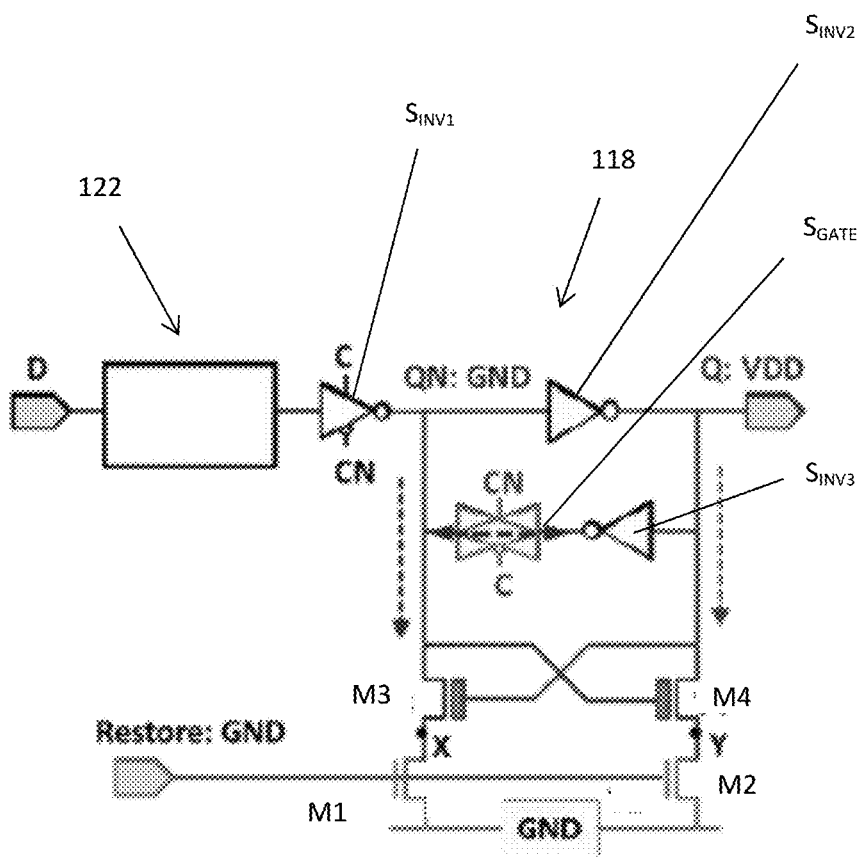
FIG. 81 is an exemplary schematic showing an embodiment of the DFF in a backup operation.

In some embodiments, in the OFF mode, the voltage supply and all inputs can be grounded, and the FeFETs 102 ($M_3$ and $M_4$) stay stable with either positive or negative polarization. In the NORMAL mode, the restore can be grounded and the two N-type MOS transistors $T_1$ and $T_2$ can be turned OFF, so the DFF 120 operates like a conventional DFF. The normal-mode supply voltage can be adjusted dynamically for the best trade-off between C-to-Q delay and energy. The FeFET device parameters, including $T_{FE}$, however, a may not be adjustable for a different hysteresis window width after fabrication. Therefore, in the normal-mode, the supply voltage can be designed to stay safely within the FeFET hysteresis window to avoid unnecessary FeFET polarization switching. In the backup mode, the restore input remains grounded, and the supply voltage is raised beyond the FeFET hysteresis edge, enabling polarization switching if a different DFF state was saved in the FeFETs 102 ($M_3$ and $M_4$). FIG. 81 shows an embodiment of the DFF 120 in a backup operation, with the DFF 120 state Q being high in voltage as an example. For $M_3$, a high gate-source voltage provides sufficient positive voltage across the ferroelectric layer, ensuring that $M_3$ stays at or switches to the positive polarization state. For $M_4$, an opposite voltage across the gate and source makes it enter or stay at the negative polarization state. Note that $M_1$ and $M_2$ are turned OFF, so the initial charge at nodes X and Y does not affect the final polarization states. After the polarization settles, the DFF state is saved, and the supply could be safely turned off for power saving, or remain high as needed if standby or continuous computation is preferred.

Figure 82:
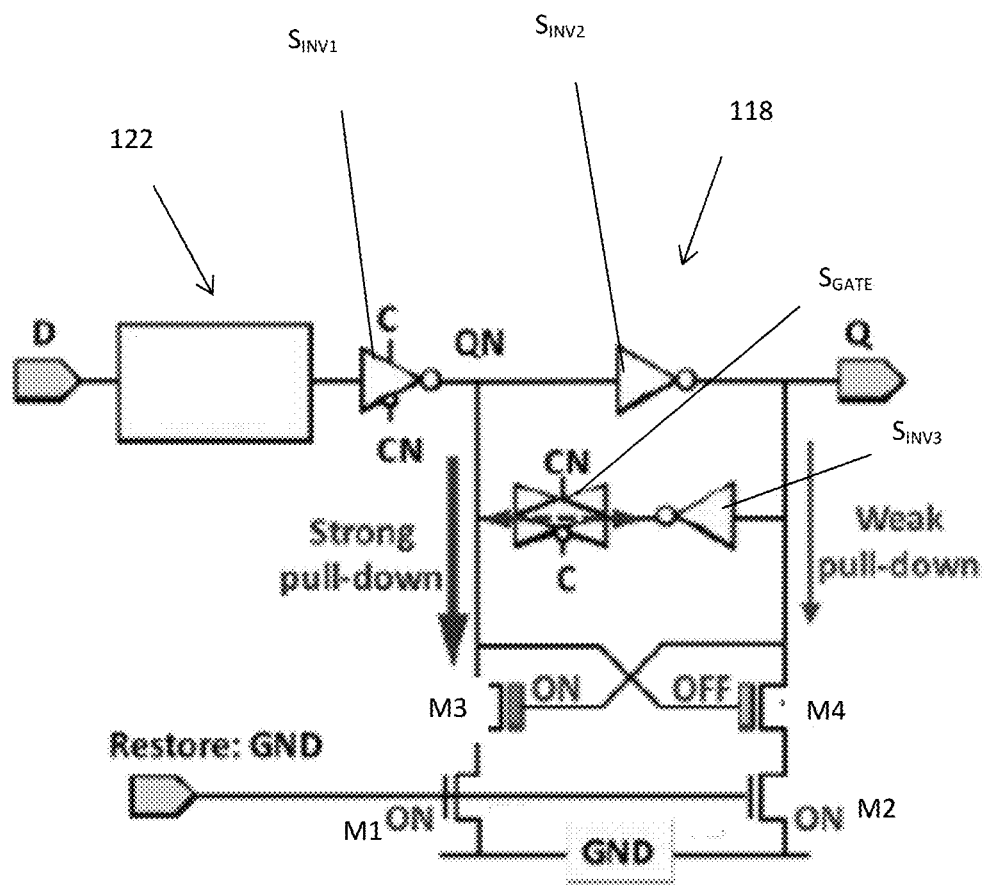
FIG. 82 is an exemplary schematic showing an embodiment of the DFF 120 in a restore operation.

FIG. 82 shows an embodiment of the DFF 120 in a restore operation. In the restore mode, the clock input C remains low to isolate the slave latch 118 from the master latch 122, and the restore control signal stays high to turn on both $M_1$ and $M_2$ before the supply ramps up. As shown in FIG. 82, the branch with positive FeFET polarization clamps QN to ground tightly but detaches Q from the ground. As the supply recovers, the latching structure in the slave latch 118 further enhances such a trend and finally leads to full settling-down.

Once $T_{FE}$ is fixed, the DFF 120 has the minimum required $V_{DD}$ to carry out successful polarization switching in the backup mode, and the maximum $V_{DD}$ to avoid polarization switching in the normal mode. These two $V_{DD}$ levels are similar in magnitude due to the steep switching hysteresis edges.

Conventional DFF devices need four extra transistors to isolate the B&R circuitry and the slave latch, so the supply voltage in the normal mode can be higher, as compared to embodiments of the DFF 120 disclosed herein. For fair comparison, the same FeFETs were used in both an embodiment of the DFF 120 and a conventional DFF to conduct an analysis. Therefore, when the normal-mode supply voltage is lower than that in the backup mode, both the conventional DFF and embodiments of the DFF 120 raise the supply voltage accordingly for backups. As will be shown, embodiments of the DFF 120 can re-use the supply voltage modulation unit without introducing other overheads.

Figure 83:
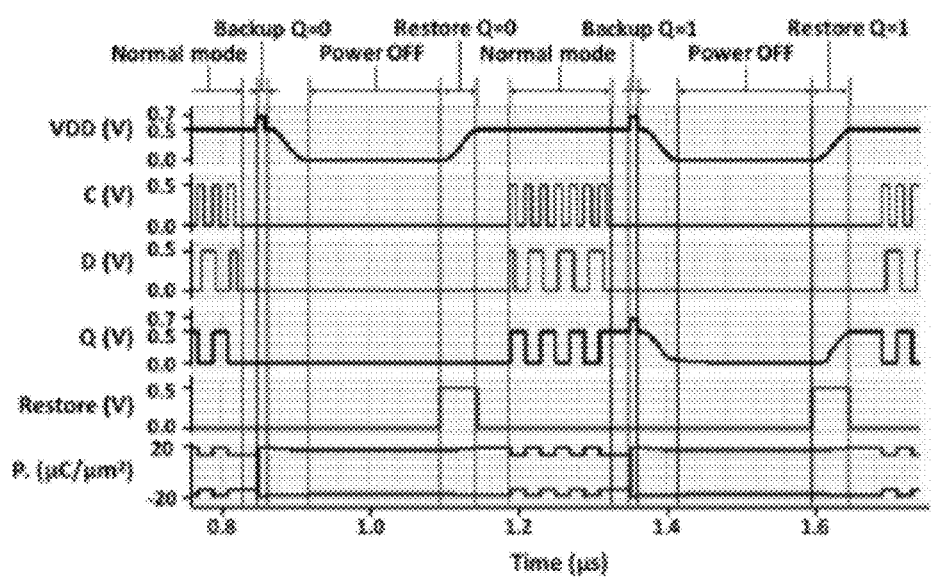
FIG. 83 is a graph showing transient waveforms of an embodiment of the DFF.
Figure 84:
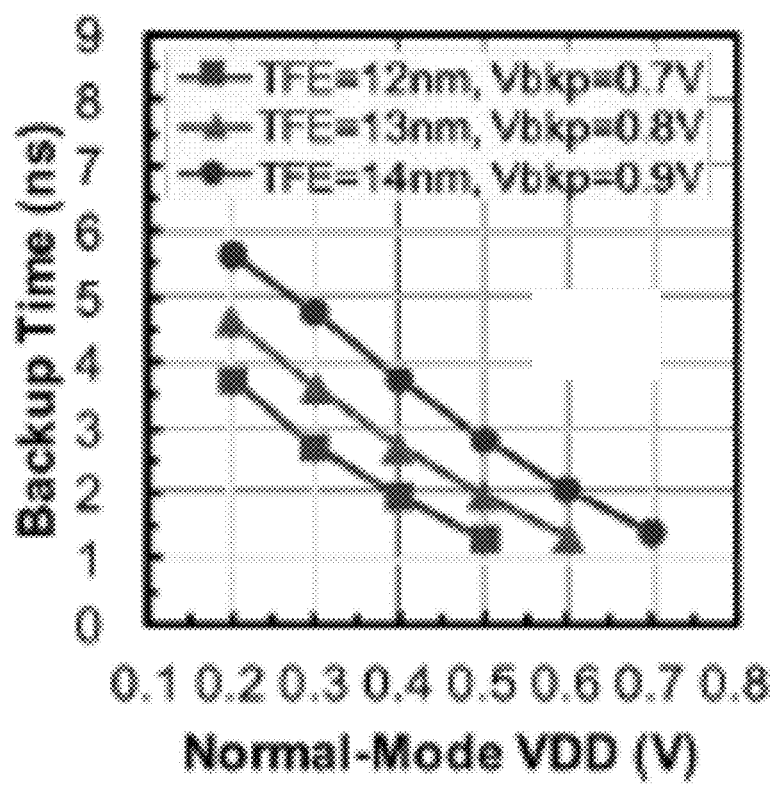
FIG. 84 is a graph showing $V_{DD}$ v. backup time for embodiments of the DFF.
Figure 85:
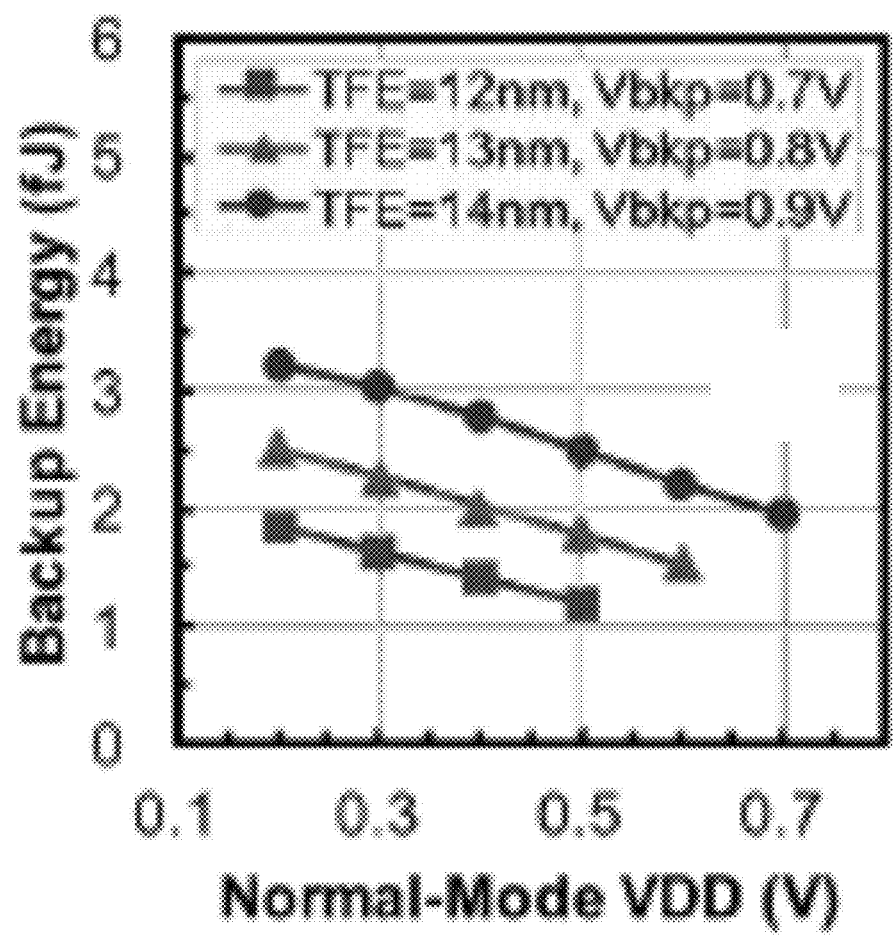
FIG. 85 is a graph showing $V_{DD}$ v. backup energy for embodiments of the DFF.
Figure 86:
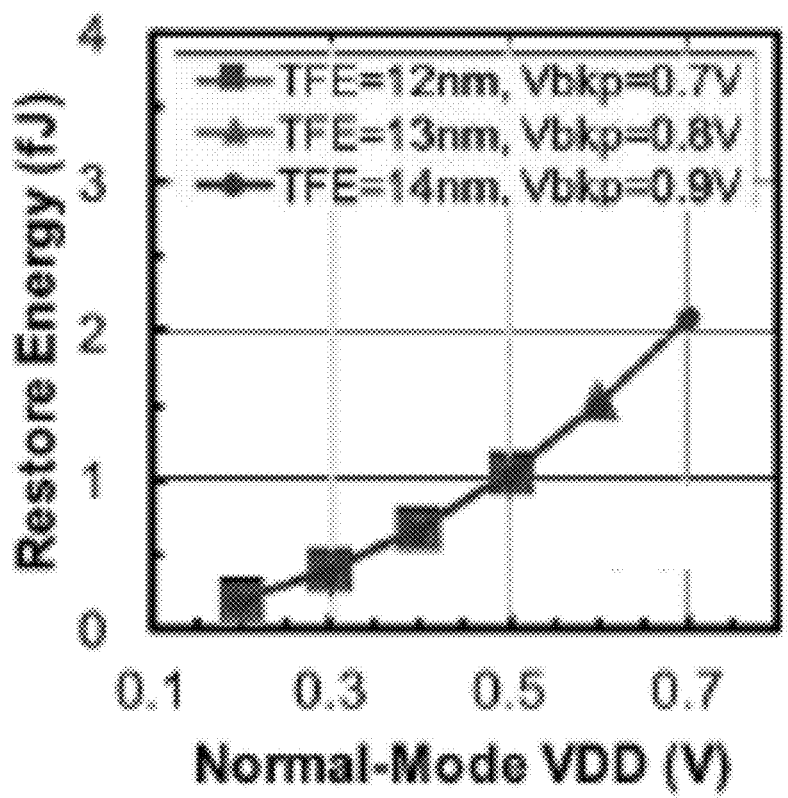
FIG. 86 is a graph showing $V_{DD}$ v. restore energy for embodiments of the DFF.
Figure 87:
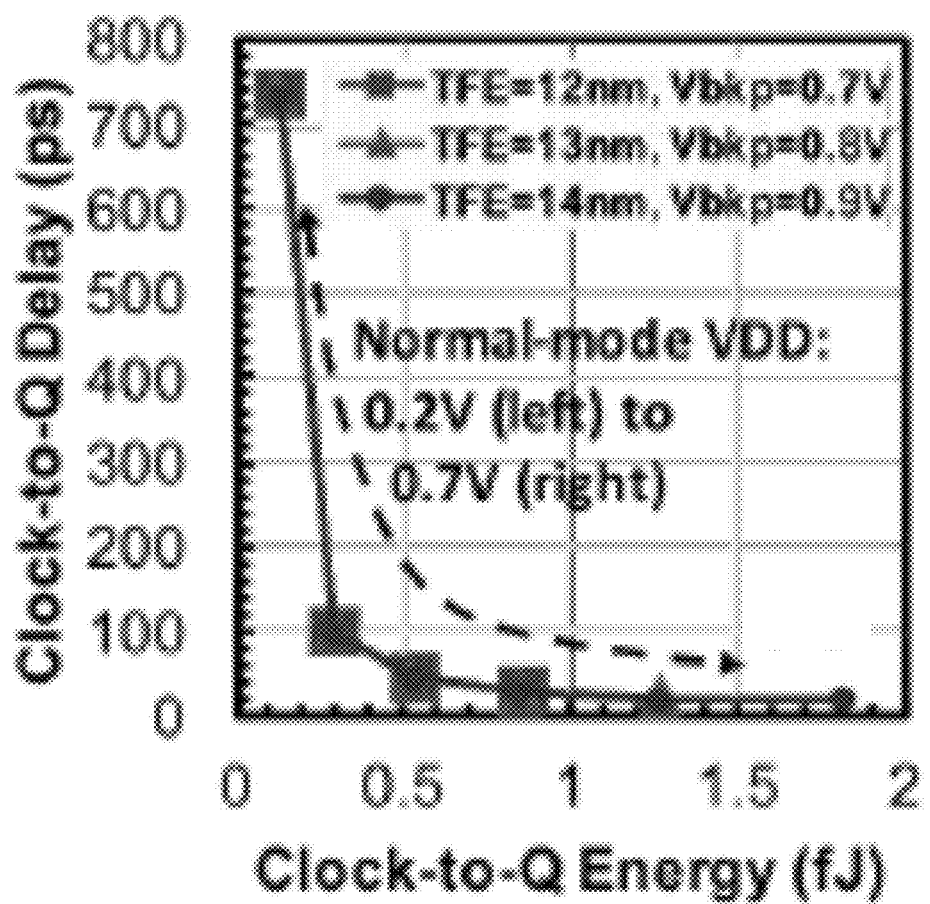
FIG. 87 is a graph showing clock to Q energy v. clock to Q delay for embodiments of the DFF.

FIG. 83 shows an example of transient simulation waveform snapshots, in which all operation modes are shown. FIGS. 84-87 show performance evaluations for embodiments of the DFF 120. FIG. 84 shows $V_{DD}$ v. backup time for embodiments of the DFF 120. FIG. 85 shows $V_{DD}$ v. backup energy for embodiments of the DFF 120. FIG. 86 shows $V_{DD}$ v. restore energy for embodiments of the DFF 120. FIG. 87 shows clock to Q energy v. clock to Q delay for embodiments of the DFF 120. The intrinsic DFF restore time is lower than 100 ps for all design process corners. Thus, the actual DFF restore time is practically almost the same as the supply voltage recovery time due to the relatively large capacitive load in the supply network. The restore energy has very little dependence on $T_{FE}$, as almost all energy is consumed to charge the capacitance at each internal node and a restore operation does not trigger polarization switching. For backup performance, scenarios when the polarization state was flipped were considered. Two observations are noted: (i) when a larger $T_{FE}$ is adopted, the wider ferroelectric hysteresis window and higher energy barrier lead to more switching time and energy for the backup operation; (ii) while reducing the normal-mode supply voltage is widely used for lower C-to-Q sample-and-hold energy in the normal mode, it also leads to more backup time and energy due to more supply voltage increase to reach the backup mode supply voltage level.

Figure 88:
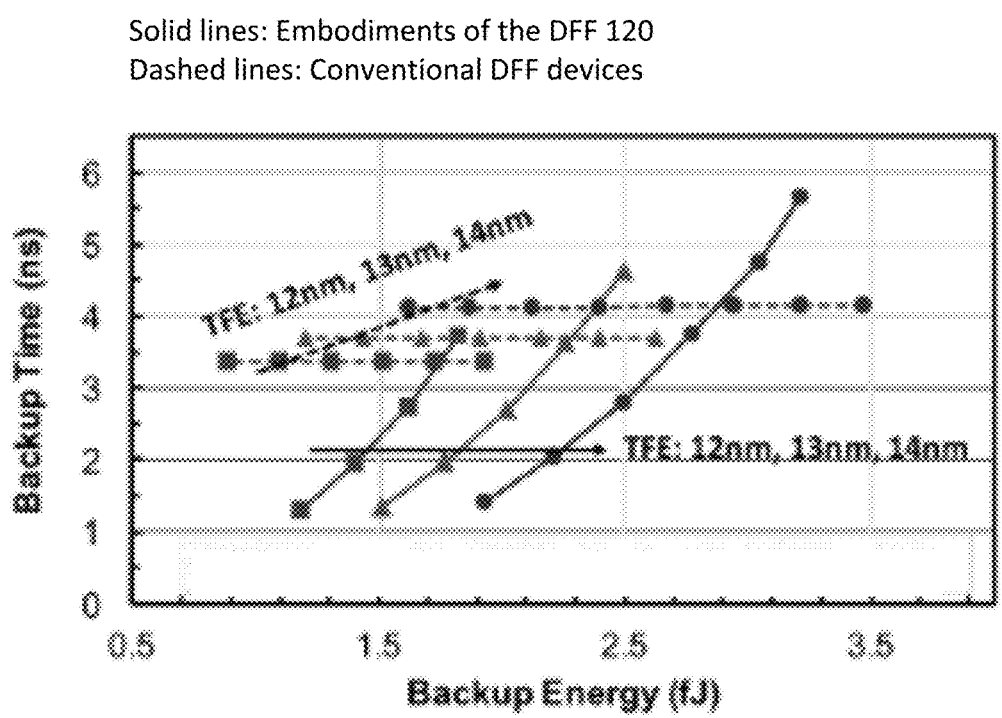
FIG. 88 is a graph showing the backup time versus backup energy for an embodiment of the DFF and compares it to conventional DFF devices.

FIG. 88 summarizes the backup time versus backup energy for the second observation, wherein a comparison of the performance of backup time and energy between an embodiment of the DFF 120 conventional DFF devices is made. While both designs have ultra-fast backup speed in ns and ultra-low backup energy in fJ, some differences are observed. The conventional DFF design with a fixed $T_{FE}$ has a relatively flat backup time because its backup operation starts with the supply voltage raised to the same level when the dedicated backup control signal is triggered. In comparison, the backup operation is faster in the inventive DFF 120 due to direct contact between the slave latch and the FeFETs without any isolation transistors used in the conventional DFF design.

Figure 89:
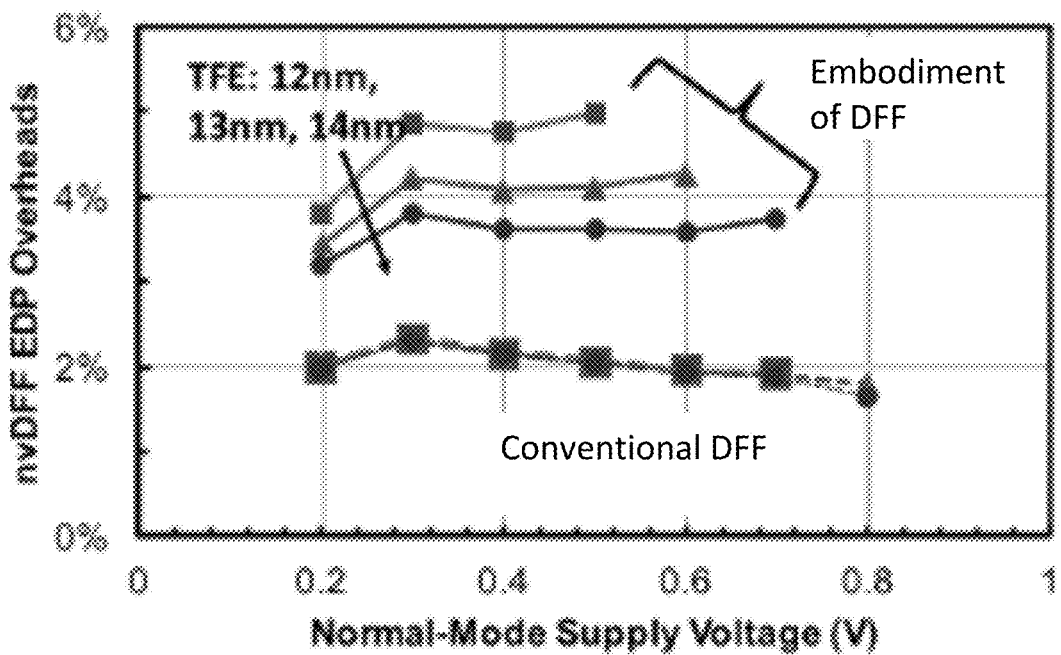
FIG. 89 is a graph showing a normal mode energy-delay overhead analysis for an embodiment of the DFF and compares it to conventional DFF devices.

FIG. 89 further provides detailed energy-delay product (EDP) overhead for en embodiment of the DFF 120, in comparison with the conventional DFF devices. While the inventive DFF 120 pays slightly higher EDP for much lower area overhead (~50%), this EDP overhead is no more than 5% for both designs. Table 5 summarizes the comparisons of metrics of an embodiment of the DFF 120 with conventional DFF devices.

TABLE 5

Metric Comparisons of an Embodiment of the DFF 120 with Conventional DFF Devices

|  | Conventional DFF | Conventional DFF | Embodiment of the DFF 120 |
|---|---|---|---|
| Number of B&R transistors | 2 or 4 | 8 | 4 |
| Normal-mode EDP overhead | 30%-50% | <5% | <5% |
| External B&R control signals | Not needed | Not needed | Needed |
| Backup and restore: energy, speed | fj, ns | fj, ns | fj, ns |
| Immunity to variation and noise | Medium | High | High |

* Restore signal needed; Backup control is embedded into the supply signal.

Embodiments of the DFF 120 can reduce the area overhead of DFF by ~50%, through harnessing the feature of logic-memory fusion in FeFETs. Embodiments of the DFF 120 consumes only ~fJ energy to accomplish the nonvolatile backup and restore operations within ns, with an energy-delay performance overhead below 5%.

It should be understood that modifications to the embodiments disclosed herein can be made to meet a particular set of design criteria. For instance, the number of or configuration of MOSFETs, FeFETs 102, DFFs 120, slave latches 118, master latches 122, memory cells 124, eyepieces 108, and/or other components or parameters may be used to meet a particular objective. In addition, any of the embodiments of the NVM devices 100 (e.g., B&R circuit 116, 4T B&R circuit 116, clave latch 118, master latch 122, DFF 120, memory cell 124, etc.) disclosed herein can be connected to other embodiments of the NVM devices 100 (e.g., B&R circuit 116, 4T B&R circuit 116, clave latch 118, master latch 122, DFF 120, memory cell 124, etc.) to generate a device.

It will be apparent to those skilled in the art that numerous modifications and variations of the described examples and embodiments are possible in light of the above teachings of the disclosure. The disclosed examples and embodiments are presented for purposes of illustration only. Other alternative embodiments may include some or all of the features of the various embodiments disclosed herein. For instance, it is contemplated that a particular feature described, either individually or as part of an embodiment, can be combined with other individually described features, or parts of other embodiments. The elements and acts of the various embodiments described herein can therefore be combined to provide further embodiments.

Therefore, it is the intent to cover all such modifications and alternative embodiments as may come within the true scope of this invention, which is to be given the full breadth thereof. Additionally, the disclosure of a range of values is a disclosure of every numerical value within that range, including the end points. Thus, while certain exemplary embodiments of apparatuses and methods of making and using the same have been discussed and illustrated herein, it is to be distinctly understood that the invention is not limited thereto but may be otherwise variously embodied and practiced within the scope of the following claims.

It should also be appreciated that some components, features, and/or configurations may be described in connection with only one particular embodiment, but these same components, features, and/or configurations can be applied or used with many other embodiments and should be considered applicable to the other embodiments, unless stated otherwise or unless such a component, feature, and/or configuration is technically impossible to use with the other embodiment. Thus, the components, features, and/or configurations of the various embodiments can be combined together in any manner and such combinations are expressly contemplated and disclosed by this statement. Thus, while certain exemplary embodiments of the NVM devices 100 have been shown and described above, it is to be distinctly understood that the invention is not limited thereto but may be otherwise variously embodied and practiced within the scope of the following claims.

We claim:

1. A nonvolatile memory (NVM) device, comprising a circuit topology having at least one Fe field effect transistor (FeFET) configured to exhibit a wide current-voltage (I-V) hysteresis covering zero gate bias, wherein:
   the circuit topology is configured as a latch configured to have a differential-driving input pair D/DN;
   the latch comprising:
      a first transistor, $M_1$, $M_1$ having an $M_1$-source, an $M_1$-gate, and an $M_1$-drain;
      a second transistor, $M_2$, $M_2$ having an $M_2$-source, an $M_2$-gate, and an $M_2$-drain;
      a third transistor, $M_3$, $M_3$ having an $M_3$-source, an $M_3$-gate, and an $M_3$-drain;
      a fourth transistor, $M_4$, $M_4$ having an $M_4$-source, an $M_4$-gate, and an $M_4$-drain;
      a fifth transistor, $M_5$, $M_5$ having an $M_5$-source, an $M_5$-gate, and an $M_5$-drain;
      a sixth transistor, $M_6$, $M_6$ having an $M_6$-source, an $M_6$-gate, and an $M_6$-drain;
      a seventh transistor, $M_7$, $M_7$ having an $M_7$-source, an $M_7$-gate, and an $M_7$-drain;
      an eighth transistor, $M_8$, $M_8$ having an $M_8$-source, an $M_8$-gate, and an $M_8$-drain;
      each of $M_1$, $M_2$, $M_3$, $M_4$, $M_7$, and $M_8$ is a metal oxide semiconductor field effect transistor (MOSFET);
      each of $M_5$ and $M_6$ is a FeFET;
      $M_1$-drain being connected to $M_3$-gate, $M_3$-source, $M_4$-source, $M_4$-gate, a data output Q, $M_2$-drain, $M_5$-gate, $M_7$-gate, $M_5$-drain, a data output QN, $M_6$-drain, $M_6$-gate, and $M_8$-gate;
      $M_1$-gate being connected to a clock driver CLK;
      $M_1$-source being connected to a data input D;
      $M_2$-drain being connected to $M_3$-gate, $M_3$-source, $M_4$-source, $M_4$-gate, data output Q, $M_1$-drain, $M_5$-gate, $M_7$-gate, $M_5$-drain, data output QN, $M_6$-drain, $M_6$-gate, and $M_8$-gate;
      $M_2$-gate being connected to $M_1$-gate;
      $M_2$-source being connected to a data input DN;
      $M_3$-drain being connected to a voltage supply $V_{DD}$;
      $M_3$-gate being connected to $M_3$-source, $M_4$-source, $M_4$-gate, data output Q, $M_1$-drain, $M_2$-drain, $M_5$-gate, $M_7$-gate, $M_5$-drain, data output QN, $M_6$-drain, $M_6$-gate, and $M_8$-gate;
      $M_3$-source being connected to $M_3$-gate, $M_4$-source, $M_4$-gate, data output Q, $M_1$-drain, $M_2$-drain, $M_5$-gate, $M_7$-gate, $M_5$-drain, data output QN, $M_6$-drain, $M_6$-gate, and $M_8$-gate;
      $M_4$-drain being connected to $V_{DD}$;
      $M_4$-gate being connected to $M_3$-source, $M_4$-source, $M_3$-gate, data output Q, $M_1$-drain, $M_2$-drain, $M_5$-gate, $M_7$-gate, $M_5$-drain, data output QN, $M_6$-drain, $M_6$-gate, and $M_8$-gate;
      $M_4$-source being connected to $M_3$-source, $M_4$-gate, $M_3$-gate, data output Q, $M_1$-drain, $M_2$-drain, $M_5$-gate, $M_7$-gate, $M_5$-drain, data output QN, $M_6$-drain, $M_6$-gate, and $M_8$-gate;
      $M_5$-drain be connected to $M_4$-source, $M_3$-source, $M_4$-gate, $M_3$-gate, data output Q, $M_1$-drain, $M_2$-drain, $M_5$-gate, $M_7$-gate, $M_5$-drain, data output QN, $M_6$-drain, $M_6$-gate, and $M_8$-gate;
      $M_5$-gate being connected to $M_4$-source, $M_3$-source, $M_4$-gate, $M_3$-gate, data output Q, $M_1$-drain, $M_2$-drain, $M_5$-drain, $M_7$-gate, $M_5$-drain, data output QN, $M_6$-drain, $M_6$-gate, and $M_8$-gate;
      $M_5$-source being connected to $M_7$-drain;
      $M_6$-drain can being connected to $M_4$-source, $M_3$-source, $M_4$-gate, $M_3$-gate, data output Q, $M_1$-drain, $M_2$-drain, $M_5$-gate, $M_7$-gate, $M_5$-drain, data output QN, $M_5$-drain, $M_6$-gate, and $M_8$-gate;
      $M_6$-gate being connected to $M_4$-source, $M_3$-source, $M_4$-gate, $M_3$-gate, data output Q, $M_1$-drain, $M_2$-drain, $M_5$-gate, $M_7$-gate, $M_5$-drain, data output QN, $M_5$-drain, $M_6$-drain, and $M_8$-gate;
      $M_6$-source being connected to $M_8$-drain;
      $M_7$-drain being connected to $M_8$-source;
      $M_7$-gate being connected to $M_6$-gate, $M_4$-source, $M_3$-source, $M_4$-gate, $M_3$-gate, data output Q, $M_1$-drain, $M_2$-drain, $M_5$-gate, $M_5$-drain, data output QN, $M_5$-drain, $M_6$-drain, and $M_8$-gate;
      $M_7$-source being connected to ground, GND;
      $M_8$-drain being connected to $M_6$-source;
      $M_8$-gate being connected to $M_7$-gate, $M_6$-gate, $M_4$-source, $M_3$-source, $M_4$-gate, $M_3$-gate, data output Q, $M_1$-drain, $M_2$-drain, $M_5$-gate, $M_5$-drain, data output QN, $M_5$-drain, and $M_6$-drain; and
      $M_8$-source being connected to GND.

2. A nonvolatile memory (NVM) device, comprising a circuit topology having at least one Fe field effect transistor (FeFET) configured to exhibit a wide current-voltage (I-V) hysteresis covering zero gate bias, wherein:
   the circuit topology is configured as a D-Flip Flop (DFF);
   the DFF comprising a master latch, a slave latch, and a backup and restore circuit (B&R circuit);
   the slave latch comprising:
      a first transistor, $M_1$, $M_1$ having an $M_1$-source, an $M_1$-gate, and an $M_1$-drain;
      a second transistor, $M_2$, $M_2$ having an $M_2$-source, an $M_2$-gate, and an $M_2$-drain;
      a third transistor, $M_3$, $M_3$ having an $M_3$-source, an $M_3$-gate, and an $M_3$-drain;
      a fourth transistor, $M_4$, $M_4$ having an $M_4$-source, an $M_4$-gate, and an $M_4$-drain;
      a fifth transistor, $M_5$, $M_5$ having an $M_5$-source, an $M_5$-gate, and an $M_5$-drain;
      a sixth transistor, $M_6$, $M_6$ having an $M_6$-source, an $M_6$-gate, and an $M_6$-drain;

a seventh transistor, $M_7$, $M_7$ having an $M_7$-source, an $M_7$-gate, and an $M_7$-drain;
an eighth transistor, $M_8$, $M_8$ having an $M_8$-source, an $M_8$-gate, and an $M_8$-drain;
each of $M_1$, $M_2$, $M_3$, $M_4$, $M_7$, and $M_8$ is a metal oxide semiconductor field effect transistor (MOSFET);
each of $M_5$ and $M_6$ is a FeFET;
$M_1$-drain being connected to $M_3$-gate, $M_3$-source, $M_4$-source, $M_4$-gate, a data output Q, $M_2$-drain, $M_5$-gate, $M_7$-gate, $M_5$-drain, a data output QN, $M_6$-drain, $M_6$-gate, and $M_8$-gate;
$M_1$-gate being connected to a clock driver CLK;
$M_1$-source being connected to a data input D;
$M_2$-drain being connected to $M_3$-gate, $M_3$-source, $M_4$-source, $M_4$-gate, data output Q, $M_1$-drain, $M_5$-gate, $M_7$-gate, $M_5$-drain, data output QN, $M_6$-drain, $M_6$-gate, and $M_8$-gate;
$M_2$-gate being connected to $M_1$-gate;
$M_2$-source being connected to a data input DN;
$M_3$-drain being connected to a voltage supply $V_{DD}$;
$M_3$-gate being connected to $M_3$-source, $M_4$-source, $M_4$-gate, data output Q, $M_1$-drain, $M_2$-drain, $M_5$-gate, $M_7$-gate, $M_5$-drain, data output QN, $M_6$-drain, $M_6$-gate, and $M_8$-gate;
$M_3$-source being connected to $M_3$-gate, $M_4$-source, $M_4$-gate, data output Q, $M_1$-drain, $M_2$-drain, $M_5$-gate, $M_7$-gate, $M_5$-drain, data output QN, $M_6$-drain, $M_6$-gate, and $M_8$-gate;
$M_4$-drain being connected to $V_{DD}$;
$M_4$-gate being connected to $M_3$-source, $M_4$-source, $M_3$-gate, data output Q, $M_1$-drain, $M_2$-drain, $M_5$-gate, $M_7$-gate, $M_5$-drain, data output QN, $M_6$-drain, $M_6$-gate, and $M_8$-gate;
$M_4$-source being connected to $M_3$-source, $M_4$-gate, $M_3$-gate, data output Q, $M_1$-drain, $M_2$-drain, $M_5$-gate, $M_7$-gate, $M_5$-drain, data output QN, $M_6$-drain, $M_6$-gate, and $M_8$-gate;
$M_5$-drain be connected to $M_4$-source, $M_3$-source, $M_4$-gate, $M_3$-gate, data output Q, $M_1$-drain, $M_2$-drain, $M_5$-gate, $M_7$-gate, $M_5$-drain, data output QN, $M_6$-drain, $M_6$-gate, and $M_8$-gate;
$M_5$-gate being connected to $M_4$-source, $M_3$-source, $M_4$-gate, $M_3$-gate, data output Q, $M_1$-drain, $M_2$-drain, $M_5$-drain, $M_7$-gate, $M_5$-drain, data output QN, $M_6$-drain, $M_6$-gate, and $M_8$-gate;
$M_5$-source being connected to $M_7$-drain;
$M_6$-drain can being connected to $M_4$-source, $M_3$-source, $M_4$-gate, $M_3$-gate, data output Q, $M_1$-drain, $M_2$-drain, $M_5$-gate, $M_7$-gate, $M_5$-drain, data output QN, $M_5$-drain, $M_6$-gate, and $M_8$-gate;
$M_6$-gate being connected to $M_4$-source, $M_3$-source, $M_4$-gate, $M_3$-gate, data output Q, $M_1$-drain, $M_2$-drain, $M_5$-gate, $M_7$-gate, $M_5$-drain, data output QN, $M_5$-drain, $M_6$-drain, and $M_8$-gate;
$M_6$-source being connected to $M_8$-drain;
$M_7$-drain being connected to $M_5$-source;
$M_7$-gate being connected to $M_6$-gate, $M_4$-source, $M_3$-source, $M_4$-gate, $M_3$-gate, data output Q, $M_1$-drain, $M_2$-drain, $M_5$-gate, $M_5$-drain, data output QN, $M_5$-drain, $M_6$-drain, and $M_8$-gate;
$M_7$-source being connected to ground, GND;
$M_8$-drain being connected to $M_6$-source;
$M_8$-gate being connected to $M_7$-gate, $M_6$-gate, $M_4$-source, $M_3$-source, $M_4$-gate, $M_3$-gate, data output Q, $M_1$-drain, $M_2$-drain, $M_5$-gate, $M_5$-drain, data output QN, $M_5$-drain, and $M_6$-drain; and
$M_8$-source being connected to GND.

3. The NVM device recited in claim 2, wherein:
$M_1$ is replaced with a first slave transmission gate, $S_{GATE1}$;
$M_2$ is replaced with a second slave transmission gate, $S_{GATE2}$;
output of $S_{GATE1}$ being connected to $M_3$-gate, $M_3$-source, $M_4$-source, $M_4$-gate, data output Q, $S_{GATE2}$ output, $M_5$-gate, $M_7$-gate, $M_5$-drain, data output QN, $M_6$-drain, $M_6$-gate, and $M_8$-gate; and
output of $S_{GATE2}$ being connected to $M_3$-gate, $M_3$-source, $M_4$-source, $M_4$-gate, data output Q, $S_{GATE1}$ output, $M_5$-gate, $M_7$-gate, $M_5$-drain, data output QN, $M_6$-drain, $M_6$-gate, and $M_8$-gate.

4. The NVM device recited in claim 3, wherein the master latch is connected to the slave latch via $S_{GATE1}$ and $S_{GATE2}$.

5. The NVM device recited in claim 4, wherein:
the master latch has a first master transmission gate $M_{GATE1}$, a first master inverter, $M_{INV1}$, a second master inverter, $M_{INV2}$, and a second master transmission gate, $M_{GATE2}$;
input of $M_{GATE1}$ being connected to a data input signal, D;
output of $M_{GATE1}$ being connected to input of $M_{INV1}$ and input of $S_{GATE}1$;
input of $M_{INV1}$ being connected to output of $M_{GATE1}$;
output of $M_{INV1}$ being connected to input of $M_{INV2}$ and input of $S_{GATE2}$;
input of $M_{INV2}$ being connected to output of $M_{INV1}$;
output of $M_{INV2}$ being connected to input of $M_{GATE2}$;
input of $M_{GATE2}$ being connected to output of $M_{INV2}$; and
output of $M_{GATE2}$ being connected to input of $M_{GATE1}$ and output of $M_{INV1}$.

6. The NVM device recited in claim 2, wherein:
$M_1$ is replaced with a first slave inverter, $S_{INV1}$:
$M_2$ is replaced with a second slave inverter, $S_{INV2}$;
output of $S_{INV1}$ being connected to $M_3$-gate, $M_3$-source, $M_4$-source, $M_4$-gate, data output Q, $S_{INV2}$ output, $M_5$-gate, $M_7$-gate, $M_5$-drain, data output QN, $M_6$-drain, $M_6$-gate, and $M_8$-gate; and
output of $S_{INV2}$ being connected to $M_3$-gate, $M_3$-source, $M_4$-source, $M_4$-gate, data output Q, $S_{INV1}$ output, $M_5$-gate, $M_7$-gate, $M_5$-drain, data output QN, $M_6$-drain, $M_6$-gate, and $M_8$-gate.

7. The NVM device recited in claim 6, wherein the master latch is connected to the slave latch via $S_{INV1}$ and $S_{INV2}$.

8. The NVM device recited in claim 7, wherein:
the master latch has a first master transmission gate $M_{GATE1}$, a first master inverter, $M_{INV1}$, a second master inverter, $M_{INV2}$, and a second master transmission gate, $M_{GATE2}$;
input of $M_{GATE1}$ being connected to a data input signal, D;
output of $M_{GATE1}$ being connected to input of $M_{INV1}$ and input of $S_{INV1}$;
input of $M_{INV1}$ being connected to output of $M_{GATE1}$;
output of $M_{INV1}$ being connected to input of $M_{INV2}$ and input of $S_{INV2}$;
input of $M_{INV2}$ being connected to output of $M_{INV1}$;
output of $M_{INV2}$ being connected to input of $M_{GATE2}$;
input of $M_{GATE2}$ being connected to output of $M_{INV2}$; and
output of $M_{GATE2}$ being connected to input of $M_{GATE1}$ and output of $M_{INV1}$.

9. A nonvolatile memory (NVM) device, comprising a circuit topology having at least one Fe field effect transistor (FeFET) configured to exhibit a wide current-voltage (I-V) hysteresis covering zero gate bias, wherein:
the circuit topology is configured as a D-Flip Flop (DFF);
the DFF comprising a master latch, a slave latch, and a backup and restore circuit (B&R circuit);

the slave latch comprising:
  a first transistor, $M_1$, $M_1$ having an $M_1$-source, an $M_1$-gate, and an $M_1$-drain;
  a second transistor, $M_2$, $M_2$ having an $M_2$-source, an $M_2$-gate, and an $M_2$-drain;
  a third transistor, $M_3$, $M_3$ having an $M_3$-source, an $M_3$-gate, and an $M_3$-drain;
  a fourth transistor, $M_4$, $M_4$ having an $M_4$-source, an $M_4$-gate, and an $M_4$-drain;
  a fifth transistor, $M_5$, $M_5$ having an $M_5$-source, an $M_5$-gate, and an $M_5$-drain;
  a sixth transistor, $M_6$, $M_6$ having an $M_6$-source, an $M_6$-gate, and an $M_6$-drain;
  a seventh transistor, $M_7$, $M_7$ having an $M_7$-source, an $M_7$-gate, and an $M_7$-drain;
  an eighth transistor, $M_8$, $M_8$ having an $M_8$-source, an $M_8$-gate, and an $M_8$-drain;
  a ninth transistor, $M_9$, $M_9$ having an $M_9$-source, an $M_9$-gate, and an $M_9$-drain;
  a tenth transistor, $M_{10}$, $M_{10}$ having an $M_{10}$-source, an $M_{10}$-gate, and an $M_{10}$-drain;
  an eleventh transistor, $M_{11}$, $M_{11}$ having an $M_{11}$-source, an $M_{11}$-gate, and an $M_{11}$-drain;
  a twelfth transistor, $M_{12}$, $M_{12}$ having an $M_{12}$-source, an $M_{12}$-gate, and an $M_{12}$-drain;
  a thirteenth transistor, $M_{5b}$, $M_{5b}$ having an $M_{5b}$-source, an $M_{5b}$-gate, and an $M_{5b}$-drain;
  a fourteenth transistor, $M_{6b}$, $M_{6b}$ having an $M_{6b}$-source, an $M_{6b}$-gate, and an $M_6$b-drain;
  each of $M_1$, $M_2$, $M_3$, $M_4$, $M_7$, $M_8$, $M_9$, $M_{10}$, and $M_{11}$ is a metal oxide semiconductor field effect transistor (MOSFET);
  each of $M_5$ and $M_6$ is a FeFET;
  $M_1$-drain being connected to $M_2$-drain and a data input D;
  $M_1$-gate being connected to a clock driver, CLK;
  $M_1$-source being connected to $M_2$-source, $M_3$-gate, $M_5$-gate, $M_7$-gate, $M_{11}$-source, $M_{12}$-source, $M_3$-source, $M_9$-source, $M_{10}$-source, $M_5$-drain, and $M_{5b}$-drain;
  $M_2$-drain being connected to $M_1$-drain and data input D;
  $M_2$-gate being connected to CLK;
  $M_2$-source being connected to $M_1$-source, $M_3$-gate, $M_5$-gate, $M_7$-gate, $M_{11}$-source, $M_{12}$-source, $M_3$-source, $M_9$-source, $M_{10}$-source, $M_5$-drain, and $M_{5b}$-drain;
  $M_3$-drain being connected to a voltage supply, $V_{DD}$;
  $M_3$-gate being connected to $M_1$-source, $M_2$-source, $M_5$-gate, $M_7$-gate, $M_{11}$-source, $M_{12}$-source, $M_3$-source, $M_9$-source, $M_{10}$-source, $M_5$-drain, and $M_{5b}$-drain;
  $M_3$-source can be connected to $M_1$-source, $M_2$-source, $M_5$-gate, $M_7$-gate, $M_{11}$-source, $M_{12}$-source, $M_3$-gate, $M_9$-source, $M_{10}$-source, $M_5$-drain, and $M_{5b}$-drain;
  $M_4$-drain being connected to $V_{DD}$;
  $M_4$-gate being connected to a data output QN, a data output Q, $M_6$-gate, $M_8$-gate, $M_4$-source, $M_9$-drain, $M_{10}$-drain, $M_{11}$-drain, $M_{12}$-drain, $M_6$b-drain, and $M_6$-drain;
  $M_4$-source being connected to data output QN, data output Q, $M_6$-gate, $M_8$-gate, $M_4$-gate, $M_9$-drain, $M_{10}$-drain, $M_1$-drain, $M_{12}$-drain, $M_6$b-drain, and $M_6$-drain;
  $M_5$-drain being connected to $M_1$-source, $M_2$-source, $M_5$-gate, $M_7$-gate, $M_{11}$-source, $M_{12}$-source, $M_3$-source, $M_9$-source, $M_{10}$-source, and $M_{5b}$-drain;
  $M_5$-gate being connected to $M_1$-source, $M_2$-source, $M_5$-drain, $M_7$-gate, $M_{11}$-source, $M_{12}$-source, $M_3$-source, $M_9$-source, $M_{10}$-source, $M_{5b}$-gate, and $M_{5b}$-drain;
  $M_5$-source being connected to $M_7$-drain;
  $M_{5b}$-drain being connected to $M_1$-source, $M_2$-source, $M_5$-gate, $M_7$-gate, $M_{11}$-source, $M_{12}$-source, $M_3$-source, $M_9$-source, $M_{10}$-source, and $M_5$-drain;
  $M_{5b}$-gate being connected to $M_5$-gate;
  $M_{5b}$-source being connected to ground, GND;
  $M_6$-drain being connected to data output QN, data output Q, $M_6$-gate, $M_8$-gate, $M_4$-source, $M_9$-drain, $M_{10}$-drain, $M_{11}$-drain, $M_{12}$-drain, $M_6$b-drain, and $M_4$-gate;
  $M_6$-gate being connected to data output QN, data output Q, $M_6$-drain, $M_{6b}$-gate, $M_8$-gate, $M_4$-source, $M_9$-drain, $M_{10}$-drain, $M_{11}$-drain, $M_{12}$-drain, $M_6$b-drain, and $M_4$-gate;
  $M_6$-source being connected to $M_8$-drain;
  $M_{6b}$-drain being connected to data output QN, data output Q, $M_6$-gate, $M_8$-gate, $M_4$-source, $M_9$-drain, $M_{10}$-drain, $M_{11}$-drain, $M_{12}$-drain, $M_4$-gate, and $M_6$-drain;
  $M_{6b}$-gate being connected to $M_6$-gate;
  $M_{6b}$-source being connected to GND;
  $M_7$-drain being connected to $M_5$-source;
  $M_7$-gate being connected to $M_1$-source, $M_2$-source, $M_5$-gate, $M_5$-drain, $M_{11}$-source, $M_{12}$-source, $M_3$-source, $M_9$-source, $M_{10}$-source, and $M_{5b}$-drain;
  $M_7$-source being connected to GND;
  $M_8$-drain being connected to $M_6$-source;
  $M_8$-gate being connected to data output QN, data output Q, $M_6$-gate, $M_4$-gate, $M_4$-source, $M_9$-drain, $M_{10}$-drain, $M_1$-drain, $M_{12}$-drain, $M_6$b-drain, and $M_6$-drain, $M_8$-source can be connected to GND;
  $M_9$-drain being connected to data output QN, data output Q, $M_6$-gate, $M_8$-gate, $M_4$-source, $M_4$-gate, $M_{10}$-drain, $M_{11}$-drain, $M_{12}$-drain, $M_6$b-drain, and $M_6$-drain;
  $M_9$-gate being connected to $V_{DD}$;
  $M_9$-source being connected to $M_1$-source, $M_2$-source, $M_5$-gate, $M_7$-gate, $M_{11}$-source, $M_{12}$-source, $M_3$-source, $M_5$-drain, $M_{10}$-source, and $M_{5b}$-drain;
  $M_{10}$-drain being connected to data output QN, data output Q, $M_6$-gate, $M_8$-gate, $M_4$-source, $M_9$-drain, $M_4$-gate, $M_1$-drain, $M_{12}$-drain, $M_6$b-drain, and $M_6$-drain;
  $M_{10}$-gate being connected to GND;
  $M_{10}$-source being connected to $M_1$-source, $M_2$-source, $M_5$-gate, $M_7$-gate, $M_{11}$-source, $M_{12}$-source, $M_3$-source, $M_9$-source, $M_5$-drain, and $M_{5b}$-drain;
  $M_{11}$-drain being connected to data output QN, data output Q, $M_6$-gate, $M_8$-gate, $M_4$-source, $M_9$-drain, $M_{10}$-drain, $M_4$-gate, $M_{12}$-drain, $M_6$b-drain, and $M_6$-drain;
  $M_{11}$-gate being connected to CLK;
  $M_{11}$-source being connected to $M_1$-source, $M_2$-source, $M_5$-gate, $M_7$-gate, $M_5$-drain, $M_{12}$-source, $M_3$-source, $M_9$-source, $M_{10}$-source, and $M_{5b}$-drain;
  $M_{12}$-drain being connected to data output QN, data output Q, $M_6$-gate, $M_8$-gate, $M_4$-source, $M_9$-drain, $M_{10}$-drain, $M_{11}$-drain, $M_4$-gate, $M_6$b-drain, and $M_6$-drain;

$M_{12}$-gate being connected to CLK; and $M_{12}$-source being connected to $M_1$-source, $M_2$-source, $M_5$-gate, $M_7$-gate, $M_{11}$-source, $M_5$-drain, $M_3$-source, $M_9$-source, $M_{10}$-source, and $M_{5b}$-drain.

10. The NVM device recited in claim 9, wherein:

each of $M_1$ and $M_2$ is replaced with a slave inverter, $S_{INV}$; and output of $S_{INV}$ being connected to $M_3$-gate, $M_5$-gate, $M_7$-gate, $M_{11}$-source, $M_{12}$-source, $M_3$-source, $M_9$-source, $M_{10}$-source, $M_5$-drain, and $M_{5b}$-drain.

11. The NVM device recited in claim 10, wherein the master latch is connected to the slave latch via $S_{INV}$.

12. The NVM device recited in claim 11, wherein:

the master latch has a first master inverter $M_{INV1}$, a second master inverter, $M_{INV2}$, a third master inverter, $M_{INV3}$, and a master transmission gate, $M_{GATE}$;

input of $M_{INV1}$ being connected to a data input signal, D;

output of $M_{INV1}$ being connected to input of $M_{INV2}$;

input of $M_{INV2}$ being connected to output of $M_{INV1}$;

output of $M_{INV2}$ being connected to input of $M_{INV3}$ and input of $S_{INV}$;

input of $M_{INV3}$ being connected to output of $M_{INV2}$;

output of $M_{INV3}$ being connected to input of $M_{GATE}$;

input of $M_{GATE}$ being connected to output of $M_{INV3}$; and output of $M_{GATE}$ being connected to input of $M_{INV2}$ and output of $M_{INV1}$.

* * * * *